(12) United States Patent
Yamazaki et al.

(10) Patent No.: US 10,128,378 B2
(45) Date of Patent: Nov. 13, 2018

(54) SEMICONDUCTOR DEVICE

(71) Applicant: SEMICONDUCTOR ENERGY LABORATORY CO., LTD., Atsugi-shi, Kanagawa-ken (JP)

(72) Inventors: Shunpei Yamazaki, Tokyo (JP); Junichi Koezuka, Tochigi (JP); Masami Jintyou, Tochigi (JP); Yukinori Shima, Gunma (JP); Takashi Hamochi, Tochigi (JP); Yasutaka Nakazawa, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/822,648

(22) Filed: Nov. 27, 2017

(65) Prior Publication Data

US 2018/0090621 A1    Mar. 29, 2018

Related U.S. Application Data

(63) Continuation of application No. 15/161,329, filed on May 23, 2016, now Pat. No. 9,831,347, which is a
(Continued)

(30) Foreign Application Priority Data

Dec. 27, 2013   (JP) .................................. 2013-271783

(51) Int. Cl.
*H01L 29/10*   (2006.01)
*H01L 29/786*  (2006.01)
(Continued)

(52) U.S. Cl.
CPC ...... *H01L 29/78606* (2013.01); *G02F 1/1368* (2013.01); *G02F 1/13394* (2013.01);
(Continued)

(58) Field of Classification Search
CPC ..... H01L 33/62; H01L 51/56; H01L 51/0072; H01L 2251/301; H01L 43/08;
(Continued)

(56) References Cited

U.S. PATENT DOCUMENTS 5,731,856 A   3/1998   Kim et al.
5,744,864 A   4/1998   Cillessen et al.
(Continued)

FOREIGN PATENT DOCUMENTS

CN    102197490 A    9/2011
EP      1737044 A   12/2006
(Continued)

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Andy Huynh
(74) *Attorney, Agent, or Firm* — Nixon Peabody LLP; Jeffrey L. Costellia

(57) ABSTRACT

A semiconductor device comprising a first transistor, a second insulating film, a conductive film, and a capacitor is provided. The first transistor comprises a first oxide semiconductor film, a gate insulating film over the first oxide semiconductor film, and a gate electrode over the gate insulating film. The second insulating film is provided over the gate electrode. The conductive film is electrically connected to the first oxide semiconductor film. The capacitor comprises a second oxide semiconductor film, the second insulating film over the second oxide semiconductor film, and the conductive film over the second insulating film. The first oxide semiconductor film comprises a first region and a
(Continued)

second region. Each of a carrier density of the second region and a carrier density of the second oxide semiconductor film is higher than a carrier density of the first region.

20 Claims, 59 Drawing Sheets

Related U.S. Application Data continuation of application No. 14/574,424, filed on Dec. 18, 2014, now Pat. No. 9,356,098.

(51) Int. Cl.
| | |
|---|---|
| *H01L 27/12* | (2006.01) |
| *H01L 29/45* | (2006.01) |
| *G02F 1/1333* | (2006.01) |
| *G02F 1/1335* | (2006.01) |
| *G02F 1/1339* | (2006.01) |
| *G02F 1/1368* | (2006.01) |
| *H01L 27/32* | (2006.01) |

(52) U.S. Cl.
CPC .. *G02F 1/133345* (2013.01); *G02F 1/133512* (2013.01); *G02F 1/133514* (2013.01); *H01L 27/124* (2013.01); *H01L 27/1225* (2013.01); *H01L 27/1233* (2013.01); *H01L 27/1251* (2013.01); *H01L 29/1033* (2013.01); *H01L 29/45* (2013.01); *H01L 29/7869* (2013.01); *H01L 29/78648* (2013.01); *H01L 29/78696* (2013.01); *H01L 27/3262* (2013.01)

(58) Field of Classification Search
CPC . H01L 27/3244; H01L 51/0097; C09K 11/06; C09K 2211/1018; C09K 2211/185; C09K 11/025; C09K 2211/1007; C09K 2211/1029; C09K 2211/1044; C09K 2211/18; C09K 2211/188
USPC .......................................................... 257/43
See application file for complete search history.

(56) References Cited

U.S. PATENT DOCUMENTS

| | | | |
|---|---|---|---|
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,601,984 | B2 | 10/2009 | Sano et al. |
| 7,674,650 | B2 | 3/2010 | Akimoto et al. |
| 7,732,819 | B2 | 6/2010 | Akimoto et al. |
| 8,067,775 | B2 | 11/2011 | Miyairi et al. |
| 8,384,076 | B2 | 2/2013 | Park et al. |
| 8,716,073 | B2 | 5/2014 | Yamazaki et al. |
| 8,772,769 | B2 | 7/2014 | Yamazaki |
| 8,809,992 | B2 | 8/2014 | Yamazaki et al. |
| 8,916,424 | B2 | 12/2014 | Isobe et al. |
| 8,927,985 | B2 | 1/2015 | Matsukura |
| 8,937,307 | B2 | 1/2015 | Yamazaki |
| 8,941,113 | B2 | 1/2015 | Takeuchi et al. |
| 8,953,358 | B2 | 2/2015 | Nishijima et al. |
| 8,975,695 | B2 | 3/2015 | Yamazaki |
| 8,981,372 | B2 | 3/2015 | Yamazaki |
| 9,006,735 | B2 | 4/2015 | Yamazaki et al. |
| 9,018,624 | B2 | 4/2015 | Yamazaki |
| 9,064,906 | B2 | 6/2015 | Yamazaki |
| 9,196,639 | B2 | 11/2015 | Endo |
| 9,231,002 | B2 | 1/2016 | Oikawa et al. |
| 9,246,047 | B2 | 1/2016 | Yamazaki |
| 9,252,287 | B2 | 2/2016 | Yamazaki |
| 9,269,728 | B2 | 2/2016 | Yamazaki |
| 9,368,516 | B2 | 6/2016 | Yamazaki |
| 9,425,220 | B2 | 8/2016 | Miyake et al. |
| 9,431,428 | B2 | 8/2016 | Yamazaki |
| 9,437,428 | B2 | 9/2016 | Oota et al. |
| 9,449,996 | B2 | 9/2016 | Yamazaki et al. |
| 9,478,535 | B2 | 10/2016 | Yamazaki et al. |
| 9,583,516 | B2 | 2/2017 | Yamazaki et al. |
| 10,008,587 | B2 | 6/2018 | Yamazaki et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |

(56) References Cited

U.S. PATENT DOCUMENTS

| | | |
|---|---|---|
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0102313 A1 | 4/2010 | Miyairi et al. |
| 2010/0109002 A1 | 5/2010 | Itagaki et al. |
| 2011/0057186 A1* | 3/2011 | Yamazaki .......... H01L 27/1225 257/43 |
| 2011/0057187 A1* | 3/2011 | Sakakura .......... H01L 27/1225 257/43 |
| 2011/0266542 A1 | 11/2011 | Ryu et al. |
| 2012/0061668 A1 | 3/2012 | Miyairi et al. |
| 2012/0315730 A1 | 12/2012 | Koezuka et al. |
| 2013/0009209 A1 | 1/2013 | Yamazaki |
| 2013/0069058 A1* | 3/2013 | Yamazaki .......... H01L 27/1225 257/43 |
| 2013/0161610 A1 | 6/2013 | Yamazaki |
| 2013/0203214 A1 | 8/2013 | Isobe et al. |
| 2013/0221347 A1 | 8/2013 | Isobe et al. |
| 2013/0256665 A1 | 10/2013 | Takeuchi et al. |
| 2013/0258746 A1 | 10/2013 | Kurokawa |
| 2013/0267068 A1 | 10/2013 | Hanaoka et al. |
| 2013/0277672 A1 | 10/2013 | Sano et al. |
| 2013/0308392 A1 | 11/2013 | Nishijima et al. |
| 2014/0014948 A1 | 1/2014 | Matsukura |
| 2014/0175432 A1 | 6/2014 | Yamazaki et al. |
| 2014/0183528 A1 | 7/2014 | Endo |
| 2014/0313446 A1 | 10/2014 | Kubota |
| 2014/0333864 A1 | 11/2014 | Miyake et al. |
| 2015/0108474 A1 | 4/2015 | Yamazaki et al. |
| 2015/0187818 A1 | 7/2015 | Miyake et al. |
| 2015/0187953 A1 | 7/2015 | Koezuka et al. |
| 2015/0228799 A1* | 8/2015 | Koezuka ............... H01L 27/124 257/43 |
| 2015/0228803 A1* | 8/2015 | Koezuka .......... H01L 29/78693 257/43 |
| 2016/0049518 A1 | 2/2016 | Endo |
| 2016/0293640 A1 | 10/2016 | Yamazaki |
| 2016/0336355 A1 | 11/2016 | Yamazaki et al. |
| 2016/0343733 A1 | 11/2016 | Oota et al. |
| 2016/0362294 A1 | 12/2016 | Yamazaki |
| 2017/0018578 A1 | 1/2017 | Yamazaki et al. |

FOREIGN PATENT DOCUMENTS

| | | |
|---|---|---|
| EP | 2120267 A | 11/2009 |
| EP | 2226847 A | 9/2010 |
| EP | 2408011 A | 1/2012 |
| EP | 2927965 A | 10/2015 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165529 A | 6/2006 |
| JP | 2007-220816 A | 8/2007 |
| JP | 2009-278115 A | 11/2009 |
| JP | 2011-233889 A | 11/2011 |
| JP | 2012-060160 A | 3/2012 |
| JP | 2012-169605 A | 9/2012 |
| JP | 2013-038400 A | 2/2013 |
| JP | 2013-048217 A | 3/2013 |
| JP | 2013-179286 A | 9/2013 |
| JP | 2013-229588 A | 11/2013 |
| JP | 2013-242954 A | 12/2013 |
| JP | 2013-247142 A | 12/2013 |
| JP | 2013-257934 A | 12/2013 |
| KR | 2011-0073616 A | 6/2011 |
| KR | 2013-0129125 A | 11/2013 |
| TW | 201034198 | 9/2010 |
| TW | 201419305 | 5/2014 |
| WO | WO-2004/114391 | 12/2004 |
| WO | WO-2010/047217 | 4/2010 |

OTHER PUBLICATIONS

Asaoka.Y et al., "29.1:Polarizer-Free Reflective LCD Combined With Ultra Low-Power Driving Technology", SID Digest '09: SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09: SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys, Rev. A (Physical Review. A), May 1, 1984, vol. 29, No. 5. pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZNO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In-Ga-Zn-O TFTs for Flat Panel Displays", AM-FPD '08 Digest of Technical Papers, Jul. 2, 2008, pp. 251-252, The Japan Society of Applied Physics.

Godo.H et al., "P-9: Numerical Analysis on Temperature Dependence of Characteristics of Amorphous In-Ga-Zn-Oxide TFT", SID Digest '09: SID International Symposium Digest of Technical Papers, May 31, 2009, pp. 1110-1112.

Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.

Hayashi.R et al., "42.1: Invited Paper: Improved Amorphous In-Ga-Zn-O TFTs", SID Digest '08: SID International Symposium Digest of Technical Papers, May 20, 2008, vol. 39, pp. 621-624.

Hirao.T et al., "Novel Top-Gate Zinc Oxide Thin-Film Transistors (ZNO TFTs) for AMLCDS", J. Soc. Inf. Display (Journal of the Society for Information Display), 2007, vol. 15, No. 1, pp. 17-22.

(56) References Cited

OTHER PUBLICATIONS

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07: SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08: SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04: SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl, Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08: SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09: SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer". Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09: SID International Symposium Digest of Technical Papers. May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07: SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YBFE2O4, and YB2FE3O7 Types of Structures for Compounds in the IN2O3 and SC2O3-A2O3-BO Systems [A; Fe, Ga, Oral: B: Mg, Mn, Fe, Ni, Cu,or ZN]At Temperatures Over 1000°C", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGe2O4-ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06: Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08: SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09: SID International Symposium Digest of Technical Papers, May 31, 2009, pp. 191-193.

Li.C et al., "Modulated Structures of Homologous Compounds InMO3(ZnO)m (M=In,Ga m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp, 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07: SID International Symposium Digest of Technical Papers, 2007, vol. 38, pp. 1673-1676.

Mo.Y et al., "Amorphous Oxide TFT Backplanes for Large Size AMOLED Displays", IDW '08: Proceedings of the 6th International Display Workshops, Dec. 3, 2008, pp. 581-584.

Nakamura.M et al., "The phase relations in the In2O3-Ga2ZnO4-ZnO system at 1350°C", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carder transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09: SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZNO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In-Ga-Zn-Oxide TFTs With a Novel Passivation Layer", SID Digest '09: SID International Symposium Digest of Technical Papers, May 31, 2009, pp. 284-287.

Ohara.H et al., "Amorphous In-Ga-Zn-Oxide TFTs with Suppressed Variation for 4.0 inch QVGA AMOLED Display", AM-FPD '09 Digest of Technical Papers, Jul. 1. 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In-Ga-Zn-Oxide TFT", SID Digest '09: SID International Symposium Digest of Technical Papers, May 31, 2009, vol. 40, pp. 184-187.

Osada.T et al., "Development of Driver-Integrated Panel Using Amorphous In-Ga-Zn-Oxide TFT", AM-FPD '09 Digest of Technical Papers, Jul. 1, 2009, pp. 33-36.

(56) References Cited

OTHER PUBLICATIONS

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92. pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZNO TFT", IMID '07 Digest, 2007, pp. 1249-1252.

Park.S et al., "42.3: Transparent ZnO Thin Film Transistor for the Application of High Aperture Ratio Bottom Emission AM-OLED Display", SID Digest '08: SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In-Ga-Zn-Oxide TFTs", IDW'09: Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08: SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08: Proceedings of the 15th International Display Workshops, Dec. 3, 2008, pp. 1637-1640.

Tsuda.K et al., "Ultra Low Power Consumption Technologies for Mobile TFT-LCDs ", IDW '02: Proceedings of the 9th International Display Workshops, Dec. 4, 2002, pp. 295-298.

Ueno.K et al., "Field-Effect Transistor on SrTiO3 With Sputtered Al2O3 Gate Insulator", Appl, Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/IB2014/066995) dated Mar. 17, 2015.

Written Opinion (Application No. PCT/IB2014/066995) dated Mar. 17, 2015.

\* cited by examiner

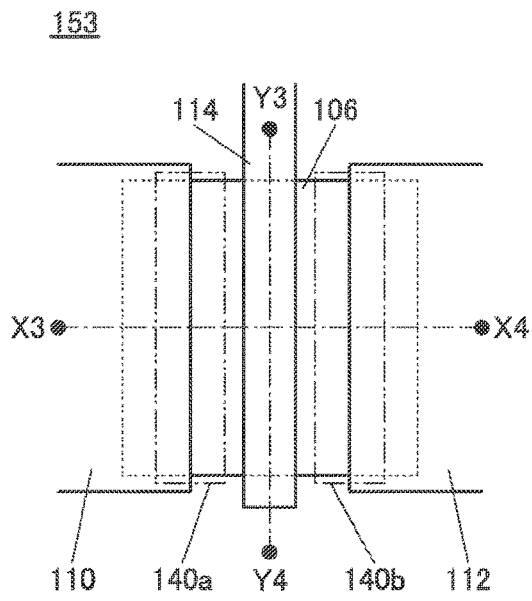
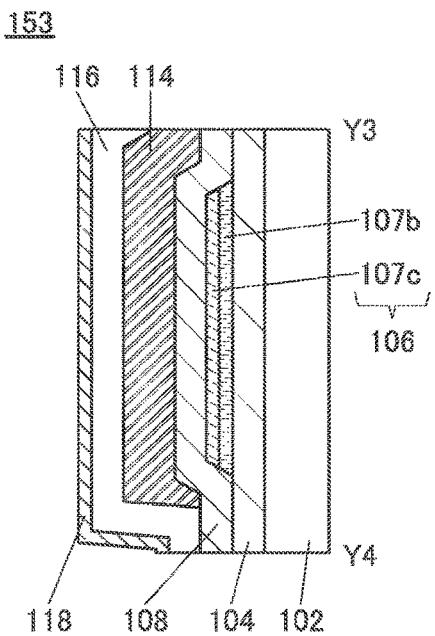
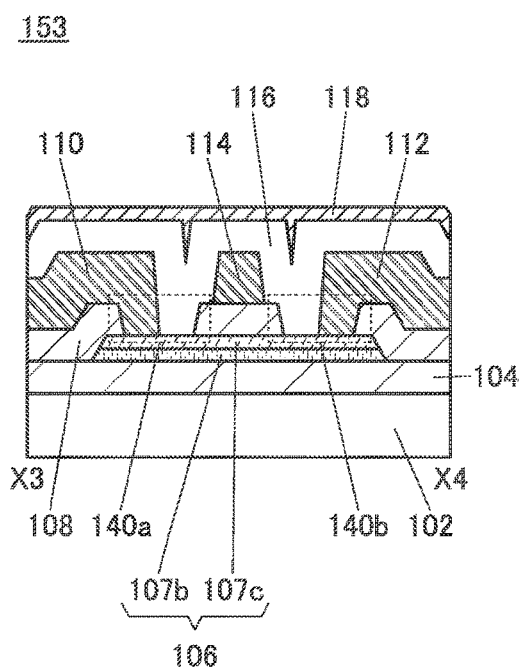

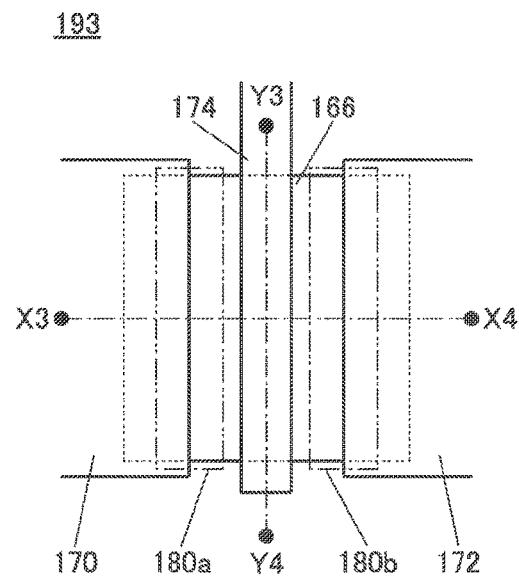
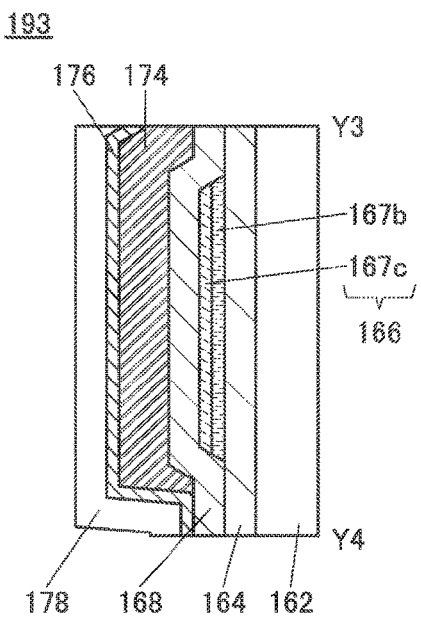
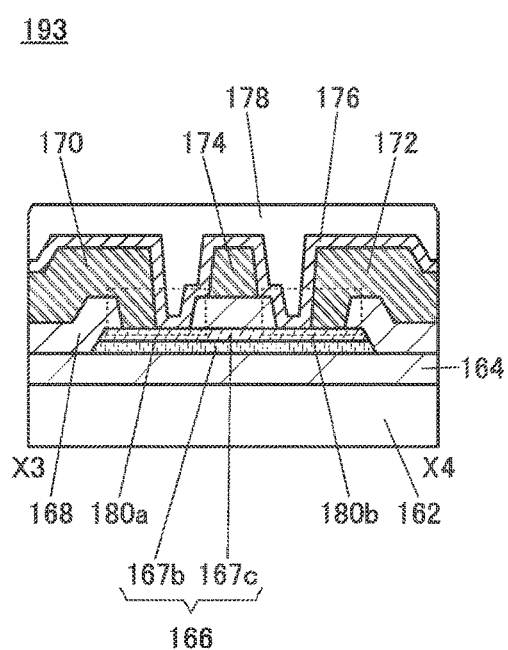

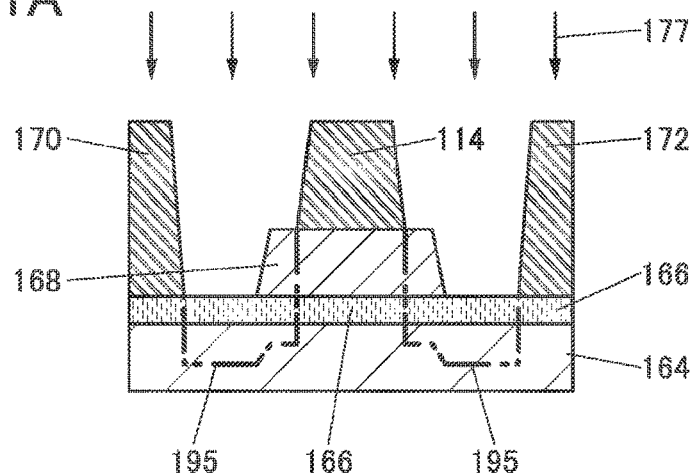
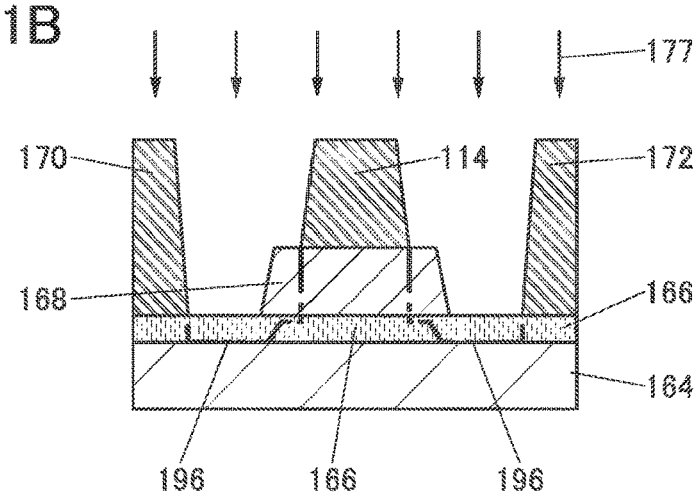
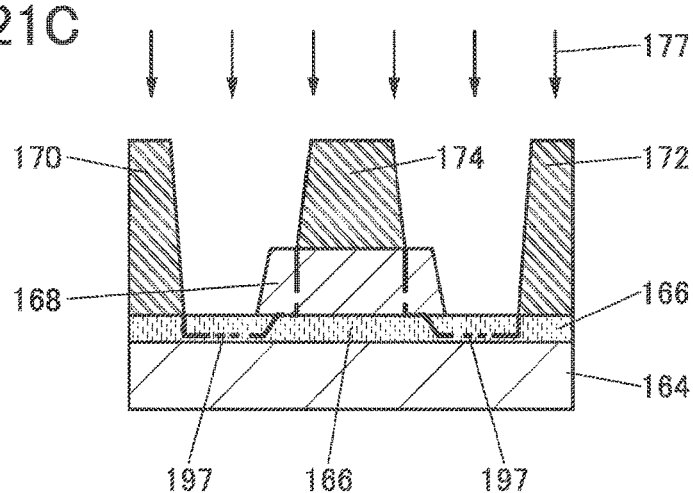

US 10,128,378 B2

SEMICONDUCTOR DEVICE

TECHNICAL FIELD

One embodiment of the present invention relates to a semiconductor device including an oxide semiconductor and a display device including the semiconductor device.

Note that one embodiment of the present invention is not limited to the above technical field. The technical field of one embodiment of the invention disclosed in this specification and the like relates to an object, a method, or a manufacturing method. In addition, the present invention relates to a process, a machine, manufacture, or a composition of matter. In particular, the present invention relates to a semiconductor device, a display device, a light-emitting device, a power storage device, a storage device, a driving method thereof, or a manufacturing method thereof.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid, crystal display device, a light-emitting device, an electro-optical device, a power generation device (including a thin film solar cell, an organic thin film solar cell, and the like), and an electronic device may each include a semiconductor device.

BACKGROUND ART

Attention has been focused on a technique for forming a transistor using a semiconductor thin film formed over a substrate having an insulating surface (also referred to as thin film transistor (TFT)). The transistor is used in a wide range of electronic devices such as an integrated circuit (IC) or an image display device (display device). A semiconductor material typified by silicon is widely known as a material for a semiconductor thin film that can be used for a transistor. As another material, an oxide semiconductor has been attracting attention.

For example, Patent Document 1 discloses a technique in which a transistor is manufactured using an amorphous oxide containing In, Zn, Ga, Sn, and the like as an oxide semiconductor.

REFERENCE

Patent Document

[Patent Document 1] Japanese Published Patent Application No. 2006-165529

DISCLOSURE OF INVENTION

As a transistor including an oxide semiconductor film, an inverted staggered transistor (also referred to as a transistor having a bottom-gate structure), a planar transistor (also referred to as a transistor having a top-gate structure), and the like are given. In the case where a transistor including an oxide semiconductor film is used for a display device, an inverted staggered transistor is used more often than a planar transistor because a manufacturing process thereof is relatively simple and manufacturing cost thereof can be kept low. However, signal delay or the like is increased by parasitic capacitance that exists between a gate electrode and source and drain electrodes of an inverted staggered transistor and accordingly image quality of a display device degrades, which has posed a problem, as an increase in screen size of a display device proceeds, or a display device is provided with a higher resolution image (for example, a high-resolution display device typified by 4 k×2 k pixels (3840 pixels in the horizontal direction and 2048 pixels in the perpendicular direction) or 8 k×4 k pixels (7680 pixels in the horizontal direction and 4320 pixels in the perpendicular direction)). Furthermore, as another problem, the occupation area of an inverted staggered transistor is larger than that of a planar transistor. Thus, with regard to a planar transistor including an oxide semiconductor film, development of a transistor which has a structure with stable semiconductor characteristics and high reliability and which is formed by a simple manufacturing process is desired.

In view of the foregoing problems, one embodiment of the present invention is to provide a novel semiconductor device including an oxide semiconductor, particularly to provide a planar type semiconductor device including an oxide semiconductor. Furthermore, another object is to provide a semiconductor device including an oxide semiconductor in which on-state current is high, provide a semiconductor device including an oxide semiconductor in which off-state current is low, provide a semiconductor device including an oxide semiconductor which occupies a small area, provide a semiconductor device including an oxide semiconductor which has a stable electrical characteristic, provide a semiconductor device including an oxide semiconductor which has high reliability, provide a novel semiconductor device, or provide a novel display device.

Note that the description of the above object does not disturb the existence of other objects. In one embodiment of the present invention, there is no need to achieve all the objects. Objects other than the above objects will be apparent from and can be derived from the description of the specification and the like.

One embodiment of the present invention is a semiconductor device including a first transistor provided in a driver circuit portion and a second transistor provided in a pixel portion; the first transistor and the second transistor have different structures. Furthermore, the first transistor and the second transistor are transistors having a top-gate structure in which conductive films serving as a gate electrode, a source electrode, and a drain electrode do not overlap. Furthermore, in an oxide semiconductor film, an impurity element is contained in a region which does not overlap with the gate electrode, the source electrode, and the drain electrode.

As the impurity element, hydrogen, boron, carbon, nitrogen, fluorine, aluminum, silicon, phosphorus, chlorine, or a rare gas element is given.

The conductivity of the oxide semiconductor film is increased by containing at least one impurity element. Thus, when a region including the impurity element is provided in a region which does not overlap with the gate electrode, the source electrode, and the drain electrode in the oxide semiconductor film, the parasitic resistance of the transistor can be reduced, and the transistor having high on-state current is obtained.

Note that the first transistor provided in the driver circuit portion may include two gate electrodes overlapping with each other with the oxide semiconductor film provided therebetween.

Furthermore, the first transistor provided in the driver circuit portion may include the oxide semiconductor film in which a first film and a second film are stacked, and the second transistor provided in the pixel portion may include the oxide semiconductor film which differs from the first film in the atomic ratio of metal elements. Furthermore, in the oxide semiconductor film included in the second transistor, the atomic ratio of metal elements may be the same as the atomic ratio of metal elements of the second film included in the oxide semiconductor film of the first transistor.

One embodiment of the present invention can provide a novel semiconductor device including an oxide semiconductor. In particular, a planar type semiconductor device including an oxide semiconductor can be provided. Alternatively, a semiconductor device including an oxide semiconductor in which on-state current is high can be provided, a semiconductor device including an oxide semiconductor in which off-state current is low can be provided, a semiconductor device including an oxide semiconductor which occupies a small area can be provided, a semiconductor device including an oxide semiconductor which has a stable electrical characteristic can be provided, a semiconductor device including an oxide semiconductor which has high reliability can be provided, a novel semiconductor device can be provided, or a novel display device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

FIGS. 5A to 5C are a top view and cross-sectional views which illustrate one embodiment of a semiconductor device.

FIGS. 16A to 16C are a top view and cross-sectional views which illustrate one embodiment of a semiconductor device.

FIGS. 21A to 21C are cross-sectional views each illustrating one embodiment of a semiconductor device.

BEST MODE FOR CARRYING OUT THE INVENTION

Figure 1A:
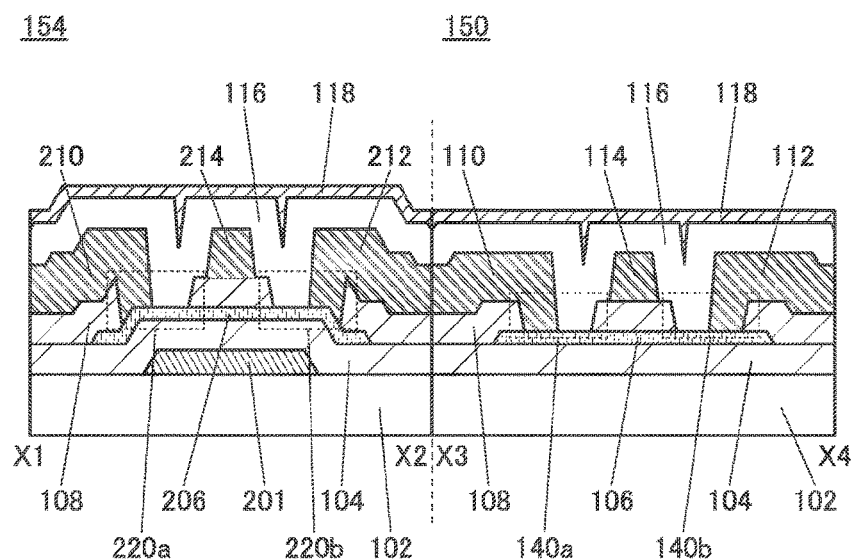
FIGS. 1A and 1B are cross-sectional views illustrating one embodiment of a semiconductor device.

Hereinafter, embodiments of the invention disclosed in this specification will be described with reference to the accompanying drawings. Note that the present invention is not limited to the following description and it will be readily appreciated by those skilled in the art that modes and details can be modified in various ways without departing from the spirit and the scope of the present invention. Accordingly, the present invention should not be interpreted as being limited to the content of the embodiments below.

Note that the position, the size, the range, or the like of each structure illustrated in drawings and the like is not accurately represented in some cases for simplification. Therefore, the disclosed invention is not necessarily limited to the position, the size, the range, or the like disclosed in the drawings and the like.

In this specification and the like, ordinal numbers such as "first", "second", and "third" are used in order to avoid confusion among components, and the terms do not mean limitation of the number of components.

Note that the term such as "over" or "below" in this specification and the like does not necessarily mean that a component is placed "directly on" or "directly under" another component. For example, the expression "a gate electrode over a gate insulating film" can mean the case where there is an additional component between the gate insulating film and the gate electrode.

In addition, in this specification and the like, the term such as an "electrode" or a "wiring" does not limit a function of a component. For example, an "electrode" is used as part of a "wiring" in some cases, and vice versa. Further, the term "electrode" or "wiring" can also mean a combination of a plurality of "electrodes" and "wirings" formed in an integrated manner.

Functions of a "source" and a "drain" are sometimes replaced with each other when a transistor of opposite polarity is used or when the direction of flow of current is changed in circuit operation, for example. Therefore, the terms "source" and "drain" can be used to denote the drain and the source, respectively, in this specification and the like.

Note that in this specification and the like, the term "electrically connected" includes the case where components are connected through an object having any electric function. There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

Embodiment 1

In this embodiment, one embodiment of a semiconductor device and a method for manufacturing the semiconductor device will be described with reference to FIGS. 1A and 1B, FIG. 2, FIGS. 3A to 3C, FIGS. 4A to 4C, FIGS. 5A to 5C, FIGS. 6A and 6B, FIGS. 7A to 7D, FIGS. 8A to 8C, FIGS. 9A to 9C, FIGS. 10A to 10C, and FIGS. 11A and 11B.

<Structure 1 of Semiconductor Device>

In FIGS. 1A and 1B and FIGS. 6A and 6B, a transistor having a top-gate structure is shown as an example of a transistor included in a semiconductor device. Here, a display device is described as an example of the semiconductor device. Furthermore, structures of transistors provided in a driver circuit and a pixel portion of the display device are described.

Figure 1B:
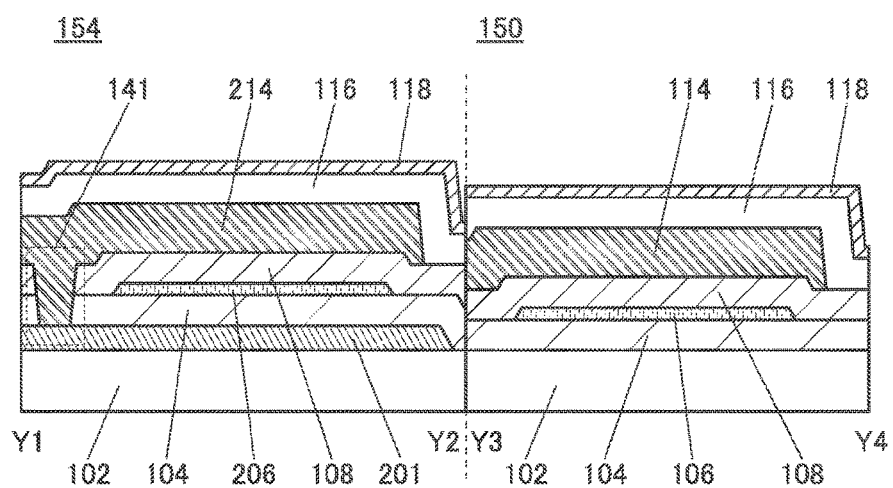
Figure 6A:
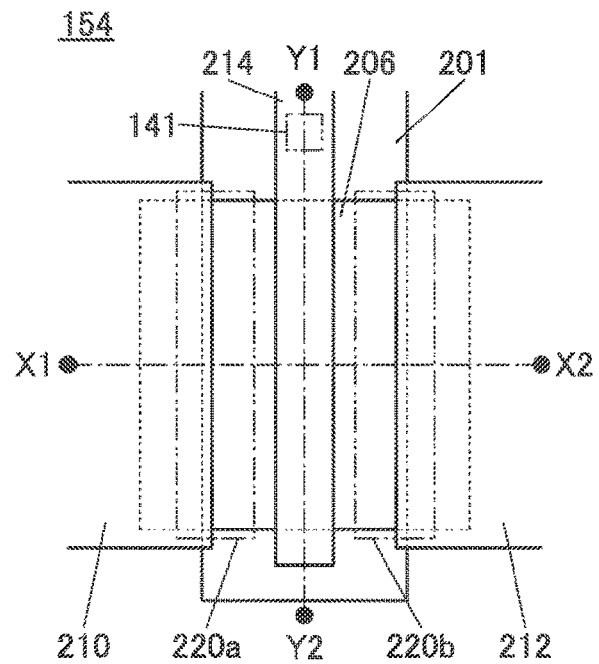
FIGS. 6A and 6B are top views illustrating one embodiment of a semiconductor device.
Figure 6B:
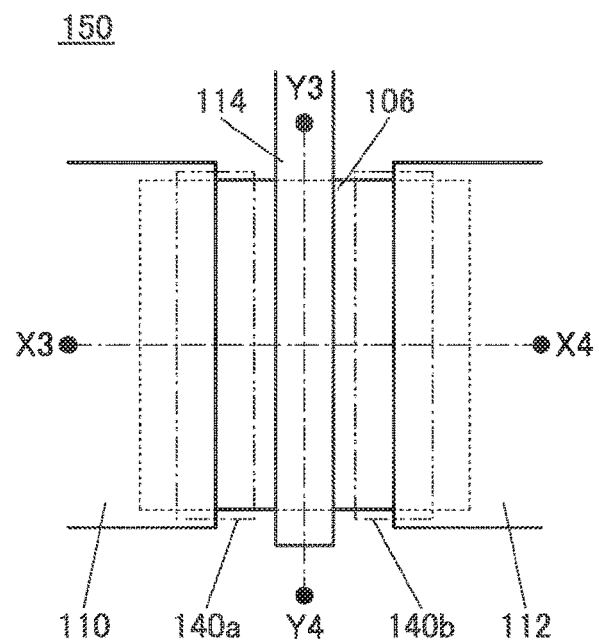

FIGS. 6A and 6B are top views of a transistor 154 provided in a driver circuit portion and a transistor 150 provided in a pixel portion. FIGS. 1A and 1B are cross-sectional views of the transistor 154 and the transistor 150. FIG. 6A is the top view of the transistor 154, and FIG. 6B is the top view of the transistor 150. FIG. 1A shows cross-sectional views along the dashed-dotted line X1-X2 in FIG. 6A and the dashed-dotted line X3-X4 in FIG. 6B. FIG. 1B shows cross-sectional views along the dashed-dotted line Y1-Y2 in FIG. 6A and the dashed-dotted line Y3-Y4 in FIG. 6B. Note that in FIGS. 6A and 6B, a substrate 102, an insulating film 104, an insulating film 108, an insulating film 116, an insulating film 118, and the like are not illustrated for simplicity. FIG. 1A shows cross-sectional views of the transistor 150 and the transistor 154 in a channel length direction, and FIG. 1B shows cross-sectional views of the transistor 150 and the transistor 154 in a channel width direction.

In a manner similar to that of the transistor 150 and the transistor 154, some components are not illustrated in some cases in top views of transistors described below. Furthermore, the direction of the dashed-dotted line X1-X1 and the direction of the dashed-dotted line X3-X4 may be called a channel length direction, and the direction of the dashed-dotted line Y1-Y2 and the direction of the dashed-dotted line Y3-Y4 may be called a channel width direction.

The transistor 150 shown in FIGS. 1A and 1B includes an oxide semiconductor film 106 over the insulating film 104 formed over the substrate 102, the insulating film 108 in contact with the oxide semiconductor film 106, a conductive film 110 in contact with the oxide semiconductor film 106 in part of an opening portion 140*a* in the insulating film 108, a conductive film 112 in contact with the oxide semiconductor film 106 in part of an opening portion 140*b* in the insulating film 108, and a conductive film 114 overlapping with the oxide semiconductor film 106 with the insulating film 108 provided therebetween. Note that the insulating film 116 and the insulating film 118 may be provided over the transistor 150.

The transistor 154 includes a conductive film 201 formed over the substrate 102, the insulating film 104 over the conductive film 201, an oxide semiconductor film 206 over the insulating film 104, the insulating film 108 in contact with the oxide semiconductor film 206, a conductive film 210 in contact with the oxide semiconductor film 206 in part of an opening portion 220*a* in the insulating film 108, a conductive film 212 in contact with the oxide semiconductor film 206 in part of an opening portion 220*b* in the insulating film 108, and a conductive film 214 overlapping with the oxide semiconductor film 206 with the insulating film 108 provided therebetween.

The transistor 154 is characterized in that the conductive film 201 is provided so as to overlap with the oxide semiconductor film 206 with the insulating film 104 provided therebetween. That is, the conductive film 201 serves as a gate electrode. Furthermore, the transistor 154 is a transistor having a dual-gate structure.

By supplying different potentials to the conductive film 214 and the conductive film 201 which are not connected to each other, the threshold voltage of the transistor 154 can be controlled. Alternatively, as shown in FIG. 1B, by supplying the same potential to the conductive film 214 and the conductive film 201 which are connected to each other, variations in the initial characteristics can be reduced, and degradation of the transistor due to the −GBT (negative gate bias-temperature) stress test and a change in the rising voltage of the on-state current at different drain voltages can be suppressed. In addition, a region where carriers flow in the oxide semiconductor film 206 becomes larger in the film thickness direction, so that the amount of carrier movement is increased. As a result, the on-state current and field-effect mobility of the transistor 154 are increased. When the channel length of the transistor is less than 2.5 µm, preferably greater than or equal to 1.45 µm and less than or equal to 2.2 µm, the on-state current can be further increased and the field-effect mobility can be increased.

Figure 54A:
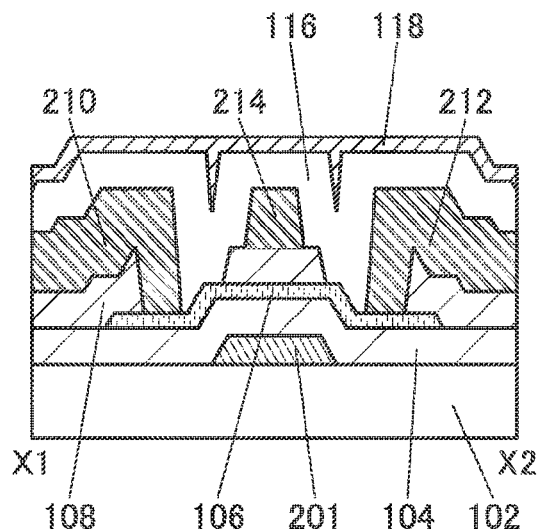
FIGS. 54A and 54B are cross-sectional views each illustrating one embodiment of a semiconductor device.
Figure 54B:
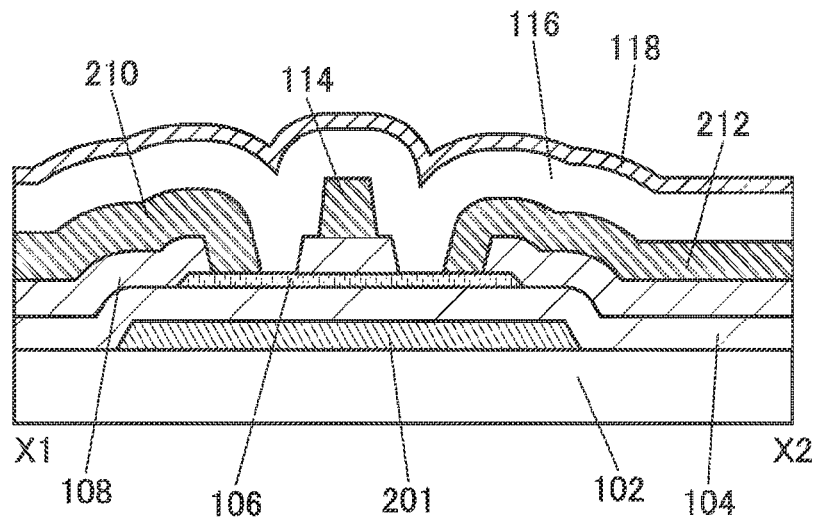

Note that a structure in which the conductive film 201 does not overlap with the conductive film 210 and the conductive film 212 may be employed. FIG. 54A illustrates an example of this case. Alternatively, the conductive film 201 may overlap with an entire region of the oxide semiconductor film 106 while overlapping with the conductive film 210 and the conductive film 212. FIG. 54B illustrates an example of this case.

In the display device described in this embodiment, the transistor in the driver circuit portion and the transistor in the pixel portion have different structures. The transistor included in the driver circuit portion has a dual-gate structure. That is, the field-effect mobility of the transistor included in the driver circuit portion is higher than that of the transistor included in the pixel portion.

Furthermore, in the display device, the transistor included in the driver circuit portion and the transistor included in the pixel portion may have different channel lengths.

Typically, the channel length of the transistor 154 included in the driver circuit portion can be less than 2.5 µm, or greater than or equal to 1.45 µm and less than or equal to 2.2 µm. The channel length of the transistor 150 included in the pixel portion can be greater than or equal to 2.5 µm, or greater than or equal to 2.5 µm and less than or equal to 20 µm.

When the channel length of the transistor 54 included in the driver circuit portion is less than 2.5 µm, preferably greater than or equal to 1.45 µm and less than or equal to 2.2 µm, as compared with the transistor 150 included in the pixel portion, the field-effect mobility can be increased, and the amount of on-state current can be increased. Consequently, a driver circuit portion capable of high-speed operation can be formed.

Since the transistor has high field-effect mobility, a demultiplexer circuit can be formed in a signal line driver circuit which is an example of the driver circuit portion. A demultiplexer circuit distributes one input signal to a plurality of outputs; thus, using the demultiplexer circuit can reduce the number of input terminals for input signals. For example, when one pixel includes a red sub-pixel, a green sub-pixel, and a blue sub-pixel and a demultiplexer circuit corresponding to each pixel is provided, an input signal can be distributed by the demultiplexer circuit to be input to each sub-pixel. Consequently, the number of input terminals can be reduced to ⅓.

In the transistor included in the pixel portion, a gate electrode does not overlap with a source electrode and a drain electrode; thus, parasitic capacitance is small. Furthermore, the oxide semiconductor film has a region containing an impurity element in a region which does not overlap with the gate electrode, the source electrode, and the drain electrode; thus, parasitic resistance is small. For these reasons, the transistor having high on-state current is provided in the pixel portion. As a result, signal delay can be reduced and display unevenness can be suppressed in a large-sized display device and a high-resolution display device.

In the oxide semiconductor film 106, an element which forms an oxygen vacancy is included in a region which does not overlap with the conductive film 110, the conductive film 112, and the conductive film 114. Furthermore, in the oxide semiconductor film 206, the element which forms an oxygen vacancy is included in a region which does not overlap with the conductive film 210, the conductive film 212, and the conductive film 214. Hereinafter, the elements which form oxygen vacancies are described as impurity elements. Typical examples of impurity elements are hydrogen, boron, carbon, nitrogen, fluorine, aluminum, silicon, phosphorus, chlorine, and rare gas elements. Typical examples of rare gas elements are helium, neon, argon, krypton, and xenon.

When the impurity element is added to the oxide semiconductor film, a bond between a metal element and oxygen in the oxide semiconductor film is cut, whereby an oxygen vacancy is formed. Alternatively, when the impurity element is added to the oxide semiconductor film, oxygen bonded to a metal element in the oxide semiconductor film is bonded to the impurity element, and the oxygen is released from the metal element, whereby an oxygen vacancy is formed. As a result, carrier density is increased in the oxide semiconductor film, and the oxide semiconductor film has higher conductivity.

Figure 2:
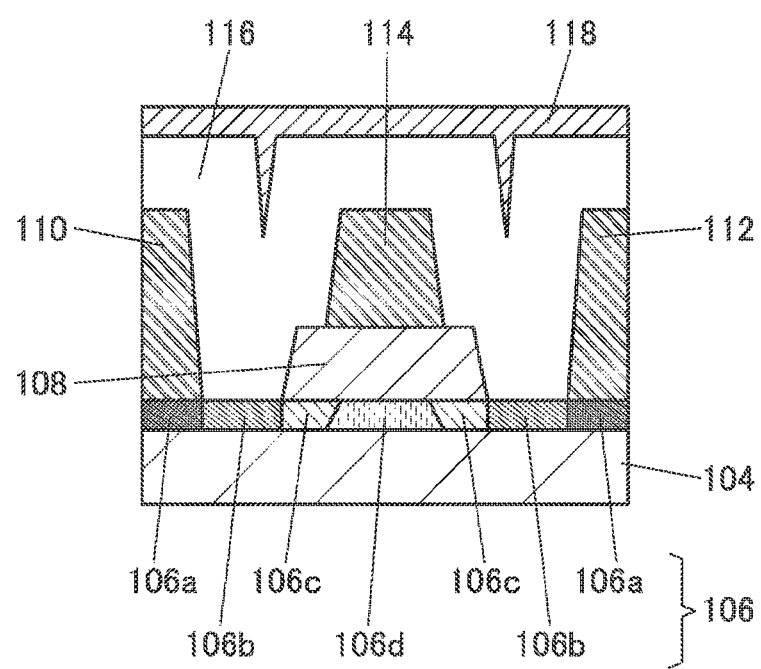
FIG. 2 is a cross-sectional view illustrating one embodiment of a semiconductor device.

FIG. 2 is an enlarged view of the vicinity of the oxide semiconductor film 106. Note that description is made using an enlarged view of the vicinity of the oxide semiconductor film 106 included in the transistor 150 as a typical example. As shown in FIG. 2, the oxide semiconductor film 106 includes regions 106a in contact with the conductive film 110 and the conductive film 112, regions 106b in contact with the insulating film 116, and regions 106c and a region 106d which overlap with the insulating film 108.

The regions 106a serve as a source region and a drain region. In the case where the conductive film 110 and the conductive film 112 are formed using a conductive material which is easily bonded to oxygen, such as tungsten, titanium, aluminum, copper, molybdenum, chromium, tantalum, an alloy of any of these, or the like, oxygen contained in the oxide semiconductor film is bonded to the conductive material contained in the conductive film 110 and the conductive film 112, and an oxygen vacancy is formed in the oxide semiconductor film. Furthermore, in some cases, part of constituent elements of the conductive material that forms the conductive film 110 and the conductive film 112 is mixed into the oxide semiconductor film. As a result, the region 106a in contact with the conductive film 110 and the conductive film 112 have higher conductivity and serve as a source region and a drain region.

The region 106b and the region 106c serve as low-resistance regions. The impurity element is contained in the region 106b and the region 106c. Note that the impurity element concentration of the region 106b is higher than the impurity element concentration of the region 106c. In the case where a side surface of the conductive film 114 has a tapered shape, part of the region 106c may overlap with the conductive film 114.

In the case where the impurity element is a rare gas element and the oxide semiconductor film 106 is formed by a sputtering method, the regions 106a to 106d each contain a rare gas element. In addition, the rare gas element concentration of each of the regions 106b and 106c is higher than that of each of the regions 106a and 106d. The reasons are as follows: in the case where the oxide semiconductor film 106 is formed by a sputtering method, a rare gas is used as a sputtering gas, so that the oxide semiconductor film 106 contains the rare gas; and a rare gas is intentionally added to the regions 106b and 106c in order to form oxygen vacancies in the regions 106b and 106c. Note that a rare gas element different from that added to the regions 106a and 106d may be added to the regions 106b and 106c.

In the case where the impurity element is boron, carbon, nitrogen, fluorine, aluminum, silicon, phosphorus, or chloride, the impurity element is contained in only the regions 106b and 106c. Thus, the impurity element concentration of each of the regions 106b and 106c is higher than the impurity element concentration of each of the regions 106a and 106d. Note that, in the region 106b and the region 106c, the impurity element concentration which is measured by secondary ion mass spectrometry (SIMS) can be higher than or equal to $1\times10^{18}$ atoms/cm$^3$ and lower than or equal to $1\times10^{22}$ atoms/cm$^3$, higher than or equal to $1\times10^{19}$ atoms/cm$^3$ and lower than or equal to $1\times10^{21}$ atoms/cm$^3$, or higher than or equal to $5\times10^{19}$ atoms/cm$^3$ and lower than or equal to $5\times10^{20}$ atoms/cm$^3$.

In the case where the impurity element is hydrogen, the impurity element concentration of each of the regions 106b and 106c is higher than the impurity element concentration of each of the regions 106a and 106d. Note that, in the region 106b and the region 106c, the concentration of hydrogen which is measured by SIMS can be higher than or equal to $8\times10^{19}$ atoms/cm$^3$, higher than or equal to $1\times10^{20}$ atoms/cm$^3$, or higher than or equal to $5\times10^{20}$ atoms/cm$^3$.

Since the region 106b and the region 106c contain the impurity elements, the amount of oxygen vacancy is increased and carrier density is increased. As a result, the region 106b and the region 106c have higher conductivity and serve as low-resistance regions.

Note that the impurity elements may be one or more of hydrogen, boron, carbon, nitrogen, fluorine, aluminum, silicon, phosphorus, and chlorine, and one or more of rare gases. In this case, the conductivity of the region 106b and the region 106c is further increased in some cases by interaction between an oxygen vacancy formed by the rare gas and one or more of hydrogen, boron, carbon, nitrogen, fluorine, aluminum, silicon, phosphorus, and chlorine which is added to the regions.

The region 106d serves as a channel.

In the insulating film 108, a region overlapping with the oxide semiconductor film 106 and the conductive film 114 and a region overlapping with the oxide semiconductor film 206 and the conductive film 214 serve as gate insulating films. Furthermore, in the insulating film 108, regions overlapping with the oxide semiconductor film 106 and the conductive films 110 and 112 and regions overlapping with the oxide semiconductor film 206 and the conductive films 210 and 212 serve as interlayer insulating films.

The conductive film 110 and the conductive film 112 serve as a source electrode and a drain electrode, and the conductive film 210 and the conductive film 212 serve as a source electrode and a drain electrode. The conductive film 114 and the conductive film 214 serve as gate electrodes.

In the transistors 150 and 154 described in this embodiment, the region serving as a low-resistance region is provided between the region serving as a channel and the regions serving as a source region and a drain region. Resistance between the channel and the source region and the drain region can be reduced, and the transistor 150 and the transistor 154 have high on-state current and high field-effect mobility.

In a process of manufacturing the transistor 150 and the transistor 154, the conductive film 114 and the conductive film 214 that serve as gate electrodes, the conductive films 110 and 112 that serve as a source electrode and a drain electrode, and the conductive films 210 and 212 that serve as a source electrode and a drain electrode are formed at the same time. Thus, in the transistor 150, the conductive film 114 does not overlap with the conductive films 110 and 112, and parasitic capacitance between the conductive film 114 and each of the conductive films 110 and 112 can be reduced. Furthermore, in the transistor 154, the conductive film 214 does not overlap with the conductive films 210 and 212, and parasitic capacitance between the conductive film 214 and each of the conductive films 210 and 212 can be reduced. As a result, in the case where a large-area substrate is used as the substrate 102, signal delay in the conductive film 110, the conductive film 112, the conductive film 114, the conductive film 210, the conductive film 212, and the conductive film 214 can be reduced.

In the transistor 150, the impurity element is added to the oxide semiconductor film 106 using the conductive film 110, the conductive film 112, and the conductive film 114 as masks. In the transistor 154, the impurity element is added to the oxide semiconductor film 206 using the conductive film 210, the conductive film 212, and the conductive film 214 as masks. That is, the low-resistance regions can be formed in a self-aligned manner.

The structure shown in FIGS. 1A and 1B is described in detail below.

As the substrate 102, any of a variety of substrates can be used without particular limitation. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. As an example of a glass substrate, a barium borosilicate glass substrate, an aluminoborosilicate glass substrate, a soda lime glass substrate, or the like can be given. Examples of a flexible substrate, an attachment film, a base material film, or the like are as follows: plastic typified by polyethylene terephthalate (PET), polyethylene naphthalate (PEN), and polyether sulfone (PES); a synthetic resin such as acrylic; polypropylene; polyester; polyvinyl fluoride; polyvinyl chloride; polyamide; polyimide; aramid; epoxy; an inorganic vapor deposition film; and paper. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

A flexible substrate may be used as the substrate 102, and the transistor may be provided directly on the flexible substrate. Alternatively, a separation layer may be provided between the substrate 102 and the transistor. The separation layer can be used when part or the whole of a semiconductor device formed over the separation layer is separated from the substrate 102 and transferred onto another substrate. In such a case, the transistor can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

Examples of a substrate to which the transistor is transferred include, in addition to the above-described substrates over which the transistor can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. When such a substrate is used, a transistor with excellent properties or a transistor with low power consumption can be formed, a device with high durability, high heat resistance can be provided, or reduction in weight or thickness can be achieved.

The insulating film 104 can be formed with a single layer or stacked layers using an oxide insulating film or a nitride insulating film. Note that at least regions of the insulating film 104 which are in contact with the oxide semiconductor film 106 and the oxide semiconductor film 206 are preferably formed using an oxide insulating film, in order to improve characteristics of the interface with the oxide semiconductor film 106 and the oxide semiconductor film 206. When the insulating film 104 is formed using an oxide insulating film from which oxygen is released by heating, oxygen contained in the insulating film 104 can be moved to the oxide semiconductor film 106 and the oxide semiconductor film 206 by heat treatment.

The thickness of the insulating film 104 can be greater than or equal to 50 nm, greater than or equal to 100 nm and less than or equal to 3000 nm, or greater than or equal to 200 nm and less than or equal to 1000 nm. By increasing the thickness of the insulating film 104, the amount of oxygen released from the insulating film 104 can be increased, and the interface state density at the interface between the insulating film 104 and each of the oxide semiconductor films 106 and 206 and oxygen vacancies contained in the oxide semiconductor film 106 and the oxide semiconductor film 206 can be reduced.

The insulating film 104 may be formed with a single layer or stacked layers using one or more of a silicon oxide film, a silicon oxynitride film, a silicon nitride oxide film, a silicon nitride film, an aluminum oxide film, a hafnium oxide film, a gallium oxide film, a Ga—Zn oxide film, and the like.

The oxide semiconductor film 106 and the oxide semiconductor film 206 are typically formed using a metal oxide film such as an In—Ga oxide film, an In—Zn oxide film, or an In-M-Zn oxide film (M is Mg, Al, Ti, Ga, Y, Zr, La, Ce, Nd, or Hf). Note that the oxide semiconductor film 106 and the oxide semiconductor film 206 have a light-transmitting property.

Note that in the case where the oxide semiconductor film 106 and the oxide semiconductor film 206 are formed using In-M-Zn oxide, when summation of In and M is assumed to be 100 atomic %, the proportions of In and M are preferably as follows: the proportion of In is greater than 25 atomic % and the proportion of M is less than 75 atomic %, or the proportion of In is greater than 34 atomic % and the proportion of M is less than 66 atomic %.

The energy gap of each of the oxide semiconductor films 106 and 206 is 2 eV or more, 2.5 eV or more, or 3 eV or more.

The thickness of each of the oxide semiconductor film 106 and the oxide semiconductor film 206 can be greater than or equal to 3 μm and less than or equal to 200 nm, greater than or equal to 3 nm and less than or equal to 100 nm, or greater than or equal to 3 nm and less than or equal to 50 nm.

In the case where each of the oxide semiconductor films 106 and 206 is an In-M-Zn oxide film (M is Mg, Al, Ti, Ga, Y, Zr, La, Ce, Nd, or Hf), it is preferable that the atomic ratio of metal elements of a sputtering target used for forming a film of the In-M-Zn oxide film satisfy In≥M and Zn≥M. As the atomic ratio of metal elements of such a sputtering target, In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, or the like is preferable. Note that the atomic ratios of metal elements in the formed oxide semiconductor films 106 and 206 vary from the above atomic ratio of metal elements of the sputtering target within a range of ±40% as an error.

When silicon or carbon that is one of elements belonging to Group 14 is contained in the oxide semiconductor films 106 and 206, oxygen vacancies are increased in the oxide semiconductor films 106 and 206, and the oxide semiconductor films 106 and 206 become n-type films. Thus, the concentration of silicon or carbon (the concentration measured by SIMS) in the oxide semiconductor film 106 and the oxide semiconductor film 206, in particular, the region 106d, can be lower than or equal to $2 \times 10^{18}$ atoms/cm$^3$, or lower than or equal to $2 \times 10^{17}$ atoms/cm$^3$. As a result, the transistor has positive threshold voltage (normally-off characteristics).

Furthermore, the concentration of alkali metal or alkaline earth metal which is measured by SIMS in the oxide semiconductor film 106 and the oxide semiconductor film 206, in particular, the region 106d, can be lower than or equal to $1\times10^{18}$ atoms/cm$^3$, or lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal in the region 106d. As a result, the transistor has positive threshold voltage (normally-off characteristics).

Furthermore, when nitrogen is contained in the oxide semiconductor film 106 and the oxide semiconductor film 206, in particular, the region 106d, electrons serving as carriers are generated, carrier density is increased, and the oxide semiconductor films 106 and 206 become n-type films in some cases. Thus, a transistor including an oxide semiconductor film which contains nitrogen is likely to have normally-on characteristics. Therefore, nitrogen is preferably reduced as much as possible in the oxide semiconductor film, in particular, the region 106d. The concentration of nitrogen which is measured by SIMS can be set to, for example, lower than or equal to $5\times10^{18}$ atoms/cm$^3$.

By reducing the impurity elements in the oxide semiconductor film 106 and the oxide semiconductor film 206, in particular, the region 106d, the carrier density of the oxide semiconductor films can be lowered. In the oxide semiconductor film 106 and the oxide semiconductor film 206, in particular, the region 106d, carrier density can be $1\times10^{17}$/cm$^3$ or less, $1\times10^{15}$/cm$^3$ or less, $1\times10^{13}$/cm$^3$ or less, or $1\times10^{11}$/cm$^3$ or less.

Note that it is preferable to use, as the oxide semiconductor film 106 and the oxide semiconductor film 206, oxide semiconductor films in which the impurity concentration is low and density of defect states is low, in which case the transistors can have more excellent electrical characteristics. Here, the state in which impurity concentration is low and density of defect states is low (the amount of oxygen vacancy is small) is referred to as "highly purified intrinsic" or "substantially highly purified intrinsic". A transistor formed using a highly purified intrinsic or substantially highly purified intrinsic oxide semiconductor has few carrier generation sources, and thus has a low carrier density in some cases. Thus, a transistor including the oxide semiconductor film in which a channel region is formed is likely to have positive threshold voltage (normally-off characteristics). A highly purified intrinsic or substantially highly purified intrinsic oxide semiconductor film has a low density of defect states and accordingly has low density of trap states in some cases. Furthermore, a transistor having a highly purified intrinsic or substantially highly purified intrinsic oxide semiconductor film has an extremely low off-state current; the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. Thus, the transistor whose channel region is formed in the oxide semiconductor film has a small variation in electrical characteristics and high reliability in some cases.

The oxide semiconductor film 106 and the oxide semiconductor film 206 may have a non-single-crystal structure, for example. The non-single-crystal structure includes a c-axis aligned crystalline oxide semiconductor (CAAC-OS) which is described later, a polycrystalline structure, a microcrystalline structure which is described later, or an amorphous structure, for example. Among the non-single-crystal structure, the amorphous structure has the highest density of defect levels, whereas CAAC-OS has the lowest density of defect levels.

Note that the oxide semiconductor film 106 and the oxide semiconductor film 206 may be mixed films including two or more of the following: a region having an amorphous structure, a region having a microcrystalline structure, a region having a polycrystalline structure, a CAAC-OS region, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Furthermore, the mixed film has a stacked-layer structure of two or more of a region having an amorphous structure, a region having a microcrystalline structure, a region having a polycrystalline structure, a CAAC-OS region, and a region having a single-crystal structure in some cases.

Note that in the oxide semiconductor film 106 and the oxide semiconductor film 206, the region 106b and the region 106d differ in crystallinity in some cases. In the oxide semiconductor film 106 and the oxide semiconductor film 206, the region 106c and the region 106d differ in crystallinity in some cases. These cases are due to damage to the region 106b or the region 106c, which lowers their crystallinity, when the impurity element is added to the region 106b or the region 106c.

The insulating film 108 can be formed with a single layer or stacked layers using an oxide insulating film or a nitride insulating film. Note that at least regions of the insulating film 108 which are in contact with the oxide semiconductor film 106 and the oxide semiconductor film 206 are preferably formed using an oxide insulating film, in order to improve characteristics of the interface with the oxide semiconductor film 106 and the oxide semiconductor film 206. The insulating film 108 may be formed with a single layer or stacked layers using one or more of a silicon oxide film, a silicon oxynitride film, a silicon nitride oxide film, a silicon nitride film, an aluminum oxide film, a hafnium oxide film, a gallium oxide film, a Ga—Zn oxide film, and the like.

Furthermore, it is possible to prevent outward diffusion of oxygen from the oxide semiconductor film 106 and the oxide semiconductor film 206 and entry of hydrogen, water, or the like into the oxide semiconductor film 106 and the oxide semiconductor film 206 from the outside by providing an insulating film having a blocking effect against oxygen, hydrogen, water, and the like as the insulating film 108. As for the insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given as examples.

The insulating film 108 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, so that gate leakage of the transistor can be reduced.

When the insulating film 108 is formed using an oxide insulating film from which oxygen is released by heating, oxygen contained in the insulating film 108 can be moved to the oxide semiconductor film 106 and the oxide semiconductor film 206 by heat treatment.

As the insulating film 108, a silicon oxynitride film with few defects can be used. In an ESR spectrum at 100 K or lower of the silicon oxynitride film with few defects, after heat treatment, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1\times10^{18}$ spins/cm$^3$, typically higher than or equal to $1\times10^{17}$ spins/cm$^3$ and lower than $1\times10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide (NO$_x$; x is greater than or equal to 0 and less than or equal to 2, or greater than or equal to 1 and less than or equal to 2). Typical examples of nitrogen oxide include nitrogen monoxide and nitrogen dioxide. Accordingly, the lower the sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the smaller the amount of nitrogen oxide contained in the silicon oxynitride film is.

In the silicon oxynitride film with few defects, the concentration of nitrogen which is measured by SIMS is lower than or equal to $6\times10^{20}$ atoms/cm$^3$. When the insulating film 108 is formed using the silicon oxynitride film with few defects, nitrogen oxide is unlikely to be generated, so that the carrier traps at the interface between the insulating film 108 and each of the oxide semiconductor films 106 and 206 can be reduced. In addition, a change in the threshold voltage of the transistor included in the semiconductor device can be reduced, which leads to a reduction in change in the threshold voltage of the transistor.

The thickness of the insulating film 108 can be greater than or equal to 5 nm and less than or equal to 400 µm, greater than or equal to 5 µm and less than or equal to 300 nm, or greater than or equal to 10 nm and less than or equal to 250 nm.

The conductive film 110, the conductive film 112, the conductive film 114, the conductive film 210, the conductive film 212, and the conductive film 214 include the same material (e.g., the same metal element) and the same stacked-layer structure because they are formed at the same time. The conductive film 110, the conductive film 112, the conductive film 114, the conductive film 210, the conductive film 212, and the conductive film 214 can be formed using a metal element selected from aluminum, chromium, copper, tantalum, titanium, molybdenum, nickel, iron, cobalt, and tungsten; an alloy containing any of these metal elements as a component; an alloy containing any of these metal elements in combination; or the like. Furthermore, one or more metal elements selected from manganese and zirconium may be used. Furthermore, the conductive film 110, the conductive film 112, the conductive film 114, the conductive film 210, the conductive film 212, and the conductive film 214 may have a single-layer structure or a stacked-layer structure including two or more layers. For example, any of the following can be used: a single-layer structure of an aluminum film containing silicon; a single-layer, structure of a copper film containing manganese; two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a copper film containing manganese; a three-layer structure in which a titanium film, an aluminum film, and a titanium film are stacked in this order; a three-layer structure in which a copper film containing manganese, a copper film, and a copper film containing manganese are stacked in this order; and the like. Furthermore, an alloy film or a nitride film which contains aluminum and one or more elements selected from titanium, tantalum, tungsten, molybdenum, chromium, neodymium, and scandium may be used.

Alternatively, the conductive film 110, the conductive film 112, the conductive film 114, the conductive film 210, the conductive film 212, and the conductive film 214 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide including silicon oxide. It is also possible to have a stacked-layer structure formed using the above light-transmitting conductive material and the above metal element.

The thickness of each of the conductive film 110, the conductive film 112, the conductive film 114, the conductive film 210, the conductive film 212, and the conductive film 214 can be greater than or equal to 30 nm and less than or equal to 500 nm, or greater than or equal to 100 nm and less than or equal to 400 nm.

The insulating film 116 can be formed with a single layer or stacked layers using an oxide insulating film or a nitride insulating film. Note that at least regions of the insulating film 116 which are in contact with the oxide semiconductor film 106 and the oxide semiconductor film 206 are preferably formed using an oxide insulating film, in order to improve characteristics of the interface with the oxide semiconductor film 106 and the oxide semiconductor film 206. When the insulating film 116 is formed using an oxide insulating film from which oxygen is released by heating, oxygen contained in the insulating film 116 can be moved to the oxide semiconductor film 106 and the oxide semiconductor film 206 by heat treatment.

The insulating film 116 may be formed with a single layer or stacked layers using one or more of a silicon oxide film, a silicon oxynitride film, a silicon nitride oxide film, a silicon nitride film, an aluminum oxide film, a hafnium oxide film, a gallium oxide film, a Ga—Zn oxide film, and the like.

The insulating film 118 is preferably a film serving as a barrier film against hydrogen, water, and the like from the outside. The insulating film 118 can be formed with a single layer or stacked layers using a silicon nitride film, a silicon nitride oxide film, or an aluminum oxide film, for example.

The thickness of each of the insulating films 116 and 118 can be greater than or equal to 30 nm and less than or equal to 500 nm, or greater than or equal to 100 nm and less than or equal to 400 nm.

<Structure 2 of Semiconductor Device>

Next, another structure of the semiconductor device is described with reference to FIGS. 3A to 3C. Here, description is made using a transistor 151 as a modification example of the transistor 150 included in the pixel portion. The structure of the insulating film 104 or the structures of the conductive film 110, the conductive film 112, and the conductive film 114 of the transistor 151 can be used for the transistor 154 in the driver circuit portion as appropriate.

Figure 3A:
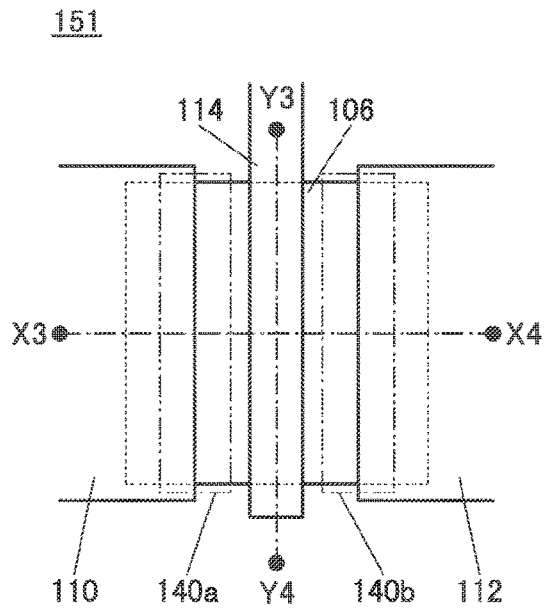
FIGS. 3A to 3C are a top view and cross-sectional views which illustrate one embodiment of a semiconductor device.
Figure 3B:
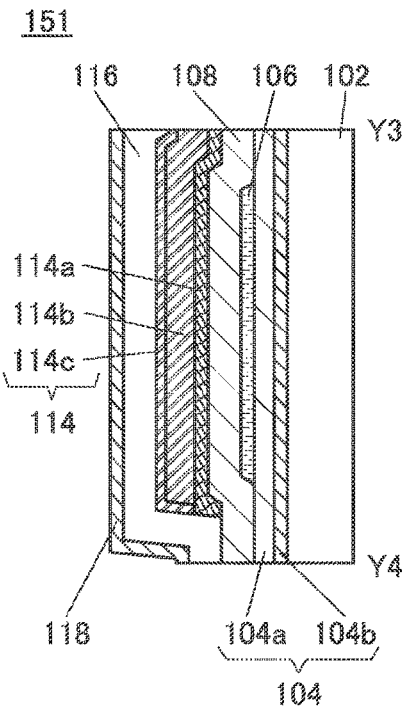
Figure 3C:
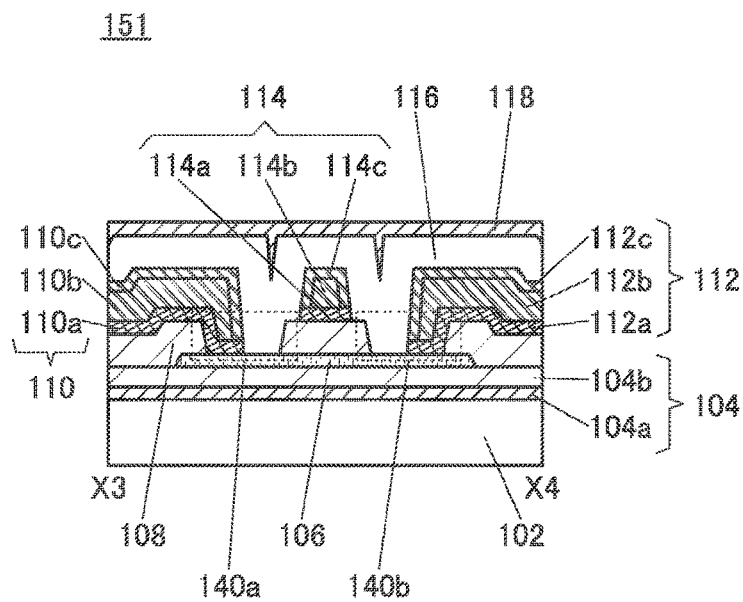

FIGS. 3A to 3C are a top view and cross-sectional views of the transistor 151 included in a semiconductor device. FIG. 3A is a top view of the transistor 151. FIG. 3B is a cross-sectional view along the dashed-dotted line Y3-Y4 in FIG. 3A. FIG. 3C is a cross-sectional view along the dashed-dotted line X3-X4 in FIG. 3A.

The transistor 151 shown in FIGS. 3A to 3C is characterized in that the conductive film 110, the conductive film 112, and the conductive film 114 each have a three-layer structure and in that the insulating film 104 has a stacked-layer structure of a nitride insulating film 104a and an oxide insulating film 104b. The other components are the same as those of the transistor 150, and the effect similar to that in the case of the transistor 150 is obtained.

First, the conductive film 110, the conductive film 112, and the conductive film 114 are described.

In the conductive film 110, a conductive film 110a, a conductive film 110b, and a conductive film 110c are stacked in this order, and the conductive film 110a and the conductive film 110c cover surfaces of the conductive film 110b. That is, the conductive film 110a and the conductive film 110c serve as protective films of the conductive film 110b.

In the conductive film 112, a conductive film 112a, a conductive film 112b, and a conductive film 112c are stacked in this order, and the conductive film 112a and the conductive film 112c cover surfaces of the conductive film 112b, in a manner similar to that of the conductive film 110.

In the conductive film 114, a conductive film 114a, a conductive film 114b, and a conductive film 114c are stacked in this order, and the conductive film 114a and the conductive film 114c cover surfaces of the conductive film 114b, in a manner similar to that of the conductive film 110.

The conductive film 110a, the conductive film 112a, and the conductive film 114a are formed using a material which prevents the metal element contained in the conductive film 110b, the conductive film 112b, and the conductive film 114b from being diffused into the oxide semiconductor film 106. The conductive film 110a, the conductive film 112a, and the conductive film 114a can be formed using titanium, tantalum, molybdenum, tungsten, an alloy of any of these, titanium nitride, tantalum nitride, molybdenum nitride, tantalum nitride, or the like. Alternatively, the conductive film 110a, the conductive film 112a, and the conductive film 114a can be formed using a Cu—X alloy (X is Mn, Ni, Cr, Fe, Co, Mo, Ta, or Ti) or the like.

In the case of using Cu—X alloy (X is Mn, Ni, Cr, Fe, Co, Mo, Ta, or Ti), a covering film is formed in a region in contact with the oxide semiconductor film or a region in contact with an insulating film by heat treatment, in some cases. The covering film includes a compound containing X. Examples of compound containing X include an oxide of X, an In—X oxide, a Ga—X oxide, an In—Ga—X oxide, and In—Ga—Zn—X oxide. When the covering film is formed over surfaces of the conductive film 110a, the conductive film 112a, and the conductive film 114a, the covering film functions as a blocking film, and Cu in the Cu—X alloy film can be prevented from entering the oxide semiconductor film.

Note that when the concentration of copper in a region serving as a channel in the oxide semiconductor film 106 is lower than or equal to $1 \times 10^{18}$ atoms/cm$^3$, electron trap state density at the interface between the oxide semiconductor film 106 and the insulating film 108 serving as a gate insulating film can be reduced. As a result, a transistor having an excellent subthreshold swing (S value) can be manufactured.

The conductive film 110b, the conductive film 112b, and the conductive film 114b are formed using a low-resistance material. The conductive film 110b, the conductive film 112b, and the conductive film 114b can be formed using copper, aluminum, gold, silver, or the like, an alloy containing any of these, a compound containing any of these as a main component, or the like.

By forming the conductive film 110c, the conductive film 112c, and the conductive film 114c using a film in which the metal element contained in the conductive film 110b, the conductive film 112b, and the conductive film 114b is subjected to passivation, the metal element contained in the conductive film 110b, the conductive film 112b, and the conductive film 114b can be prevented from moving to the oxide semiconductor film 106 in a step of forming the insulating film 116. The conductive film 110c, the conductive film 112c, and the conductive film 114c can be formed using metal silicide, metal silicide-nitride, or the like; $CuSi_x$ (x>0), $CuSi_xN_y$ (x>0, y>0), and the like are typical examples thereof.

Here, a method for forming the conductive film 110c, the conductive film 112c, and the conductive film 114c is described. Note that the conductive film 110b, the conductive film 112b, and the conductive film 114b are formed using copper. The conductive film 110c, the conductive film 112c, and the conductive film 114c are formed using $CuSi_xN_y$ (x>0, y>0).

The conductive film 110b, the conductive film 112b, and the conductive film 114b are exposed to plasma generated in a reducing atmosphere of hydrogen, ammonia, carbon monoxide, or the like to reduce oxide on surfaces of the conductive film 110b, the conductive film 112b, and the conductive film 114b.

Next, the conductive film 110b, the conductive film 112b, and the conductive film 114b are exposed to silane while heating is performed at a temperature higher than or equal to 200° C. and lower than or equal to 400° C. Thus, copper contained in the conductive film 110b, the conductive film 112b, and the conductive film 114b acts as a catalyst, and the silane is decomposed into Si and $H_2$, and $CuSi_x$ (x>0) is formed on the surfaces of the conductive film 110b, the conductive film 112b, and the conductive film 114b.

Next, the conductive film 110b, the conductive film 112b, and the conductive film 114b are exposed to plasma generated in an atmosphere containing nitrogen, such as an atmosphere of ammonia or nitrogen, so that $CuSi_x$ (x>0) formed on the surfaces of the conductive film 110b, the conductive film 112b, and the conductive film 114b reacts with nitrogen contained in the plasma. In this manner, $CuSi_xN_y$ (x>0, y>0) is formed as the conductive film 110c, the conductive film 112c, and the conductive film 114c.

Note that in the above-described step, after the conductive film 110b, the conductive film 112b, and the conductive film 114b are exposed to plasma generated in an atmosphere containing nitrogen, such as an atmosphere of ammonia or nitrogen, the conductive film 110b, the conductive film 112b, and the conductive film 114b are exposed to silane while heating is performed at a temperature higher than or equal to 200° C. and lower than or equal to 400° C., whereby $CuSi_xN_y$ (x>0, y>0) may be formed as the conductive film 110c, the conductive film 112c, and the conductive film 114c.

Next, the insulating film 104 in which the nitride insulating film 104a and the oxide insulating film 104b are stacked is described.

For example, the nitride insulating film 104a can be formed using a silicon nitride film, a silicon nitride oxide film, an aluminum nitride film, an aluminum nitride oxide film, or the like. The oxide insulating film 104b can be formed using a silicon oxide film, a silicon oxynitride film, an aluminum oxide film, or the like. Providing the nitride insulating film 104a on the substrate 102 side can prevent hydrogen, water, and the like from the outside from being diffused into the oxide semiconductor film 106.

<Structure 3 of Semiconductor Device>

Next, another structure of the semiconductor device is described with reference to FIGS. 4A to 4C, FIGS. 5A to 5C, and FIGS. 11A and 11B. Here, description is made using a transistor 152 and a transistor 153 as modification examples of the transistor 150 included in the pixel portion. The structure of the oxide semiconductor film 106 included in the transistor 152 or the structure of the oxide semiconductor film 106 included in the transistor 153 can be used for the transistor 154 in the driver circuit portion as appropriate.

Figure 4A:
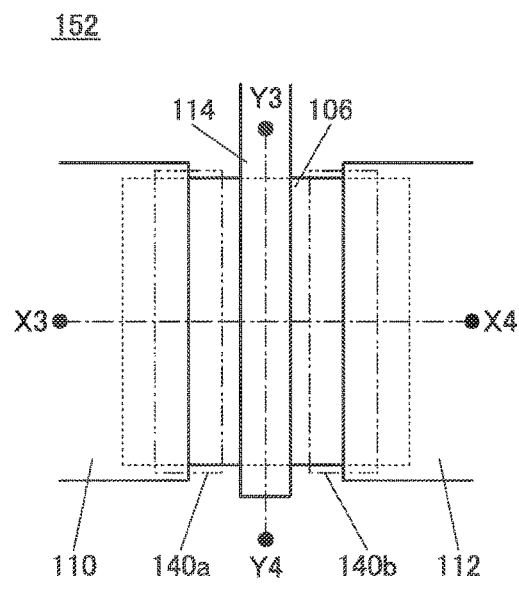
FIGS. 4A to 4C are a top view and cross-sectional views which illustrate one embodiment of a semiconductor device.
Figure 4B:
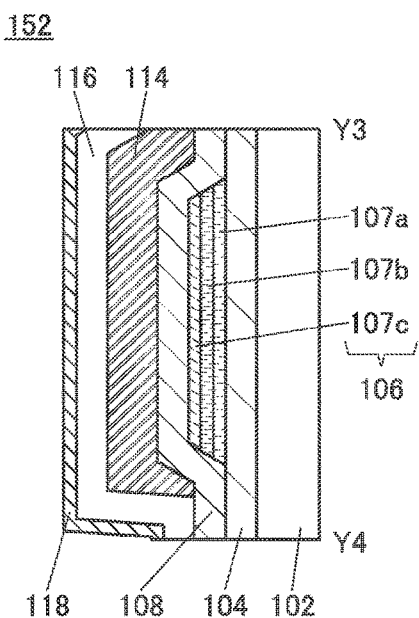
Figure 4C:
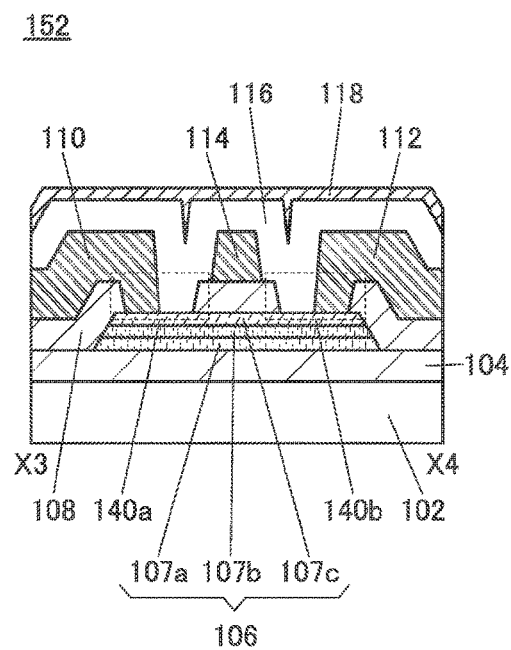

FIGS. 4A to 4C are a top view and cross-sectional views of the transistor 152 included in a semiconductor device. FIG. 4A is a top view of the transistor 152. FIG. 4B is a cross-sectional view along the dashed-dotted line Y3-Y4 in FIG. 4A. FIG. 4C is a cross-sectional view along the dashed-dotted line X3-X4 in FIG. 4A.

The transistor 152 shown in FIGS. 4A to 4C is characterized in that the oxide semiconductor film 106 has a multilayer structure. Specifically, the oxide semiconductor film 106 includes an oxide semiconductor film 107a in contact with the insulating film 104, an oxide semiconductor film 107b in contact with the oxide semiconductor film 107a, and an oxide semiconductor film 107c in contact with the oxide semiconductor film 107b, the conductive film 110, the conductive film 112, the insulating film 108, and the insulating film 116. The other components are the same as those of the transistor 150 and the effect similar to that in the case of the transistor 150 is obtained.

The oxide semiconductor film 107a, the oxide semiconductor film 107b, and the oxide semiconductor film 107c are typically formed using a metal oxide film such as an In—Ga oxide film, an In—Zn oxide film, or an In-M-Zn oxide film (M is Mg, Al, Ti, Ga, Zr, La, Ce, Nd, or Hf).

The oxide semiconductor film 107a and the oxide semiconductor film 107c are typically each an In—Ga oxide film, an In—Zn oxide film, an In—Mg oxide film, a Zn—Mg oxide film, or an In-M-Zn oxide film (M is Mg, Al, Ti, Ga, Y, Zr, La, Ce, Nd, or Hf), and has the energy at the bottom of the conduction band closer to a vacuum level than that of the oxide semiconductor film 107b. Typically, a difference between the energy at the bottom of the conduction band of the oxide semiconductor film 107b and the energy at the bottom of the conduction band of each of the oxide semiconductor film 107a and the oxide semiconductor film 107c is greater than or equal to 0.05 eV, greater than or equal to 0.07 eV, greater than or equal to 0.1 eV, or greater than or equal to 0.2 eV and also less than or equal to 2 eV, less than or equal to 1 eV, less than or equal to 0.5 eV, or less than or equal to 0.4 eV. Note that the difference between the vacuum level and the energy at the bottom of the conduction band is referred to as electron affinity.

In the case where the oxide semiconductor film 107b is an In-M-Zn oxide film (M is Mg, Al, Ti, Ga, Y, Zr, La, Ce, Nd, or Hf) and a target having the atomic ratio of metal elements of In:M:Zn=$x_1$:$y_1$:$z_1$ is used for forming the oxide semiconductor film 107b, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS film as the oxide semiconductor film 107b is easily formed. Typical examples of the atomic ratio of metal elements of such a sputtering target are In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, and the like.

In the case where the oxide semiconductor film 107a and the oxide semiconductor film 107c are each an In-M-Zn oxide film (M is Mg, Al, Ti, Ga, Y, Zr, La, Ce, Nd, or Hf) and a target having the atomic ratio of metal elements of In:M:Zn=$x_2$:$y_2$:$z_2$ is used for forming the oxide semiconductor film 107a and the oxide semiconductor film 107c, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, CAAC-OS films are easily formed as the oxide semiconductor film 107a and the oxide semiconductor film 107c. Typical examples of the atomic ratio of metal elements of such a sputtering target are In:M:Zn=1:3:2, In:M:Zn=1:3:4, In:M:Zn=1:3:6, In:M:Zn=1:3:8, In:M:Zn=1:4:3, In:M:Zn=1:4:4, In:M:Zn=1:4:5, In:M:Zn=1:4:6, In:M:Zn=1:6:3, In:M:Zn=1:6:4, In:M:Zn=1:6:5, In:M:Zn=1:6:6, In:M:Zn=1:6:7, In:M:Zn=1:6:8, In:M:Zn=1:6:9, and the like.

In the case where the oxide semiconductor film 107a and the oxide semiconductor film 107c are each an In—Ga oxide film, the oxide semiconductor film 107a and the oxide semiconductor film 107c can be formed by a sputtering method using an In—Ga metal oxide target (In:Ga=7:93), for example. To deposit the In—Ga oxide film by a sputtering method using DC discharge to form the oxide semiconductor film 107a and the oxide semiconductor film 107c, when an atomic ratio of In:Ga is x:y, it is preferable that y/(x+y) be less than or equal to 0.96, further preferably less than or equal to 0.95, for example, 0.93.

Note that the atomic ratio of metal elements in each of the oxide semiconductor film 107a, the oxide semiconductor film 107b, and the oxide semiconductor film 107c varies within a range of ±40% of that in the above atomic ratio as an error.

The atomic ratio is not limited to the above, and the atomic ratio may be appropriately set in accordance with needed semiconductor characteristics.

The oxide semiconductor film 107a and the oxide semiconductor film 107c may have the same composition. For example, as the oxide semiconductor film 107a and the oxide semiconductor film 107c, an In—Ga—Zn oxide in which the atomic ratio of In to Ga and Zn is 1:3:2, 1:3:4, 1:4:5, 1:4:6, 1:4:7, or 1:4:8 may be used.

Alternatively, the oxide semiconductor film 107a and the oxide semiconductor film 107c may have different compositions. For example, an In—Ga—Zn oxide film in which the atomic ratio of In to Ga and Zn is 1:3:2 may be used as the oxide semiconductor film 107a, whereas an In—Ga—Zn oxide film in which the atomic ratio of In to Ga and Zn is 1:3:4 or 1:4:5 may be used as the oxide semiconductor film 107c.

The thickness of each of the oxide semiconductor film 107a and the oxide semiconductor film 107c is greater than or equal to 3 nm and less than or equal to 100 nm, or greater than or equal to 3 nm and less than or equal to 50 nm. The thickness of the oxide semiconductor film 107b is greater than or equal to 3 nm and less than or equal to 200 nm, greater than or equal to 3 nm and less than or equal to 100 nm, or greater than or equal to 3 nm and less than or equal to 50 nm. Note that when the thickness of each of the oxide semiconductor film 107a and the oxide semiconductor film 107c is smaller than the thickness of the oxide semiconductor film 107b, the amount of change in the threshold voltage of the transistor can be reduced.

The interfaces with the oxide semiconductor film 107a, the oxide semiconductor film 107b, and the oxide semiconductor film 107c can be observed by scanning transmission electron microscopy (STEM) in some cases.

The crystal structure of the oxide semiconductor film 106 described in Embodiment 1 can be used for the oxide semiconductor film 107a, the oxide semiconductor film 107b, and the oxide semiconductor film 107c as appropriate.

The oxide semiconductor film 107a and the oxide semiconductor film 107c in each of which oxygen vacancies are less likely to be generated than in the oxide semiconductor film 107b are provided in contact with an upper surface and a lower surface of the oxide semiconductor film 107b, whereby oxygen vacancies in the oxide semiconductor film 107b can be reduced. Furthermore, because the oxide semiconductor film 107b is in contact with the oxide semiconductor film 107a and the oxide semiconductor film 107c that contain one or more metal elements forming the oxide semiconductor film 107b, the densities of interface levels at the interface between the oxide semiconductor film 107a and the oxide semiconductor film 107b and at the interface between the oxide semiconductor film 107b and the oxide semiconductor film 107c are extremely low. Accordingly, oxygen vacancies in the oxide semiconductor film 107b can be reduced.

Here, in the case where the oxide semiconductor film 107b is in contact with an insulating film containing a different constituent element (e.g., an insulating film containing a silicon oxide film), an interface state is sometimes formed at the interface between the two films and the interface state forms a channel. At this time, another transistor having a different threshold voltage appears, so that an apparent threshold voltage of the transistor is varied. However, because the oxide semiconductor film 107a containing one or more kinds of metal elements forming the oxide semiconductor film 107b is in contact with the oxide semiconductor film 107b, an interface state is unlikely to be formed at the interface between the oxide semiconductor film 107a and the oxide semiconductor film 107b. Thus, providing the oxide semiconductor film 107a makes it possible to reduce fluctuation in the electrical characteristics of the transistor, such as threshold voltage.

In the case where a channel is formed at the interface between the insulating film 108 and the oxide semiconductor film 107b, interface scattering occurs at the interface, so that the field-effect mobility of a transistor is reduced. However, because the oxide semiconductor film 107c containing one or more kinds of metal elements forming the oxide semiconductor film 107b is provided in contact with the oxide semiconductor film 107b, scattering of carriers does not easily occur at the interface between the oxide semiconductor film 107b and the oxide semiconductor film 107c, and thus the field-effect mobility of the transistor can be increased.

Furthermore, the oxide semiconductor film 107a and the oxide semiconductor film 107c each also serve as a barrier film which suppresses formation of an impurity state in the oxide semiconductor film 107 due to the entry of the constituent element of the insulating films 104 and 108 or the constituent element of the conductive films 110 and 112 into the oxide semiconductor film 107b.

For example, in the case of using an insulating film containing silicon or an insulating film containing carbon as the insulating film 104 and the insulating film 108, silicon in the insulating film 104 and the insulating film 108 or carbon mixed in the insulating film 104 and the insulating film 108 enters the oxide semiconductor film 107a and the oxide semiconductor film 107c to a depth of about several nanometers from the interfaces in some cases. An impurity such as silicon or carbon entering the oxide semiconductor film 107b forms impurity levels. The impurity levels serve as a donor and generate an electron, so that the oxide semiconductor film 107b may become n-type.

However, when the thickness of each of the oxide semiconductor film 107a and the oxide semiconductor film 107c is larger than several nanometers, the impurity such as silicon or carbon does not reach the oxide semiconductor film 107b, so that the influence of impurity levels is suppressed.

From the above, variation in the electrical characteristics such as threshold voltage is reduced in the transistor described in this embodiment.

FIGS. 5A to 5C show a transistor having a structure different from that shown in FIGS. 4A to 4C.

FIGS. 5A to 5C are a top view and cross-sectional views of a transistor 153 included in a semiconductor device. FIG. 5A is a top view of the transistor 153, FIG. 5B is a cross-sectional view along the dashed-dotted line Y3-Y4 in FIG. 5A, and FIG. 5C is a cross-sectional view along the dashed-dotted line X3-X4 in FIG. 5A.

As in the transistor 153 shown in FIGS. 5A to 5C, the oxide semiconductor film 106 may have a stacked-layer structure including the oxide semiconductor film 107b in contact with the insulating film 104 and the oxide semiconductor film 107c in contact with the oxide semiconductor film 107b and the insulating film 108. The other components are the same as those of the transistor 150 and the effect similar to that in the case of the transistor 150 is obtained.

<Band Structure>

Figure 11A:
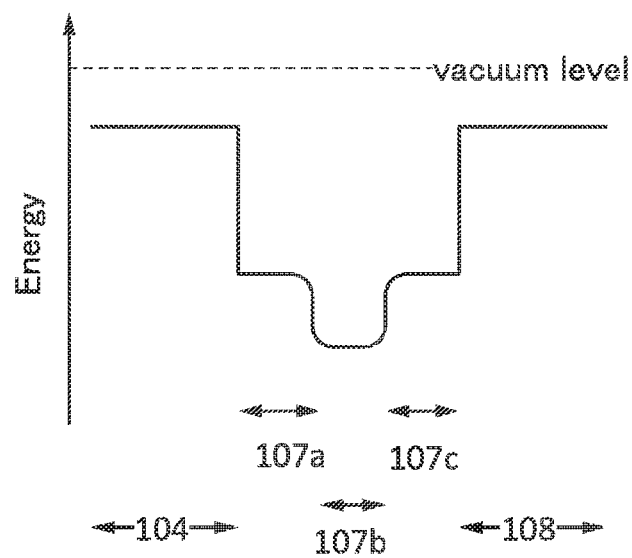
FIGS. 11A and 11B each show one embodiment of a band structure.
Figure 11B:
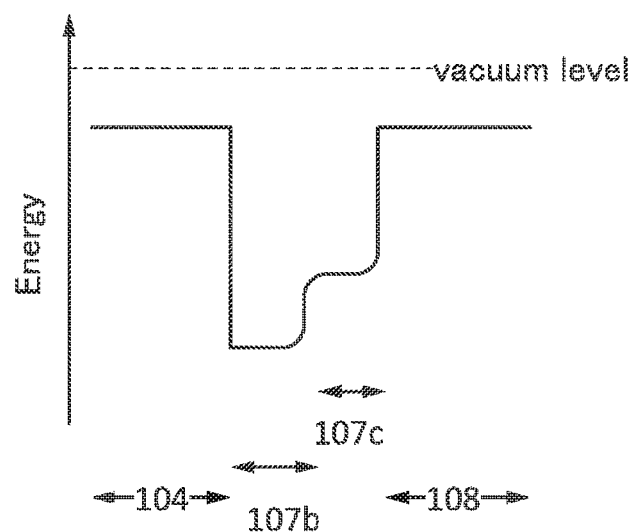

Here, band structures of the transistors shown in FIGS. 4A to 4C and FIGS. 5A to 5C are described. Note that FIG. 11A is a band structure of the transistor 153 shown in FIGS. 4A to 4C; for easy understanding, energy (Ec) of the bottom of the conduction band of each of the insulating film 104, the oxide semiconductor film 107a, the oxide semiconductor film 107b, the oxide semiconductor film 107c, and the insulating film 108 is shown. FIG. 11B is a band structure of the transistor 154 shown in FIGS. 5A to 5C; for easy understanding, energy (Ec) of the bottom of the conduction band of each of the insulating film 104, the oxide semiconductor film 107b, the oxide semiconductor film 107c, and the insulating film 108 is shown.

As illustrated in FIG. 11A, the energy at the bottom of the conduction band changes continuously in the oxide semiconductor film 107a, the oxide semiconductor film 107b, and the oxide semiconductor film 107c. This can be understood also from the fact that the constituent elements are common among the oxide semiconductor film 107a, the oxide semiconductor film 107b, and the oxide semiconductor film 107c and oxygen easily diffuses among the oxide semiconductor film 107a, the oxide semiconductor film 107b, and the oxide semiconductor film 107c. Thus, the oxide semiconductor film 107a, the oxide semiconductor film 107b, and the oxide semiconductor film 107c have a continuous physical property although they are a stack of films having different compositions.

The oxide semiconductor films that are stacked and contain the same main components have not only a simple stacked-layer structure of the layers but also a continuous energy band (here, in particular, a well structure having a U shape in which the bottom of the conduction band continuously varies among the layers (U-shape well)). That is, a stacked-layer structure is formed so that impurities that cause defect levels such as a trap center or a recombination center for the oxide semiconductor or impurities that inhibit carrier flow do not exist at the interfaces between the layers. If impurities are mixed between the stacked oxide semiconductor films, the continuity of the energy band is lost and carriers disappear by a trap or recombination.

Note that FIG. 11A illustrates the case where the Ec of the oxide semiconductor film 107a and the Ec of the oxide semiconductor film 107c are equal to each other; however, they may be different from each other.

As illustrated in FIG. 11A, the oxide semiconductor film 107b serves as a well and a channel of the transistor 152 is formed in the oxide semiconductor film 107b. Note that because the energy at the bottom of the conduction band of the oxide semiconductor films 107a, 107b, and 107c changes continuously, a channel having a U-shaped well structure can also be referred to as a buried channel.

As illustrated in FIG. 11B, the energy at the bottom of the conduction band may change continuously in the oxide semiconductor film 107b and the oxide semiconductor film 107c.

As illustrated in FIG. 11B, the oxide semiconductor film 107b serves as a well and a channel of the transistor 153 is formed in the oxide semiconductor film 107b.

In the transistor 152 shown in FIGS. 4A to 4C, the oxide semiconductor film 107a and the oxide semiconductor film 107c contain one or more kinds of metal elements that form the oxide semiconductor film 107b. Therefore, an interface state is not easily formed at the interface between the oxide semiconductor film 107a and the oxide semiconductor film 107b and at the interface between the oxide semiconductor film 107c and the oxide semiconductor film 107b. Thus, providing the oxide semiconductor film 107a and the oxide semiconductor film 107c makes it possible to reduce variations or changes in electrical characteristics of the transistor, such as threshold voltage.

In the transistor 153 shown in FIGS. 5A to 5C, the oxide semiconductor film 107c contain one or more kinds of metal elements that form the oxide semiconductor film 107b. Therefore, an interface state is not easily formed at the interface between the oxide semiconductor film 107c and the oxide semiconductor film 107b. Thus, providing the oxide semiconductor film 107c makes it possible to reduce variations or changes in electrical characteristics of the transistor, such as threshold voltage.

<Method 1 for Manufacturing Semiconductor Device>

Next, a method for manufacturing the transistor 150 and the transistor 154 illustrated in FIGS. 1A and 1B will be described with reference to FIGS. 7A to 7D, FIGS. 8A to 8C, and FIGS. 9A to 9C.

The films included in the transistor 150 and the transistor 154 (i.e., the insulating film, the oxide semiconductor film, the conductive film, and the like) can be formed by any of a sputtering method, a chemical vapor deposition (CVD) method, a vacuum evaporation method, and a pulsed laser deposition (PLD) method. Alternatively, a coating method or a printing method can be used. Although the sputtering method and a plasma-enhanced chemical vapor deposition (PECVD) method are typical examples of the film formation method, a thermal CVD method may be used. As the thermal CVD method, a metal organic chemical vapor deposition (MOCVD) method or an atomic layer deposition (ALD) method may be used, for example.

Deposition by a thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, the thermal CVD method has an advantage that no defect due to plasma damage is caused.

Deposition by the ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first source gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

Figure 7A:
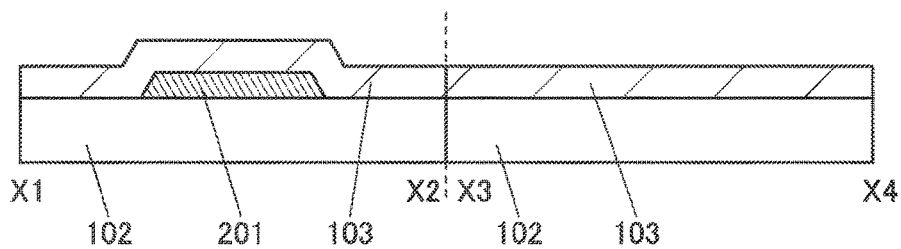
FIGS. 7A to 7D are cross-sectional views illustrating one embodiment of a manufacturing process of a semiconductor device.
Figure 7B:
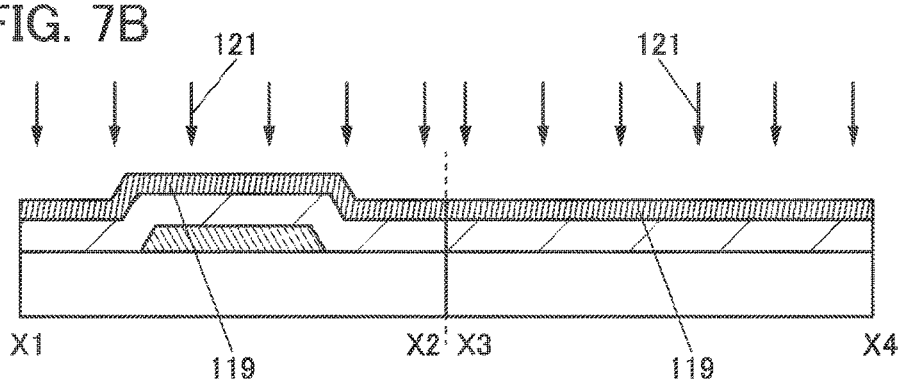
Figure 7C:
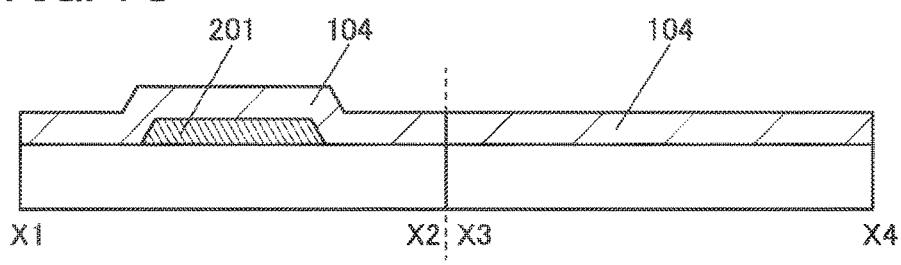

As shown in FIG. 7C, the conductive film 201 is formed over the substrate 102, and the insulating film 104 is formed over the conductive film 201.

The conductive film 201 is formed as follows: a conductive film is formed by a sputtering method, a vacuum evaporation method, a pulsed laser deposition (PLD) method, a thermal CVD method, or the like, a mask is formed over the conductive film by a lithography process, and then etching treatment is performed.

Alternatively, a tungsten film can be formed for the conductive film 201 with a deposition apparatus employing ALD. In that case, a $WF_6$ gas and a $B_2H_6$ gas are sequentially introduced more than once to form an initial tungsten film, and then a $WF_6$ gas and an $H_2$ gas are introduced at a time, so that a tungsten film is formed. Note that an $SiH_4$ gas may be used instead of a $B_2H_6$ gas.

Note that the conductive film 201 may be formed by an electrolytic plating method, a printing method, an inkjet method, or the like instead of the above formation method.

The insulating film 104 can be formed by a sputtering method, a CVD method, an evaporation method, a pulsed laser deposition (PLD) method, a printing method, a coating method, or the like, as appropriate. The insulating film 104 can be formed in such a manner that, after an insulating film is formed over the substrate 102, oxygen is added to the insulating film to form the insulating film 104. Examples of the oxygen that is added to the insulating film include an oxygen radical, an oxygen atom, an oxygen atomic ion, an oxygen molecular ion, and the like. As a method for adding the oxygen, an ion doping method, an ion implantation method, plasma treatment, or the like can be given. Alternatively, after a film which suppresses release of oxygen is formed over the insulating film, oxygen may be added to the insulating film through the film.

As the insulating film 104, a silicon oxide film or a silicon oxynitride film from which oxygen can be released by heat treatment can be formed under the following conditions: the substrate placed in a treatment chamber of the plasma CVD apparatus that is vacuum-evacuated is held at a temperature higher than or equal to 180° C. and lower than or equal to 280° C., or higher than or equal to 200° C. and lower than or equal to 240° C., the pressure is greater than or equal to 100 Pa and less than or equal to 250 Pa, or greater than or equal to 100 Pa and less than or equal to 200 Pa with introduction of a source gas into the treatment chamber, and a high-frequency power of greater than or equal to 0.17 W/cm$^2$ and less than or equal to 0.5 W/cm$^2$, or greater than or equal to 0.25 W/cm$^2$ and less than or equal to 0.35 W/cm$^2$ is supplied to an electrode provided in the treatment chamber.

Here, a method in which a film which suppresses release of oxygen is formed over the insulating film and then oxygen is added to the insulating film through the film is described with reference to FIGS. 7A and 7B.

As shown in FIG. 7A, an insulating film 103 is formed over the substrate 102 and the conductive film 201.

Next, as shown in FIG. 7B, a film 119 which suppresses release of oxygen is formed over the insulating film 103. Next, oxygen 121 is added to the insulating film 103 through the film 119.

The film 119 which suppresses release of oxygen is formed using any of the following conductive materials: a metal element selected from aluminum, chromium, tantalum, titanium, molybdenum, nickel, iron, cobalt, and tungsten; an alloy containing the above-described metal element as a component; an alloy containing any of the above-described metal elements in combination; a metal nitride containing the above-described metal element; a metal oxide containing the above-described metal element; a metal nitride oxide containing the above-described metal element; and the like.

The thickness of the film 119 which suppresses release of oxygen can be greater than or equal to 1 nm and less than or equal to 20 nm, or greater than or equal to 2 nm and less than or equal to 10 nm.

As a method for adding the oxygen 121 to the insulating film 103 through the film 119, an ion doping method, an ion implantation method, plasma treatment, or the like is given. By adding oxygen to the insulating film 103 with the film 119 provided over the insulating film 103, the film 119 serves as a protective film which suppresses release of oxygen from the insulating film 103. Thus, a larger amount of oxygen can be added to the insulating film 103.

In the case where oxygen is added by plasma treatment, by making oxygen excited by a microwave to generate high density oxygen plasma, the amount of oxygen added to the oxide insulating film 103 can be increased.

After that, the film 119 is removed; consequently, the insulating film 104 to which oxygen is added can be formed over the substrate 102 as shown in FIG. 7C. Note that the treatment for adding oxygen which is shown in FIGS. 7A and 7B is not necessarily performed in the case where the insulating film 104 to which a sufficient amount of oxygen is added can be formed after deposition.

Figure 7D:
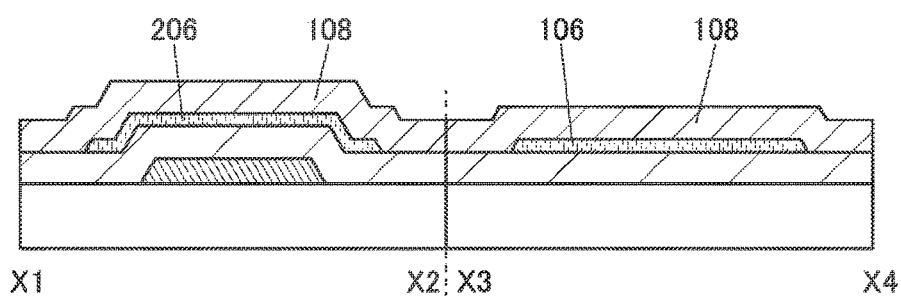

Next, as shown in FIG. 7D, the oxide semiconductor film 106 and the oxide semiconductor film 206 are formed over the insulating film 104. Next, the insulating film 108 is formed over the insulating film 104, the oxide semiconductor film 106, and the oxide semiconductor film 206.

Methods for forming the oxide semiconductor film 106 and the oxide semiconductor film 206 are described below. An oxide semiconductor film is formed over the insulating film 104 by a sputtering method, a coating method, a pulsed laser deposition method, a laser ablation method, a thermal CVD method, or the like. Next, oxygen contained in the insulating film 104 is transferred to the oxide semiconductor film by heat treatment. Then, after a mask is formed over the oxide semiconductor film by a lithography process, the oxide semiconductor film is partly etched using the mask. Thus, the oxide semiconductor film 106 and the oxide semiconductor film 206 can be formed as illustrated in FIG. 7D. After that, the mask is removed. Note that heat treatment may be performed after the oxide semiconductor film 106 is formed by etching part of the oxide semiconductor film.

Alternatively, by using a printing method for forming the oxide semiconductor film 106 and the oxide semiconductor film 206, the oxide semiconductor film 106 and the oxide semiconductor film 206 subjected to element isolation can be formed directly.

As a power supply device for generating plasma in the case of forming the oxide semiconductor film by a sputtering method, an RF power supply device, an AC power supply device, a DC power supply device, or the like can be used as appropriate. Note that a CAAC-OS film can be formed using an AC power supply device or a DC power supply device. In forming the oxide semiconductor film, a sputtering method using an AC power supply device or a DC power supply device is preferable to a sputtering method using an RF power supply device because the oxide semiconductor film can be uniform in film thickness, film composition, or crystallinity.

As a sputtering gas, a rare gas (typically argon), an oxygen gas, or a mixed gas of a rare gas and oxygen is used as appropriate. In the case of using the mixed gas of a rare gas and oxygen, the proportion of oxygen to a rare gas is preferably increased.

Furthermore, a target may be appropriately selected in accordance with the composition of the oxide semiconductor film to be formed.

For example, in the case where the oxide semiconductor film is formed by a sputtering method at a substrate temperature higher than or equal to 150° C. and lower than or equal to 750° C., higher than or equal to 150° C. and lower than or equal to 450° C., or higher than or equal to 200° C. and lower than or equal to 350° C., a CAAC-OS film can be formed. In the case where the substrate temperature is higher than or equal to 25° C. and lower than 150° C., a microcrystalline oxide semiconductor film can be formed.

For the deposition of the CAAC-OS film to be described later, the following conditions are preferably used.

By suppressing entry of impurities during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, or −100° C. or lower is used.

Furthermore, it is preferable that the proportion of oxygen in the deposition gas be increased and the power be optimized in order to reduce plasma damage at the deposition. The proportion of oxygen in the deposition gas is 30 vol. % or higher, or 100 vol. %.

Furthermore, after the oxide semiconductor film is formed, heat treatment may be performed so that the oxide semiconductor film is subjected to dehydrogenation or dehydration. The heat treatment is performed typically at a temperature higher than or equal to 150° C. and lower than the strain point of the substrate, higher than or equal to 250° C. and lower than or equal to 450° C., or higher than or equal to 300° C. and lower than or equal to 450° C.

The heat treatment is performed under an inert gas atmosphere containing nitrogen or a rare gas such as helium, neon, argon, xenon, or krypton. Alternatively, the heat treatment may be performed under an inert gas atmosphere first, and then under an oxygen atmosphere. It is preferable that the above inert gas atmosphere and the above oxygen atmosphere do not contain hydrogen, water, and the like. The treatment time is from 3 minutes to 24 hours.

An electric furnace, an RTA apparatus, or the like can be used for the heat treatment. With the use of an RTA apparatus, the heat treatment can be performed at a temperature of higher than or equal to the strain point of the substrate if the heating time is short. Therefore, the heat treatment time can be shortened.

By forming the oxide semiconductor film while it is heated or performing heat treatment after the formation of the oxide semiconductor film, the hydrogen concentration in the oxide semiconductor film which is measured by SIMS can be $5\times10^{19}$ atoms/cm$^3$ or lower, $1\times10^{19}$ atoms/cm$^3$ or lower, $5\times10^{18}$ atoms/cm$^3$ or lower, $1\times10^{18}$ atoms/cm$^3$ or lower, $5\times10^{17}$ atoms/cm$^3$ or lower, or $1\times10^{16}$ atoms/cm$^3$ or lower.

For example, in the case where an oxide semiconductor film, e.g., an In—Ga—Zn—O film is formed using a deposition apparatus employing ALD, an $In(CH_3)_3$ gas and an $O_3$ gas are sequentially introduced plural times to form an In—O layer, a $Ga(CH_3)_3$ gas and an $O_3$ gas are introduced at a time to form a Ga—O layer, and then a $Zn(CH_3)_2$ gas and an $O_3$ gas are introduced at a time to form a Zn—O layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Instead of an $In(CH_3)_3$ gas, an $In(C_2H_5)_3$ may be used. Instead of a $Ga(CH_3)_3$ gas, a $Ga(C_2H_5)_3$ gas may be used. Furthermore, a $Zn(CH_3)_2$ gas may be used.

Here, an oxide semiconductor film having a thickness of 35 nm is formed by a sputtering method, and then, heat treatment is performed so that oxygen contained in the insulating film 104 is moved to the oxide semiconductor film. Next, a mask is formed over the oxide semiconductor film, and part of the oxide semiconductor film is selectively etched. In this manner, the oxide semiconductor film 106 and the oxide semiconductor film 206 are formed.

When the heat treatment is performed at a temperature higher than 350° C. and lower than or equal to 650° C., or higher than or equal to 450° C. and lower than or equal to 600° C., it is possible to obtain an oxide semiconductor film whose proportion of CAAC is greater than or equal to 60% and less than 100%, greater than or equal to 80% and less than 100%, greater than or equal to 90% and less than 100%, or greater than or equal to 95% and less than or equal to 98%. Note that the proportion of CAAC refers to the proportion of a region where a diffraction pattern of a CAAC-OS film is observed in a predetermined area by measuring a transmission electron diffraction pattern using a transmission electron diffraction measurement apparatus. Furthermore, it is possible to obtain an oxide semiconductor film having a low content of hydrogen, water, and the like. That is, an oxide semiconductor film with a low impurity concentration and a low density of defect states can be formed.

The insulating film 108 can be formed by the formation method of the insulating film 104 as appropriate.

In the case where a conductive film 109 is formed using, for example, a low-resistance material, entry of the low-resistance material into the oxide semiconductor film leads to poor electrical characteristics of the transistor. In this embodiment, the insulating film 108 is formed before the conductive film 109 is formed; thus, a channel in each of the oxide semiconductor film 106 and the oxide semiconductor film 206 is not in contact with the conductive film 109. Therefore, the variation in the electrical characteristics, typically threshold voltage, of the transistor can be suppressed.

As the insulating film 108, a silicon oxide film or a silicon oxynitride film can be formed by a CVD method. In this case, a deposition gas containing silicon and an oxidizing gas are preferably used as a source gas. Typical examples of the deposition gas containing silicon include silane, disilane, trisilane, and silane fluoride. As the oxidizing gas, oxygen, ozone, dinitrogen monoxide, and nitrogen dioxide can be given as examples.

A silicon oxynitride film with few defects can be formed as the insulating film 108 by a CVD method under the conditions where the ratio of an oxidizing gas to a deposition gas is higher than 20 times and lower than 100 times, or higher than or equal to 40 times and lower than or equal to 80 times and the pressure in a treatment chamber is lower than 100 Pa, or lower than or equal to 50 Pa.

A silicon oxide film or a silicon oxynitride film which is dense can be formed as the insulating film 108 under the following conditions: the substrate placed in a treatment chamber of a plasma CVD apparatus that is vacuum-evacuated is held at a temperature higher than or equal to 280° C. and lower than or equal to 400° C., the pressure in the treatment chamber is greater than or equal to 20 Pa and less than or equal to 250 Pa, preferably greater than or equal to 100 Pa and less than or equal to 250 Pa with introduction of a source gas into the treatment chamber, and a high-frequency power is supplied to an electrode provided in the treatment chamber.

The insulating film 108 can be formed by a plasma CVD method using a microwave. The microwave refers to a wave in the frequency range of 300 MHz to 300 GHz. In a microwave, electron temperature is low and electron energy is low. Furthermore, in supplied power, the proportion of power used for acceleration of electrons is low, and therefore, power can be used for dissociation and ionization of more molecules. Thus, plasma with high density (high-density plasma) can be excited. Therefore, the oxide semiconductor film 106, the oxide semiconductor film 206, the insulating film 104, and a deposit are less damaged by plasma, and the insulating film 108 with few defects can be formed.

Alternatively, the insulating film 108 can be formed by a CVD method using an organosilane gas. As the organosilane gas, any of the following silicon-containing compound can be used: tetraethyl orthosilicate (TEOS) (chemical formula: $Si(OC_2H_5)_4$); tetramethylsilane (TMS) (chemical formula: $Si(CH_3)_4$); tetramethylcyclotetrasiloxane (TMCTS); octamethylcyclotetrasiloxane (OMCTS); hexamethyldisilazane (HMDS); triethoxysilane ($SiH(OC_2H_5)_3$); trisdimethylaminosilane ($SiH(N(CH_3)_2)_3$); or the like. The insulating film 108 having high coverage can be formed by a CVD method using an organosilane gas.

In the case where a gallium oxide film is formed as the insulating film 108, a metal organic chemical vapor deposition (MOCVD) method can be used.

In the case where a hafnium oxide film is formed as the insulating film 108 by a thermal CVD method such as an MOCVD method or an ALD method, two kinds of gases, i.e., ozone ($O_3$) as an oxidizer and a source gas which is obtained by vaporizing a liquid containing a solvent and a hafnium precursor compound (a hafnium alkoxide solution, which is typified by tetrakis(dimethylamide)hafnium (TDMAH)), are used. Note that the chemical formula of tetrakis(dimethylamide)hafnium is $Hf[N(CH_3)_2]_4$. Examples of another material liquid include tetrakis(ethylmethylamide)hafnium.

In the case where an aluminum oxide film is formed as the insulating film 108 by a thermal CVD method such as an MOCVD method or an ALD method, two kinds of gases, i.e., $H_2O$ as an oxidizer and a source gas which is obtained by vaporizing a liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate). Note that the ALD method enables the insulating film 108 to have excellent coverage and small thickness.

In the case where a silicon oxide film is formed as the insulating film 108 by a thermal CVD method such as an MOCVD method or an ALD method, hexachlorodisilane is adsorbed on the oxide semiconductor film 106, the oxide semiconductor film 206, and the insulating film 104, chlorine contained in adsorbate is removed, and radicals of an oxidizing gas (e.g., $O_2$ or dinitrogen monoxide) are supplied to react with the adsorbate.

Here, a silicon oxynitride film is formed as the insulating film 108 by a plasma CVD method.

Figure 8A:
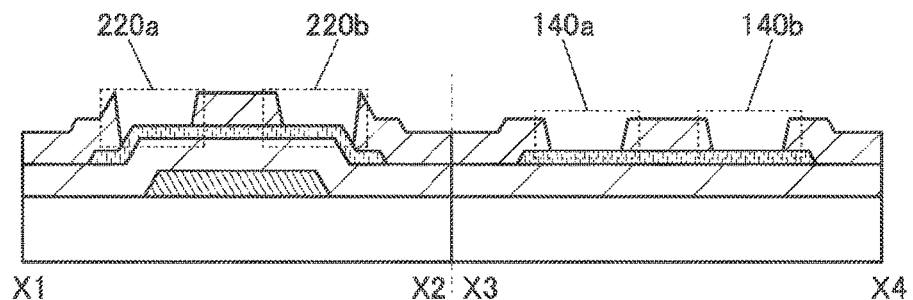
FIGS. 8A to 8C are cross-sectional views illustrating one embodiment of a manufacturing process of a semiconductor device.

Next, after a mask is formed over the insulating film 108 by a lithography process, part of the insulating film 108 is etched, whereby the opening portion 140a and the opening portion 140b which expose part of the oxide semiconductor film 106 and the opening portion 220a and the opening portion 220b which expose part of the oxide semiconductor film 206 are formed as shown in FIG. 8A.

As a method for etching the insulating film 108, a wet etching method or/and a dry etching method can be employed as appropriate.

Figure 8B:
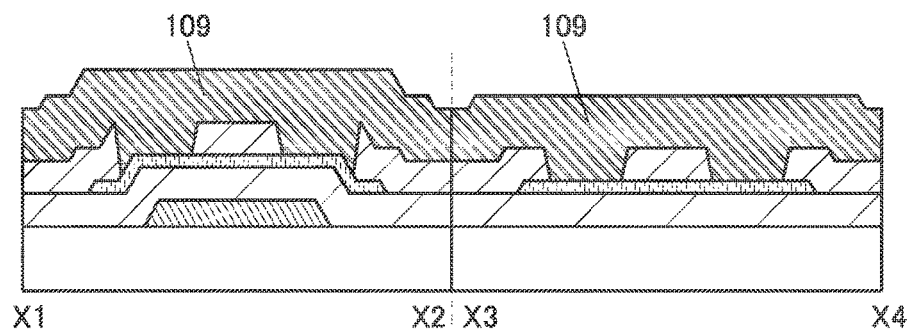

Next, as shown in FIG. 8B, the conductive film 109 is formed over the oxide semiconductor film 106, the oxide semiconductor film 206, and the insulating film 108.

The conductive film 109 can be formed by the formation method of the conductive film 201 as appropriate.

Figure 8C:
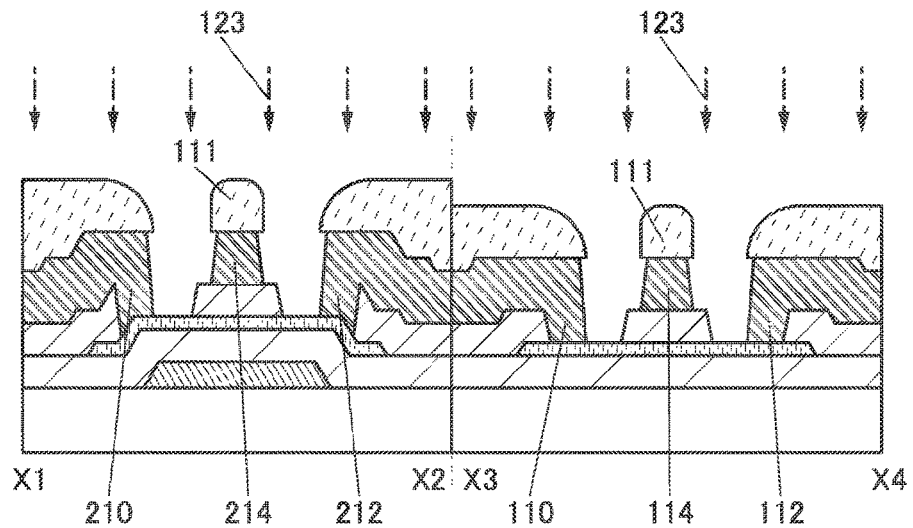

Next, after a mask 111 is formed over the conductive film 109 by a lithography process, the conductive film 109 is exposed to an etchant or/and an etching gas 123, whereby the conductive film 110, the conductive film 112, the conductive film 114, the conductive film 210, the conductive film 212, and the conductive film 214 are formed as shown in FIG. 8C.

As a method for etching the conductive film 109, a wet etching method or/and a dry etching method can be employed as appropriate. Note that after the conductive film 109 is etched, a cleaning step for removing a residue on a side surface of the insulating film 108 may be performed. As a result, leakage current between the conductive film 114 serving as a gate electrode and the oxide semiconductor film 106 and between the conductive film 214 serving as a gate electrode and the oxide semiconductor film 206 can be reduced.

Note that the conductive film 110, the conductive film 112, the conductive film 114, the conductive film 210, the conductive film 212, and the conductive film 214 may be formed by an electrolytic plating method, a printing method, an inkjet method, or the like instead of the above formation method.

Figure 9A:
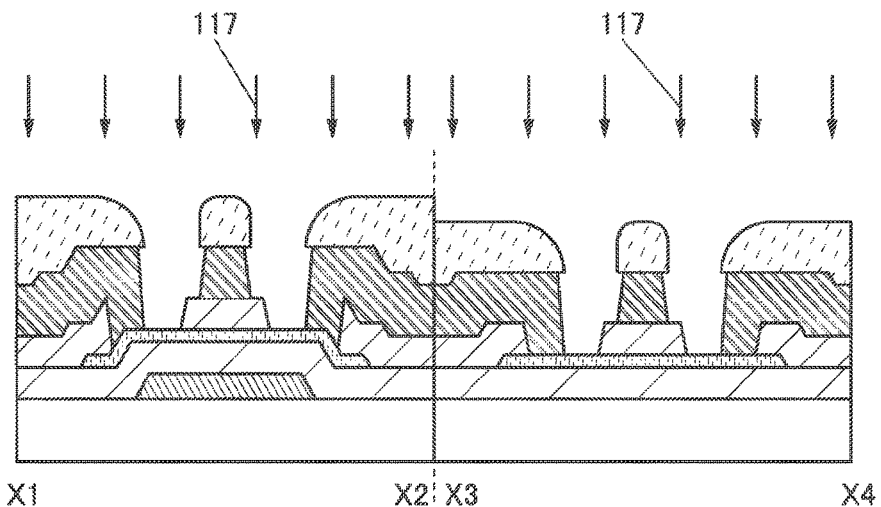
FIGS. 9A to 9C are cross-sectional views illustrating one embodiment of a manufacturing process of a semiconductor device.

Next, as shown in FIG. 9A, an impurity element 117 is added to the oxide semiconductor film 106 and the oxide semiconductor film 206 with the mask 111 left. As a result, the impurity element is added to regions which are not covered with the mask 111 in the oxide semiconductor films. Note that by the addition of the impurity element 117, an oxygen vacancy is formed in the oxide semiconductor film 106 and the oxide semiconductor film 206.

As a method for adding the impurity element 117, an ion doping method, an ion implantation method, plasma treatment, or the like can be given. In the case of plasma treatment, plasma is generated in a gas atmosphere containing an impurity element to be added and plasma treatment is performed, whereby the impurity element can be added. A dry etching apparatus, a plasma CVD apparatus, a high-density plasma CVD apparatus, or the like can be used to generate the plasma.

Note that, as a source gas of the impurity element 117, one or more of $B_2H_6$, $PH_3$, $CH_4$, $N_2$, $NH_3$, $AlH_3$, $AlCl_3$, $SiH_4$, $Si_2H_6$, $F_2$, HF, $H_2$, and a rare gas can be used. Alternatively, one or more of $B_2H_6$, $PH_3$, $N_2$, $NH_3$, $AlH_3$, $AlCl_3$, $F_2$, HF, and $H_2$ which are diluted with a rare gas can be used. By adding the impurity element 117 to the oxide semiconductor film 106 and the oxide semiconductor film 206 using one or more of $B_2H_6$, $PH_3$, $N_2$, $NH_3$, $AlH_3$, $AlCl_3$, $F_2$, HF, and $H_2$ which are diluted with a rare gas, the rare gas and one or more of hydrogen, boron, carbon, nitrogen, fluorine, aluminum, silicon, phosphorus, and chlorine can be added at a time to the oxide semiconductor film 106 and the oxide semiconductor film 206.

Alternatively, after a rare gas is added to the oxide semiconductor film 106 and the oxide semiconductor film 206, one or more of $B_2H_6$, $PH_3$, $CH_4$, $N_2$, $NH_3$, $AlH_3$, $AlCl_3$, $SiH_4$, $Si_2H_6$, $F_2$, HF, and $H_2$ may be added to the oxide semiconductor film 106 and the oxide semiconductor film 206.

Further alternatively, after one or more of $B_2H_6$, $PH_3$, $CH_4$, $N_2$, $NH_3$, $AlH_3$, $AlCl_3$, $SiH_4$, $Si_2H_6$, $F_2$, HF, and $H_2$ are added to the oxide semiconductor film 106 and the oxide semiconductor film 206, a rare gas may be added to the oxide semiconductor film 106 and the oxide semiconductor film 206.

The addition of the impurity element 117 is controlled by appropriately setting the implantation conditions such as the acceleration voltage and the dose. For example, in the case where argon is added by an ion implantation method, the acceleration voltage is set to 10 kV and the dose is set to greater than or equal to $1\times10^{13}$ ions/cm$^2$ and less than or equal to $1\times10^{16}$ ions/cm$^2$, e.g., $1\times10^{14}$ ions/cm$^2$. In the case where a phosphorus ion is added by an ion implantation method, the acceleration voltage is set to 30 kV and the dose is set to greater than or equal to $1\times10^{13}$ ions/cm$^2$ and less than or equal to $5\times10^{16}$ ions/cm$^2$, e.g., $1\times10^{15}$ ions/cm$^2$.

Figure 10A:
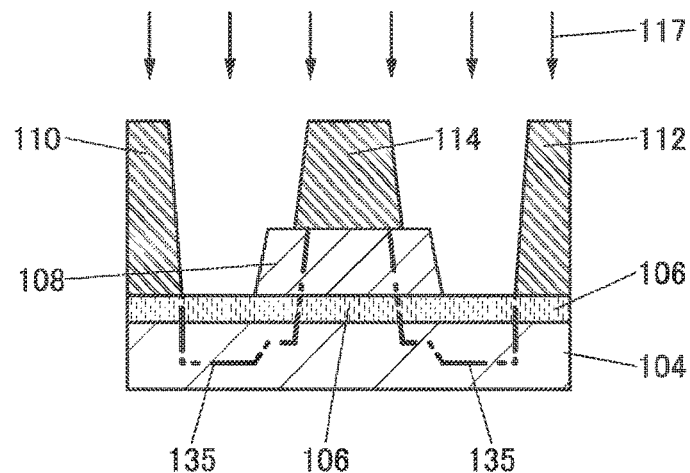
FIGS. 10A to 10C are cross-sectional views each illustrating one embodiment of a semiconductor device.
Figure 10B:
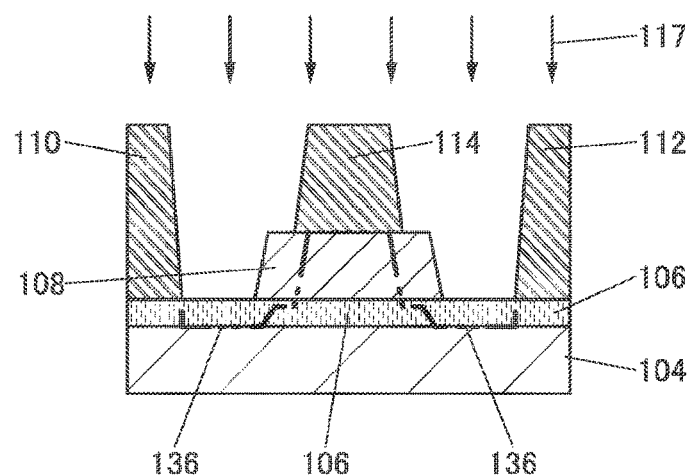
Figure 10C:
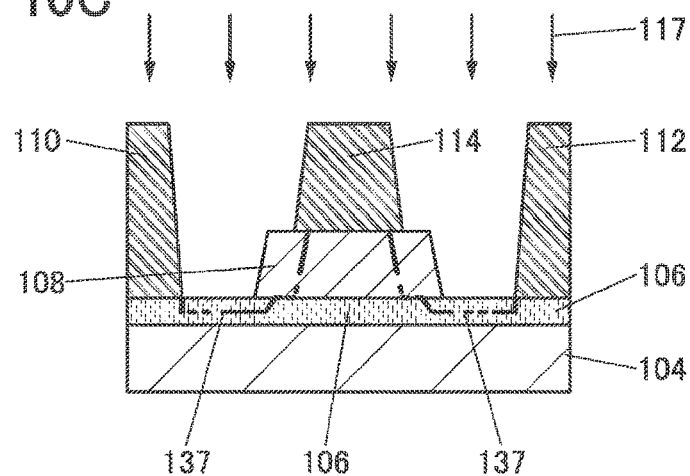

FIGS. 10A to 10C are conceptual diagrams of a region to which the impurity element 117 is added in a thickness direction when the impurity element is added to the oxide semiconductor film 106. Note that here, description is made using an enlarged view of the vicinity of the oxide semiconductor film 106 included in the transistor 150 as a typical example.

As shown in FIG. 10A, a region to which the impurity element 117 is added is formed in the insulating film 104, the oxide semiconductor film 106, and the insulating film 108 in some cases. Note that an end portion 135 of the region to which the impurity element 117 is added is positioned inside the insulating film 104 in a depth direction of a region where the oxide semiconductor film 106 is exposed. Note that the depth direction refers to a direction from the insulating film 108 to the insulating film 104 which is parallel to the thickness direction of the oxide semiconductor film 106.

Alternatively, as shown in FIG. 10B, a region to which the impurity element 117 is added is formed in the oxide semiconductor film 106 and the insulating film 108 in some cases. Note that an end portion 136 of the region to which the impurity element 117 is added is positioned at the interface between the insulating film 104 and the oxide semiconductor film 106 in a depth direction of a region where the oxide semiconductor film 106 is exposed.

Still alternatively, as shown in FIG. 10C, a region to which the impurity element 117 is added is formed in the oxide semiconductor film 106 and the insulating film 108 in some cases. Note that an end portion 137 of the region to which the impurity element 117 is added is positioned inside the oxide semiconductor film 106 in a depth direction of a region where the oxide semiconductor film 106 is exposed.

Figure 9B:
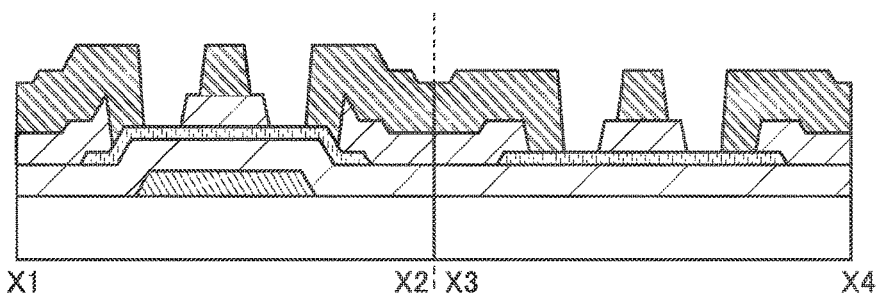

As a result, the low-resistance regions can be formed in the oxide semiconductor film 106 and the oxide semiconductor film 206. Specifically, the region 106b and the region 106c shown in FIG. 2 can be formed. Note that the impurity element concentration of the region 106c is lower than the impurity element concentration of the region 106b because the impurity element is added to the oxide semiconductor film 106 and the oxide semiconductor film 206 through the insulating film 108. After that, the mask 111 is removed as shown in FIG. 9B.

Note that here, the impurity element 117 is added to the oxide semiconductor film 106 and the oxide semiconductor film 206 using the mask 111; alternatively, the impurity element 117 may be added to the oxide semiconductor film 106 and the oxide semiconductor film 206 using the conductive film 110, the conductive film 112, the conductive film 114, the conductive film 210, the conductive film 212, and the conductive film 214 as masks after the mask 111 is removed.

After that, heat treatment may be performed to further increase the conductivity of the region to which the impurity element 117 is added. The temperature of the heat treatment is typically higher than or equal to 150° C. and lower than the strain point of the substrate, higher than or equal to 250° C. and lower than or equal to 450° C., or higher than or equal to 300° C. and lower than or equal to 450° C.

Figure 9C:
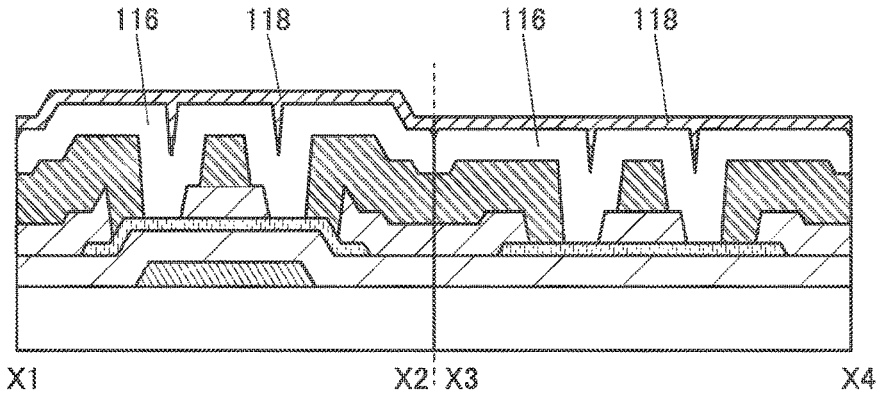

Next, as shown in FIG. 9C, the insulating film 116 may be formed over the oxide semiconductor film 106, the insulating film 108, the conductive film 110, the conductive film 112, the conductive film 114, the oxide semiconductor film 206, the conductive film 210, the conductive film 212, and the conductive film 214, and the insulating film 118 may be formed over the insulating film 116.

The insulating film 116 and the insulating film 118 can be formed using the formation methods of the insulating film 104 and the insulating film 108 as appropriate.

Note that a silicon oxide film or a silicon oxynitride film from which oxygen can be released by heat treatment can be formed as the insulating film 116 under the following conditions: the substrate placed in a treatment chamber of the plasma CVD apparatus that is vacuum-evacuated is held at a temperature higher than or equal to 180° C. and lower than or equal to 280° C., or higher than or equal to 200° C. and lower than or equal to 240° C., the pressure is greater than or equal to 100 Pa and less than or equal to 250 Pa, or greater than or equal to 100 Pa and less than or equal to 200 Pa with introduction of a source gas into the treatment chamber, and a high-frequency power of greater than or equal to 0.17 W/cm$^2$ and less than or equal to 0.5 W/cm$^2$, or greater than or equal to 0.25 W/cm$^2$ and less than or equal to 0.35 W/cm$^2$ is supplied to an electrode provided in the treatment chamber.

Alternatively, heat treatment is performed after an aluminum film or an aluminum oxide film is formed over the oxide semiconductor film 106, the conductive film 110, the conductive film 112, the conductive film 114, the oxide semiconductor film 206, the conductive film 210, the conductive film 212, and the conductive film 214, whereby oxygen contained in the oxide semiconductor film 106 and the oxide semiconductor film 206 reacts with the aluminum film or the aluminum oxide film in the region 106b shown in FIG. 2; thus, an aluminum oxide film is formed as the insulating film 116, and an oxygen vacancy is formed in the region 106b shown in FIG. 2. As a result, the conductivity of the region 106b can be further increased.

After that, heat treatment may be performed to further increase the conductivity of the region to which the impurity element 117 is added. The temperature of the heat treatment is typically higher than or equal to 150° C. and lower than the strain point of the substrate, higher than or equal to 250° C. and lower than or equal to 450° C., or higher than or equal to 300° C. and lower than or equal to 450° C.

Through the above process, the transistor 150 and the transistor 154 can be manufactured.

<Method 2 for Manufacturing Semiconductor Device>

A method for manufacturing the transistor 151 illustrated in FIGS. 3A to 3C is described. Note that here, a step of forming the conductive film 110c, the conductive film 112c, and the conductive film 114c which are included in the conductive film 110, the conductive film 112, and the conductive film 114 in the transistor 151 and a step of adding the impurity element 117 to the oxide semiconductor film 106 are described.

Through the steps shown in FIGS. 7A to 7D and FIGS. 8A to 8C, the insulating film 104, the oxide semiconductor film 106, the insulating film 108, the conductive film 110, the conductive film 112, the conductive film 114, and the mask 111 are formed over the substrate 102.

Next, as shown in FIG. 8C, the impurity element 117 is added to the oxide semiconductor film 106.

Next, the mask 111 is removed.

Next, the conductive film 110b, the conductive film 112b, and the conductive film 114b which are included in the conductive film 110, the conductive film 112, and the conductive film 114, respectively, are exposed to plasma generated in a reducing atmosphere, so that an oxide on surfaces of the conductive film 110b, the conductive film 112b, and the conductive film 114b is reduced. Next, the conductive film 110b, the conductive film 112b, and the conductive film 114b are exposed to silane while heating is performed at a temperature higher than or equal to 200° C. and lower than or equal to 400° C. Next, the conductive film 110b, the conductive film 112b, and the conductive film 114b are exposed to plasma generated in an atmosphere containing nitrogen, such as an atmosphere of ammonia or nitrogen, whereby $CuSi_xN_y$ (x>0, y>0) can be formed as the conductive film 110c, the conductive film 112c, and the conductive film 114c.

Note that in performing the exposure to the plasma generated in an atmosphere containing nitrogen, such as an atmosphere of ammonia or nitrogen, the oxide semiconductor film 106 is exposed to the plasma generated in the atmosphere containing nitrogen, such as an atmosphere of ammonia or nitrogen. Therefore, nitrogen or/and hydrogen can be added to the oxide semiconductor film 106.

Note that before the impurity element 117 is added to the oxide semiconductor film 106, the mask 111 may be removed and the conductive film 110c, the conductive film 112c, and the conductive film 114c which are included in the conductive film 110, the conductive film 112, and the conductive film 114 may be formed.

Then, the step illustrated in FIG. 9B is performed. In this manner, the transistor 151 can be manufactured.

In the transistor described in this embodiment, the conductive films serving as a source electrode and a drain electrode do not overlap with the conductive film searing as a gate electrode, and thus, parasitic capacitance can be reduced and on-state current is high. Furthermore, in the transistor described in this embodiment, the low-resistance region can be formed stably; therefore, on-state current is higher and variation in the electrical characteristics of the transistor is more reduced than in a conventional transistor.

The structures, methods, and the like described in this embodiment can be used as appropriate in combination with any of the structures, methods, and the like described in the other embodiments.

Embodiment 2

In this embodiment, one embodiment of a semiconductor device and a method for manufacturing the semiconductor device will bee described with reference to FIGS. 12A and 12B, FIG. 13, FIGS. 14A to 14C, FIGS. 15A to 15C, FIGS. 16A to 16C, FIGS. 17A and 17B, FIGS. 18A and 18B, FIGS. 19A to 19C, FIGS. 20A to 20C, FIGS. 21A to 21C, and FIGS. 22A to 22C. Note that a difference between this embodiment and Embodiment 1 is in a method for forming the low-resistance region.

<Structure 1 of Semiconductor Device>

In FIGS. 12A and 12B and FIGS. 17A and 17B, a transistor having a top-gate structure is shown as an example of a transistor included in a semiconductor device.

Figure 12A:
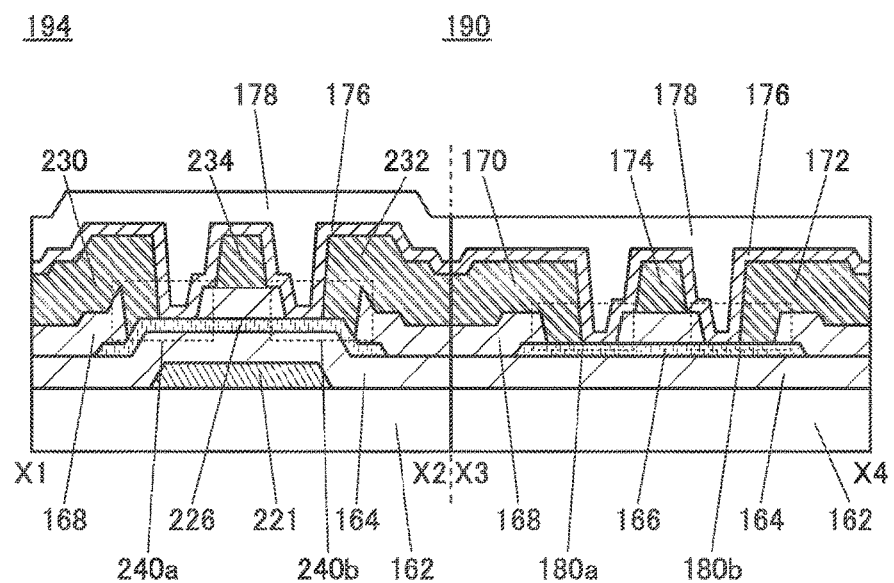
FIGS. 12A and 12B are cross-sectional views illustrating one embodiment of a semiconductor device.
Figure 12B:
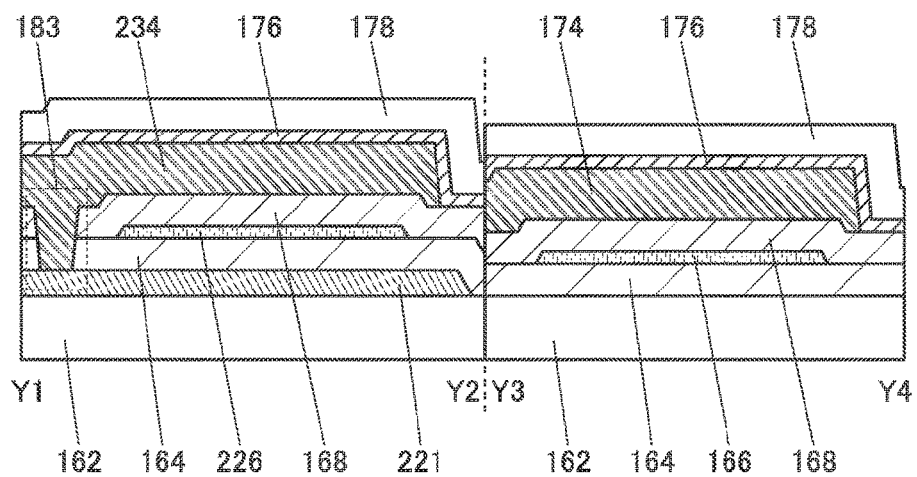
Figure 17A:
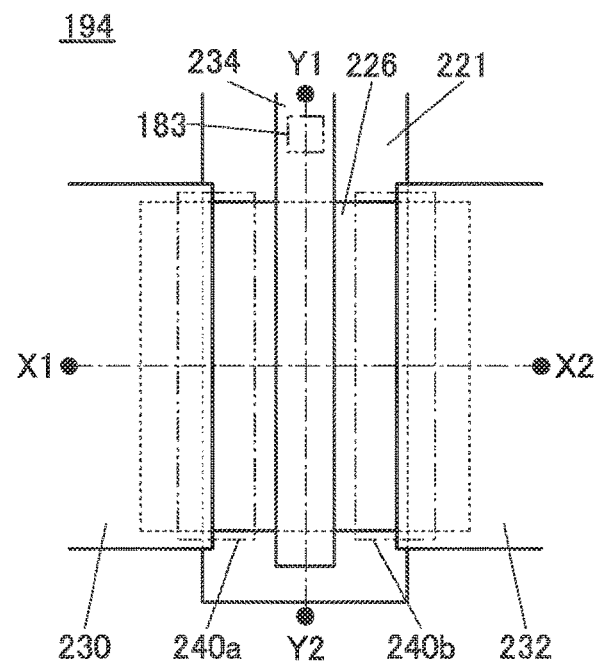
FIGS. 17A and 17B are top views illustrating one embodiment of a semiconductor device.
Figure 17B:
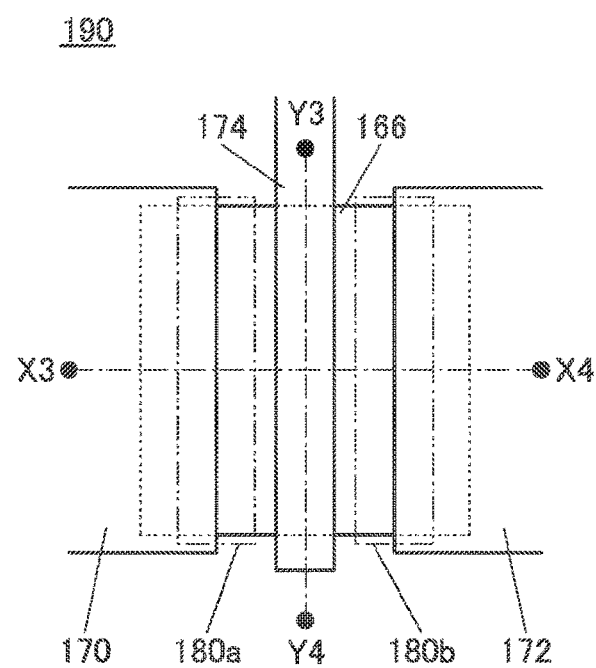

FIGS. 17A and 17B are top views of a transistor 194 provided in a driver circuit portion and a transistor 190 provided in a pixel portion. FIGS. 12A and 12B are cross-sectional views of the transistor 194 and the transistor 190. FIG. 17A is the top view of the transistor 194, and FIG. 17B is the top view of the transistor 190. FIG. 12A shows cross-sectional views along the dashed-dotted line X1-X2 in FIG. 17A and the dashed-dotted line X3-X4 in FIG. 17B. FIG. 12B shows cross-sectional views along the dashed-dotted line Y1-Y2 in FIG. 17A and the dashed-dotted line Y3-Y4 in FIG. 17B. FIG. 12A shows a cross-sectional view of the transistor 190 in a channel length direction, and FIG. 12B shows a cross-sectional view of the transistor 190 in a channel width direction.

The transistor 190 shown in FIGS. 12A and 12B includes an oxide semiconductor film 166 over an insulating film 164 formed over a substrate 162, an insulating film 168 in contact with the oxide semiconductor film 166, a conductive film 170 in contact with the oxide semiconductor film 166 in part of an opening portion 180a in the insulating film 168, a conductive film 172 in contact with the oxide semiconductor film 166 in part of an opening portion 180b in the insulating film 168, and a conductive film 174 overlapping with the oxide semiconductor film 166 with the insulating film 168 provided therebetween. Note that an insulating film 176 is provided over the transistor 190. Furthermore, an insulating film 178 may be provided over the insulating film 176.

The transistor 194 shown in FIGS. 12A and 12B includes a conductive film 221 formed over the substrate 162, the insulating film 164 over the conductive film 221, an oxide semiconductor film 226 over the insulating film 164, the insulating film 168 in contact with the oxide semiconductor film 226, a conductive film 230 in contact with the oxide semiconductor film 226 in part of an opening portion 240a in the insulating film 168, a conductive film 232 in contact with the oxide semiconductor film 226 in part of an opening portion 240b in the insulating film 168, and a conductive film 234 overlapping with the oxide semiconductor film 226 with the insulating film 168 provided therebetween.

The transistor 194 is characterized by including the conductive film 221 overlapping with the oxide semiconductor film 226 with the insulating film 164 provided therebetween. That is, the conductive film 221 serves as a gate electrode. Furthermore, the transistor 194 is a transistor having a dual-gate structure.

The threshold voltage of the transistor 194 can be controlled by supplying different potentials to the conductive film 234 and the conductive film 221 which are not connected to each other. Alternatively, as shown in FIG. 17A, by supplying the same potential to the conductive film 234 and the conductive film 221 which are connected to each other through an opening portion 183, variations in the initial characteristics can be reduced, and degradation of the transistor due to the −GBT stress test and a change in the rising voltage of the on-state current at different drain voltages can be suppressed. In addition, a region where carriers flow in the oxide semiconductor film 226 becomes larger in the film thickness direction, so that the amount of carrier movement is increased. As a result, the on-state current and field-effect mobility of the transistor 194 are increased. When the channel length of the transistor 194 is set to less than 2.5 μm, preferably greater than or equal to 1.45 μm and less than or equal to 2.2 μm, the on-state current can be further increased and the field-effect mobility can be increased.

In the display device described in this embodiment, the transistor in the driver circuit portion and the transistor in the pixel portion have different structures. The transistor included in the driver circuit portion has a dual-gate structure. That is, the field-effect mobility of the transistor included in the driver circuit portion is higher than that of the transistor included in the pixel portion.

Furthermore, in the display device, the transistor included in the driver circuit portion and the transistor included in the pixel portion may have different channel lengths.

Typically, the channel length of the transistor 194 included in the driver circuit portion can be less than 2.5 µm, or greater than or equal to 1.45 µm and less than or equal to 2.2 µm. The channel length of the transistor 190 included in the pixel portion can be greater than or equal to 2.5 µm, or greater than or equal to 2.5 µm and less than or equal to 20 µm.

When the channel length of the transistor 194 included in the driver circuit portion is less than 2.5 µm, preferably greater than or equal to 1.45 µm and less than or equal to 2.2 µm, as compared with the transistor 190 included in the pixel portion, the field-effect mobility can be increased, and the amount of on-state current can be increased. Consequently, a driver circuit portion capable of high-speed operation can be formed.

When the transistor in the driver circuit portion has high field-effect mobility, the number of input terminals can be made small. Furthermore, because the on-state current of the transistor included in the pixel portion can be increased, display unevenness in the pixel portion can be suppressed.

In the oxide semiconductor film 166, an element which forms an oxygen vacancy is included in a region which does not overlap with the conductive film 170, the conductive film 172, and the conductive film 174. In the oxide semiconductor film 226, an element which forms an oxygen vacancy is included in a region which does not overlap with the conductive film 230, the conductive film 232, and the conductive film 234. Hereinafter, the elements which form oxygen vacancies are described as impurity elements. Typical examples of the impurity elements are hydrogen, rare gas elements, and the like. Typical examples of the rare gas elements are helium, neon, argon, krypton, and xenon. Furthermore, as the impurity element, boron, carbon, nitrogen, fluorine, aluminum, silicon, phosphorus, chlorine, or the like may be contained in the oxide semiconductor film 166 and the oxide semiconductor film 226.

The insulating film 176 is a film containing hydrogen, and a nitride insulating film is a typical example thereof. The insulating film 176 is in contact with the oxide semiconductor film 166 and the oxide semiconductor film 226. Therefore, hydrogen contained in the insulating film 176 is diffused into the oxide semiconductor film 166 and the oxide semiconductor film 226. As a result, much hydrogen is contained in a region in contact with the insulating film 176 in the oxide semiconductor film 166 and the oxide semiconductor film 226.

When a rare gas element is added as the impurity element to the oxide semiconductor film, a bond between a metal element and oxygen in the oxide semiconductor film is cut, whereby an oxygen vacancy is formed. By interaction between hydrogen and oxygen vacancy included in the oxide semiconductor film, the conductivity of the oxide semiconductor film is increased. Specifically, when hydrogen enters the oxygen vacancy in the oxide semiconductor film, an electron serving as a carrier is generated. As a result, the conductivity is increased.

Figure 13:
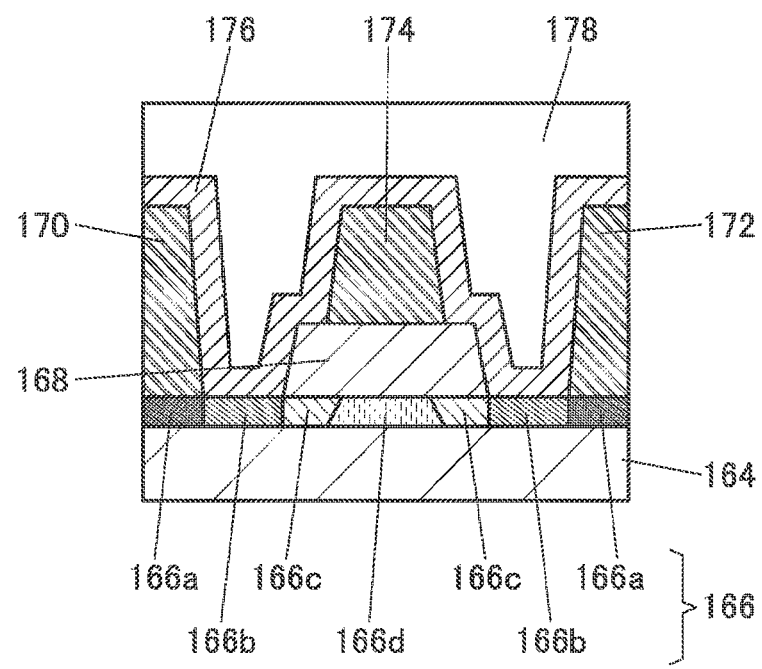
FIG. 13 is a cross-sectional view illustrating one embodiment of a semiconductor device.

FIG. 13 is an enlarged view of the vicinity of the oxide semiconductor film 166. Note that description is made using an enlarged view of the vicinity of the oxide semiconductor film 166 included in the transistor 190 as a typical example. As shown in FIG. 13, the oxide semiconductor film 166 includes a region 166a in contact with the conductive film 170 or the conductive film 172, a region 166b in contact with the insulating film 176, and a region 166c and a region 166d which overlap with the insulating film 168.

The regions 166a serve as a source region and a drain region. Like the regions 106a described in Embodiment 1, the regions 166a in contact with the conductive film 170 and the conductive film 172 have high conductivity and serve as a source region and a drain region.

The region 166b and the region 166c serve as low-resistance regions. The region 166b and the region 166c contain at least a rare gas and hydrogen as the impurity elements. Note that the impurity element concentration of the region 166b is higher than the impurity element concentration of the region 166c. In the case where a side surface of the conductive film 174 has a tapered shape, part of the region 166c may overlap with the conductive film 174.

In the case where the oxide semiconductor film 166 is formed by a sputtering method, the regions 166a to 166d each contain a rare gas element. In addition, the rare gas element concentration of each of the regions 166b and 166c is higher than that of each of the regions 166a and 166d. The reasons are as follows: in the case where the oxide semiconductor film 166 is formed by a sputtering method, a rare gas is used as a sputtering gas, so that the oxide semiconductor film 166 contains the rare gas; and a rare gas is intentionally added to the regions 166b and 166c in order to form oxygen vacancies in the regions 166b and 166c. Note that a rare gas element different from that added to the regions 166a and 166d may be added to the regions 166b and 166c.

Since the region 166b is in contact with the insulating film 176, the concentration of hydrogen in the region 166b is higher than the concentration of hydrogen in the region 166a and the concentration of hydrogen in the region 166d. In the case where hydrogen is diffused from the region 166b to the region 166c, the concentration of hydrogen in the region 166c is higher than the concentration of hydrogen in the region 166a and the concentration of hydrogen in the region 166d. Note that the concentration of hydrogen in the region 166b is higher than the concentration of hydrogen in the region 166c.

In the regions 166b and 166c, the concentration of hydrogen which is measured by SIMS can be higher than or equal to $8\times10^{19}$ atoms/cm$^3$, higher than or equal to $1\times10^{20}$ atoms/cm$^3$, or higher than or equal to $5\times10^{20}$ atoms/cm$^3$. Note that in the regions 166a and 166d, the concentration of hydrogen which is measured by SIMS can be lower than or equal to $5\times10^{19}$ atoms/cm$^3$, lower than or equal to $1\times10^{19}$ atoms/cm$^3$, lower than or equal to $5\times10^{18}$ atoms/cm$^3$, lower than or equal to $1\times10^{18}$ atoms/cm$^3$, lower than or equal to $5\times10^{17}$ atoms/cm$^3$, or lower than or equal to $1\times10^{16}$ atoms/cm$^3$.

In the case where boron, carbon, nitrogen, fluorine, aluminum, silicon, phosphorus, or chloride is added as the impurity element to the oxide semiconductor film 166, the impurity element is contained in only the regions 166b and 166c. Thus, the impurity element concentration of each of the regions 166b and 166c is higher than the impurity element concentration of each of the regions 166a and 166d. Note that, in the region 166b and the region 166c, the impurity element concentration which is measured by SIMS can be higher than or equal to $5\times10^{18}$ atoms/cm$^3$ and lower than or equal to $1\times10^{22}$ atoms/cm$^3$, higher than or equal to $1\times10^{19}$ atoms/cm$^3$ and lower than or equal to $1\times10^{21}$ atoms/cm$^3$, or higher than or equal to $5\times10^{19}$ atoms/cm$^3$ and lower than or equal to $5\times10^{20}$ atoms/cm$^3$.

The regions 166b and 166c have higher hydrogen concentrations than the region 166d and have more oxygen vacancies than the region 166d because of addition of impurity elements. Therefore, the regions 166b and 166c have higher conductivity and serve as low-resistance regions. Thus, the resistivity of the regions 166b and 166c can be typically greater than or equal to $1 \times 10^{-3}$ Ωcm and less than $1 \times 10^4$ Ωcm, or greater than or equal to $1 \times 10^{-3}$ Ωcm and less than $1 \times 10^{-1}$ Ωcm.

Note that in the region 166b and the region 166c, when the amount of hydrogen is smaller than or equal to the amount of oxygen vacancy, hydrogen is easily captured by the oxygen vacancy and is not easily diffused into the region 166d that serves as a channel. As a result, a normally-off transistor can be manufactured.

Furthermore, in the case where the amount of oxygen vacancy is larger than the amount of hydrogen in the region 166b and the region 166c, the carrier density of the region 166b and the region 166c can be controlled by controlling the amount of hydrogen. Alternatively, in the case where the amount of hydrogen is larger than the amount of oxygen vacancy in the region 166b and the region 166c, the carrier density of the region 166b and the region 166c can be controlled by controlling the amount of oxygen vacancy. Note that when the carrier density of the region 166b and the region 166c is greater than or equal to $5 \times 10^{18}/cm^3$, greater than or equal to $1 \times 10^{19}/cm^3$, or greater than or equal to $1 \times 10^{20}/cm^3$, a transistor in which resistance between the channel and the source and the drain regions is small and on-state current is high can be formed.

The region 166d serves as a channel.

In the insulating film 168, a region overlapping with the oxide semiconductor film 166 and the conductive film 174 and a region overlapping with the oxide semiconductor film 226 and the conductive film 234 serve as gate insulating films. Furthermore, in the insulating film 168, regions overlapping with the oxide semiconductor film 166 and the conductive films 170 and 172 and regions overlapping with the oxide semiconductor film 226 and the conductive films 230 and 232 serve as interlayer insulating films.

The conductive film 170 and the conductive film 172 serve as a source electrode and a drain electrode, and the conductive film 230 and the conductive film 232 serve as a source electrode and a drain electrode. The conductive film 174 and the conductive film 234 serve as gate electrodes.

In the transistors 190 and 194 described in this embodiment, the regions 166b and 166c serving as low-resistance regions are provided between the region 166d serving as a channel and the regions 166a serving as a source region and a drain region. Resistance between the channel and the source region and the drain region can be reduced, and the transistor 190 and the transistor 194 have high on-state current and high field-effect mobility.

In a process of manufacturing the transistor 190 and the transistor 194, the conductive film 174 and the conductive film 234 that serve as gate electrodes and the conductive films 170 and 172 that serve as a source electrode and a drain electrode are formed at the same time. Thus, in the transistor 190, the conductive film 174 does not overlap with the conductive films 170 and 172, and parasitic capacitance between the conductive film 174 and each of the conductive films 170 and 172 can be reduced. Furthermore, in the transistor 194, the conductive film 234 does not overlap with the conductive films 230 and 232, and parasitic capacitance between the conductive film 234 and each of the conductive films 230 and 232 can be reduced. As a result, in the case where a large-area substrate is used as the substrate 162, signal delay in the conductive film 170, the conductive film 172, the conductive film 174, the conductive film 230, the conductive film 232, and the conductive film 234 can be reduced.

In the transistor 190, a region including oxygen vacancy is formed by adding the rare gas element to the oxide semiconductor film 166 using the conductive film 170, the conductive film 172, and the conductive film 174 as masks. Furthermore, in the transistor 194, a region including oxygen vacancy is formed by adding the impurity element to the oxide semiconductor film 226 using the conductive film 230, the conductive film 232, and the conductive film 234 as masks. Furthermore, because the region including oxygen vacancy is in contact with the insulating film 176 containing hydrogen, hydrogen contained in the insulating film 176 is diffused into the region including oxygen vacancy, so that a low-resistance region is formed. That is, the low-resistance region can be formed in a self-aligned manner.

In the transistor 190 and the transistor 194 described in this embodiment, the rare gas is added to the region 166b and the region 166c to form oxygen vacancy, and furthermore, hydrogen is added. Therefore, the conductivity of the region 166b and the region 166c can be increased, and variation in the conductivity of the region 166b and the region 166c between transistors can be reduced. That is, by adding the rare gas and hydrogen to the region 166b and the region 166c, the conductivity of the region 166b and the region 166c can be controlled.

The structure shown in FIGS. 12A and 12B is described in detail below.

As the substrate 162, the substrate 102 described in Embodiment 1 can be used as appropriate.

The insulating film 164 can be formed using a material for the insulating film 104 in Embodiment 1, as appropriate.

The oxide semiconductor film 166 and the oxide semiconductor film 226 can be formed using the material and the structure of the oxide semiconductor film 106 in Embodiment 1, as appropriate.

The insulating film 168 can be formed using the material for the insulating film 108 in Embodiment 1, as appropriate.

The conductive films 170, 172, and 174 and the conductive films 230, 232, and 234 can be formed using the material for the conductive films 110, 112, and 114 in Embodiment 1, as appropriate.

The insulating film 176 is a film containing hydrogen, and a nitride insulating film is a typical example thereof. The nitride insulating film can be formed using silicon nitride, aluminum nitride, or the like.

The insulating film 178 can be formed using the material for the insulating film 118 in Embodiment 1, as appropriate.
<Structure 2 of Semiconductor Device>

Next, another structure of the semiconductor device is described with reference to FIGS. 14A to 14C. Here, description is made using a transistor 191 as a modification example of the transistor 190 included in the pixel portion. The structure of the insulating film 164 or the structures of the conductive film 170, the conductive film 172, and the conductive film 174 of the transistor 191 can be used for the transistor 194 in the driver circuit portion as appropriate.

Figure 14A:
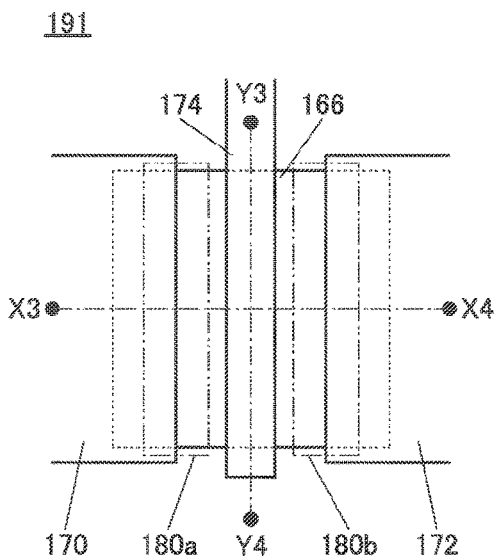
FIGS. 14A to 14C are a top view and cross-sectional views which illustrate one embodiment of a semiconductor device.
Figure 14B:
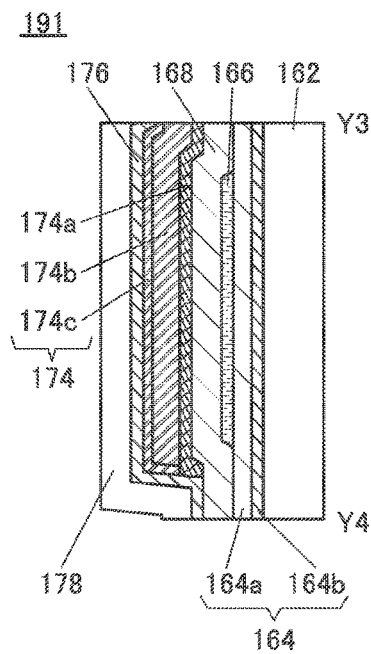
Figure 14C:
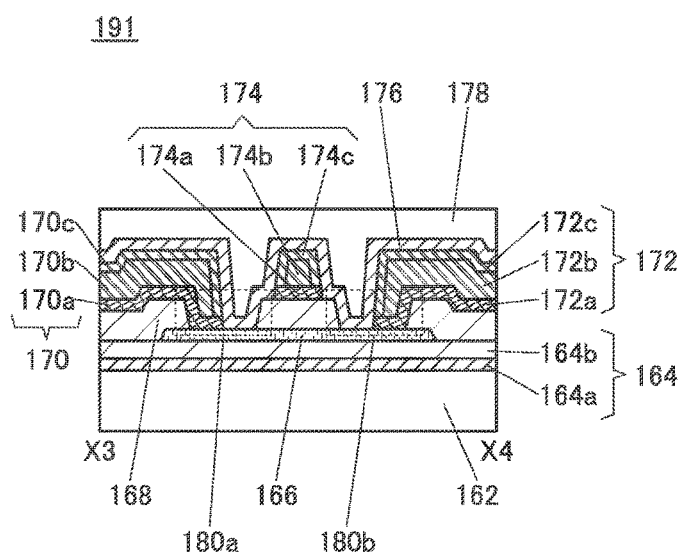

FIGS. 14A to 14C are a top view and cross-sectional views of the transistor 191 included in a semiconductor device. FIG. 14A is a top view of the transistor 191. FIG. 14B is a cross-sectional view along the dashed-dotted line Y3-Y4 in FIG. 14A. FIG. 14C is a cross-sectional view along the dashed-dotted line X3-X4 in FIG. 14A.

The transistor 191 shown in FIGS. 14A to 14C is characterized in that the conductive film 170, the conductive film 172, and the conductive film 174 each have a three-layer structure and in that the insulating film 164 has a stacked-layer structure of a nitride insulating film 164a and an oxide insulating film 164b. The other components are the same as those of the transistor 190, and the effect similar to that in the case of the transistor 190 is obtained.

First, the conductive film 170, the conductive film 172, and the conductive film 174 are described.

In the conductive film 170, a conductive film 170a, a conductive film 170b, and a conductive film 170c are stacked in this order, and the conductive film 170a and the conductive film 170c cover surfaces of the conductive film 170b. That is, the conductive film 170a and the conductive film 170c serve as protective films of the conductive film 170b.

In the conductive film 172, a conductive film 172a, a conductive film 172b, and a conductive film 172c are stacked in this order, and the conductive film 172a and the conductive film 172c cover surfaces of the conductive film 172b, in a manner similar to that of the conductive film 170.

In the conductive film 174, a conductive film 174a, a conductive film 174b, and a conductive film 174c are stacked in this order, and the conductive film 174a and the conductive film 174c cover surfaces of the conductive film 174b, in a manner similar to that of the conductive film 170.

Like the conductive film 110a, the conductive film 112a, and the conductive film 114a in Embodiment 1, the conductive film 170a, the conductive film 172a, and the conductive film 174a can be formed using a material which prevents the metal element contained in the conductive film 170b, the conductive film 172b, and the conductive film 174b from being diffused into the oxide semiconductor film 166, as appropriate.

Like the conductive film 110b, the conductive film 112b, and the conductive film 114b in Embodiment 1, the conductive film 170b, the conductive film 172b, and the conductive film 174b can be formed using a low-resistance material, as appropriate.

Like the conductive film 111c, the conductive film 112c, and the conductive film 114c in Embodiment 1, the conductive film 170c, the conductive film 172c, and the conductive film 174c can be formed using a film in which the metal element contained in the conductive film 170b, the conductive film 172b, and the conductive film 174b is subjected to passivation. As a result, the metal element contained in the conductive film 170b, the conductive film 172b, and the conductive film 174b can be prevented from moving to the oxide semiconductor film 166 in the step of forming the insulating film 176.

Next, the insulating film 164 in which the nitride insulating film 164a and the oxide insulating film 164b are stacked is described.

The nitride insulating film 164a and the oxide insulating film 164b can be formed using the material for the nitride insulating film 104a and the oxide insulating film 104b in Embodiment 1, as appropriate.

<Structure 3 of Semiconductor Device>

Next, another structure of the semiconductor device is described with reference to FIGS. 15A to 15C and FIGS. 16A to 16C. Here, description is made using a transistor 192 and a transistor 193 as modification examples of the transistor 190 included in the pixel portion. The structure of the oxide semiconductor film 166 included in the transistor 192 or the structure of the oxide semiconductor film 166 included in the transistor 193 can be used for the transistor 194 in the driver circuit portion as appropriate.

Figure 15A:
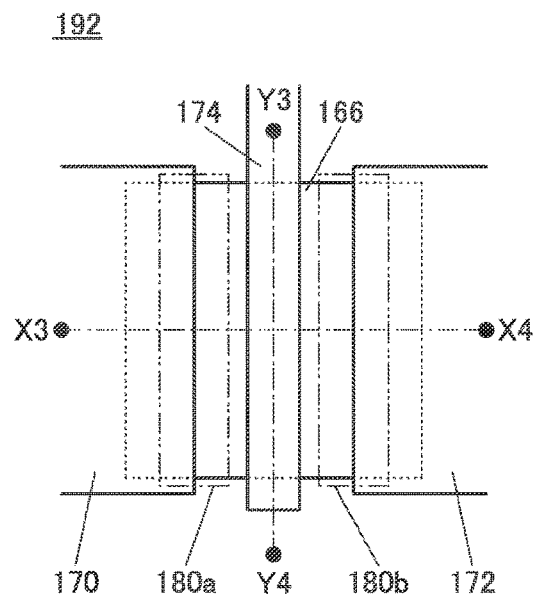
FIGS. 15A to 15C are a top view and cross-sectional views which illustrate one embodiment of a semiconductor device.
Figure 15B:
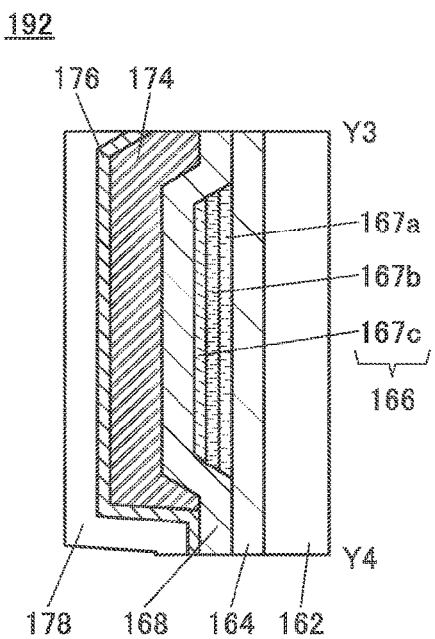
Figure 15C:
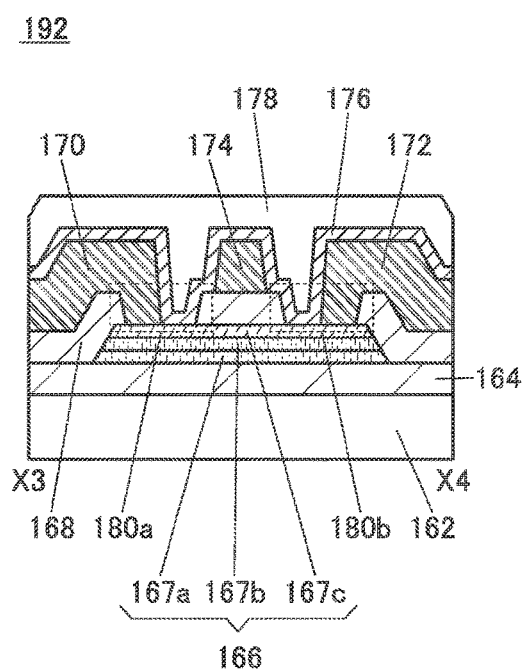

FIGS. 15A to 15C are a top view and cross-sectional views of the transistor 192 included in a semiconductor device. FIG. 15A is a top view of the transistor 192. FIG. 15B is a cross-sectional view along the dashed-dotted line Y3-Y4 in FIG. 15A. FIG. 15C is a cross-sectional view along the dashed-dotted line X3-X4 in FIG. 15A.

The transistor 192 shown in FIGS. 15A to 15C is characterized in that the oxide semiconductor film 166 has a multilayer structure. Specifically, the oxide semiconductor film 166 includes an oxide semiconductor film 167a in contact with the insulating film 164, an oxide semiconductor film 167b in contact with the oxide semiconductor film 167a, and an oxide semiconductor film 167c in contact with the oxide semiconductor film 167b, the conductive film 170, the conductive film 172, the insulating film 168, and the insulating film 176. The other components are the same as those of the transistor 190 and the of similar to that in the case of the transistor 190 is obtained.

The oxide semiconductor film 167a, the oxide semiconductor film 167b, and the oxide semiconductor film 167c can be formed using the material and the crystalline structure of the oxide semiconductor film 107a, the oxide semiconductor film 107b, and the oxide semiconductor film 107c in Embodiment 1, as appropriate.

The oxide semiconductor film 167a and the oxide semiconductor film 167c in each of which oxygen vacancies are less likely to be generated than in the oxide semiconductor film 167b are provided in contact with an upper surface and a lower surface of the oxide semiconductor film 167b, whereby oxygen vacancies in the oxide semiconductor film 167b can be reduced. Furthermore, because the oxide semiconductor film 167b is in contact with the oxide semiconductor film 167a and the oxide semiconductor film 167c that contain one or more metal elements forming the oxide semiconductor film 167b, the densities of interface levels at the interface between the oxide semiconductor film 167a and the oxide semiconductor film 167b and at the interface between the oxide semiconductor film 167b and the oxide semiconductor film 167c are extremely low. Accordingly, oxygen vacancies in the oxide semiconductor film 167b can be reduced.

Furthermore, providing the oxide semiconductor film 167a makes it possible to reduce variations in the electrical characteristics of the transistor, such as a threshold voltage.

Furthermore, because the oxide semiconductor film 167c containing one or more kinds of metal elements forming the oxide semiconductor film 167b is provided in contact with the oxide semiconductor film 167b, scattering of carriers does not easily occur at the interface between the oxide semiconductor film 167b and the oxide semiconductor film 167c, and thus the field-effect mobility of the transistor can be increased.

Furthermore, the oxide semiconductor film 167a and the oxide semiconductor film 167c each also serve as a barrier film which suppresses formation of an impurity state due to the entry of the constituent element of the insulating films 164 and 168 or the constituent element of the conductive films 170 and 172 into the oxide semiconductor film 167b.

From the above, variation in the electrical characteristics such as threshold voltage is reduced in the transistor described in this embodiment.

FIGS. 16A to 16C show a transistor having a structure different from that shown in FIGS. 15A to 15C.

FIGS. 16A to 16C are a top view and cross-sectional views of the transistor 193 included in a semiconductor device. FIG. 16A is a top view of the transistor 193. FIG. 16B is a cross-sectional view along the dashed-dotted line Y3-Y4 in FIG. 16A. FIG. 16C is a cross-sectional view along the dashed-dotted line X3-X4 in FIG. 16A.

As in the transistor 193 shown in FIGS. 16A to 16C, the oxide semiconductor film 166 may have a stacked-layer structure including the oxide semiconductor film 167b in contact with the insulating film 164 and the oxide semiconductor film 167c in contact with the oxide semiconductor film 167b and the insulating film 168. The other components are the same as those of the transistor 190 and the effect similar to that in the case of the transistor 190 is obtained.
<Method 1 for Manufacturing Semiconductor Device>

Next, a method for manufacturing the transistor 190 and the transistor 194 illustrated in FIGS. 12A and 12B will be described with reference to FIGS. 18A and 18B, FIGS. 19A to 19C, and FIGS. 20A to 20C.

Figure 18A:
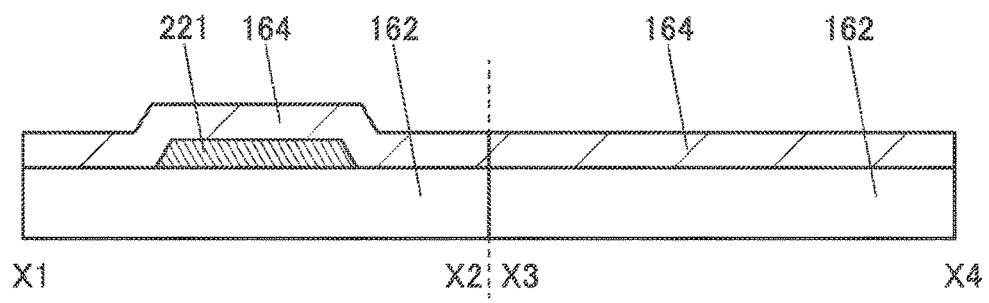
FIGS. 18A and 18B are cross-sectional views illustrating one embodiment of a manufacturing process of a semiconductor device.

As shown in FIG. 18A, the conductive film 221 is formed over the substrate 162, and the insulating film 164 is formed over the conductive film 221.

The conductive film 221 can be formed by the formation method of the conductive film 201 in Embodiment 1 as appropriate.

The insulating film 164 can be formed by the formation method of the insulating film 104 in Embodiment 1 as appropriate.

Figure 18B:
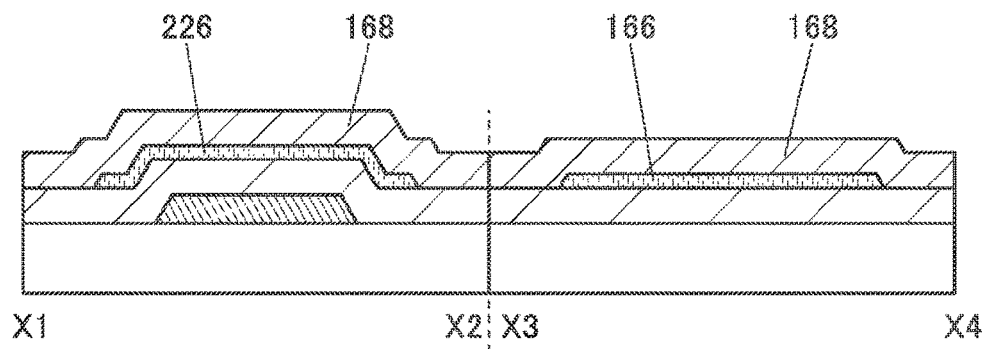

Next, the oxide semiconductor film 166 and the oxide semiconductor film 226 are formed over the insulating film 164 as shown in FIG. 18B. Next, the insulating film 168 is formed over the insulating film 164, the oxide semiconductor film 166, and the oxide semiconductor film 226. The oxide semiconductor film 166, the oxide semiconductor film 226, and the insulating film 168 can be formed by the formation method of the oxide semiconductor film 106 and the insulating film 108 in Embodiment 1, as appropriate.

Figure 19A:
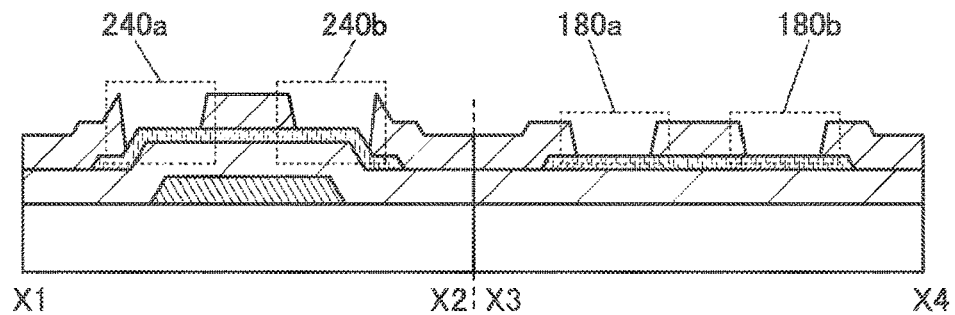
FIGS. 19A to 19C are cross-sectional views illustrating one embodiment of a manufacturing process of a semiconductor device.

Next, after a mask is formed over the insulating film 168 by a lithography process, part of the insulating film 168 is etched, whereby the opening portion 180a and the opening portion 180b which expose part of the oxide semiconductor film 166 and the opening portion 240a and the opening portion 240b which expose part of the oxide semiconductor film 226 are formed as shown in FIG. 19A.

Figure 19B:
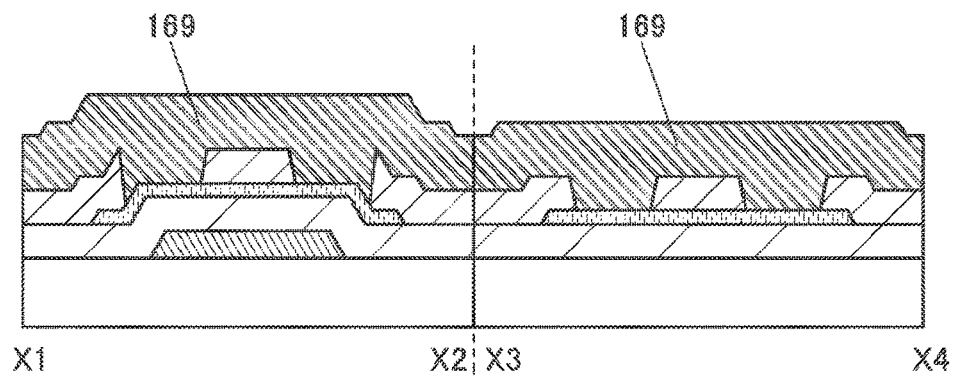

Next, as shown in FIG. 19B, the conductive film 169 is formed over the oxide semiconductor film 166, the oxide semiconductor film 226, and the insulating film 168.

The conductive film 169 can be formed by the formation method of the conductive film 201 in Embodiment 1 as appropriate.

Figure 19C:
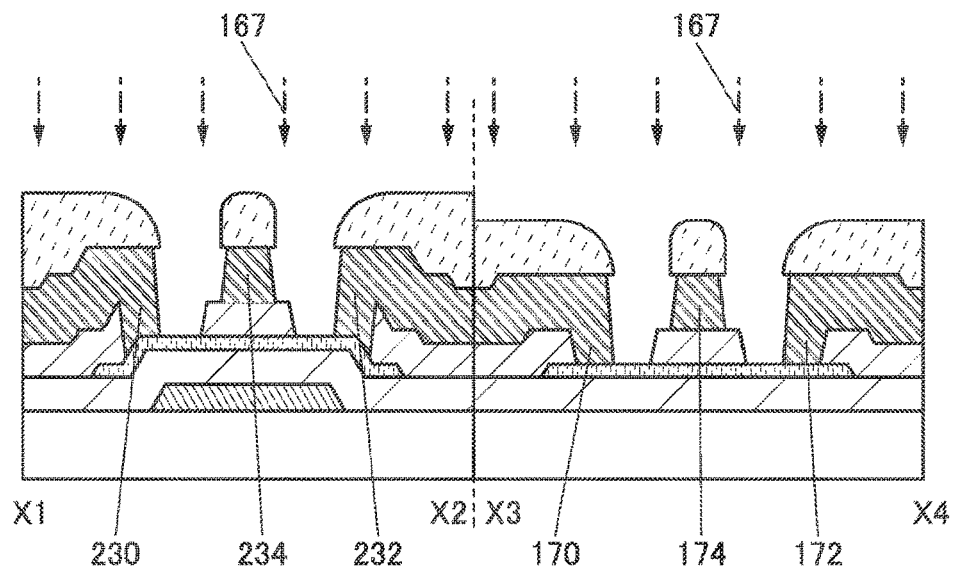

Next, after a mask 111 is formed over the conductive film 169 by a lithography process, the conductive film 169 is exposed to an etchant or/and an etching gas 167, whereby the conductive film 170, the conductive film 172, the conductive film 174, the conductive film 230, the conductive film 232, and the conductive film 234 are formed as shown in FIG. 19C.

As a method for etching the conductive film 169, a wet etching method or/and a dry etching method can be employed as appropriate.

Note that the conductive film 170, the conductive film 172, the conductive film 174, the conductive film 230, the conductive film 232, and the conductive film 234 may be formed by an electrolytic plating method, a printing method, an inkjet method, or the like instead of the above formation method.

Figure 20A:
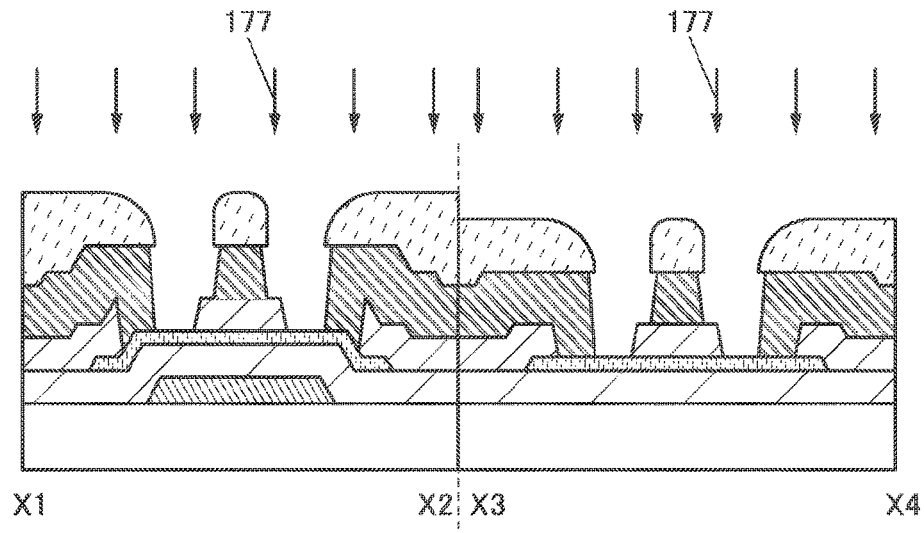
FIGS. 20A to 20C are cross-sectional views illustrating one embodiment of a manufacturing process of a semiconductor device.

Next, as shown in FIG. 20A, a rare gas is added as the impurity element 177 to the oxide semiconductor film 166 and the oxide semiconductor film 226 with the mask 111 left. As a result, the impurity element is added to regions which are not covered with the mask 111 in the oxide semiconductor films. Note that by the addition of the impurity element 177, oxygen vacancy is formed in the oxide semiconductor film.

As a method for adding the impurity element 177, the method for adding the impurity element 117 described in Embodiment 1 can be used as appropriate.

FIGS. 21A to 21C are conceptual diagrams of a region to which the impurity element 177 is added in a thickness direction when the impurity element is added to the oxide semiconductor film 166. Note that here, description is made using an enlarged view of the vicinity of the oxide semiconductor film 166 included in the transistor 190 as a typical example.

As shown in FIG. 21A, a region to which the impurity element 177 is added is formed in the insulating film 164, the oxide semiconductor film 166, and the insulating film 168 in some cases. Note that an end portion 195 of the region to which the impurity element 177 is added is positioned inside the insulating film 164 in a depth direction of a region where the oxide semiconductor film 166 is exposed.

Alternatively, as shown in FIG. 21B, a region to which the impurity element 177 is added is formed in the oxide semiconductor film 166 and the insulating film 168 in some cases. Note that an end portion 196 of the region to which the impurity element 177 is added is positioned at the interface between the insulating film 164 and the oxide semiconductor film 166 in a depth direction of a region where the oxide semiconductor film 166 is exposed.

Still alternatively, as shown in FIG. 21C, a region to which the impurity element 177 is added is formed in the oxide semiconductor film 166 and the insulating film 168 in some cases. Note that an end portion 197 of the region to which the impurity element 177 is added is positioned inside the oxide semiconductor film 166 in a depth direction of a region where the oxide semiconductor film 166 is exposed.

Figure 20B:
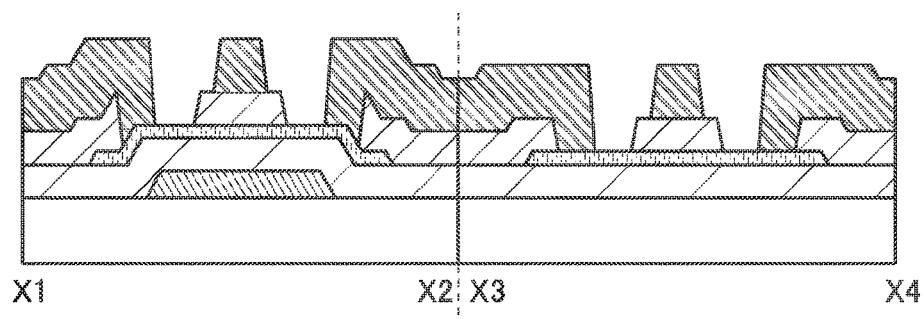

After that, the mask 111 is removed as shown in FIG. 20B.

Note that here, the impurity element 177 is added to the oxide semiconductor film 166 and the oxide semiconductor film 226 using the mask 111; alternatively, the impurity element 177 may be added to the oxide semiconductor film 166 and the oxide semiconductor film 226 using the conductive film 170, the conductive film 172, the conductive film 174, the conductive film 230, the conductive film 232, and the conductive film 234 as masks after the mask 111 is removed.

In the case where the oxide semiconductor film 166 and the oxide semiconductor film 226 are damaged and oxygen vacancy is formed in a step of forming the conductive film 169, a step of etching the conductive film 169, or a step of forming the insulating film 176 which is to be described later, the impurity element 177 is not necessarily added.

Figure 20C:
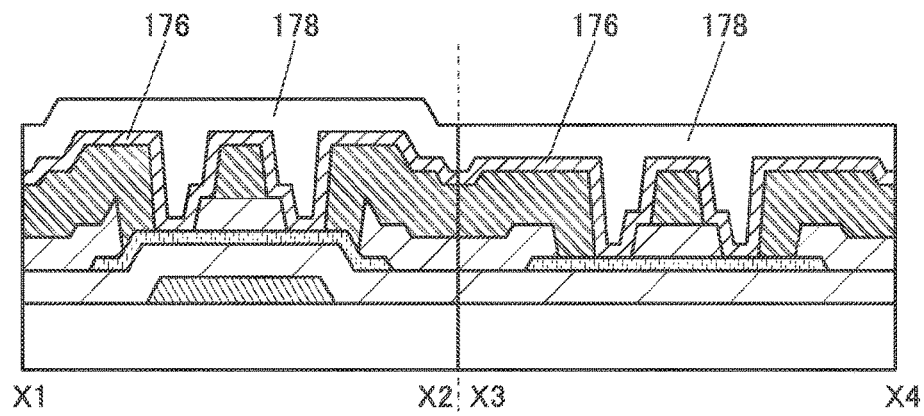

Next, as shown in FIG. 20C, the insulating film 176 may be formed over the oxide semiconductor film 166, the insulating film 168, the conductive film 170, the conductive film 172, the conductive film 174, the oxide semiconductor film 226, the conductive film 230, the conductive film 232, and the conductive film 234, and the insulating film 178 may be formed over the insulating film 176.

As a method for forming the insulating film 176, a sputtering method, a CVD method, a vacuum evaporation method, a pulsed laser deposition (PLD) method, or the like is given. Note that a silicon nitride film containing hydrogen can be formed by a plasma CVD method using silane and ammonia as a source gas or using silane and nitrogen as a source gas. Furthermore, by using a plasma CVD method, the oxide semiconductor film 166 can be damaged, and oxygen vacancy can be formed in the oxide semiconductor film 166.

Since hydrogen is contained in the insulating film 176, when the insulating film 176 is in contact with the region to which the impurity element is added in the oxide semiconductor film 166 and the oxide semiconductor film 226, hydrogen contained in the insulating film 176 moves to the region to which the impurity element is added in the oxide semiconductor film. Since oxygen vacancy is included in the region to which the impurity element is added, the low-resistance region can be formed in the oxide semiconductor film 166 and the oxide semiconductor film 226. Specifically, the region 166b and the region 166c shown in FIG. 13 can be formed. Note that the impurity element concentration of the region 166c is lower than the impurity element concentration of the region 166b because the impurity element is added to the oxide semiconductor film 166 and the oxide semiconductor film 226 through the insulating film 168.

By forming the insulating film 176 while heating is performed, hydrogen contained in the oxide semiconductor film is diffused. However, when hydrogen moves to the oxygen vacancy, the hydrogen becomes stable in terms of energy; therefore, hydrogen is unlikely to move from the oxygen vacancy. Furthermore, by interaction between the oxygen vacancy and the hydrogen, an electron serving as a carrier is produced. Thus, by forming the insulating film 176 while heating is performed, the low-resistance region with small variation in conductivity can be formed.

After that, heat treatment may be performed to further increase the conductivity of the region to which the impurity element 177 is added. The heat treatment is performed typically at a temperature higher than or equal to 150° C. and lower than the strain point of the substrate, higher than or equal to 250° C. and lower than or equal to 450° C., or higher than or equal to 300° C. and lower than or equal to 450° C. As a result, the conductivity of the low-resistance region can be increased, and variation in the conductivity of the low-resistance region can be reduced.

The insulating film 178 can be formed by any of the formation methods of the insulating film 164 and the insulating film 168 as appropriate.

Note that, as the insulating film 178, a silicon oxide film or a silicon oxynitride film from which oxygen can be released by heat treatment can be formed under the following conditions: the substrate placed in a treatment chamber of the plasma CVD apparatus that is vacuum-evacuated is held at a temperature higher than or equal to 180° C. and lower than or equal to 280° C., or higher than or equal to 200° C. and lower than or equal to 240° C., the pressure is greater than or equal to 100 Pa and less than or equal to 250 Pa, or greater than or equal to 100 Pa and less than or equal to 200 Pa with introduction of a source gas into the treatment chamber, and a high-frequency power of greater than or equal to 0.17 W/cm$^2$ and less than or equal to 0.5 W/cm$^2$, or greater than or equal to 0.25 W/cm$^2$ and less than or equal to 0.35 W/cm$^2$ is supplied to an electrode provided in the treatment chamber.

Through the above-described process, the transistor can be manufactured.

<Method 2 for Manufacturing Semiconductor Device>

A method for manufacturing the transistor 191 illustrated in FIGS. 14A to 14C is described. Note that here, a step of forming the conductive film 170c, the conductive film 172c, and the conductive film 174c which are included in the conductive film 170, the conductive film 172, and the conductive film 174 in the transistor 191 and a step of adding the impurity element 177 to the oxide semiconductor film 166 are described.

Through the steps shown in FIGS. 18A and 18B and FIGS. 19A to 19C, the insulating film 164, the oxide semiconductor film 166, the insulating film 168, the conductive film 170, the conductive film 172, the conductive film 174, and the mask 111 are formed over the substrate 162.

Next, as shown in FIG. 20A, the impurity element 177 is added to the oxide semiconductor film 166.

Next, the mask 111 is removed.

Next, the conductive film 170b, the conductive film 172b, and the conductive film 174b which are included in the conductive film 170, the conductive film 172, and the conductive film 174, respectively, are exposed to plasma generated in a reducing atmosphere so that an oxide on surfaces of the conductive film 170b, the conductive film 172b, and the conductive film 174b is reduced. Next, the conductive film 170b, the conductive film 172b, and the conductive film 174b are exposed to silane while heating is performed at a temperature higher than or equal to 200° C. and lower than or equal to 400° C. Next, the conductive film 170b, the conductive film 172b, and the conductive film 174b are exposed to plasma generated in an atmosphere containing nitrogen, such as an atmosphere of ammonia or nitrogen, whereby $CuSi_xN_y$ (x>0, y>0) can be formed as the conductive film 170c, the conductive film 172c, and the conductive film 174c.

Note that in performing the exposure to the plasma generated in an atmosphere containing nitrogen, such as an atmosphere of ammonia or nitrogen, the oxide semiconductor film 166 is exposed to the plasma generated in the atmosphere containing nitrogen, such as an atmosphere of ammonia or nitrogen. Therefore, nitrogen or/and hydrogen can be added to the oxide semiconductor film 166.

Note that before the impurity element 177 is added to the oxide semiconductor film 166, the mask 111 may be removed and the conductive film 170c, the conductive film 172c, and the conductive film 174c which are included in the conductive film 170, the conductive film 172, and the conductive film 174 may be formed.

Then, the step shown in FIG. 20C is performed, whereby the transistor 191 can be manufactured.

<Method 3 for Manufacturing Semiconductor Device>

Another method for manufacturing the transistor 190 illustrated in FIGS. 12A and 12B is described. Note that here, a step of adding the impurity element and a step of forming the insulating film 176 are described with reference to FIGS. 22A to 22C.

Figure 22A:
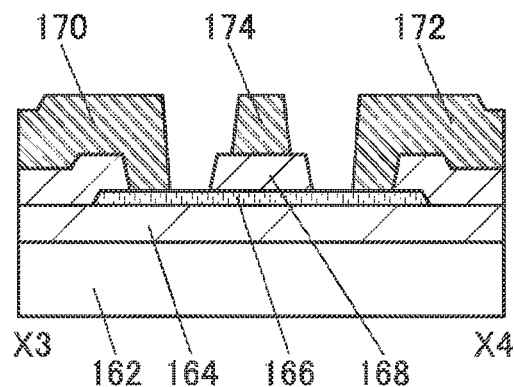
FIGS. 22A to 22C are cross-sectional views illustrating one embodiment of a manufacturing process of a semiconductor device.

Through the steps shown in FIGS. 18A and 18B and FIGS. 19A to 19C, the insulating film 164, the oxide semiconductor film 166, the insulating film 168, the conductive film 170, the conductive film 172, the conductive film 174, and the mask 111 are formed over the substrate 162. After that, the mask 111 is removed as shown in FIG. 22A.

Figure 22B:
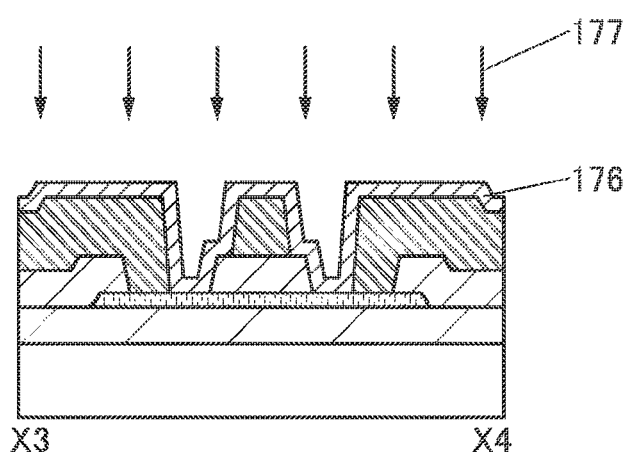

Next, as shown in FIG. 22B, after the insulating film 176 is formed over the oxide semiconductor film 166, the insulating film 168, the conductive film 170, the conductive film 172, and the conductive film 174, the impurity element 177 is added to the oxide semiconductor film 166 through the insulating film 176 using the conductive film 170, the conductive film 172, and the conductive film 174 as masks.

Figure 22C:
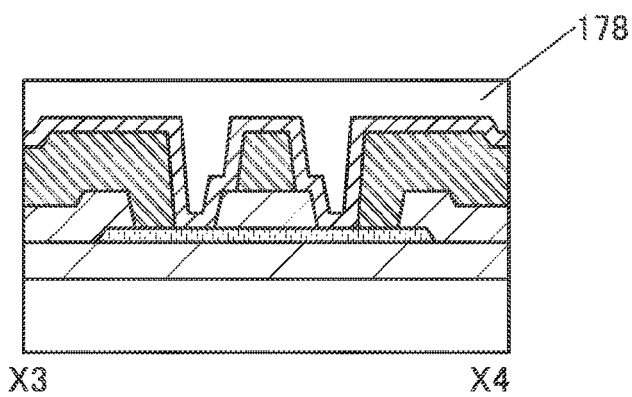

Next, the insulating film 178 may be formed as shown in FIG. 22C. Through the above-described process, the transistor 190 can be manufactured.

In the transistor described in this embodiment, the conductive films serving as a source electrode and a drain electrode do not overlap with the conductive film serving as a gate electrode, and thus, parasitic capacitance can be reduced and on-state current is high. Furthermore, in the transistor described in this embodiment, the low-resistance region can be formed stably; therefore, on-state current is higher and variation in the electrical characteristics of the transistor is more reduced than in a conventional transistor.

The structures, methods, and the like described in this embodiment can be used as appropriate in combination with any of the structures, methods, and the like described in the other embodiments.

Embodiment 3

In this embodiment, one embodiment of a semiconductor device and a manufacturing method thereof will be described with reference to FIGS. 23A and 23B, FIGS. 24A and 24B, FIGS. 25A to 25C, FIGS. 26A to 26C, FIGS. 27A to 27C, FIGS. 28A and 28B, FIGS. 29A and 29B, FIGS. 30A to 30D, FIGS. 31A to 31C, FIGS. 32A to 32C, FIGS. 33A and 33B, FIGS. 34A to 34D, and FIGS. 35A to 35C. Note that this embodiment differs from Embodiment 1 in that a method for forming a conductive film serving as a gate electrode is different from a method for forming a conductive film serving as a source electrode and a conductive film serving as a drain electrode. Furthermore, as a method for forming a low-resistance region included in a transistor, the method in Embodiment 2 is used.

<Structure 1 of Semiconductor Device>

Figure 23A:
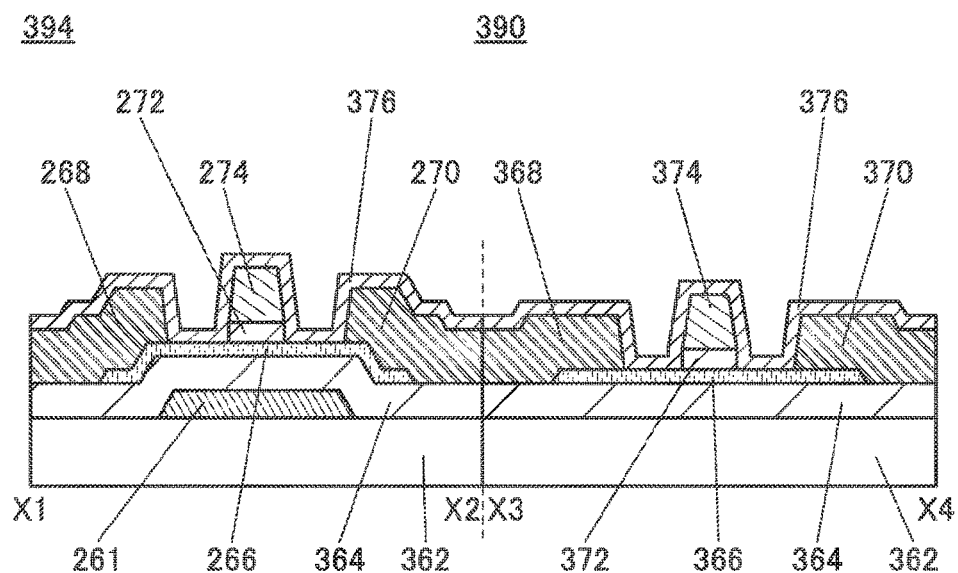
FIGS. 23A and 23B are cross-sectional views illustrating one embodiment of a manufacturing process of a semiconductor device.
Figure 23B:
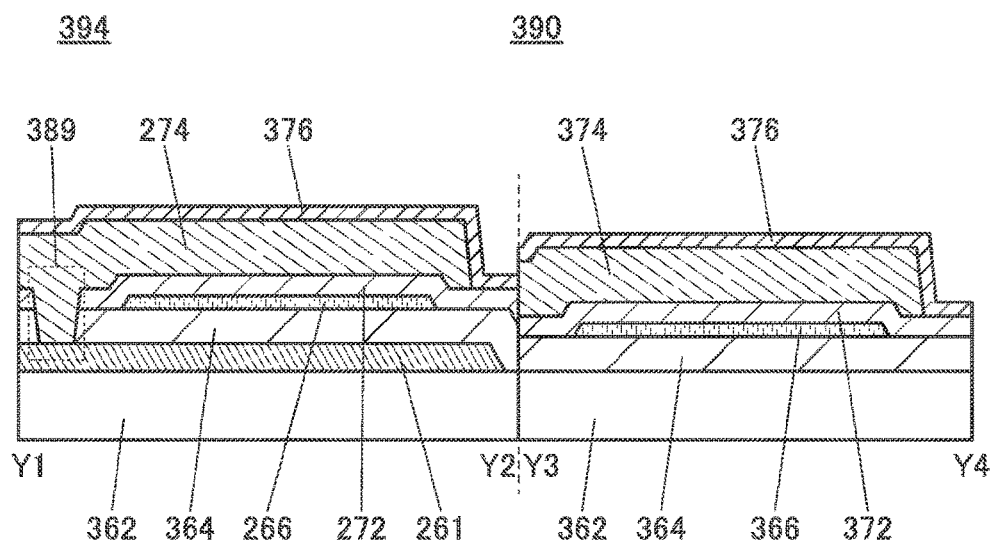

In FIGS. 23A and 23B, a transistor having a top-gate structure is shown as an example of a transistor included in a semiconductor device.

Figure 28A:
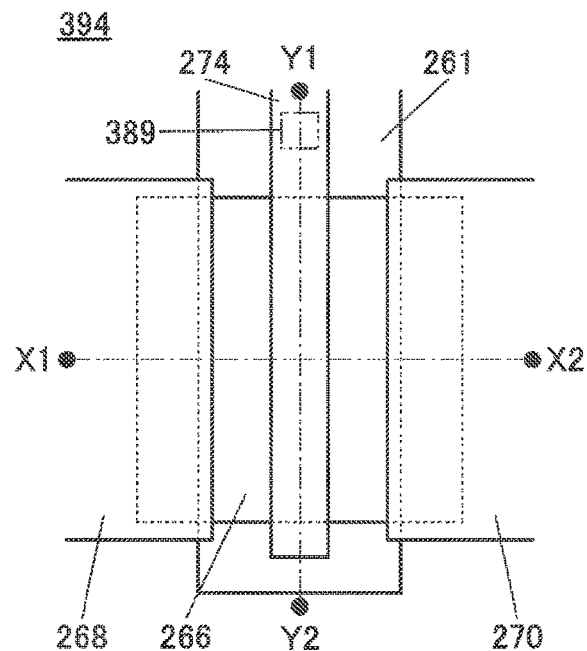
FIGS. 28A and 28B are top views illustrating one embodiment of a semiconductor device.
Figure 28B:
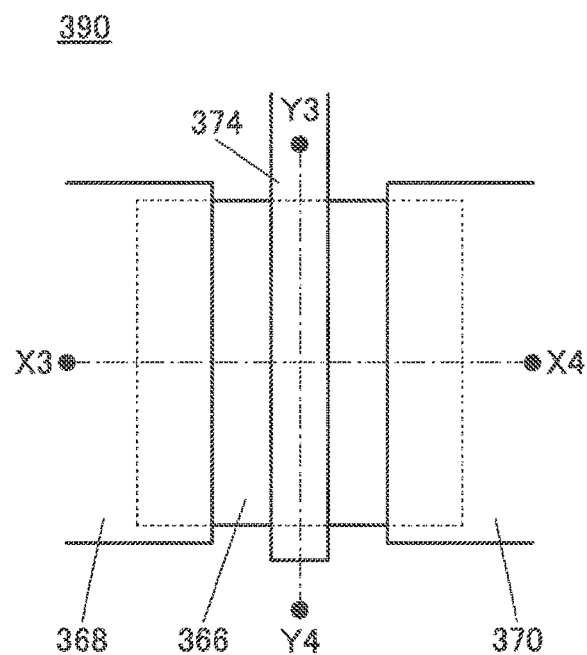

FIGS. 28A and 28B are top views of a transistor 394 provided in a driver circuit portion and a transistor 390 provided in a pixel portion. FIGS. 23A and 23B are cross-sectional views of the transistor 394 and the transistor 390. FIG. 28A is the top view of the transistor 394, and FIG. 28B is the top view of the transistor 390. FIG. 23A shows cross-sectional views along the dashed-dotted line X1-X2 in FIG. 28A and the dashed-dotted line X3-X4 in FIG. 28B. FIG. 23B shows cross-sectional views along the dashed-dotted line Y1-Y2 in FIG. 28A and the dashed-dotted line Y3-Y4 in FIG. 28B. FIG. 23A shows a cross-sectional view of the transistor 390 in a channel length direction, and FIG. 23B shows a cross-sectional view of the transistor 390 in a channel width direction.

The transistor 390 shown in FIGS. 23A and 23B includes an oxide semiconductor film 366 over an insulating film 364 formed over a substrate 362; a conductive film 368, a conductive film 370, and an insulating film 372 in contact with the oxide semiconductor film 366; and a conductive film 374 overlapping with the oxide semiconductor film 366 with the insulating film 372 provided therebetween. Note that an insulating film 376 is provided over the transistor 390.

The transistor 394 shown in FIGS. 23A and 23B includes an oxide semiconductor film 266 over the insulating film 364 formed over the substrate 362; a conductive film 268, a conductive film 270, and an insulating film 272 in contact with the oxide semiconductor film 266; and a conductive film 274 overlapping with the oxide semiconductor film 266 with the insulating film 272 provided therebetween.

The transistor 394 is characterized in that a conductive film 261 is provided so as to overlap with the oxide semiconductor film 266 with the insulating film 364 provided therebetween. That is, the conductive film 261 serves as a gate electrode. Furthermore, the transistor 394 is a transistor having a dual-gate structure. The other components are the same as those of the transistor 390 and the effect similar to that in the case of the transistor 390 is obtained.

By supplying different potentials to the conductive film 274 and the conductive film 261 which are not connected to each other, the threshold voltage of the transistor 394 can be controlled. Alternatively, as shown in FIG. 23B, by supplying the same potential to the conductive film 274 and the conductive film 261 which are connected to each other, variations in the initial characteristics can be reduced, and degradation of the transistor due to the −GBT stress test and a change in the rising voltage of the on-state current at different drain voltages can be suppressed. In addition, a region where carriers flow in the oxide semiconductor film 266 becomes larger in the film thickness direction, so that the amount of carrier movement is increased. As a result, the on-state current and field-effect mobility of the transistor 394 are increased. When the channel length of the transistor is less than 2.5 µm, preferably greater than or equal to 1.45 µm and less than or equal to 2.2 µm, the on-state current can be further increased and the field-effect mobility can be increased.

In the display device described in this embodiment, the transistor in the driver circuit portion and the transistor in the pixel portion have different structures. The transistor included in the driver circuit portion has a dual-gate structure. That is, the field-effect mobility of the transistor included in the driver circuit portion is higher than that of the transistor included in the pixel portion.

Furthermore, in the display device, the transistor included in the driver circuit portion and the transistor included in the pixel portion may have different channel lengths.

Typically, the channel length of the transistor 394 included in the driver circuit portion can be less than 2.5 µm, or greater than or equal to 1.45 µm and less than or equal to 2.2 µm. The channel length of the transistor 390 included in the pixel portion can be greater than or equal to 2.5 µm, or greater than or equal to 2.5 µm and less than or equal to 20 µm.

When the channel length of the transistor 394 included in the driver circuit portion is less than 2.5 µm, preferably greater than or equal to 1.45 µm and less than or equal to 2.2 µm, as compared with the transistor 390 included in the pixel portion, the field-effect mobility can be increased, and the amount of on-state current can be increased. Consequently, a driver circuit portion capable of high-speed operation can be formed. Furthermore, because the on-state current of the transistor included in the pixel portion can be increased, display unevenness in the pixel portion can be suppressed.

When the transistor in the driver circuit portion has high field-effect mobility, the number of input terminals can be made small.

In the oxide semiconductor film 366, an element which forms an oxygen vacancy is included in a region which does not overlap with the conductive film 368, the conductive film 370, and the conductive film 374. In the oxide semiconductor film 266, an element which forms an oxygen vacancy is included in a region which does not overlap with the conductive film 268, the conductive film 270, and the conductive film 274. Hereinafter, the elements which form oxygen vacancies are described as impurity elements. Typical examples of the impurity elements are hydrogen, rare gas elements, and the like. Typical examples of the rare gas elements are helium, neon, argon, krypton, and xenon.

Furthermore, as the impurity element, boron, carbon, nitrogen, fluorine, aluminum, silicon, phosphorus, chlorine, or the like may be contained in the oxide semiconductor film 366 and the oxide semiconductor film 266.

The insulating film 376 is a film containing hydrogen, and a nitride insulating film is a typical example thereof. The insulating film 376 is in contact with the oxide semiconductor film 366 and the oxide semiconductor film 266. Therefore, hydrogen contained in the insulating film 376 is diffused into the oxide semiconductor film 366 and the oxide semiconductor film 266. As a result, much hydrogen is contained in a region in contact with the insulating film 376 in the oxide semiconductor film 366 and the oxide semiconductor film 266.

When a rare gas element is added as the impurity element to the oxide semiconductor film, a bond between a metal element and oxygen in the oxide semiconductor film is cut, whereby an oxygen vacancy is formed. By interaction between hydrogen and oxygen vacancy included in the oxide semiconductor film, the conductivity of the oxide semiconductor film is increased. Specifically, when hydrogen enters the oxygen vacancy in the oxide semiconductor film, an electron serving as a carrier is generated. As a result, the conductivity is increased.

Figure 24A:
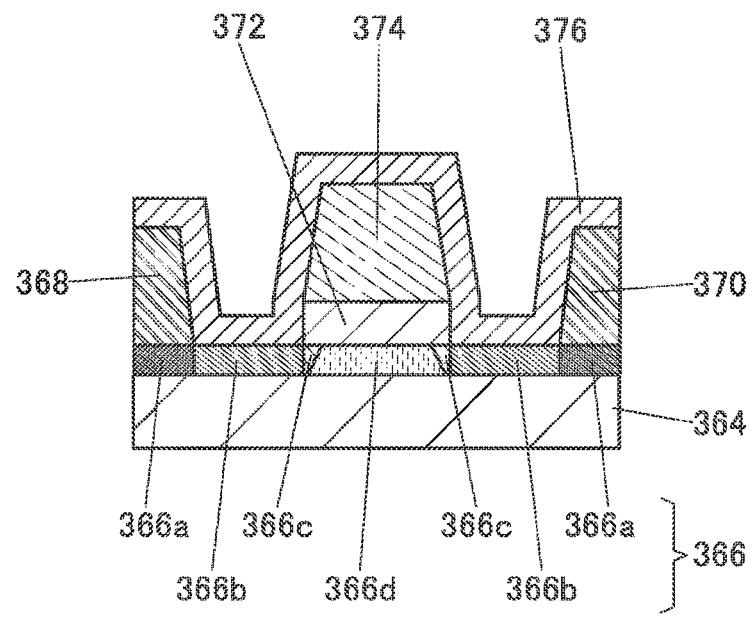
FIGS. 24A and 24B are cross-sectional views illustrating one embodiment of a semiconductor device.
Figure 24B:
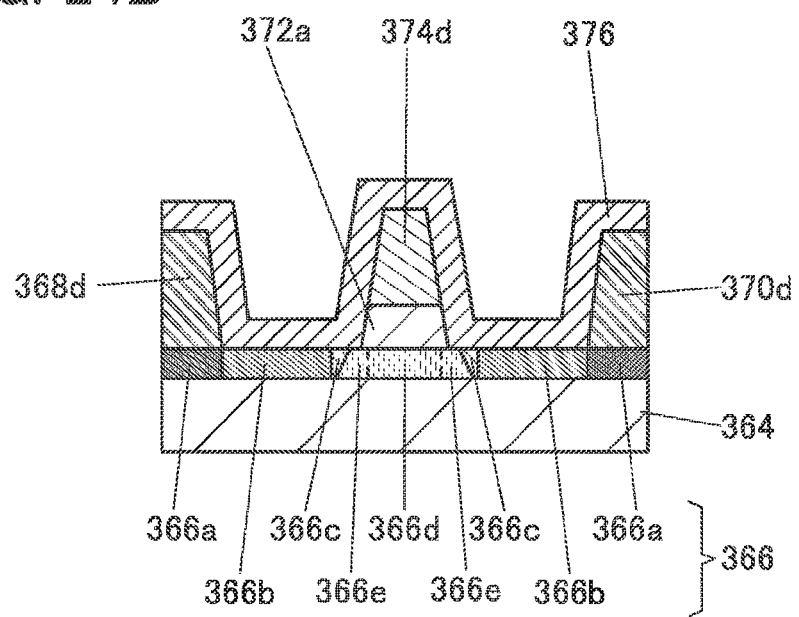

FIGS. 24A and 24B are enlarged views of the vicinity of the oxide semiconductor film 366. Note that description is made using an enlarged view of the vicinity of the oxide semiconductor film 366 included in the transistor 390 as a typical example. As shown in FIGS. 24A and 24B, the oxide semiconductor film 366 includes a region 366a in contact with the conductive film 368 or the conductive film 370, a region 366b in contact with the insulating film 376, and a region 366d in contact with the insulating film 372. Note that in the case where a side surface of the conductive film 374 has a tapered shape, a region 366c overlapping with the tapered portion of the conductive film 374 may be provided.

The regions 366a serve as a source region and a drain region. Like the regions 106a described in Embodiment 1, the regions 366a in contact with the conductive film 368 and the conductive film 370 have high conductivity and serve as a source region and a drain region.

The region 366b serves as a low-resistance region. The region 366b contains at least a rare gas and hydrogen as the impurity elements. Note that in the case where the side surface of the conductive film 374 has a tapered shape, the impurity element is added to the region 366c through the tapered portion of the conductive film 374. Therefore, although the region 366c has a lower concentration of rare gas elements as an example of the impurity element than the region 366b, the impurity element is contained. By providing the region 366c, a source-drain breakdown voltage of the transistor can be increased.

In the case where the oxide semiconductor film 366 is formed by a sputtering method, the regions 366a to 366d each contain a rare gas element. In addition, the rare gas element concentration of each of the regions 366b and 366c is higher than that of each of the regions 366a and 366d. The reasons are as follows: in the case where the oxide semiconductor film 366 is formed by a sputtering method, a rare gas is used as a sputtering gas, so that the oxide semiconductor film 366 contains the rare gas; and a rare gas is intentionally added to the regions 366b and 366c in order to form oxygen vacancies in the regions 366b and 366c. Note that a rare gas element different from that added to the regions 366a and 366d may be added to the regions 366b and 366c.

Since the region 366b is in contact with the insulating film 376, the concentration of hydrogen in the region 366b is higher than the concentration of hydrogen in the region 366a and the concentration of hydrogen in the region 366d. In the case where hydrogen is diffused from the region 366b to the region 366c, the concentration of hydrogen in the region 366c is higher than the concentration of hydrogen in the region 366a and the concentration of hydrogen in the region 366d. Note that the concentration of hydrogen in the region 366b is higher than the concentration of hydrogen in the region 366c.

In the regions 366b and 366c, the concentration of hydrogen which is measured by SIMS can be higher than or equal to $8\times10^{19}$ atoms/cm$^3$, higher than or equal to $1\times10^{20}$ atoms/cm$^3$, or higher than or equal to $5\times10^{20}$ atoms/cm$^3$. Note that in the regions 366a and 366d, the concentration of hydrogen which is measured by SIMS can be lower than or equal to $5\times10^{19}$ atoms/cm$^3$, lower than or equal to $1\times10^{19}$ atoms/cm$^3$, lower than or equal to $5\times10^{18}$ atoms/cm$^3$, lower than or equal to $1\times10^{18}$ atoms/cm$^3$, lower than or equal to $5\times10^{17}$ atoms/cm$^3$, or lower than or equal to $1\times10^{16}$ atoms/cm$^3$.

In the case where boron, carbon, nitrogen, fluorine, aluminum, silicon, phosphorus, or chloride is added as the impurity element to the oxide semiconductor film 366, the impurity element is contained in only the regions 366b and 366c. Thus, the impurity element concentration of each of the regions 366b and 366c is higher than the impurity element concentration of each of the regions 366a and 366d. Note that, in the region 366b and the region 366c, the impurity element concentration which is measured by SIMS can be higher than or equal to $1\times10^{18}$ atoms/cm$^3$ and lower than or equal to $1\times10^{22}$ atoms/cm$^3$, higher than or equal to $1\times10^{19}$ atoms/cm$^3$ and lower than or equal to $1\times10^{21}$ atoms/cm$^3$, or higher than or equal to $5\times10^{19}$ atoms/cm$^3$ and lower than or equal to $5\times10^{20}$ atoms/cm$^3$.

The regions 366b and 366c have higher hydrogen concentrations than the region 366d and have more oxygen vacancies than the region 366d because of addition of impurity elements. Therefore, the regions 366b and 366c have higher conductivity and serve as low-resistance regions. Thus, the resistivity of the regions 366b and 366c can be typically greater than or equal to $1\times10^{-3}$ Ωcm and less than $1\times10^4$ Ωcm, or greater than or equal to $1\times10^{-3}$ Ωcm and less than $1\times10^{-1}$ Ωcm.

Note that in the region 366b and the region 366c, when the amount of hydrogen is smaller than or equal to the amount of oxygen vacancy, hydrogen is easily captured by the oxygen vacancy and is not easily diffused into the region 366d that serves as a channel. As a result, a normally-off transistor can be manufactured.

The region 366d serves as a channel.

Furthermore, after the impurity element is added to the oxide semiconductor film 366 using the conductive film 368, the conductive film 370, and the conductive film 374 as masks, the area of the top surface shape of each of the conductive film 368, the conductive film 370, and the conductive film 374 may be reduced in the following manner. A slimming process is performed on a mask over the conductive film 368, the conductive film 370, and the conductive film 374 in a step of forming the conductive film 368, the conductive film 370, and the conductive film 374 to obtain a mask with a minuter structure. Then, the conductive film 368, the conductive film 370, and the conductive film 374 are etched using the mask, whereby a conductive film 368d, a conductive film 370d, and a conductive film 374d in FIG. 24B can be formed. As the slimming process, an aching process using an oxygen radical or the like can be employed, for example.

As a result, in the oxide semiconductor film 366, an offset region 366e is formed between the region 366c and the region 366d serving as a channel. Note that a decrease in the on-state current of the transistor can be suppressed when the length of the offset region 366e in the channel length direction is less than 0.1 μm.

The insulating film 372 and the insulating film 272 serve as gate insulating films.

The conductive film 368 and the conductive film 370 serve as a source electrode and a drain electrode, and the conductive film 268 and the conductive film 270 serve as a source electrode and a drain electrode.

The conductive film 374 and the conductive film 274 serve as gate electrodes.

In the transistors 390 and 394 described in this embodiment, the region 366b and/or the region 366c that serves as a low-resistance region is/are provided between the region 366d serving as a channel and the regions 366a serving as a source region and a drain region. Resistance between the channel and the source region and the drain region can be reduced, and the transistor 390 and the transistor 394 have high on-state current and high field-effect mobility.

In the transistor 390, the conductive film 374 does not overlap with the conductive films 368 and 370, and parasitic capacitance between the conductive film 374 and each of the conductive films 368 and 370 can be reduced. Furthermore, in the transistor 394, the conductive film 274 does not overlap with the conductive films 268 and 270, and parasitic capacitance between the conductive film 274 and each of the conductive films 268 and 270 can be reduced. As a result, in the case where a large-area substrate is used as the substrate 362, signal delay in the conductive film 368, the conductive film 370, the conductive film 374, the conductive film 268, the conductive film 270, and the conductive film 274 can be reduced.

In the transistor 390, a region including oxygen vacancy is formed by adding the rare gas element to the oxide semiconductor film 366 using the conductive film 368, the conductive film 370, and the conductive film 374 as masks. Furthermore, in the transistor 394, a region including oxygen vacancy is formed by adding the impurity element to the oxide semiconductor film 266 using the conductive film 268, the conductive film 270, and the conductive film 274 as masks. Furthermore, because the region including oxygen vacancy is in contact with the insulating film 376 containing hydrogen, hydrogen contained in the insulating film 376 is diffused into the region including oxygen vacancy, so that a low-resistance region is formed. That is, the low-resistance region can be formed in a self-aligned manner.

In the transistor 390 and the transistor 394 described in this embodiment, the rare gas is added to the region 366b to form oxygen vacancy, and furthermore, hydrogen is added. Therefore, the conductivity of the region 366b can be increased, and variation in the conductivity of the region 366b between transistors can be reduced. That is, by adding the rare gas and hydrogen to the region 366b, the conductivity of the region 366b can be controlled.

The structure shown in FIGS. 23A and 23B is described in detail below.

As the substrate 362, the substrate 102 described in Embodiment 1 can be used as appropriate.

The insulating film 364 can be formed using the material for the insulating film 104 in Embodiment 1, as appropriate.

The oxide semiconductor film 366 and the oxide semiconductor film 266 can be formed using the material and the structure of the oxide semiconductor film 106 in Embodiment 1, as appropriate.

The insulating film 372 and the insulating film 272 can be formed using the material for the insulating film 108 in Embodiment 1, as appropriate.

The conductive films 368, 370, and 374 and the conductive films 261, 268, 270, and 274 can be formed using the material for the conductive films 110, 112, and 114 in Embodiment 1, as appropriate.

The insulating film 376 is a film containing hydrogen, and a nitride insulating film is a typical example thereof. The nitride insulating film can be formed using silicon nitride, aluminum nitride, or the like.

<Structure 2 of Semiconductor Device>

Next, another structure of the semiconductor device is described with reference to FIGS. 25A to 25C. Here, description is made using a transistor 391 as a modification example of the transistor 390 included in the pixel portion. The structure of the insulating film 364 or the structures of the conductive film 368, the conductive film 370, and the conductive film 374 of the transistor 391 can be used for the transistor 394 in the driver circuit portion as appropriate.

Figure 25A:
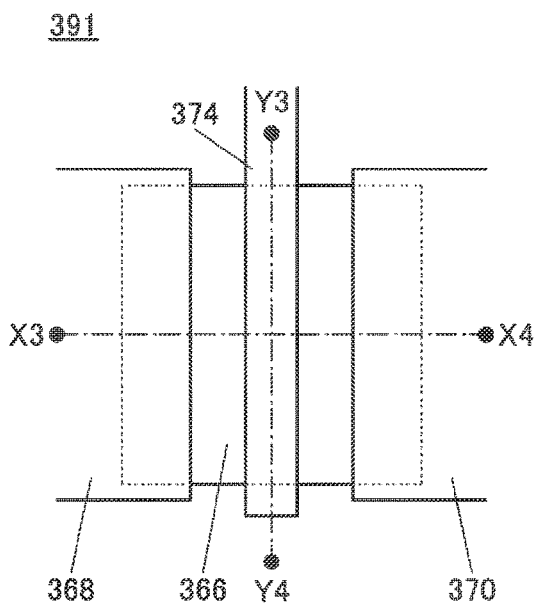
FIGS. 25A to 25C are a top view and cross-sectional views which illustrate one embodiment of a semiconductor device.
Figure 25B:
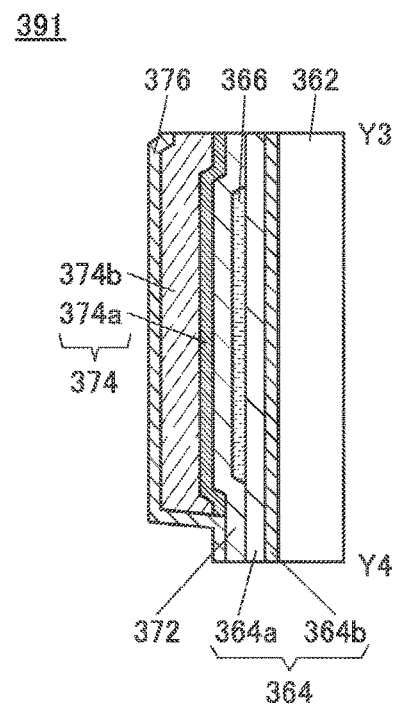
Figure 25C:
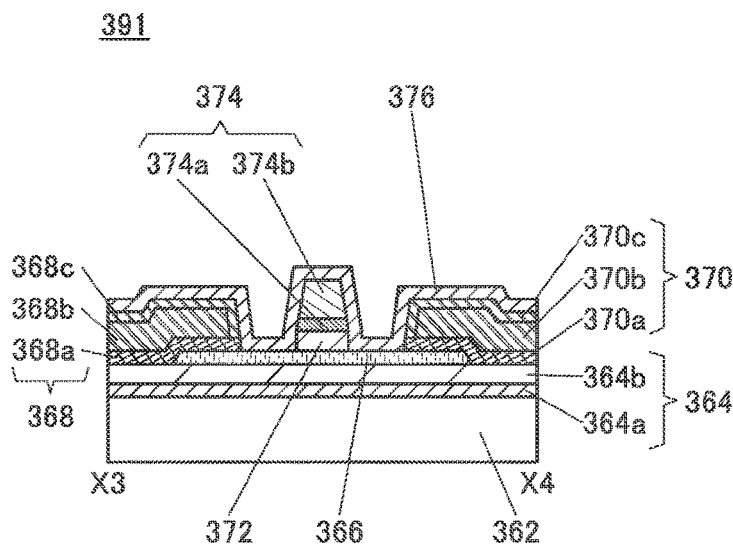

FIGS. 25A to 25C are a top view and cross-sectional views of the transistor 391 included in a semiconductor device. FIG. 25A is a top view of the transistor 391. FIG. 25B is a cross-sectional view along the dashed-dotted line Y3-Y4 in FIG. 25A. FIG. 25C is a cross-sectional view along the dashed-dotted line X3-X4 in FIG. 25A.

The transistor 391 shown in FIGS. 25A to 25C is characterized in that the conductive film 368, the conductive film 370, and the conductive film 374 each have a three-layer structure and in that the insulating film 364 has a stacked-layer structure of a nitride insulating film 364a and an oxide insulating film 364b. The other components are the same as those of the transistor 390, and the effect similar to that in the case of the transistor 390 is obtained.

First, the conductive film 368, the conductive film 370, and the conductive film 374 are described.

In the conductive film 368, a conductive film 368a, a conductive film 368b, and a conductive film 368c are stacked in this order, and the conductive film 368a and the conductive film 368c cover surfaces of the conductive film 368b. That is, the conductive film 368a and the conductive film 368c serve as protective films of the conductive film 368b.

In the conductive film 370, a conductive film 370a, a conductive film 370b, and a conductive film 370c are stacked in this order, and the conductive film 370a and the conductive film 370c cover surfaces of the conductive film 370b, in a manner similar to that of the conductive film 368.

In the conductive film 374, a conductive film 374a and a conductive film 374b are stacked in this order.

Like the conductive film 110a, the conductive film 112a, and the conductive film 114a in Embodiment 1, the conductive film 368a, the conductive film 370a, and the conductive film 374a can be formed using a material which prevents the metal element contained in the conductive film 368b, the conductive film 370b, and the conductive film 374b from being diffused into the oxide semiconductor film 366, as appropriate.

Like the conductive film 110b, the conductive film 112b, and the conductive film 114b in Embodiment 1, the conductive film 368b, the conductive film 370b, and the conductive film 374b can be formed using a low-resistance material, as appropriate.

Like the conductive film 110c, the conductive film 112c, and the conductive film 114c in Embodiment 1, the conductive film 368c and the conductive film 370c can be formed using a film in which the metal element contained in the conductive film 368b and the conductive film 370b is subjected to passivation. As a result, the metal element contained in the conductive film 368b and the conductive film 370b can be prevented from being moved to the oxide semiconductor film 366 in the step of forming the insulating film 376.

Next, the insulating film 364 in which the nitride insulating film 364a and the oxide insulating film 364b are stacked is described.

The nitride insulating film 364a and the oxide insulating film 364b can be formed using the material for the nitride insulating film 104a and the oxide insulating film 104b in Embodiment 1, as appropriate.

<Structure 3 of Semiconductor Device>

Next, another structure of the semiconductor device is described with reference to FIGS. 26A to 26C and FIGS. 27A to 27C. Here, description is made using a transistor 392 and a transistor 393 as modification examples of the transistor 390 included in the pixel portion. The structure of the oxide semiconductor film 366 included in the transistor 392 or the structure of the oxide semiconductor film 366 included in the transistor 393 can be used for the transistor 394 in the driver circuit portion as appropriate.

Figure 26A:
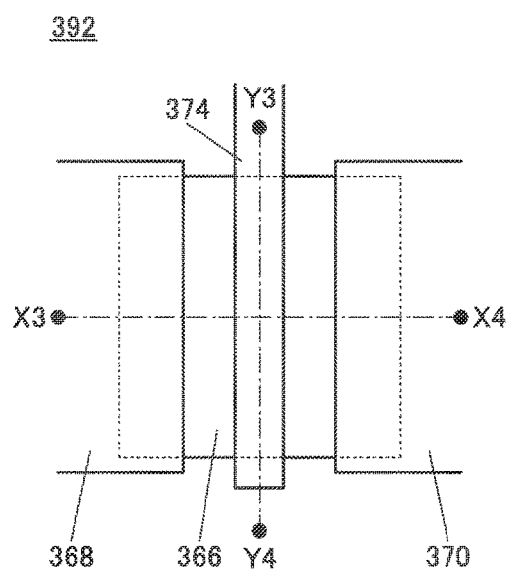
FIGS. 26A to 26C are a top view and cross-sectional views which illustrate one embodiment of a semiconductor device.
Figure 26B:
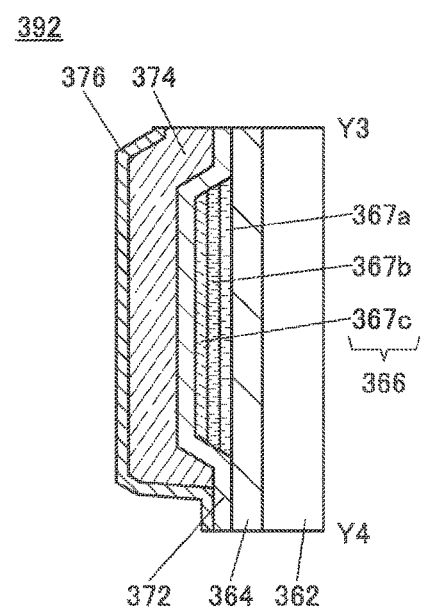
Figure 26C:
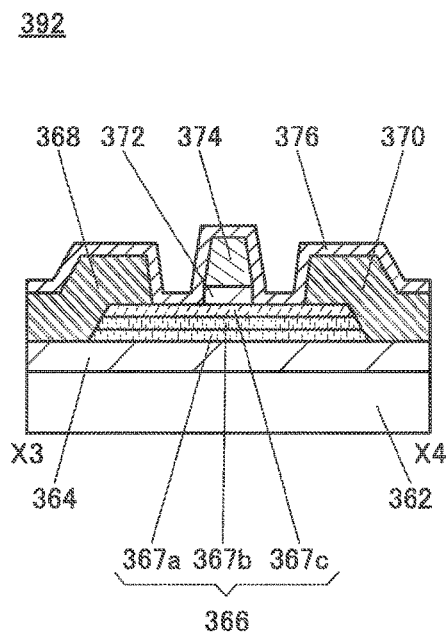

FIGS. 26A to 26C are a top view and cross-sectional views of the transistor 392 included in a semiconductor device. FIG. 26A is a top view of the transistor 392. FIG. 26B is a cross-sectional view along the dashed-dotted line Y3-Y4 in FIG. 26A. FIG. 26C is a cross-sectional view along the dashed-dotted line X3-X4 in FIG. 26A.

The transistor 392 shown in FIGS. 26A to 26C is characterized in that the oxide semiconductor film 366 has a multilayer structure. Specifically, the oxide semiconductor film 366 includes an oxide semiconductor film 367a in contact with the insulating film 364, an oxide semiconductor film 367b in contact with the oxide semiconductor film 367a, and an oxide semiconductor film 367c in contact with the oxide semiconductor film 367b, the conductive film 368, the conductive film 370, the insulating film 372, and the insulating film 376. The other components are the same as those of the transistor 390 and the effect similar to that in the case of the transistor 390 is obtained.

The oxide semiconductor film 367a, the oxide semiconductor film 367b, and the oxide semiconductor film 367c can be formed using the material and the crystalline structure of the oxide semiconductor film 107a, the oxide semiconductor film 107b, and the oxide semiconductor film 107c in Embodiment 1, as appropriate.

The oxide semiconductor film 367a and the oxide semiconductor film 367c in each of which oxygen vacancies are less likely to be generated than in the oxide semiconductor film 367b are provided in contact with an upper surface and a lower surface of the oxide semiconductor film 367b, whereby oxygen vacancies in the oxide semiconductor film 367b can be reduced. Furthermore, because the oxide semiconductor film 367b is in contact with the oxide semiconductor film 367a and the oxide semiconductor film 367c that contain one or more metal elements forming the oxide semiconductor film 367b, the densities of interface levels at the interface between the oxide semiconductor film 367a and the oxide semiconductor film 367b and at the interface between the oxide semiconductor film 367b and the oxide semiconductor film 367c are extremely low. Accordingly, oxygen vacancies in the oxide semiconductor film 367b can be reduced.

Thus, providing the oxide semiconductor film 367a makes it possible to reduce variations or changes in electrical characteristics of the transistor, such as threshold voltage.

Since the oxide semiconductor film 367c containing one or more kinds of metal elements forming the oxide semiconductor film 367b is provided in contact with the oxide semiconductor film 367b, scattering of carriers does not easily occur at the interface between the oxide semiconductor film 367b and the oxide semiconductor film 367c, and thus the field-effect mobility of the transistor can be increased.

Furthermore, the oxide semiconductor film 367a and the oxide semiconductor film 367c each also serve as a barrier film which suppresses formation of an impurity state due to the entry of the constituent element of the insulating films 364 and 372 into the oxide semiconductor film 367b.

From the above, variation in the electrical characteristics such as threshold voltage is reduced in the transistor described in this embodiment.

Figure 27A:
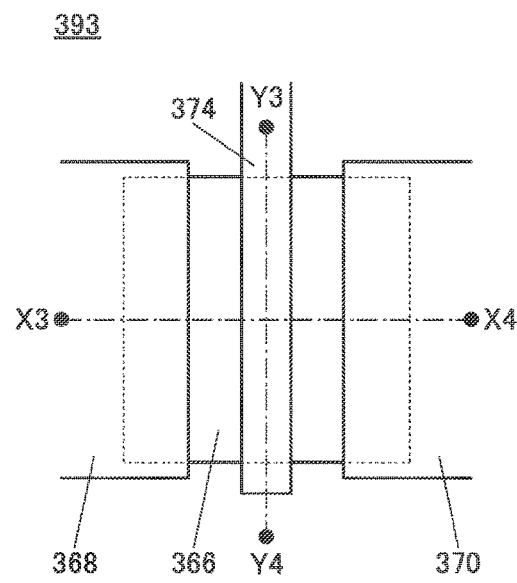
FIGS. 27A to 27C are a top view and cross-sectional views which illustrate one embodiment of a semiconductor device.
Figure 27B:
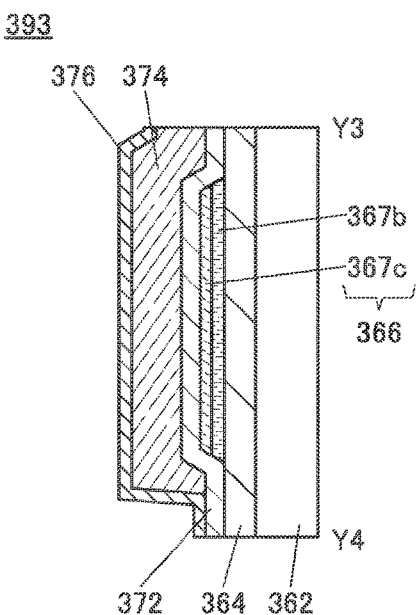
Figure 27C:
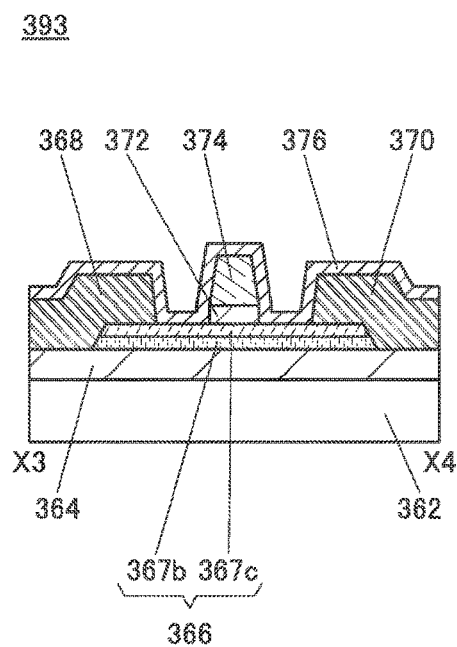

FIGS. 27A to 27C show a transistor having a structure different from that shown in FIGS. 26A to 26C.

FIGS. 27A to 27C are a top view and cross-sectional views of the transistor 393 included in a semiconductor device. FIG. 27A is a top view of the transistor 393. FIG. 27B is a cross-sectional view along the dashed-dotted line Y3-Y4 in FIG. 27A. FIG. 27C is a cross-sectional view along the dashed-dotted line X3-X4 in FIG. 27A. Note that in FIG. 27A, the substrate 362, the insulating film 364, the insulating film 372, the insulating film 376, and the like are not illustrated for simplicity. FIG. 27B shows a cross-sectional view of the transistor 393 in a channel width direction, and FIG. 27C shows a cross-sectional view of the transistor 393 in a channel length direction.

As in the transistor 393 shown in FIGS. 27A to 27C, the oxide semiconductor film 366 may have a stacked-layer structure including the oxide semiconductor film 367b in contact with the insulating film 364 and the oxide semiconductor film 367c in contact with the oxide semiconductor film 367b and the insulating film 372.

<Structure 4 of Semiconductor Device>

Next, another structure of the semiconductor device is described with reference to FIG. 36. Here, a transistor in which a low-resistance region is formed by the method described in Embodiment 1 is described.

Figure 36:
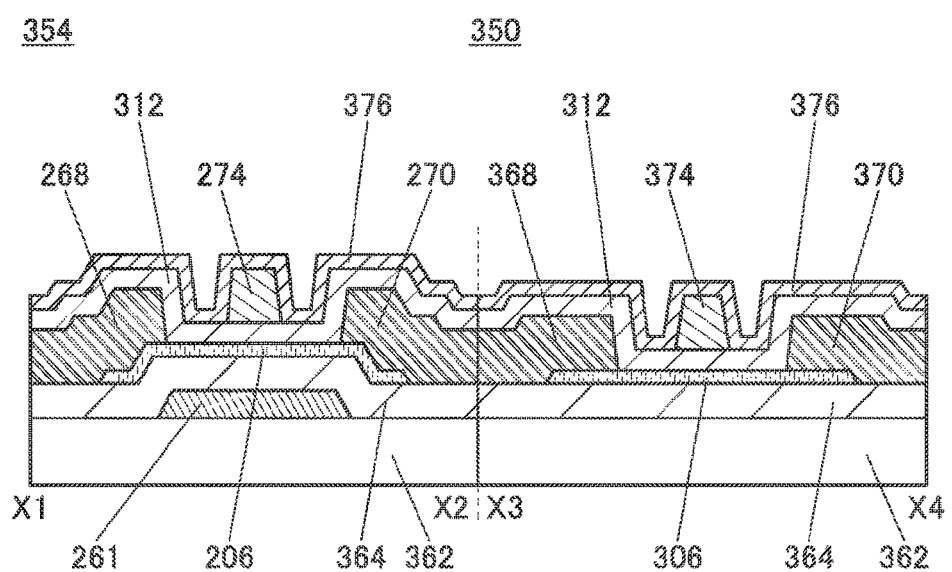
FIG. 36 is a cross-sectional view illustrating one embodiment of a semiconductor device.

The transistor 350 shown in FIG. 36 includes an oxide semiconductor film 306 over the insulating film 364 formed over the substrate 362; the conductive film 368, the conductive film 370, and an insulating film 312 in contact with the oxide semiconductor film 306; and the conductive film 374 overlapping with the oxide semiconductor film 306 with the insulating film 312 provided therebetween. Note that the insulating film 376 is provided over the transistor 350.

The transistor 354 shown in FIG. 36 includes the conductive film 261 formed over the substrate 362; the insulating film 364 over the conductive film 261; the oxide semiconductor film 206 over the insulating film 364; the conductive film 268, the conductive film 270, and the insulating film 312 in contact with the oxide semiconductor film 206; and the conductive film 274 overlapping with the oxide semiconductor film 206 with the insulating film 312 provided therebetween.

The transistor 354 is characterized by including the conductive film 261 overlapping with the oxide semiconductor film 206 with the insulating film 364 provided therebetween. That is, the conductive film 261 serves as a gate electrode. Furthermore, the transistor 354 is a transistor having a dual-gate structure. The other components are the same as those of the transistor 350 and the effect similar to that in the case of the transistor 350 is obtained.

In the transistor 350 and the transistor 354, the insulating film 312 serves as a gate insulating film. The oxide semiconductor film 306, the oxide semiconductor film 206, and the low-resistance regions included in the oxide semiconductor film 306 and the oxide semiconductor film 206 can be formed in manners similar to those of the oxide semiconductor film 306, the oxide semiconductor film 206, and the low-resistance regions included in the oxide semiconductor film 306 and the oxide semiconductor film 206, respectively, which are described in Embodiment 1.

<Structure 5 of Semiconductor Device>

Next, another structure of the semiconductor device is described with reference to FIGS. 53A and 53B.

Figure 53A:
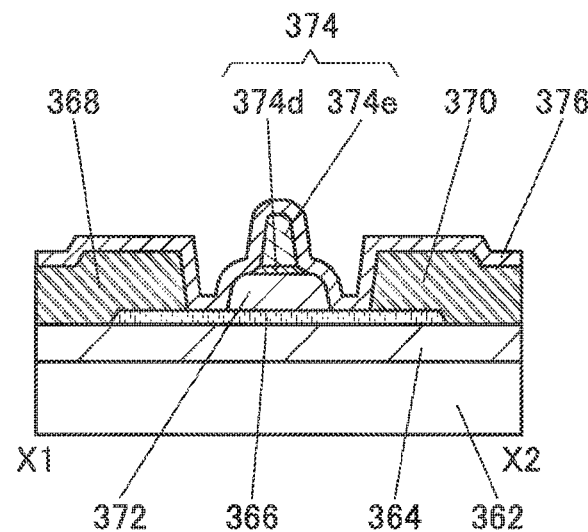
FIGS. 53A and 53B are cross-sectional views each illustrating one embodiment of a semiconductor device.

FIG. 53A is a cross-sectional view of a transistor 390a of the semiconductor device. FIG. 53B is a conceptual diagram in a thickness direction in the case where the impurity element is added to the oxide semiconductor film 366. Note that a top view and a cross-sectional view in the channel width direction of the transistor 390a shown in FIG. 53A are similar to the top view shown in FIG. 28B and the cross-sectional view shown in FIG. 23A, respectively; thus, they are not described here.

The transistor 390a shown in FIG. 53A is a modification example of the transistor 390 shown in FIG. 23A. The transistor 390a shown in FIG. 53A is different from the transistor 390 shown in FIG. 23A in the structure of the conductive film 374 and in the cross-sectional shape of the insulating film 372 and the insulating film 376. In the transistor 390a shown in FIG. 53A, the conductive film 374 has a two-layer structure, and shapes of edge portions of the insulating film 372 and the insulating film 376 partly have a curvature. The other components are the same as those of the transistor 390 and the effect similar to that in the case of the transistor 390 can be obtained.

The conductive film 374 has a stacked-layer structure of a conductive film 374d and a conductive film 374e. The conductive film 374d can be formed using a metal nitride film of tantalum nitride, titanium nitride, molybdenum nitride, or tungsten nitride, for example.

The conductive film 374e can be formed using the low-resistance metal material described above. Examples of the low-resistance metal material include aluminum, copper, silver, and tungsten.

Furthermore, in the conductive film 374, a side edge portion of the conductive film 374d juts out from the conductive film 374e. By making the conductive film 374 have such a two-layer structure where the lower conductive film juts out from the upper conductive film, the conductive film can have a hat-like shape. When the conductive film has the hat-like shape, the lower conductive film can suppress the passage of impurity in adding the impurity element, in some cases.

Examples of a method for processing the conductive film 374 include a dry etching method. When the conductive film 374 is processed by the dry etching method, part of a side edge portion of the insulating film 372 is reduced, and thus, the side edge portion has a shape with a curvature in some cases. In the case where the side edge portion of the insulating film 372 has a shape with a curvature, part of a side edge portion of the insulating film 376 formed over the insulating film 372 also has a curvature in some cases because of the effect of the insulating film 372.

A conceptual diagram in the thickness direction in the case where the impurity element is added to the oxide semiconductor film 366 of the transistor 390a shown in FIG. 53A is described below with reference to FIG. 53B.

Figure 53B:
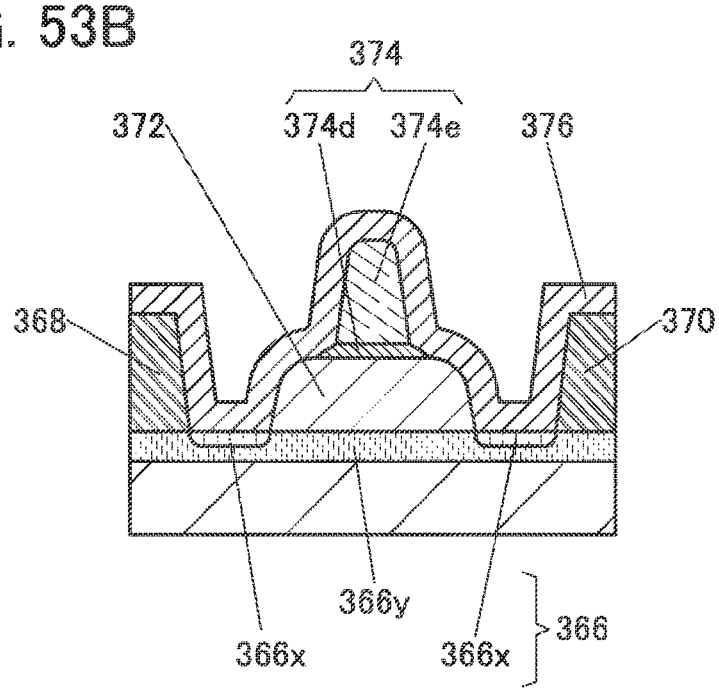

In FIG. 53B, the oxide semiconductor film 366 includes a region 366x and a region 366y. In the case where the oxide semiconductor film 366 is a crystalline oxide semiconductor film, for example, the crystallinity of the region 366y is higher than that of the region 366x. The difference in crystallinity is due to a decrease in crystallinity of the region 366x which is damaged when the impurity element is added.

<Method 1 for Manufacturing Semiconductor Device>

Next, a method for manufacturing the transistor 390 and the transistor 394 illustrated in FIGS. 23A and 23B will be described with reference to FIGS. 29A and 29B, FIGS. 30A to 30D and FIGS. 31A to 31C.

Figure 29A:
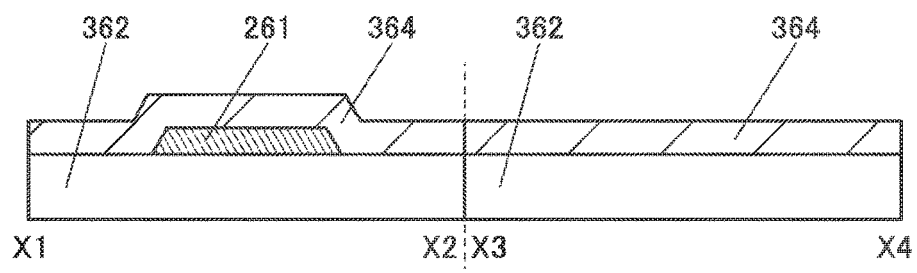
FIGS. 29A and 29B are cross-sectional views illustrating one embodiment of a manufacturing process of a semiconductor device.

As shown in FIG. 29A, the conductive film 261 is formed over the substrate 362, and the insulating film 364 is formed over the conductive film 261.

The conductive film 261 can be formed by the formation method of the conductive film 201 in Embodiment 1 as appropriate.

The insulating film 364 can be formed by the formation method of the insulating film 104 in Embodiment 1 as appropriate.

Figure 29B:
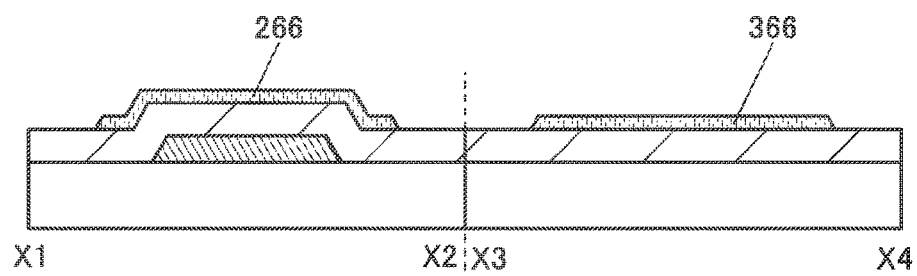

Next, the oxide semiconductor film 366 and the oxide semiconductor film 266 are formed over the insulating film 364 as shown in FIG. 29B. The oxide semiconductor film 366 and the oxide semiconductor film 266 can be formed by the formation method of the oxide semiconductor film 106 in Embodiment 1, as appropriate.

Figure 30A:
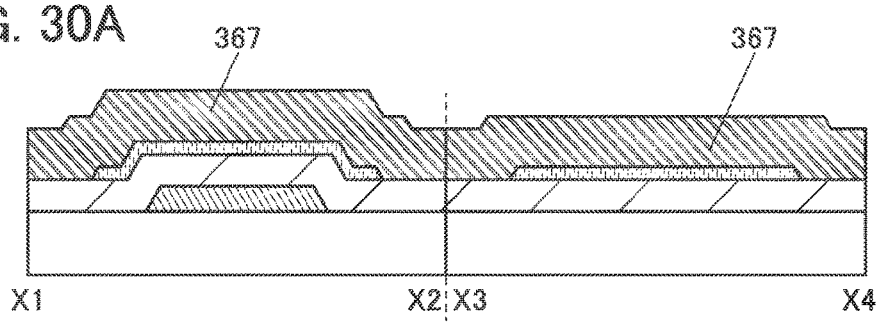
FIGS. 30A to 30D are cross-sectional views illustrating one embodiment of a manufacturing process of a semiconductor device.

Next, as shown FIG. 30A, the conductive film 367 is formed over the ulating film 364, the oxide semiconductor film 366, and the oxide semiconductor film 266.

The conductive film 367 can be formed by the formation method of the conductive film 201 in Embodiment 1 as appropriate.

Figure 30B:
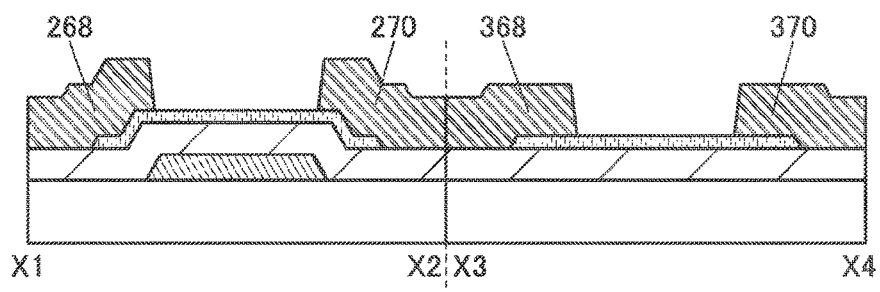

Next, as shown in FIG. 30B, after a mask is formed by a lithography process over the conductive film 367, the conductive film 367 is exposed to the etchant or/and the etching gas, whereby the conductive film 368 and the conductive film 370, and the conductive film 268 and the conductive film 270 are formed.

As a method for etching the conductive film 367, a wet etching method or/and a dry etching method can be employed as appropriate.

Note that the conductive film 368, the conductive film 370, the conductive film 268, and the conductive film 270 may be formed by an electrolytic plating method, a printing method, an inkjet method, or the like instead of the formation method.

Figure 30C:
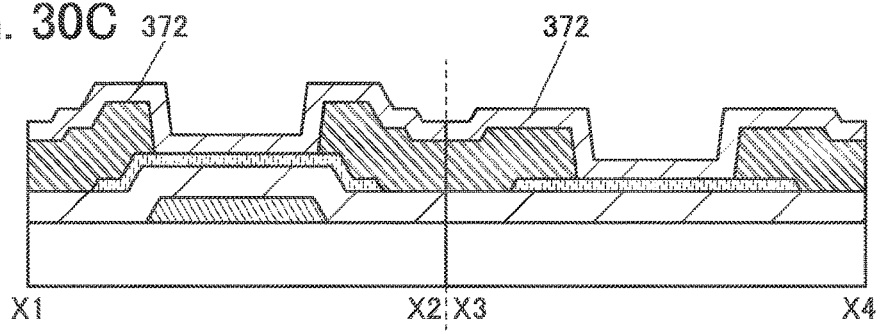

Next, as shown in FIG. 30C, the insulating film 372 is formed over the insulating film 364, the oxide semiconductor film 366, the conductive film 368, the conductive film 370, the oxide semiconductor film 266, the conductive film 268, and the conductive film 270. The insulating film 372 can be formed by the formation method of the insulating film 108 in Embodiment 1, as appropriate.

Figure 30D:
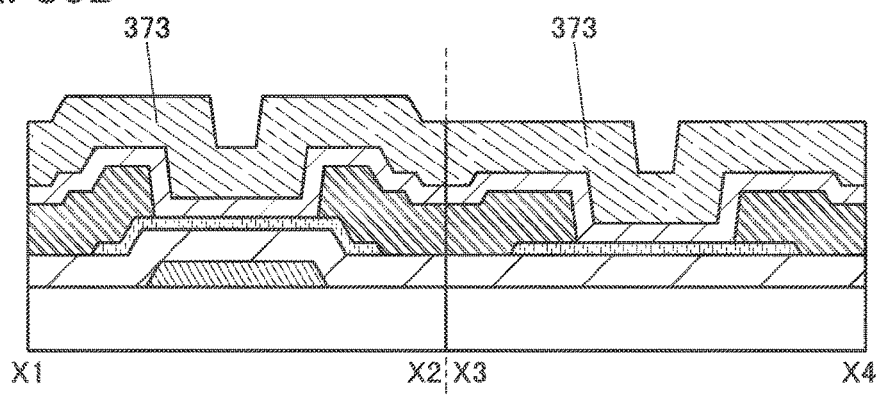

Next, as shown in FIG. 30D, a conductive film 373 is formed over the insulating film 372.

The conductive film 373 can be formed by the formation method of the conductive film 201 in Embodiment 1 as appropriate.

Figure 31A:
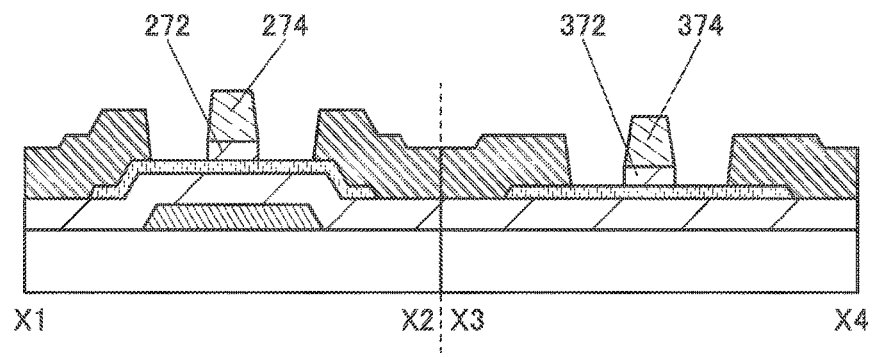
FIGS. 31A to 31C are cross-sectional views illustrating one embodiment of a manufacturing process of a semiconductor device.

Next, as shown in FIG. 31A, after a mask is formed by a lithography process over the conductive film 373, the conductive film 373 is exposed to the etchant or/and the etching gas, whereby the insulating film 372 and the conductive film 374, and the insulating film 272 and the conductive film 274 are formed.

As a method for etching the conductive film 373, a wet etching method or/and a dry etching method can be employed as appropriate.

Note that the conductive film 374 and the conductive film 274 may be formed by an electrolytic plating method, a printing method, an inkjet method, or the like instead of the above formation method.

Figure 31B:
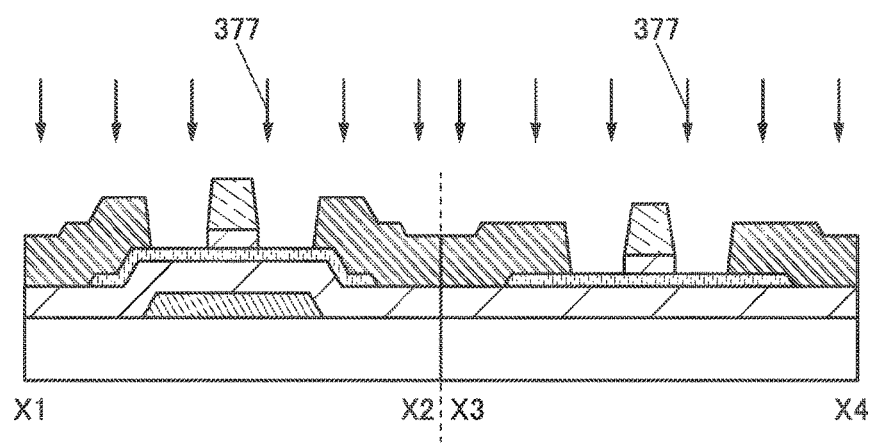

Next, as shown in FIG. 31B, after the mask is removed, a rare gas is added as the impurity element 377 to the oxide semiconductor film 366 and the oxide semiconductor film 266. As a result, the impurity element is added to a region which does not overlap with the conductive film 368, the conductive film 370, and the conductive film 374 in the oxide semiconductor film 366. Furthermore, the impurity element is added to a region which does not overlap with the conductive film 268, the conductive film 270, and the conductive film 274 in the oxide semiconductor film 266. Note that by the addition of the impurity element 377, oxygen vacancy is formed in the oxide semiconductor film 366 and the oxide semiconductor film 266.

Figure 32A:
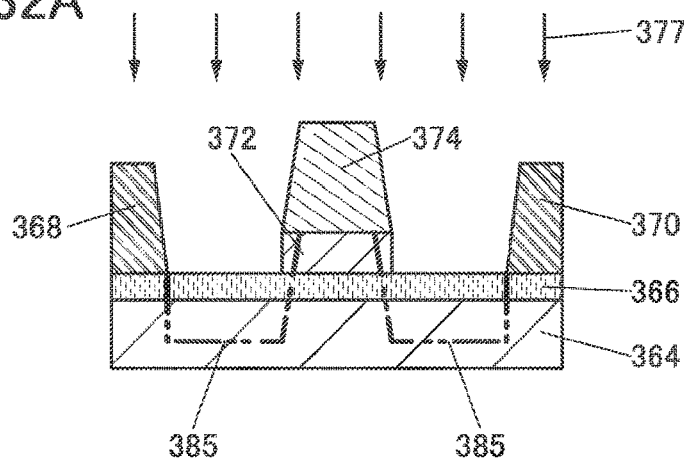
FIGS. 32A to 32C are cross-sectional views each illustrating one embodiment of a semiconductor device.
Figure 32B:
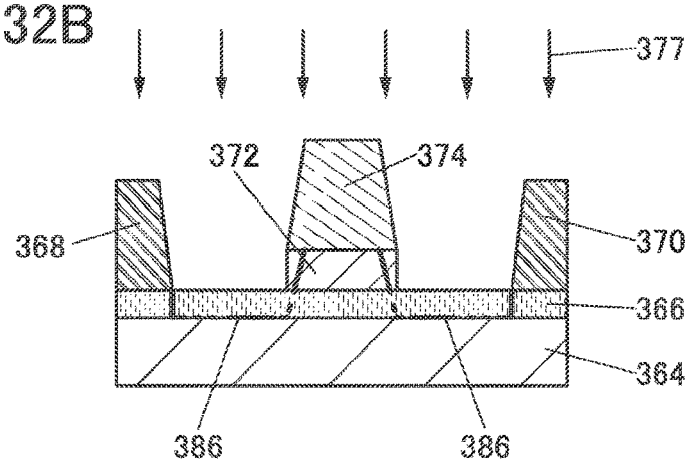
Figure 32C:
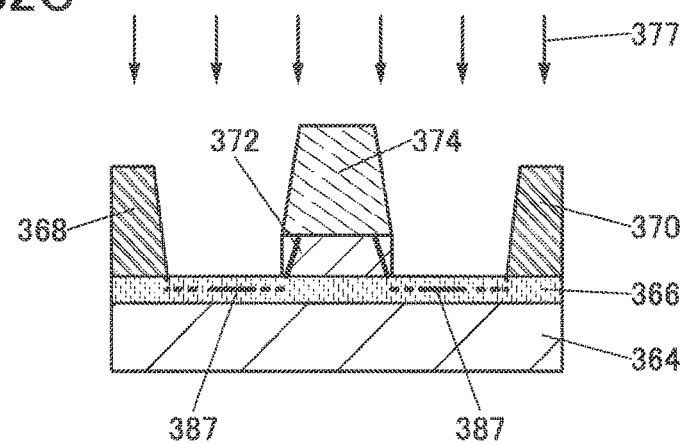

As a method for adding the impurity element 377, the method for adding the impurity element 117 described in Embodiment 1 can be used as appropriate FIGS. 32A to 32C are conceptual diagrams of a region to which the impurity element 377 is added in a thickness direction when the impurity element is added to the oxide semiconductor film 366. Note that here, description is made using an enlarged view of the vicinity of the oxide semiconductor film 366 included in the transistor 390 as a typical example.

As shown in FIG. 32A, a region to which the impurity element 377 is added is formed in the insulating film 364, the oxide semiconductor film 366, and the insulating film 372 in some cases. Note that an end portion 385 of the region to which the impurity element 377 is added is positioned inside the insulating film 364 in a depth direction of a region where the oxide semiconductor film 366 is exposed.

Alternatively, as shown in FIG. 32B, a region to which the impurity element 377 is added is formed in the oxide semiconductor film 366 and the insulating film 372 in some cases. Note that an end portion 386 of the region to which the impurity element 377 is added is positioned at the interface between the insulating film 364 and the oxide semiconductor film 366 in a depth direction of a region where the oxide semiconductor film 366 is exposed.

Still alternatively, as shown in FIG. 32C, a region to which the impurity element 377 is added is formed in the oxide semiconductor film 366 and the insulating film 372 in some cases. Note that an end portion 387 of the region to which the impurity element 377 is added is positioned inside the oxide semiconductor film 366 in a depth direction of a region where the oxide semiconductor film 366 is exposed.

Note that although the impurity element 377 is added to the oxide semiconductor film 366 using the conductive film 368, the conductive film 370, and the conductive film 374 as masks here, the impurity element 377 may be added to the oxide semiconductor film 366 before the mask for forming the conductive film 368, the conductive film 370, and the conductive film 374 is removed.

Figure 31C:
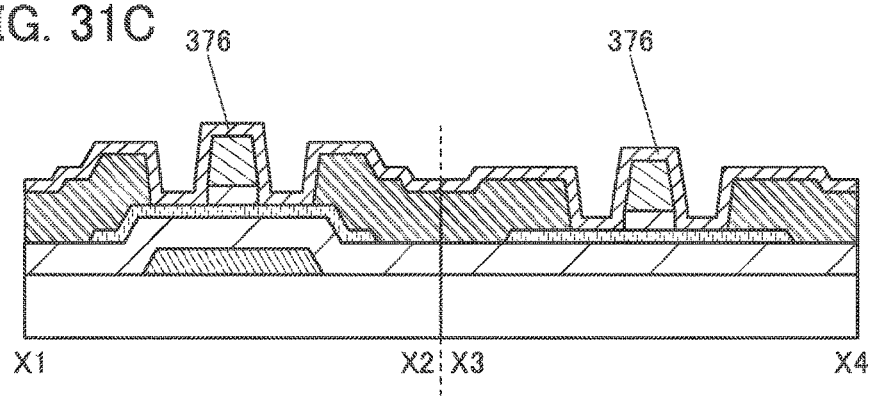

Next, as shown in FIG. 31C, the insulating film 376 is formed over the oxide semiconductor film 366, the insulating film 372, the conductive film 368, the conductive films 370 and 374, the oxide semiconductor film 266, the insulating film 272, the conductive film 268, and the conductive films 270 and 274.

The insulating film 376 can be formed by the formation method of the insulating film 176 in Embodiment 2 as appropriate.

Since hydrogen is contained in the insulating film 376, when the insulating film 376 is in contact with the region to which the impurity element is added in the oxide semiconductor film 366 and the oxide semiconductor film 266, hydrogen contained in the insulating film 376 moves to the region to which the impurity element is added in the oxide semiconductor film. Since oxygen vacancy is included in the region to which the impurity element is added, the low-resistance region can be formed in the oxide semiconductor film 366 and the oxide semiconductor film 266. Specifically, the region 366b and the region 366c shown in FIGS. 24A and 24B can be formed. Note that in the case where the side surface of the conductive film 374 has a tapered shape, the impurity element is added to the region 366c through the tapered portion of the conductive film 374. Therefore, the region 366c has a lower concentration of rare gas elements as an example of the impurity element than the region 366b.

After that, heat treatment may be performed to further increase the conductivity of the region to which the impurity element 377 is added. The temperature of the heat treatment is typically higher than or equal to 150° C. and lower than the strain point of the substrate, higher than or equal to 250° C. and lower than or equal to 450° C., or higher than or equal to 300° C. and lower than or equal to 450° C. By the heat treatment, hydrogen contained in the region 366b is diffused into the region 366c. As a result, the conductivity of the region 366c is increased.

Through the above-described process, the transistor can be manufactured.

<Method 2 for Manufacturing Semiconductor Device>

A method for manufacturing the transistor 391 illustrated in FIGS. 25A to 25C is described. Note that here, a step of forming the conductive film 368c and the conductive film 370c which are included in the conductive film 368 and the conductive film 370 in the transistor 391 and a step of adding the impurity element 377 to the oxide semiconductor film 366 are described.

Through the steps shown in FIGS. 29A and 29B and FIGS. 30A to 30B, the insulating film 364, the oxide semiconductor film 366, the conductive film 368, and the conductive film 370 are formed over the substrate 362.

Next, the conductive film 368b and the conductive film 370b which are included in the conductive film 368 and the conductive film 370, respectively, are exposed to plasma generated in a reducing atmosphere so that an oxide on surfaces of the conductive film 368b and the conductive film 370b is reduced. Next, the conductive film 368b and the conductive film 370b are exposed to silane while heating is performed at a temperature higher than or equal to 200° C. and lower than or equal to 400° C. Next, the conductive film 368b and the conductive film 370b are exposed to plasma generated in an atmosphere containing nitrogen, such as an atmosphere of ammonia or nitrogen, whereby $CuSi_xN_y$ (x>0, y>0) can be formed as the conductive film 368c and the conductive film 370c.

Then, the steps illustrated in FIG. 30C, FIG. 30D, and FIGS. 31A to 31C are performed. In this manner, the transistor 391 can be manufactured.

<Method 3 for Manufacturing Semiconductor Device>

Another method for manufacturing the transistor 390 illustrated in FIGS. 23A and 23B is described. Note that here, a step of adding the impurity element and a step of forming the insulating film 376 are described with reference to FIGS. 33A and 33B.

Through the steps shown in FIGS. 29A and 29B, FIGS. 30A to 30D, and FIG. 31A, the insulating film 364, the oxide semiconductor film 366, the conductive film 368, the conductive film 370, the insulating film 372, and the conductive film 374 are formed over the substrate 362.

Figure 33A:
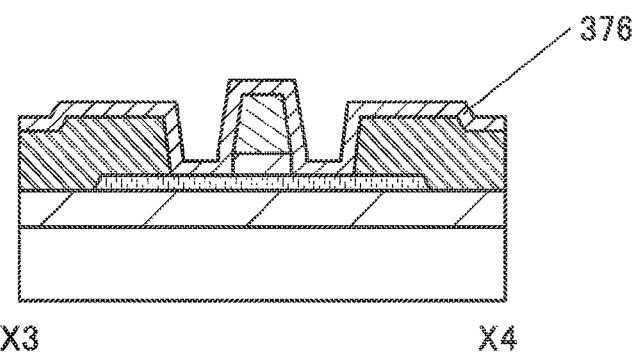
FIGS. 33A and 33B are cross-sectional views illustrating one embodiment of a manufacturing process of a semiconductor device.
Figure 33B:
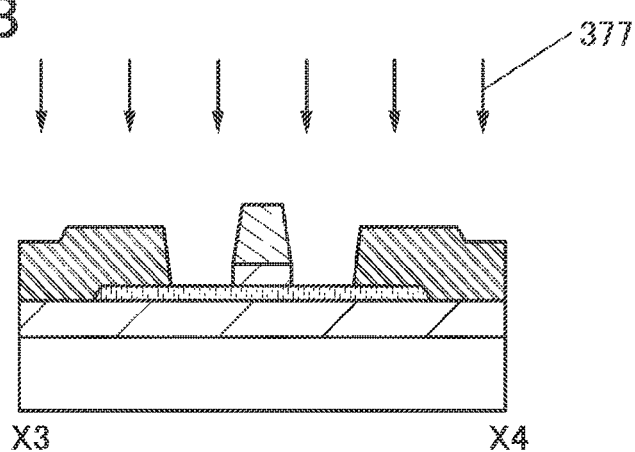

Next, the insulating film 376 is formed over the oxide semiconductor film 366, the conductive film 368, the conductive film 370, the insulating film 372, and the conductive film 374 as shown in FIG. 33A, and then, the impurity element 377 is added to the oxide semiconductor film 366 using the conductive film 368, the conductive film 370, and the conductive film 374 as masks as shown in FIG. 33B.

Through the above-described process, the transistor 390 can be manufactured.

<Method 4 for Manufacturing Semiconductor Device>

A method for manufacturing a transistor including a sidewall insulating film is described with reference to FIGS. 34A to 34D and FIGS. 35A to 35C.

Through the steps shown in FIGS. 29A and 29B, FIGS. 30A to 30D, and FIG. 31A, the insulating film 364, the oxide semiconductor film 366, the conductive film 368, the conductive film 370, the insulating film 372, and the conductive film 374 are formed over the substrate 362. Note that here, the insulating film 372 is formed over an entire surface without being etched.

Figure 34A:
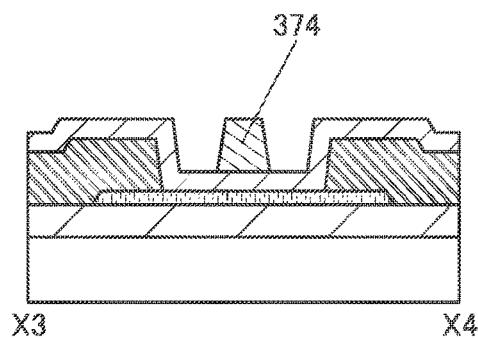
FIGS. 34A to 34D are cross-sectional views illustrating one embodiment of a manufacturing process of a semiconductor device.
Figure 34B:
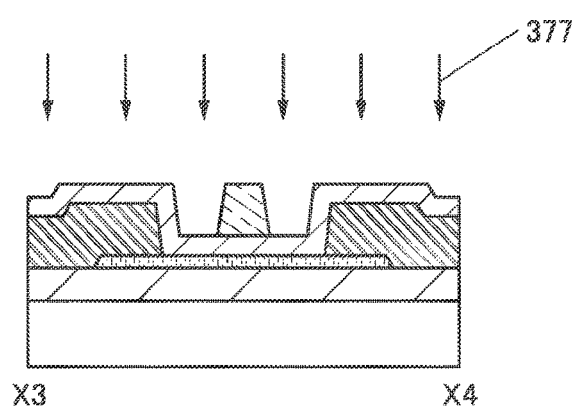

Next, as shown in FIG. 34B, the impurity element 377 is added to the oxide semiconductor film 366 using the conductive film 368, the conductive film 370, and the conductive film 374 as masks.

Figure 34C:
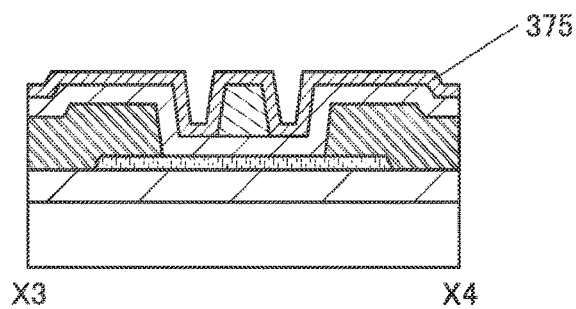

Next, as shown in FIG. 34C, an insulating film 375 is formed over the insulating film 372 and the conductive film 374.

The insulating film 375 is a film to be sidewall insulating films. The insulating film 375 can be formed as appropriate using the material and the formation method of the insulating film 104 in Embodiment 1.

Figure 34D:
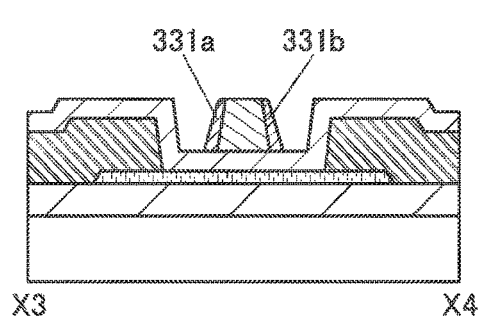

Next, the insulating film 375 is processed by anisotropic etching such as a reactive ion etching (RIE) method, whereby a sidewall insulating film 331a and a sidewall insulating film 331b which are in contact with the side surfaces of the conductive film 374 can be formed in a self-aligned manner as shown in FIG. 34D.

Figure 35A:
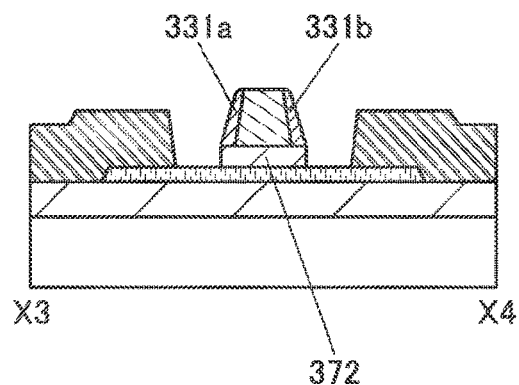
FIGS. 35A to 35C are cross-sectional views illustrating one embodiment of a manufacturing process of a semiconductor device.

Next, as shown in FIG. 35A, the insulating film 372 is etched using the sidewall insulating film 331a and the sidewall insulating film 331b as masks, so that part of the oxide semiconductor film 366 is exposed.

Figure 35B:
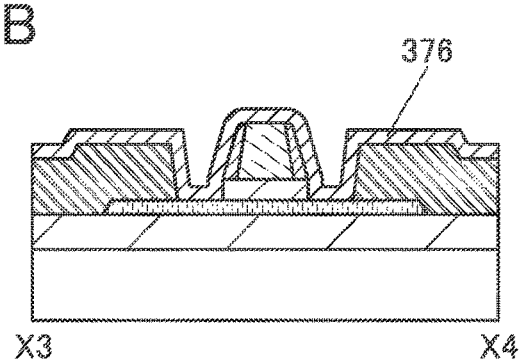

Next, as shown in FIG. 35B, the insulating film 376 is formed over the oxide semiconductor film 366, the conductive film 368, the conductive film 370, and the conductive film 374. Since the insulating film 376 is a film containing hydrogen, hydrogen moves to a region in contact with the insulating film 376 in the oxide semiconductor film 366.

Figure 35C:
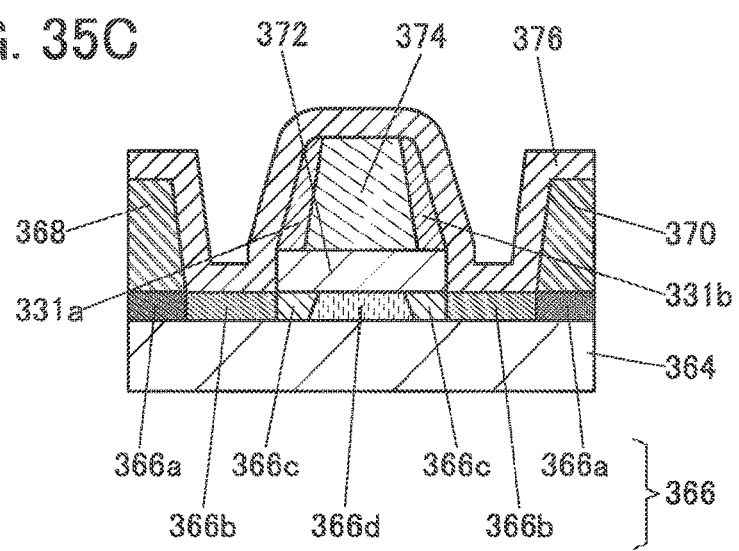

FIG. 35C is an enlarged view of the vicinity of the oxide semiconductor film 366 in FIG. 35D. The oxide semiconductor film 366 includes the region 366a in contact with the conductive film 368 or the conductive film 370, the region 366b in contact with the insulating film 376, and the region 366d in contact with the insulating film 372. Furthermore, the region 366c overlapping with the sidewall insulating films 331a and 331b with the insulating film 372 provided therebetween is included. Note that in the case where a side surface of the conductive film 374 has a tapered shape, the region 366c may overlap with the tapered portion of the conductive film 374.

The region 366b and the region 366c serve as low-resistance regions. The region 366b contains at least a rare gas and hydrogen as the impurity elements. Furthermore, the region 366c contains at least a rare gas element as the impurity element. In the case where hydrogen is diffused from the region 366b, hydrogen is contained in the region 366c, but the impurity element concentration of the region 366c is lower than the impurity element concentration of the region 366b. By providing the region 366c, a source-drain breakdown voltage of the transistor can be increased.

In the transistor described in this embodiment, the conductive films serving as a source electrode and a drain electrode do not overlap with the conductive film serving as a gate electrode, and thus, parasitic capacitance can be reduced and on-state current is high. Furthermore, in the transistor described in this embodiment, the low-resistance region can be formed stably; therefore, on-state current is higher and variation in the electrical characteristics of the transistor is more reduced than in a conventional transistor.

The structures, methods, and the like described in this embodiment can be used as appropriate in combination with any of the structures, methods, and the like described in the other embodiments.

Embodiment 4

In this embodiment, one embodiment of a semiconductor device and a manufacturing method thereof will be described with reference to FIGS. 50A and 50B, FIGS. 51A and 51B, and FIGS. 52A to 52D. Note that this embodiment is different from Embodiment 1 in a structure of an oxide semiconductor film included in a transistor of a driver circuit portion. Furthermore, as a method for forming a low-resistance region included in a transistor, the method given in Embodiment 3 is used.

<Structure of Semiconductor Device>

Figure 50A:
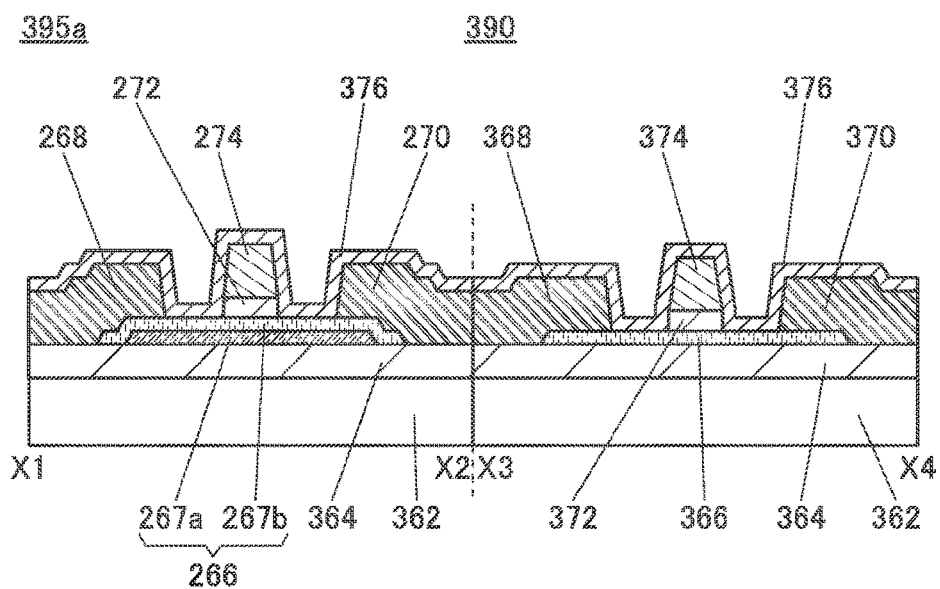
FIGS. 50A and 50B are cross-sectional views illustrating one embodiment of a semiconductor device.
Figure 50B:
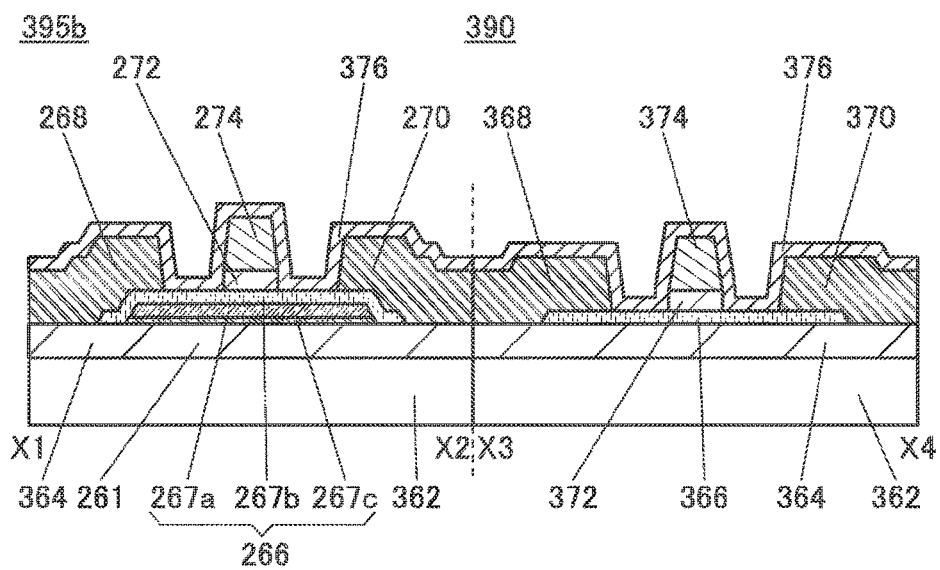

In FIGS. 50A and 50B, a transistor having a top-gate structure is shown as an example of a transistor included in a semiconductor device.

FIG. 50A shows cross-sectional views of the transistor 390 and a transistor 395a. FIG. 50B shows cross-sectional views of the transistor 390 and a transistor 395b. Note that in FIGS. 50A and 50B, FIGS. 51A and 51B, and FIGS. 52A to 52D, X1-X2 corresponds to the cross-sectional view of the transistor provided in a driver circuit portion, and X3-X4 corresponds to the cross-sectional view of the transistor provided in a pixel portion.

FIGS. 50A and 50B are characterized in that the transistor provided in the driver circuit portion differs from the transistor provided in the pixel portion in the structure of an oxide semiconductor film.

Like the transistor 390 in Embodiment 3, the transistor 390 shown in FIG. 50A includes the oxide semiconductor film 366 having a single-layer structure.

The transistor 395a shown in FIG. 50A is characterized by including the oxide semiconductor film 266 in which an oxide semiconductor film 267a and an oxide semiconductor film 267b are stacked. Note that in a top surface shape, an edge portion of the oxide semiconductor film 267b is positioned outside an edge portion of the oxide semiconductor film 267a. That is, the oxide semiconductor film 267b covers a top surface and a side surface of the oxide semiconductor film 267a. Furthermore, the oxide semiconductor film 267a is in contact with the insulating film 364, and the oxide semiconductor film 267b is in contact with the oxide semiconductor film 267a and the insulating film 272.

The transistor 395b shown in FIG. 50B is characterized by including the oxide semiconductor film 266 in which the oxide semiconductor film 267a, the oxide semiconductor film 267b, and an oxide semiconductor film 267c are stacked. Note that in a top surface shape, an edge portion of the oxide semiconductor film 267b is positioned outside edge portions of the oxide semiconductor film 267a and the oxide semiconductor film 267c. That is, the oxide semiconductor film 267b covers a top surface and a side surface of the oxide semiconductor film 267a and a side surface of the oxide semiconductor film 267c. Furthermore, the oxide semiconductor film 267c is in contact with the insulating film 364, the oxide semiconductor film 267b is in contact with the insulating film 272, and the oxide semiconductor film 267a is in contact with the oxide semiconductor film 267b and the oxide semiconductor film 267c.

In the transistor 395a, the transistor 395b, and the transistor 390, the oxide semiconductor film 267a and the oxide semiconductor film 267b have different components, whereas the oxide semiconductor film 267b and the oxide semiconductor film 366 have the same composition. That is, the oxide semiconductor film 267a is formed in a step different from the step of forming the oxide semiconductor film 267b and the oxide semiconductor film 366, and, in addition, the oxide semiconductor film 267b and the oxide semiconductor film 366 are formed in the same step.

In the transistor 395a and the transistor 395b, a channel is formed in the oxide semiconductor film 267a. Therefore, the thickness of the oxide semiconductor film 267a is preferably larger than that of the oxide semiconductor film 267b.

The thickness of the oxide semiconductor film 267a is greater than or equal to 3 nm and less than or equal to 200 nm, greater than or equal to 10 nm and less than or equal to 50 nm, or greater than or equal to 20 nm and less than or equal to 35 nm. The thickness of each of the oxide semiconductor films 267b and 366 is greater than or equal to 3 nm and less than or equal to 200 nm, greater than or equal to 3 nm or less than or equal to 100 nm, greater than or equal to 10 nm and less than or equal to 100 nm, or greater than or equal to 30 nm and less than or equal to 50 nm.

The oxide semiconductor film 267a, the oxide semiconductor film 267b, and the oxide semiconductor film 366 are each formed using a metal oxide film containing at least In, and typically formed using an In—Ga oxide film, In-M-Zn oxide film (M is Mg, Al, Ti, Ga, Y, Zr, La, Ce, Nd, or Hf), or the like.

In the oxide semiconductor film 267a, the proportion of In atoms is higher than that of M (M is Mg, Al, Ti, Ga, Y, Zr, La, Ce, Nd, or Hf) atoms. In the case where the oxide semiconductor film 367a contains an In-M-Zn oxide (M is Mg, Al, Ti, Ga, Y, Zr, La, Ce, Nd, or Hf), and a target having the atomic ratio of the metal elements of In:M:Zn=$x_3$:$y_3$:$z_3$ is used for forming the oxide semiconductor film 367a, $x_3/y_3$ is preferably greater than 1 and less than or equal to 6. Typical examples of the atomic ratio of the metal elements of the target are In:M:Zn=2:1:1.5, In:M:Zn=2:1:2.3, In:M:Zn=2:1:3, In:M:Zn=3:1:2, In:M:Zn=3:1:3, and In:M:Zn=3:1:4.

In the oxide semiconductor film 267b and the oxide semiconductor film 366, the proportion of In atoms is lower than or equal to that of M (M is Mg, Al, Ti, Ga, Y, Zr, La, Ce, Nd, or Hf) atoms. In the case where the oxide semiconductor film 267b and the oxide semiconductor film 366 is an In-M-Zn oxide film (M is Mg, Al, Ti, Ga, Y, Zr, La, Ce, Nd, or Hf), and a target having the atomic ratio of the metal elements of In:M:Zn=$x_4$:$y_4$:$z_4$ is used for forming the oxide semiconductor film 267b and the oxide semiconductor film 366, $x_4/y_4$ is preferably greater than or equal to ⅙ and less than or equal to 1, and $z_4/y_4$ is preferably greater than or equal to ⅓ and less than or equal to 6, further preferably greater than or equal to 1 and less than or equal to 6. Note that when $z_4/y_4$ is greater than or equal to 1 and less than or equal to 6, a CAAC-OS film as the oxide semiconductor film 267b and the oxide semiconductor film 366 is easily formed. Typical examples of the atomic ratio of the metal elements of the target are In:M:Zn=1:1:1, In:M:Zn=1:1:1.2, In:M:Zn=1:3:2, In:M:Zn=1:3:4, In:M:Zn=1:3:6, In:M:Zn=1:3:8, In:M:Zn=1:4:4, In:M:Zn=1:4:5, In:M:Zn=1:4:6, In:M:Zn=1:4:7, In:M:Zn=1:4:8, In:M:Zn=1:5:5, In:M:Zn=1:5:6, In:M:Zn=1:5:7, In:M:Zn=1:5:8, and In:M:Zn=1:6:8.

The transistor 395a and the transistor 395b have high field-effect mobility because a channel is formed in the oxide semiconductor film 267a in which the proportion of In atoms is higher than that of M (M is Mg, Al, Ti, Ga, Y, Zr, La, Ce, Nd, or Hf) atoms. The transistor 395a and the transistor 395b are transistors having a field-effect mobility of greater than or equal to 10 cm$^2$/Vs and less than 60 cm$^2$/Vs, preferably greater than or equal to 15 cm$^2$/Vs and less than 50 cm$^2$/Vs. However, when light is emitted, a current in an off state is increased. Therefore, by providing a light-blocking film in the driver circuit portion, a transistor in which a field-effect mobility is high and a current in an off state is low is obtained. As a result, the driver circuit portion capable of high-speed operation can be formed.

Figure 51A:
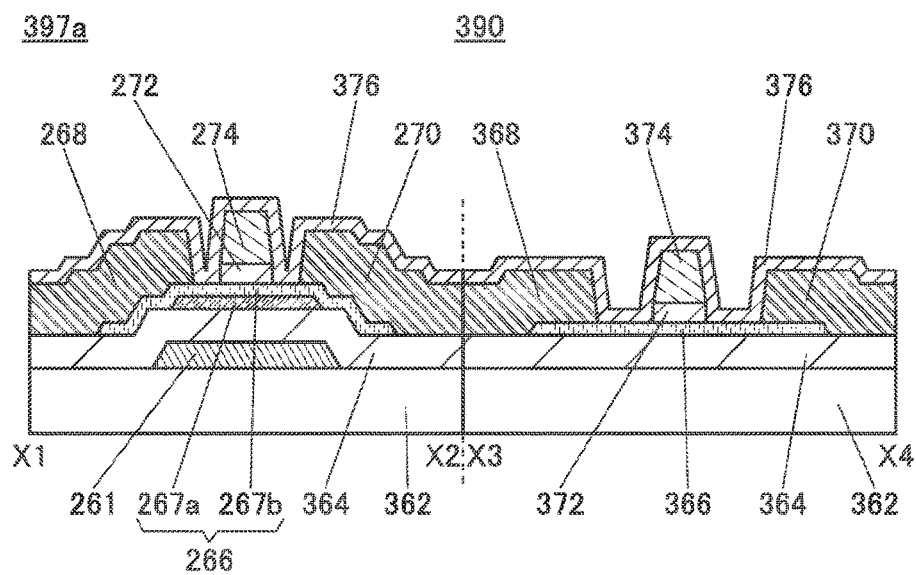
FIGS. 51A and 51B are cross-sectional views illustrating one embodiment of a semiconductor device.
Figure 51B:
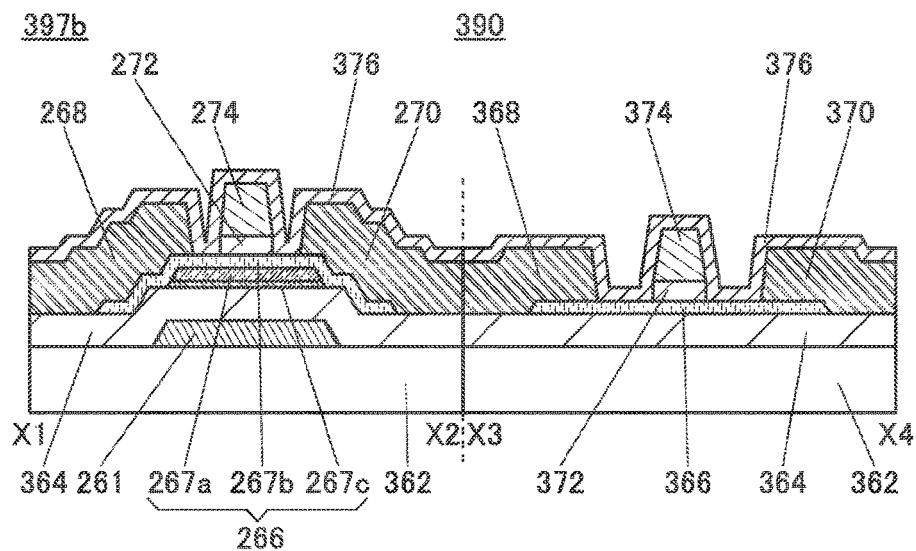

Alternatively, as in the transistor 397a shown in FIG. 51A and the transistor 397b shown in FIG. 51B, the conductive film 261 serving as a light-blocking film may be provided. Furthermore, by connecting the conductive film 261 and the conductive film 274, the on-state current of the transistor 397a and the transistor 397b can be further increased, and field-effect mobility can be increased.

In the transistor 390, a channel is formed in the oxide semiconductor film in which the proportion of In atoms is lower than or equal to that of M (M is Mg, Al, Ti, Ga, Y, Zr, La, Ce, Nd, or Hf) atoms. Thus, even when light is emitted to the oxide semiconductor film, the amount of increase in off-state current is small. Therefore, by providing the transistor including the oxide semiconductor film in which the proportion of In atoms is lower than or equal to that of M (M is Mg, Al, Ti, Ga, Y, Zr, La, Ce, Nd, or Hf) atoms in the pixel portion, the pixel portion that hardly deteriorate due to light irradiation and provides high display quality can be obtained.

In the oxide semiconductor film 267c, the proportion of In atoms is lower than that of M (M is Mg, Al, Ti, Ga, Y, Zr, La, Ce, Nd, or Hf) atoms. In the case where the oxide semiconductor film 267c is an In-M-Zn oxide film (M is Mg, Al, Ti, Ga, Y, Zr, La, Ce, Nd, or Hf), and a target having the atomic ratio of the metal elements of In:M:Zn=$x_5$:$y_5$:$z_5$ is used for forming the oxide semiconductor film 267c, $x_5/y_5$ is preferably greater than or equal to ⅙ and less than 1, and $z_5/y_5$ is preferably greater than or equal to ⅓ and less than or equal to 6, further preferably greater than or equal to 1 and less than or equal to 6. Note that when $z_5/y_5$ is greater than or equal to 1 and less than or equal to 6, a CAAC-OS film as the oxide semiconductor film 267c is easily formed. Typical examples of the atomic ratio of the metal elements of the target are In:M:Zn=1:3:2, In:M:Zn=1:3:4, In:M:Zn=1:3:6, In:M:Zn=1:3:8, In:M:Zn=1:4:4, In:M:Zn=1:4:5, In:M:Zn=1:4:6, In:M:Zn=1:4:7, In:M:Zn=1:4:8, In:M:Zn=1:5:5, In:M:Zn=1:5:6, In:M:Zn=1:5:7, In:M:Zn=1:5:8, and In:M:Zn=1:6:8.

In the case where the oxide semiconductor film 267c is an In—Ga oxide film, the oxide semiconductor film 267c can be formed by a sputtering method using an In—Ga metal oxide target (In:Ga=7:93). To deposit the In—Ga oxide film by a sputtering method using DC discharge to form the oxide semiconductor film 267c, when an atomic ratio of In:Ga is x:y, it is preferable that y/(x+y) be less than or equal to 0.96, further preferably less than or equal to 0.95, for example, 0.93.

The thicknesses of the oxide semiconductor films 267c provided in the transistor 395b shown in FIG. 50B and the transistor 397b shown in FIG. 51B are each smaller than the thickness of the oxide semiconductor film 267a and is greater than or equal to 2 μm and less than or equal to 100 nm, preferably greater than or equal to 2 nm and less than or equal to 50 nm, further preferably greater than or equal to 3 nm and less than or equal to 15 nm. By providing the oxide semiconductor film 267c between the insulating film 364 serving as a gate insulating film and the oxide semiconductor film 267a, variation in threshold voltage of the transistor can be reduced.

<Method for Manufacturing Semiconductor Device>

Next, a method for manufacturing the transistor 390 and the transistor 397a illustrated in FIG. 51A will be described with reference to FIGS. 52A to 52D.

Figure 52A:
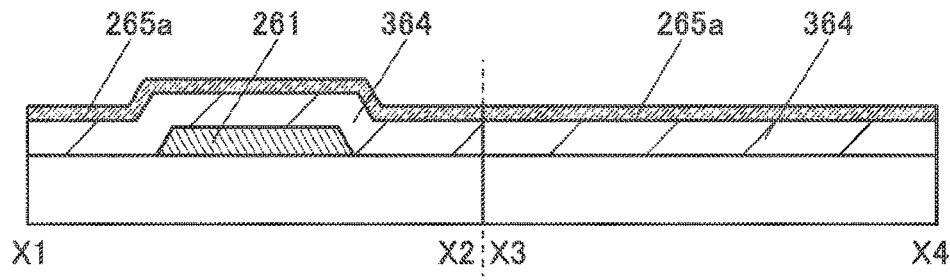
FIGS. 52A to 52D are cross-sectional views illustrating one embodiment of a manufacturing process of a semiconductor device.

As illustrated in FIG. 52A, the conductive film 261 is formed over the substrate 362. Next, the insulating film 364 is formed over the substrate 362 and the conductive film 261. Next, an oxide semiconductor film 265a is formed over the insulating film 364.

Figure 52B:
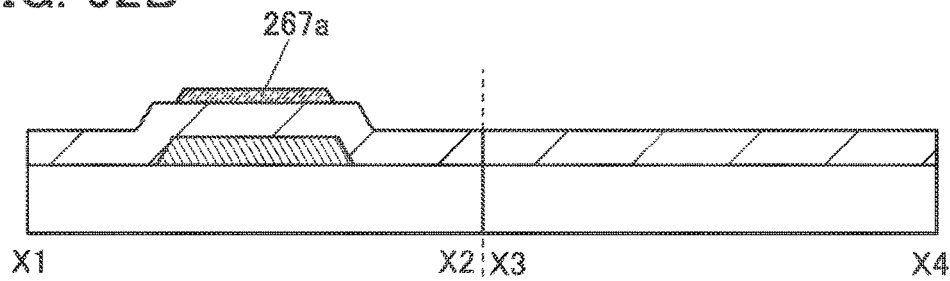

Next, as shown in FIG. 52B, after a mask is formed over the oxide semiconductor film 265a by a photolithography process, the oxide semiconductor film 265a is etched to form the oxide semiconductor film 267a in the driver circuit portion.

Figure 52C:
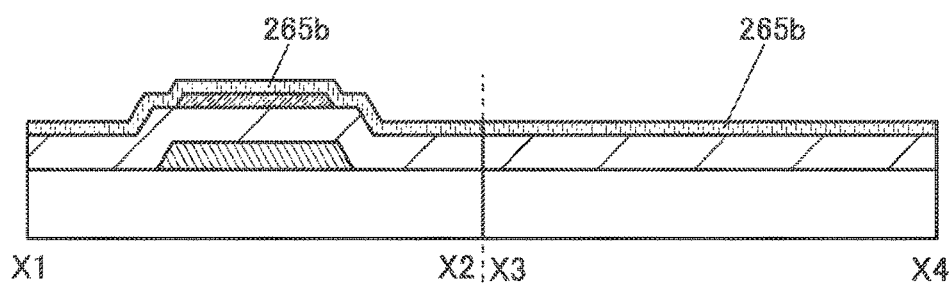

Next, as shown in FIG. 52C, an oxide semiconductor film 265b is formed over the insulating film 364 and the oxide semiconductor film 267a.

Figure 52D:
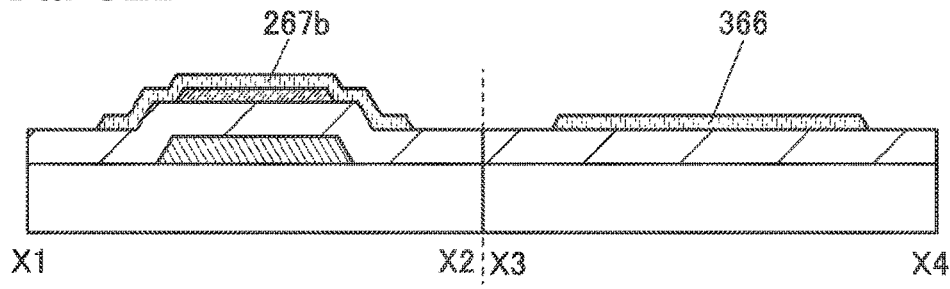

Next, as shown in FIG. 52D, after a mask is formed over the oxide semiconductor film 265b by a photolithography process, the oxide semiconductor film 265b is etched to form the oxide semiconductor film 267b covering the oxide semiconductor film 267a in the driver circuit portion and form the oxide semiconductor film 366 in the pixel portion. Note that in this step, the oxide semiconductor film 267b is formed to cover a top surface and a side surface of the oxide semiconductor film 267a, to prevent the oxide semiconductor film 267a from being etched in a later step of forming conductive films serving as a source electrode and a drain electrode. This is preferable because variations in the length of the oxide semiconductor film 267a in the channel width direction of the transistor can be reduced.

After that, the steps illustrated in FIGS. 30A to 30D and FIGS. 31A to 31C are performed, whereby the transistor 390 and the transistor 397a can be manufactured.

The structure, method, and the like described in this embodiment can be used as appropriate in combination with any of the structures, methods, and the like described in the other embodiments.

Embodiment 5

In this embodiment, one embodiment of a semiconductor device is described with reference to FIGS. 37A and 37B, FIGS. 38A and 38B, and FIGS. 39A and 39B. Here, a display device is described as an example of a semiconductor device. A pixel portion of the display device includes a plurality of pixels. Here, structures of a transistor included in one pixel and a capacitor connected to the transistor are described.

<Structure 1 of Semiconductor Device>

Figure 37A:
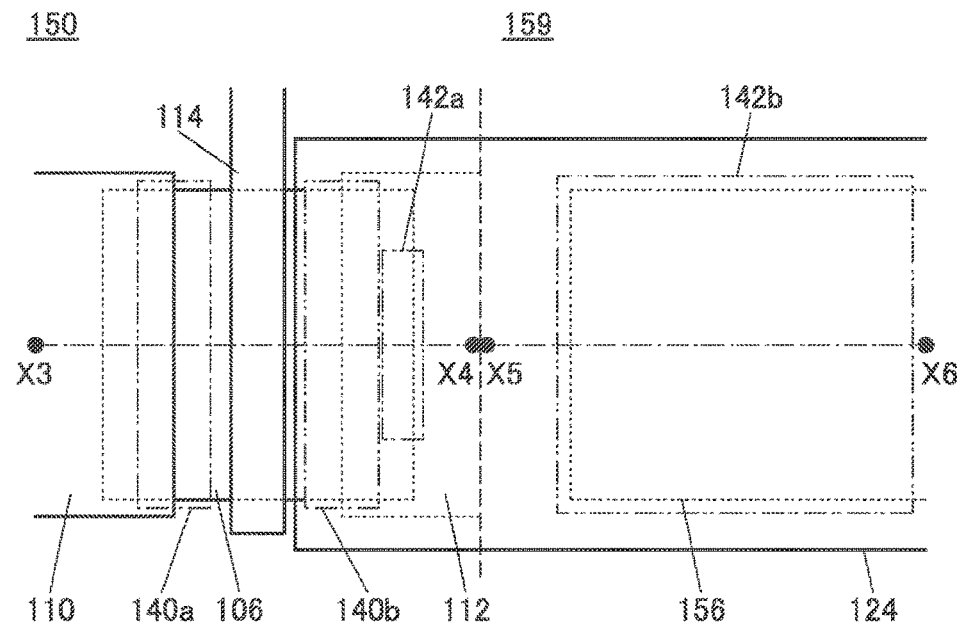
FIGS. 37A and 37B are a top view and a cross-sectional view which illustrate one embodiment of a semiconductor device.
Figure 37B:
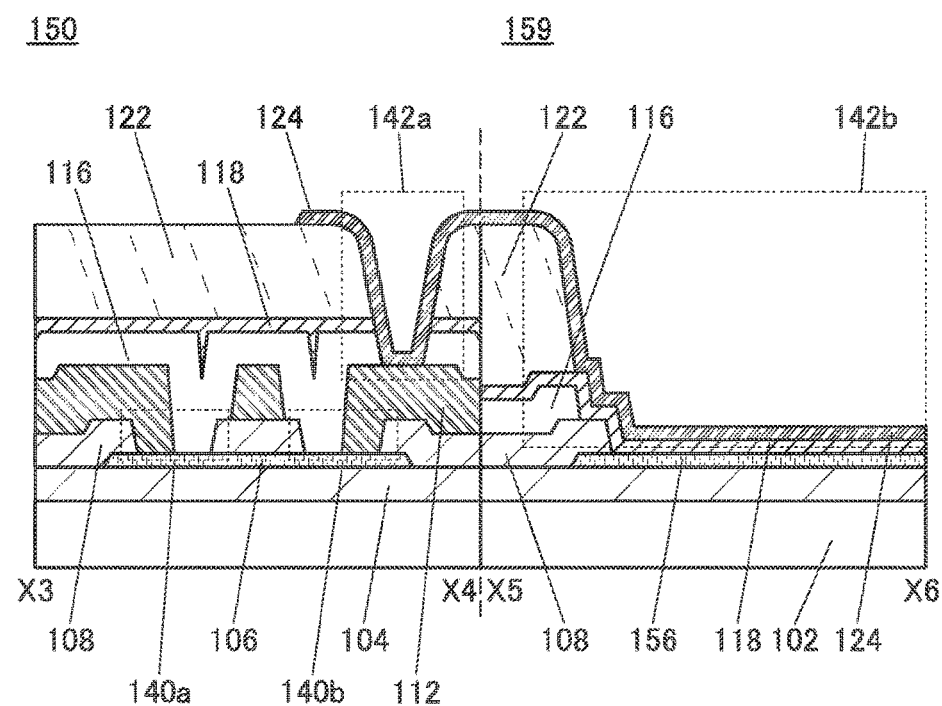

FIGS. 37A and 37B illustrate structures of the transistor 150 included in a pixel and a capacitor 159 connected to the transistor 150.

FIGS. 37A and 37B are top views and cross-sectional views of the transistor 150 and the capacitor 159. FIG. 37A shows the top views of the transistor 150 and the capacitor 159. FIG. 37B shows the cross-sectional views along the dashed-dotted line X3-X4 and the dashed-dotted line X5-X6 in FIG. 37A.

The transistor 150 illustrated in FIGS. 37A and 37B has a structure similar to that of the transistor 150 in Embodiment 1.

The capacitor 159 includes an oxide semiconductor film 156 over the insulating film 104, the insulating film 118 in contact with the oxide semiconductor film 156, and a conductive film 124 over the insulating film 118.

An insulating film 122 is formed over the insulating film 118. The conductive film 124 is in contact with the conductive film 112 in an opening portion 142a in the insulating film 116, the insulating film 118, and the insulating film 122. The conductive film 124 is in contact with the insulating film 118 in an opening portion 142b in the insulating film 108, the insulating film 116, and the insulating film 122.

As the insulating film 122, for example, an organic resin film of polyimide, acrylic, polyamide, or epoxy can be used. The insulating film 122 preferably has a thickness greater than or equal to 500 nm and less than or equal to 10 μm.

The conductive film 124 can be formed using a light-transmitting conductive material such as indium tin oxide, indium oxide including tungsten oxide, indium zinc oxide including tungsten oxide, indium oxide including titanium oxide, indium tin oxide including titanium oxide, indium zinc oxide, or indium tin oxide including silicon oxide.

The conductive film 124 can be formed using a metal element which reflects light, such as silver, aluminum, chromium, copper, tantalum, titanium, molybdenum, or tungsten. Furthermore, a film formed using a metal element which reflects light and a film formed using the above light-transmitting conductive material may be stacked.

The oxide semiconductor film 156 has a light-transmitting property because of being formed concurrently with the oxide semiconductor film 106. Furthermore, the impurity element is added to the oxide semiconductor film 156 in a manner similar to that of the region 106b included in the oxide semiconductor film 106. Thus, the oxide semiconductor film 156 has conductivity.

In the case where the conductive film 124 is formed using a light-transmitting conductive material, the capacitor 159 has a light-transmitting property. Thus, by providing the capacitor 159 in the pixel of the display device, the aperture ratio in the pixel can be increased.

<Structure 2 of Semiconductor Device>

Figure 38A:
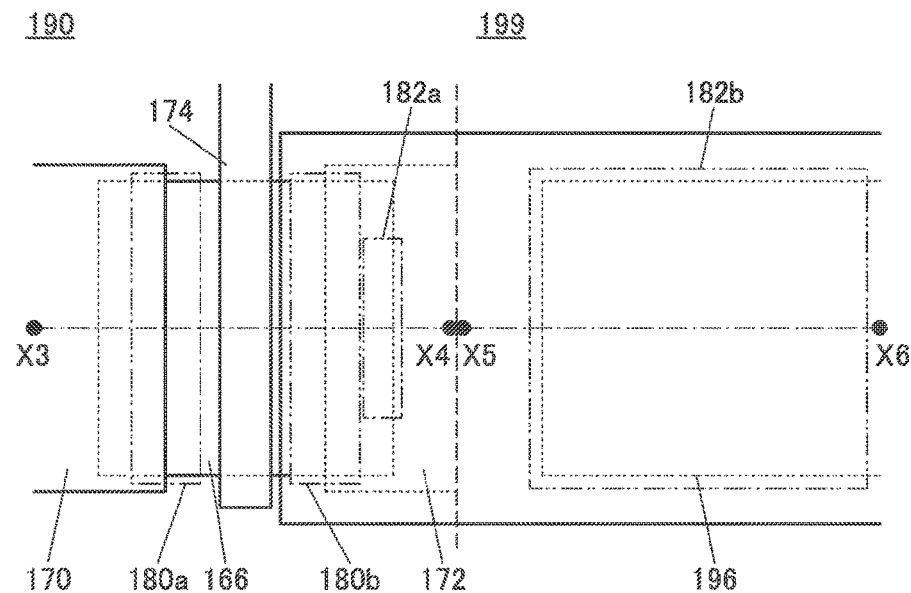
FIGS. 38A and 38B are a top view and a cross-sectional view which illustrate one embodiment of a semiconductor device.
Figure 38B:
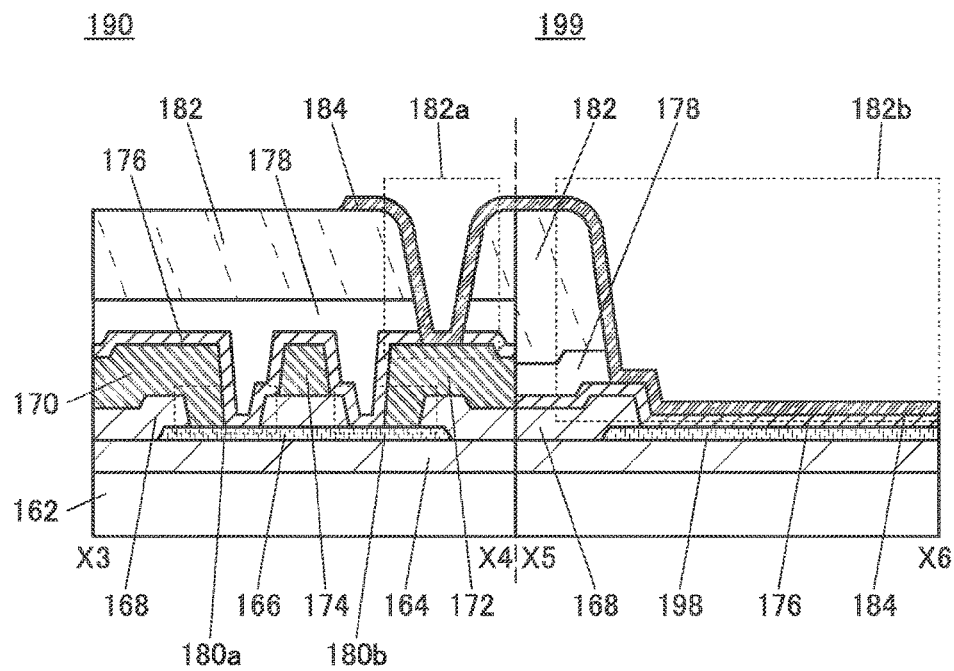

FIGS. 38A and 38B illustrate structures of the transistor 190 included in a pixel and a capacitor 199 connected to the transistor 190.

FIGS. 38A and 38B are top views and cross-sectional views of the transistor 190 and the capacitor 199. FIG. 38A shows the top views of the transistor 190 and the capacitor 199. FIG. 38B shows the cross-sectional views along the dashed-dotted line X3-X4 and the dashed-dotted line X5-X6 in FIG. 38A.

The transistor 190 illustrated in FIGS. 38A and 38B has a structure similar to that of the transistor 190 in Embodiment 2.

The capacitor 199 includes an oxide semiconductor film 198 over the insulating film 164, the insulating film 176 in contact with the oxide semiconductor film 198, and a conductive film 184 over the insulating film 176.

An insulating film 182 is formed over the insulating film 178. The conductive film 184 is in contact with the conductive film 172 in an opening portion 182a in the insulating film 176, the insulating film 178, and the insulating film 182. The conductive film 184 is in contact with the insulating film 176 in an opening portion 182b in the insulating film 168, the insulating film 178, and the insulating film 182.

The insulating film 182 can be formed using the material for the insulating film 122 illustrated in FIG. 37B, as appropriate.

The conductive film 184 can be formed using the material for the conductive film 124 illustrated in FIG. 37B, as appropriate.

The oxide semiconductor film 198 has a light-transmitting property because of being formed concurrently with the oxide semiconductor film 166. Furthermore, the impurity element is added to the oxide semiconductor film 198 in a manner similar to that of the region 166b included in the oxide semiconductor film 166. Thus, the oxide semiconductor film 198 has conductivity.

In the case where the conductive film 184 is formed using a light-transmitting conductive material, the capacitor 199 has a light-transmitting property. Thus, by providing the capacitor 199 in the pixel of the display device, the aperture ratio in the pixel can be increased.

Furthermore, as one electrode of the capacitor, the oxide semiconductor film having conductivity can be formed concurrently with the oxide semiconductor film included in the transistor. Therefore, the transistor and the capacitor can be concurrently formed without increasing the number of masks.

<Structure 3 of Semiconductor Device>

Figure 39A:
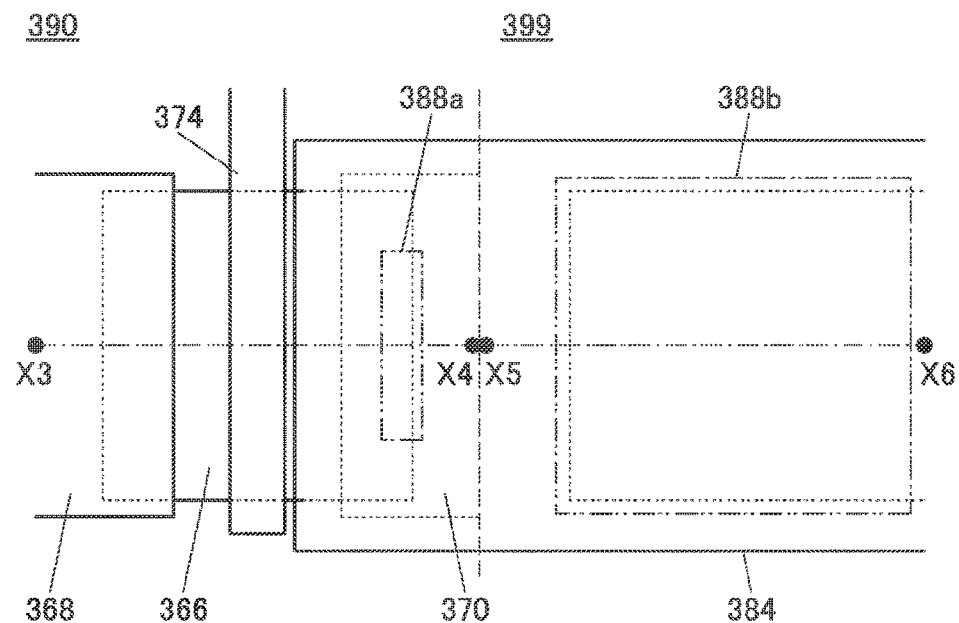
FIGS. 39A and 39B are a top view and a cross-sectional view which illustrate one embodiment of a semiconductor device.
Figure 39B:
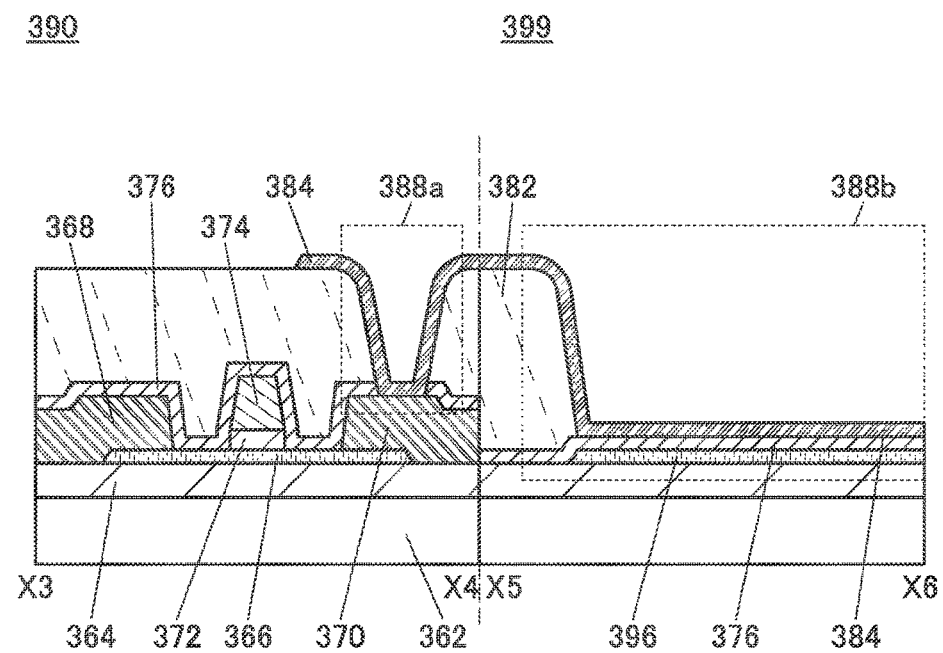

FIGS. 39A and 39B illustrate structures of the transistor 390 included in a pixel and a capacitor 399 connected to the transistor 390.

FIGS. 39A and 39B are top views and cross-sectional views of the transistor 390 and the capacitor 399. FIG. 39A shows the top views of the transistor 390 and the capacitor 399. FIG. 39B shows the cross-sectional views along the dashed-dotted line X3-X4 and the dashed-dotted line X5-X6 in FIG. 39A.

The transistor 390 illustrated in FIGS. 39A and 39B has a structure similar to that of the transistor 390 in Embodiment 3.

The capacitor 399 includes an oxide semiconductor film 396 over the insulating film 364, the insulating film 376 in contact with the oxide semiconductor film 396, and a conductive film 384 over the insulating film 376.

An insulating film 382 is formed over the insulating film 376. The conductive film 384 is in contact with the conductive film 370 in an opening portion 388a in the insulating film 376 and the insulating film 382. The conductive film 384 is in contact with the insulating film 376 in an opening portion 388b in the insulating film 382.

The insulating film 382 can be formed using the material for the insulating film 122 illustrated in FIG. 37B, as appropriate.

The conductive film 384 can be formed using the material for the conductive film 124 illustrated in FIG. 37B, as appropriate.

The oxide semiconductor film 396 has a light-transmitting property because of being formed concurrently with the oxide semiconductor film 366. Furthermore, the impurity element is added to the oxide semiconductor film 396 in a manner similar to that of the region 366b included in the oxide semiconductor film 366. Thus, the oxide semiconductor film 396 has conductivity.

In the case where the conductive film 384 is formed using a light-transmitting conductive material, the capacitor 399 has a light-transmitting property. Thus, by providing the capacitor 399 in the pixel of the display device, the aperture ratio in the pixel can be increased.

Furthermore, as one electrode of the capacitor, the oxide semiconductor film having conductivity can be formed concurrently with the oxide semiconductor film included in the transistor. Therefore, the transistor and the capacitor can be concurrently formed without increasing the number of masks.

The structures, method, and the like described in this embodiment can be used as appropriate in combination with any of the structures, methods, and the like described in the other embodiments.

Embodiment 6

In this embodiment, the structure of an oxide semiconductor film included in a semiconductor device of one embodiment of the present invention is described below in detail.

<Structure of Oxide Semiconductor>

A structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and a microcrystalline oxide semiconductor.

<CAAC-OS>

First, a CAAC-OS is described. Note that a CAAC-OS can be referred to as an oxide semiconductor including c-axis aligned nanocrystals (CANC).

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 47A:
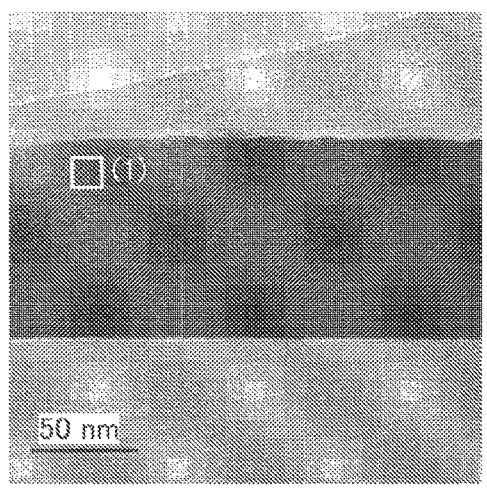
FIGS. 47A to 47D are Cs-corrected high-resolution TEM images of a cross section of a CAAC-OS and a cross-sectional schematic view of a CAAC-OS.

A CAAC-OS observed with a TEM is described below. FIG. 47A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 47B:
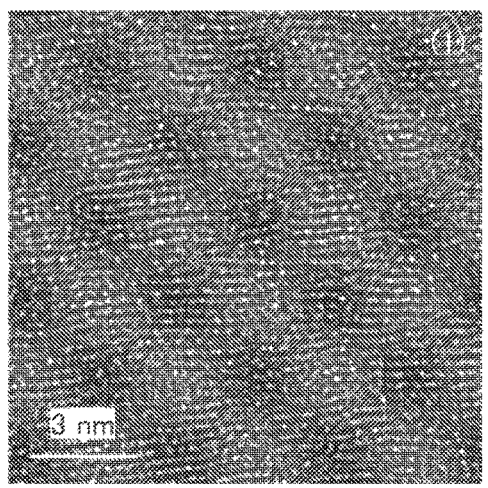

FIG. 47B is an enlarged Cs-corrected high-resolution TEM image of a region (1) in FIG. 47A. FIG. 47B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 47C:
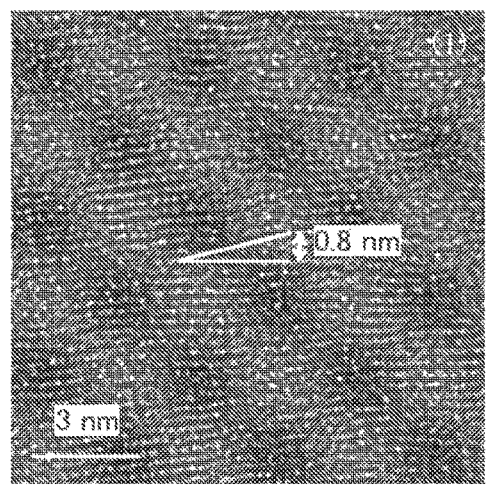

As shown in FIG. 47B, the CAAC-OS has a characteristic atomic arrangement. The characteristic atomic arrangement is denoted by an auxiliary line in FIG. 47C. FIGS. 47B and 47C prove that the size of a pellet is approximately 1 nm to 3 nm, and the size of a space caused by tilt of the pellets is approximately 0.8 nm. Therefore, the pellet can also be referred to as a nanocrystal (nc).

Figure 47D:
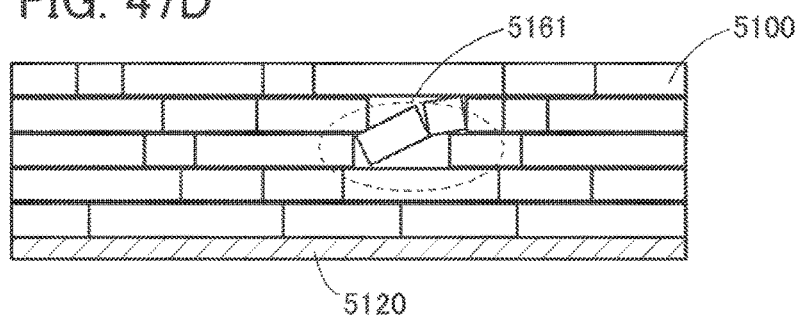

Here, according to the Cs-corrected high-resolution TEM images, the schematic arrangement of pellets 5100 of a CAAC-OS over a substrate 5120 is illustrated by such a structure in which bricks or blocks are stacked (see FIG. 47D). The part in which the pellets are tilted as observed in FIG. 47C corresponds to a region 5161 shown in FIG. 47D.

Figure 48A:
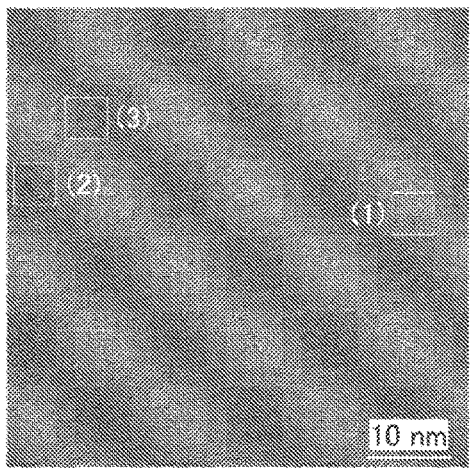
FIGS. 48A to 48D are Cs-corrected high-resolution TEM images of a plane of a CAAC-OS.
Figure 48B:
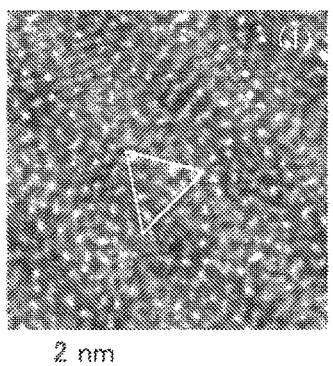
Figure 48C:
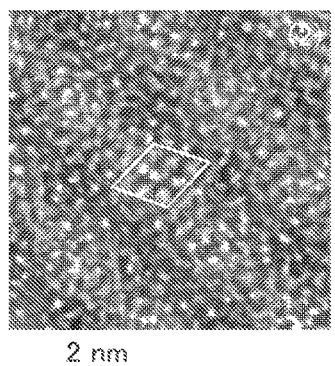
Figure 48D:
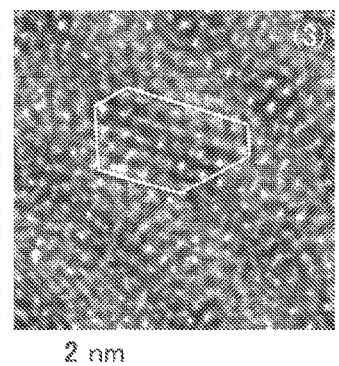

FIG. 48A shows a Cs-corrected high-resolution TEM image of a plane of the CAAC-OS observed from a direction substantially perpendicular to the sample surface. FIGS. 48B, 48C, and 48D are enlarged Cs-corrected high-resolution TEM images of regions (1), (2), and (3) in FIG. 48A, respectively. FIGS. 48B, 48C, and 48D indicate that metal atoms are arranged in a triangular, quadrangular, or hexagonal configuration in a pellet. However, there is no regularity of arrangement of metal atoms between different pellets.

Figure 49A:
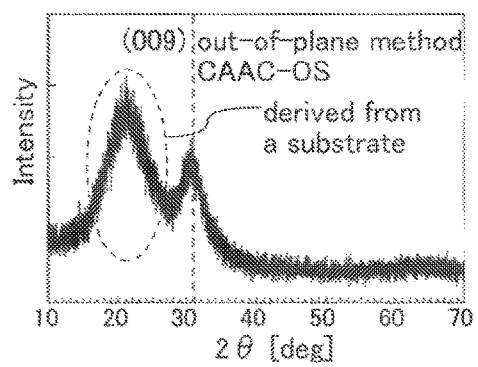
FIGS. 49A to 49C show structural analysis of a CAAC-OS and a single crystal oxide semiconductor by XRD.

Next, a CAAC-OS analyzed by X-ray diffraction (XRD) is described. For example, when the structure of a CAAC-OS including an InGaZnO$_4$ crystal is analyzed by an out-of-plane method, a peak appears at a diffraction angle (2θ) of around 31° as shown in FIG. 49A. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 49B:
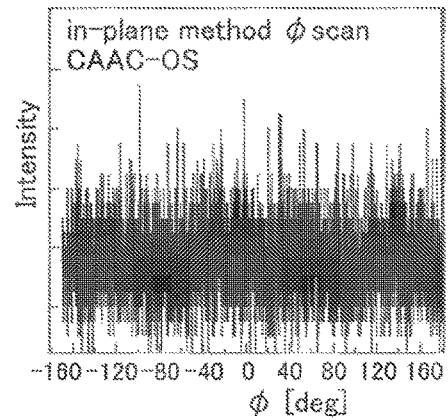
Figure 49C:
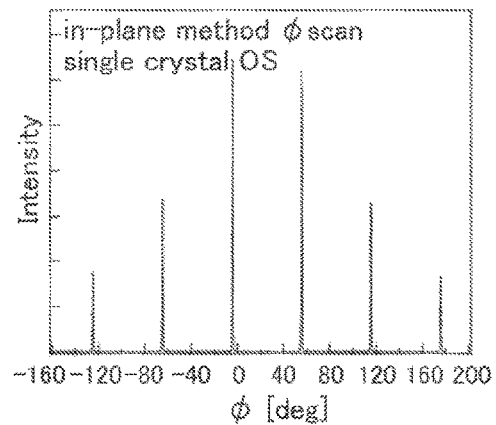

On the other hand, in structural analysis of the CAAC-OS by an in-plane method in which an X-ray is incident on a sample in a direction substantially perpendicular to the c-axis, a peak appears when 2θ is around 56°. This peak is derived from the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 49B, a peak is not clearly observed. In contrast, in the case of a single crystal oxide semiconductor of InGaZnO$_4$, when φ scan is performed with 2θ fixed at around 56°, as shown in FIG. 49C, six peaks which are derived from crystal planes equivalent to the (110) plane are observed. Accordingly, the structural analysis using XRD shows that the directions of a-axes and b-axes are different in the CAAC-OS.

Figure 55A:
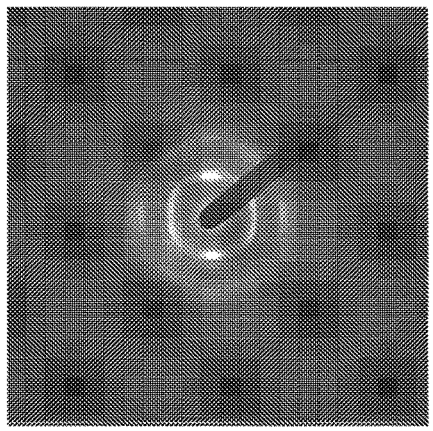
FIGS. 55A and 55B show electron diffraction patterns of a CAAC-OS.
Figure 55B:
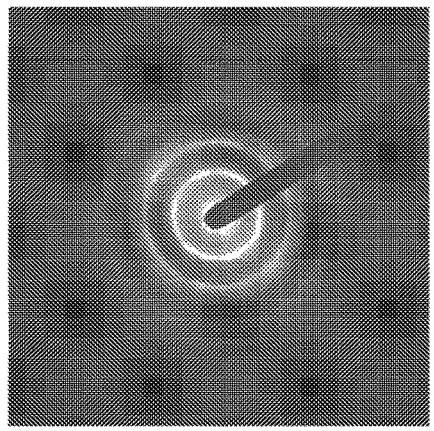

Next, a CAAC-OS analyzed by electron diffraction is described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 55A might be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 55B shows a diffraction pattern obtained in such a manner that an electron beam with a probe diameter of 300 nm is incident on the same sample in a direction perpendicular to the sample surface. As in FIG. 55B, a ring-like diffraction pattern is observed. Thus, the electron diffraction also indicates that the a-axes and b-axes of the pellets included in the CAAC-OS do not have regular alignment. The first ring in FIG. 55B is considered to be derived from the (010) plane, the (100) plane, and the like of the InGaZnO$_4$ crystal. The second ring in FIG. 55B is considered to be derived from the (110) plane and the like.

Moreover, the CAAC-OS is an oxide semiconductor having a low density of defect states. Defects in the oxide semiconductor are, for example, a defect due to impurity and oxygen vacancy. Therefore, the CAAC-OS can be regarded as an oxide semiconductor with a low impurity concentration, or an oxide semiconductor having a small amount of oxygen vacancy.

The impurity contained in the oxide semiconductor might serve as a carrier trap or serve as a carrier generation source. Furthermore, oxygen vacancy in the oxide semiconductor serves as a carrier trap or serves as a carrier generation source when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

An oxide semiconductor having a low density of defect states (a small amount of oxygen vacancy) can have a low carrier density. Such an oxide semiconductor is referred to as a highly purified intrinsic or substantially highly purified intrinsic oxide semiconductor. A CAAC-OS has a low impurity concentration and a low density of defect states. That is, a CAAC-OS is likely to be highly purified intrinsic or substantially highly purified intrinsic oxide semiconductor. Thus, a transistor including a CAAC-OS rarely has negative threshold voltage (is rarely normally on). The highly purified intrinsic or substantially highly purified intrinsic oxide semiconductor has few carrier traps. An electric charge trapped by the carrier traps in the oxide semiconductor takes a long time to be released. The trapped electric charge may behave like a fixed electric charge. Thus, the transistor which includes the oxide semiconductor having a high impurity concentration and a high density of defect states might have unstable electrical characteristics. However, a transistor including a CAAC-OS has small variation in electrical characteristics and high reliability.

Since the CAAC-OS has a low density of defect states, carriers generated by light irradiation or the like are less likely to be trapped in defect states. Therefore, in a transistor using the CAAC-OS, change in electrical characteristics due to irradiation with visible light or ultraviolet light is small.

<Microcrystalline Oxide Semiconductor>

Next, a microcrystalline oxide semiconductor is described.

A microcrystalline oxide semiconductor has a region in which a crystal part is observed and a region in which a crystal part is not observed clearly in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.

<Amorphous Oxide Semiconductor>

Next, an amorphous oxide semiconductor is described.

The amorphous oxide semiconductor is such an oxide semiconductor having disordered atomic arrangement and no crystal part and exemplified by an oxide semiconductor which exists in an amorphous state as quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and only a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of a crystal part, for example, a CAAC-OS and an nc-OS cannot be called an amorphous oxide semiconductor or a completely amorphous oxide semiconductor.

<Amorphous-Like Oxide Semiconductor>

Note that an oxide semiconductor may have a structure intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the Samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 56:
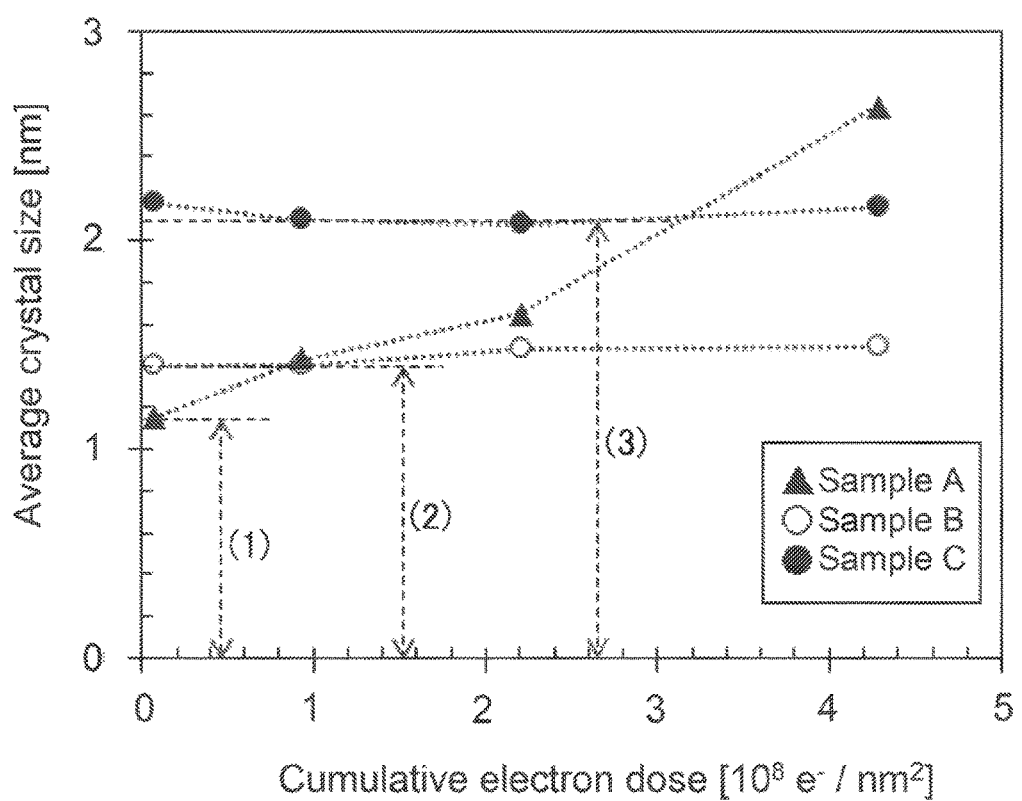
FIG. 56 shows a change in crystal part of an In—Ga—Zn oxide induced by electron irradiation.

FIG. 56 shows change in the average size of crystal parts (at 22 points to 45 points) in each sample. Note that the crystal part size corresponds to the length of a lattice fringe. FIG. 56 indicates that the crystal part size in the a-like OS increases with an increase in the cumulative electron dose. Specifically, as shown by (1) in FIG. 56, a crystal part of approximately 1.2 nm at the start of TEM observation (the crystal part is also referred to as an initial nucleus) grows to a size of approximately 2.6 nm at a cumulative electron dose of 4.2×10$^8$ e$^-$/nm$^2$. In contrast, the crystal part size in the nc-OS and the CAAC-OS shows little change from the start of electron irradiation to a cumulative electron dose of 4.2×10$^8$ e$^-$/nm$^2$. Specifically, as shown by (2) and (3) in FIG. 56, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, a microcrystalline oxide semiconductor, and a CAAC-OS, for example.

<Deposition Model>

Examples of deposition models of a CAAC-OS and an nc-OS are described below.

Figure 57A:
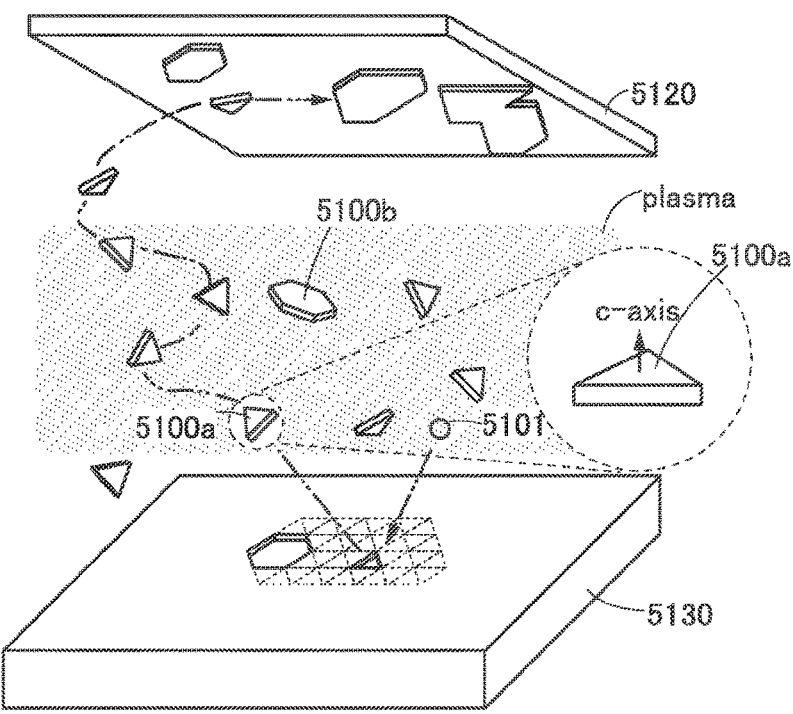
FIGS. 57A and 57B are schematic views showing deposition models of a CAAC-OS and an nc-OS.

FIG. 57A is a schematic view of the inside of a deposition chamber where a CAAC-OS is deposited by a sputtering method.

A target 5130 is attached to a backing plate. A plurality of magnets is provided to face the target 5130 with the backing plate positioned therebetween. The plurality of magnets generate a magnetic field. A sputtering method in which the disposition rate is increased by utilizing a magnetic field of magnets is referred to as a magnetron sputtering method.

The substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5130, and plasma is observed. The magnetic field forms a high-density plasma region in the vicinity of the target 5130. In the high-density plasma region, the deposition gas is ionized, so that an ion 5101 is generated. Examples of the ion 5101 include an oxygen cation (O$^+$) and an argon cation (Ar$^+$).

Figure 58A:
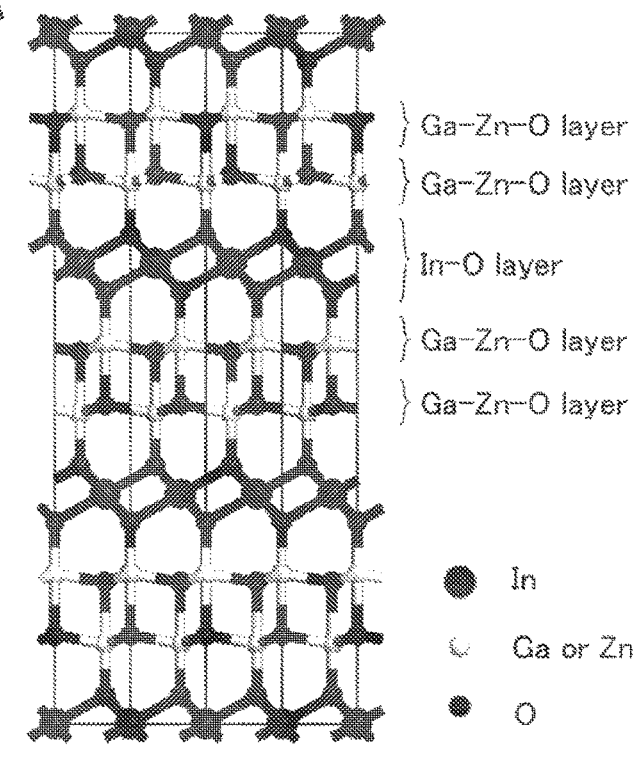
FIGS. 58A to 58C show an InGaZnO$_4$ crystal and a pellet.

Here, the target 5130 has a polycrystalline structure which includes a plurality of crystal grains and in which a cleavage plane exists in at least one crystal grain. FIG. 58A shows a structure of an InGaZnO$_4$ crystal included in the target 5130 as an example. Note that FIG. 58A shows a structure of the case where the InGaZnO$_4$ crystal is observed from a direction parallel to the b-axis. FIG. 58A indicates that oxygen atoms in a Ga—Zn—O layer are positioned close to those in an adjacent Ga—Zn—O layer. The oxygen atoms have negative charge, whereby repulsive force is generated between the two Ga—Zn—O layers. As a result, the InGaZnO$_4$ crystal has a cleavage plane between the two adjacent Ga—Zn—O layers.

The ion 5101 generated in the high-density plasma region is accelerated toward the target 5130 side by an electric field, and then collides with the target 5130. At this time, a pellet 5100a and a pellet 5100b which are flat-plate-like (pellet-like) sputtered particles are separated and sputtered from the cleavage plane. Note that structures of the pellet 5100a and the pellet 5100b may be distorted by an impact of collision of the ion 5101.

The pellet 5100a is a flat-plate-like (pellet-like) sputtered particle having a triangle plane, e.g., regular triangle plane. The pellet 5100b is a flat-plate-like (pellet-like) sputtered particle having a hexagon plane, e.g., regular hexagon plane. Note that flat-plate-like (pellet-like) sputtered particles such as the pellet 5100a and the pellet 5100b are collectively called pellets 5100. The shape of a flat plane of the pellet 5100 is not limited to a triangle or a hexagon. For example, the flat plane may have a shape formed by combining two or more triangles. For example, a quadrangle (e.g., rhombus) may be formed by combining two triangles (e.g., regular triangles).

Figure 58B:
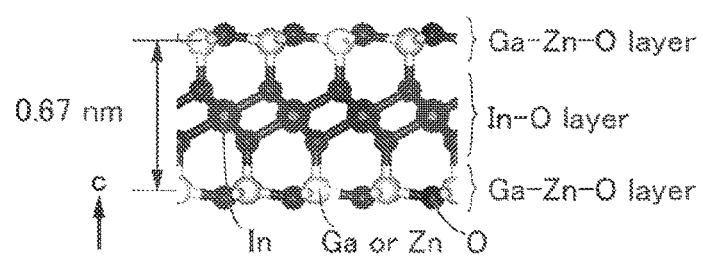
Figure 58C:
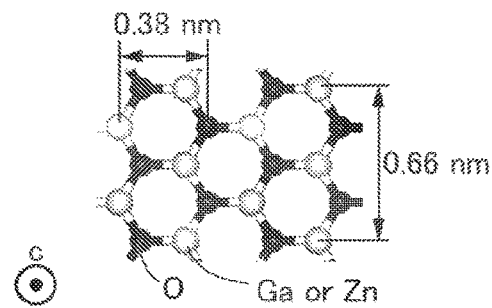

The thickness of the pellet 5100 is determined depending on the kind of deposition gas and the like. The thicknesses of the pellets 5100 are preferably uniform; the reason for this is described later. In addition, the sputtered particle preferably has a pellet shape with a small thickness as compared to a dice shape with a large thickness. For example, the thickness of the pellet 5100 is greater than or equal to 0.4 nm and less than or equal to 1 nm, preferably greater than or equal to 0.6 nm and less than or equal to 0.8 nm. In addition, for example, the width of the pellet 5100 is greater than or equal to 1 nm and less than or equal to 3 nm, preferably greater than or equal to 1.2 nm and less than or equal to 2.5 nm. The pellet 5100 corresponds to the initial nucleus in the description of (1) in FIG. 56. For example, when the ion 5101 collides with the target 5130 including an In—Ga—Zn oxide, the pellet 5100 that includes three layers of a Ga—Zn—O layer, an In—O layer, and a Ga—Zn—O layer as shown in FIG. 58B is separated. Note that FIG. 58C shows the structure of the separated pellet 5100 which is observed from a direction parallel to the c-axis. The pellet 5100 has a nanometer-sized sandwich structure including two Ga—Zn—O layers and an In—O layer.

The pellet 5100 may receive a charge when passing through the plasma, so that side surfaces thereof are negatively or positively charged. In the pellet 5100, for example, an oxygen atom positioned on its side surface may be negatively charged. When the side surfaces are charged with the same polarity, charges repel each other, and accordingly, the pellet 5100 can maintain a flat-plate shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged. In addition, the pellet 5100 may grow by being bonded with an indium atom, a gallium atom, a zinc atom, an oxygen atom, or the like when passing through plasma. A difference in size between (2) and (1) in FIG. 56 corresponds to the amount of growth in plasma. Here, in the case where the temperature of the substrate 5120 is at around room temperature, the pellet 5100 on the substrate 5120 hardly grows; thus, an nc-OS is formed (see FIG. 57B). An nc-OS can be deposited when the substrate 5120 has a large size because the deposition of an nc-OS can be carried out at room temperature. Note that in order that the pellet 5100 grows in plasma, it is effective to increase deposition power in sputtering. High deposition power can stabilize the structure of the pellet 5100.

Figure 57B:
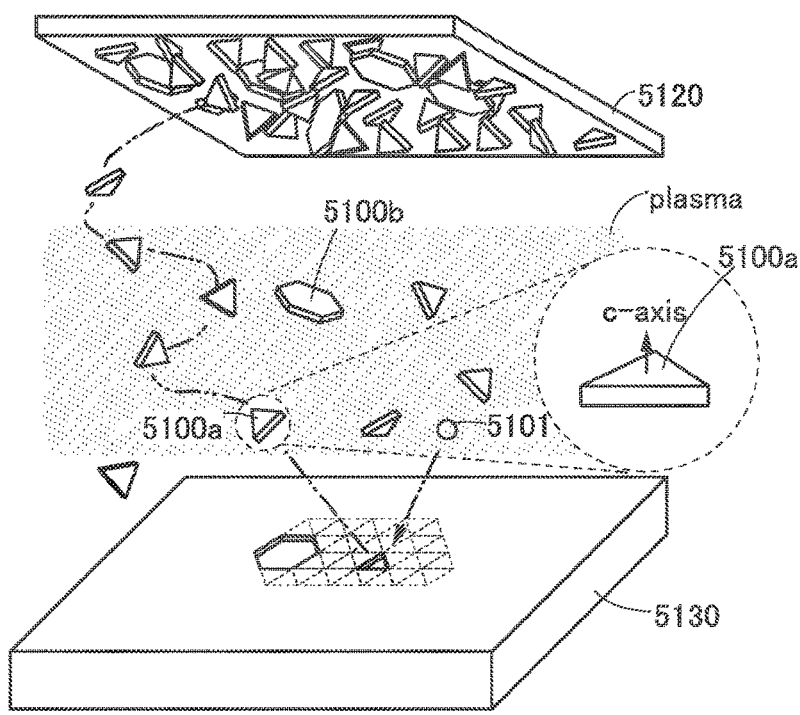

As shown in FIGS. 57A and 57B, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field in a direction parallel to the top surface of the substrate 5120 (also referred to as a horizontal magnetic field) is generated. A potential difference is given between the substrate 5120 and the target 5130, and accordingly, current flows from the substrate 5120 toward the target 5130. Thus, the pellet 5100 is given a force (Lorentz force) on the top surface of the substrate 5120 by an effect of the magnetic field and the current. This is explainable with Fleming's left-hand rule.

The mass of the pellet 5100 is larger than that of an atom. Therefore, to move the pellet 5100 over the top surface of the substrate 5120, it is important to apply some force to the pellet 5100 from the outside. One kind of the force may be force which is generated by the action of a magnetic field and current. In order to apply a sufficient force to the pellet 5100 so that the pellet 5100 moves over a top surface of the substrate 5120, it is preferable to provide, on the top surface, a region where the magnetic field in a direction parallel to the top surface of the substrate 5120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate 5120 is 1.5 times or higher, preferably twice or higher, further preferably 3 times or higher, still further preferably 5 times or higher as high as the magnetic field in a direction perpendicular to the top surface of the substrate 5120.

At this time, the magnets and the substrate 5120 are moved or rotated relatively, whereby the direction of the horizontal magnetic field on the top surface of the substrate 5120 continues to change. Therefore, the pellet 5100 can be moved in various directions on the top surface of the substrate 5120 by receiving forces in various directions.

Furthermore, as shown in FIG. 57A, when the substrate 5120 is heated, resistance between the pellet 5100 and the substrate 5120 due to friction or the like is low. As a result, the pellet 5100 glides above the top surface of the substrate 5120. The glide of the pellet 5100 is caused in a state where its flat plane faces the substrate 5120. Then, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancies in a CAAC-OS might be filled; thus, the CAAC-OS has a low density of defect states. Note that the temperature of the top surface of the substrate 5120 is, for example, higher than or equal to 100° C. and lower than 500° C., higher than or equal to 150° C. and lower than 450° C., or higher than or equal to 170° C. and lower than 400° C. Hence, even when the substrate 5120 has a large size, it is possible to deposit a CAAC-OS.

Furthermore, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur, which is caused by turning the pellet 5100 into substantially single crystal. Thus, formation of defects such as a grain boundary due to expansion of a space between the pellets 5100 can be prevented, and accordingly, generation of crevasses can be prevented.

The CAAC-OS does not have a structure like a board of a single crystal oxide semiconductor but has arrangement with a group of pellets 5100 (nanocrystals) like stacked bricks or blocks. Furthermore, a grain boundary does not exist between the pellets 5100. Therefore, even when deformation such as shrink occurs in the CAAC-OS owing to heating during deposition, heating or bending after deposition, it is possible to relieve local stress or release distortion. Therefore, this structure is suitable for a flexible semiconductor device. Note that the nc-OS has arrangement in which pellets 5100 (nanocrystals) are randomly stacked.

When the target 5130 is sputtered with the ion 5101, in addition to the pellets 5100, zinc oxide or the like may be separated. The zinc oxide is lighter than the pellet and thus reaches the top surface of the substrate 5120 before the pellet. As a result, the zinc oxide forms a zinc oxide layer 5102 with a thickness greater than or equal to 0.1 nm and less than or equal to 10 nm, greater than or equal to 0.2 nm and less than or equal to 5 nm, or greater than or equal to 0.5 nm and less than or equal to 2 nm. FIGS. 59A to 59D are cross-sectional schematic views.

Figure 59A:
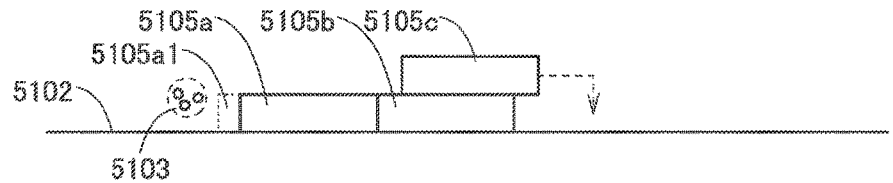
FIGS. 59A to 59D are schematic views showing a deposition model of a CAAC-OS.

As illustrated in FIG. 59A, a pellet 5105*a* and a pellet 5105*b* are deposited over the zinc oxide layer 5102. Here, side surfaces of the pellet 5105*a* and the pellet 5105*b* are in contact with each other. In addition, a pellet 5105*c* is deposited over the pellet 5105*b*, and then glides over the pellet 5105*b*. Furthermore, a plurality of particles 5103 separated from the target together with the zinc oxide is crystallized by heat from the substrate 5120 to form a region 5105*a*1 on another side surface of the pellet 5105*a*. Note that the plurality of particles 5103 may contain oxygen, zinc, indium, gallium, or the like.

Figure 59B:
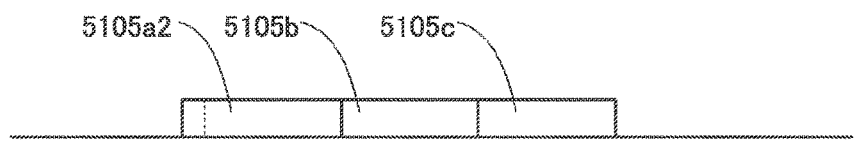

Then, as illustrated in FIG. 59B, the region 5105*a*1 grows to part of the pellet 5105*a* to form a pellet 5105*a*2. In addition, a side surface of the pellet 5105*c* is in contact with another side surface of the pellet 5105*b*.

Figure 59C:
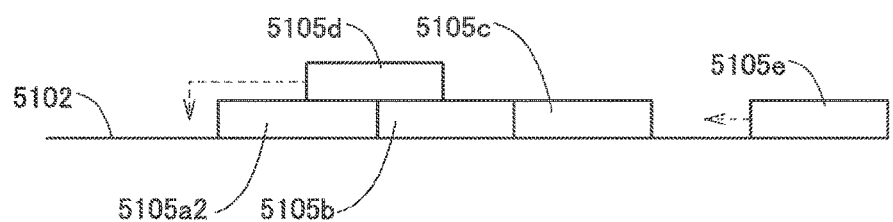

Next, as illustrated in FIG. 59C, a pellet 5105*d* is deposited over the pellet 5105*a*2 and the pellet 5105*b*, and then glides over the pellet 5105*a*2 and the pellet 5105*b*. Furthermore, a pellet 5105*e* glides toward another side surface of the pellet 5105*c* over the zinc oxide layer 5102.

Figure 59D:
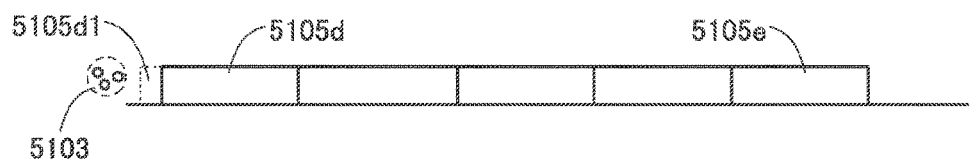

Then, as illustrated in FIG. 59D, the pellet 5105*d* is placed so that a side surface of the pellet 5105*d* is in contact with a side surface of the pellet 5105*a*2. Furthermore, a side surface of the pellet 5105*e* is in contact with another side surface of the pellet 5105*c*. A plurality of particles 5103 separated from the target 5130 together with the zinc oxide is crystallized by heat from the substrate 5120 to form a region 5105*d*1 on another side surface of the pellet 5105*d*.

As described above, deposited pellets are placed to be in contact with each other and then growth is caused at side surfaces of the pellets, whereby a CAAC-OS is formed over the substrate 5120. Therefore, each pellet of the CAAC-OS is larger than that of the nc-OS. A difference in size between (3) and (2) in FIG. 56 corresponds to the amount of growth after deposition.

When spaces between pellets are extremely small, the pellets may form a large pellet. The large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above. In this case, in an oxide semiconductor used for a minute transistor, a channel formation region might be fit inside the large pellet. That is, the region having a single crystal structure can be used as the channel formation region. Furthermore, when the size of the pellet is increased, the region having a single crystal structure can be used as the channel formation region, the source region, and the drain region of the transistor.

In this manner, when the channel formation region or the like of the transistor is formed in a region having a single crystal structure, the frequency characteristics of the transistor can be increased in some cases.

As shown in such a model, the pellets 5100 are considered to be deposited on the substrate 5120. Thus, a CAAC-OS can be deposited even when a formation surface does not have a crystal structure; therefore, a growth mechanism in this case is different from epitaxial growth. In addition, laser crystallization is not needed for formation of a CAAC-OS, and a uniform film can be formed even over a large-sized glass substrate or the like. For example, even when the top surface (formation surface) of the substrate 5120 has an amorphous structure (e.g., the top surface is formed of amorphous silicon oxide), a CAAC-OS can be formed.

In addition, it is found that in formation of the CAAC-OS, the pellets 5100 are arranged in accordance with the top surface shape of the substrate 5120 that is the formation surface even when the formation surface has unevenness. For example, in the case where the top surface of the substrate 5120 is flat at the atomic level, the pellets 5100 are arranged so that flat planes parallel to the a-b plane face downwards. In the case where the thicknesses of the pellets 5100 are uniform, a layer with a uniform thickness, flatness, and high crystallinity is formed. By stacking n layers (n is a natural number), the CAAC-OS can be obtained.

In the case where the top surface of the substrate 5120 has unevenness, a CAAC-OS in which n layers (n is a natural number) in each of which the pellets 5100 are arranged along the unevenness are stacked is formed. Since the substrate 5120 has unevenness, a gap is easily generated between the pellets 5100 in the CAAC-OS in some cases. Note that, even in such a case, owing to intermolecular force, the pellets 5100 are arranged so that a gap between the pellets is as small as possible even on the unevenness surface. Therefore, even when the film formation surface has unevenness, a CAAC-OS with high crystallinity can be obtained.

Since a CAAC-OS is deposited in accordance with such a model, the sputtered particle preferably has a pellet shape with a small thickness. Note that when the sputtered particles has a dice shape with a large thickness, planes facing the substrate 5120 vary; thus, the thicknesses and orientations of the crystals cannot be uniform in some cases.

According to the deposition model described above, a CAAC-OS with high crystallinity can be formed even on a film formation surface with an amorphous structure.

The structure and method described in this embodiment can be implemented by being combined as appropriate with any of the other structures and methods described in the other embodiments.

Embodiment 7

In this embodiment, an example of a display device including the transistor described above and having a display function is described below with reference to FIGS. 40A and 40B, FIG. 41, and FIG. 42.

Figure 40A:
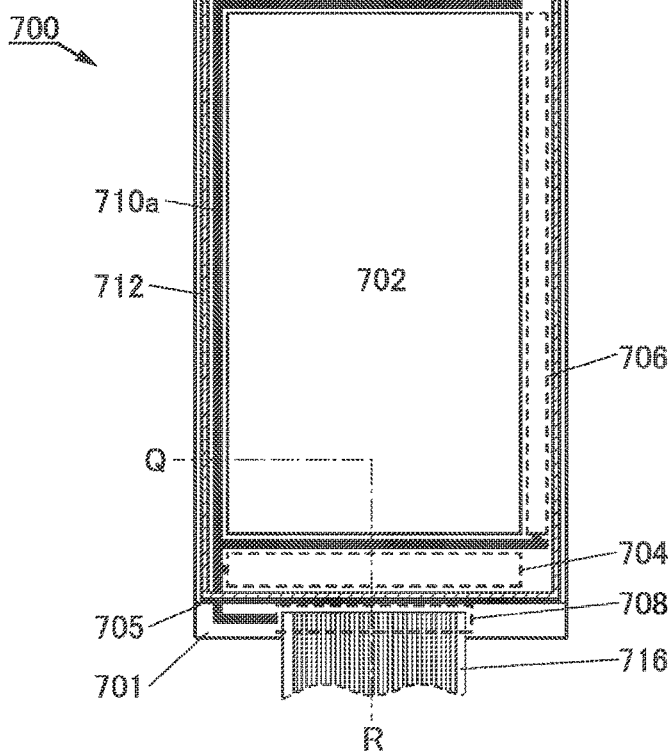
FIGS. 40A and 40B are top views each illustrating one embodiment of a display device.

FIG. 40A is a top view of an example of a display device. A display device 700 illustrated in FIG. 40A includes a pixel portion 702 provided over a first substrate 701; a source driver circuit portion 704 and a gate driver circuit portion 706 which are a driver circuit portion and provided over the first substrate 701; a sealant 712 provided to surround the pixel portion 702, the source driver circuit portion 704, and the gate driver circuit portion 706; and a second substrate 705 provided to face the first substrate 701. The first substrate 701 and the second substrate 705 are sealed with the sealant 712. That is, the pixel portion 702, the source driver circuit portion 704, and the gate driver circuit portion 706 are sealed with the first substrate 701, the sealant 712, and the second substrate 705. Although not illustrated in FIG. 40A, a display element is provided between the first substrate 701 and the second substrate 705.

In the display device 700, a flexible printed circuit (FPC) terminal portion 708 electrically connected to the pixel portion 702, the source driver circuit portion 704, and the gate driver circuit portion 706 is provided in a region different from the region which is surrounded by the sealant 712 and positioned over the first substrate 701. Furthermore, an FPC 716 is connected to the FPC terminal portion 708, and a variety of signals and the like are supplied to the pixel portion 702, the source driver circuit portion 704, and the gate driver circuit portion 706 through the FPC 716. Furthermore, a signal line 710*a* is connected to the pixel portion 702, the source driver circuit portion 704, the gate driver circuit portion 706, and FPC terminal portion 708. Various signals and the like are applied to the pixel portion 702, the source driver circuit portion 704, the gate driver circuit portion 706, and the FPC terminal portion 708 via the signal line 710*a* from the FPC 716.

Figure 40B:
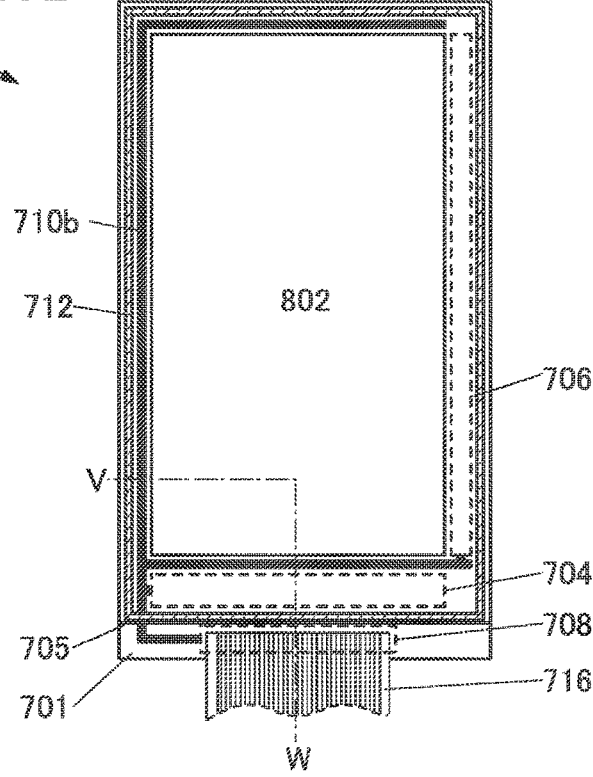

FIG. 40B is a top view of an example of a display device. In a display device 800 illustrated in FIG. 40B, a pixel portion 802 is used instead of the pixel portion 702 of the display device 700 shown in FIG. 40A, and a signal line 710*b* is used instead of the signal line 710*a*.

A plurality of gate driver circuit portions 706 may be provided in each of the display devices 700 and 800. An example in which the source driver circuit portion 704 and the gate driver circuit portion 706 are formed over the first substrate 701 where the pixel portion 702 or 802 is also formed in the display devices 700 and 800 is described; however, one embodiment of the present invention is not limited to the structure. For example, only the gate driver circuit portion 706 may be formed over the first substrate 701 or only the source driver circuit portion 704 may be formed over the first substrate 701. In this case, a substrate where a source driver circuit, a gate driver circuit, or the like is formed (e.g., a driver circuit substrate formed using a single crystal semiconductor film or a polycrystalline semiconductor film) may be mounted on the first substrate 701.

There is no particular limitation on the connection method of a separately formed driver circuit substrate; a chip on glass (COG) method, a wire bonding method, or the like can be used. Note that the display device in this specification means an image display device, a display device, or a light source (including a lighting device or the like). Furthermore, the display device also includes the following modules in its category: a module to which a connector such as an FPC or a tape carrier package (TCP) is attached; a module having a TCP at the tip of which a printed wiring board is provided; and a module in which a driver circuit substrate or an integrated circuit (IC) is directly mounted on a display element by a COG method.

The pixel portions 702 and 802, the source driver circuit portion 704, and the gate driver circuit portion 706 included in the display devices 700 and 800 include a plurality of transistors. As the plurality of transistors, any of the transistors that are the semiconductor devices of embodiments of the present invention can be used.

Note that the display device 700 includes a liquid crystal element as a display element, and the display device 800 includes a light-emitting element as a display element.

Note that a display element, a display device which is a device including a display element, a light-emitting element, and a light-emitting device which is a device including a light-emitting element can employ various modes and can include various elements. Examples of a display element, a display device, a light-emitting element, or a light-emitting device include a display medium whose contrast, luminance, reflectance, transmittance, or the like is changed by electromagnetic action, such as an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, or a carbon nanotube. Examples of display devices including EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

The display device 700 and the display device 800 are described in detail with reference to FIG. 41, FIG. 42, and FIG. 43. Common portions between the display device 700 and the display device 800 are described first, and then different portions are described.

<Common Portions in Display Devices>

Figure 41:
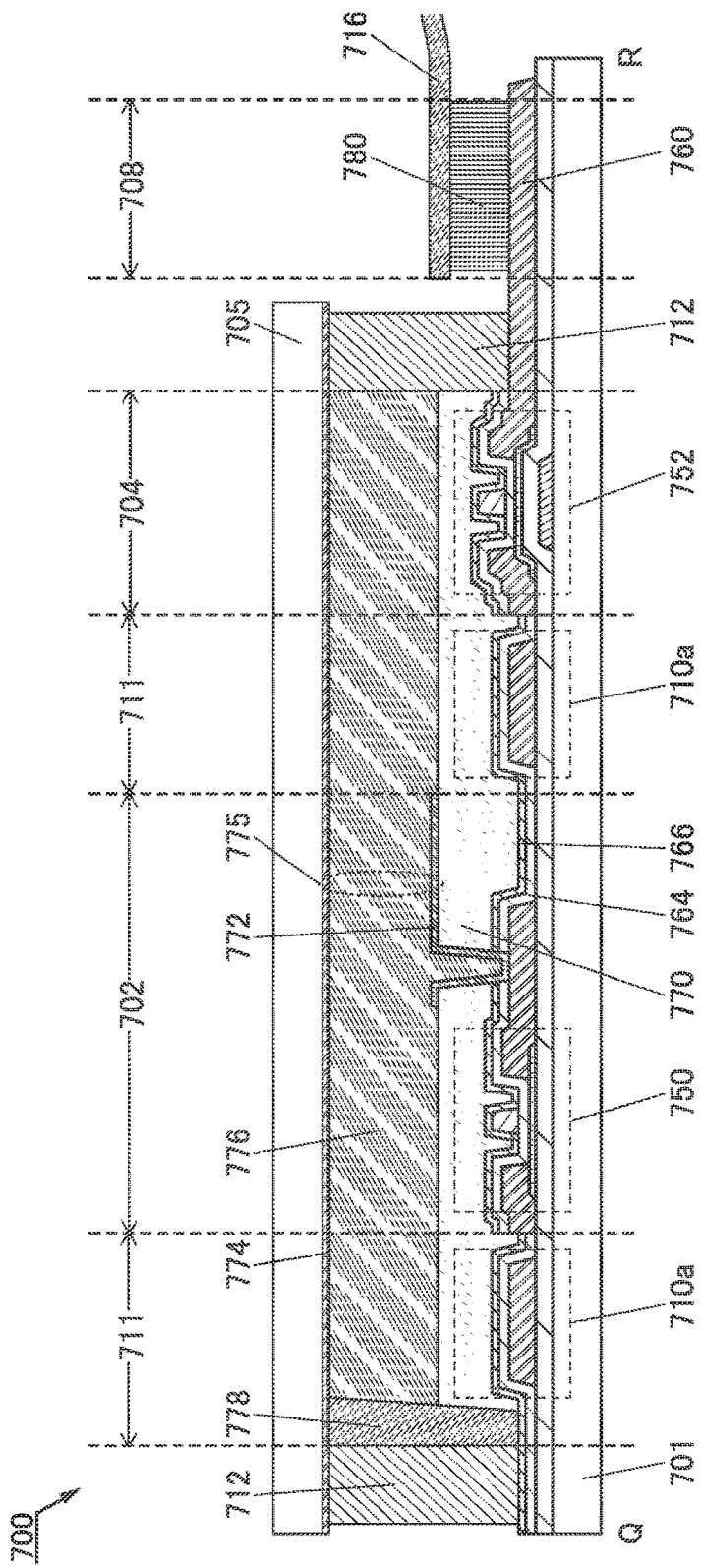
FIG. 41 is a cross-sectional view illustrating one embodiment of a display device.

FIG. 41 is a cross-sectional view taken along line dashed dotted line Q-R in FIG. 40A. FIG. 42 is a cross-sectional view taken along dashed dotted line V-W in FIG. 40B.

Figure 42:
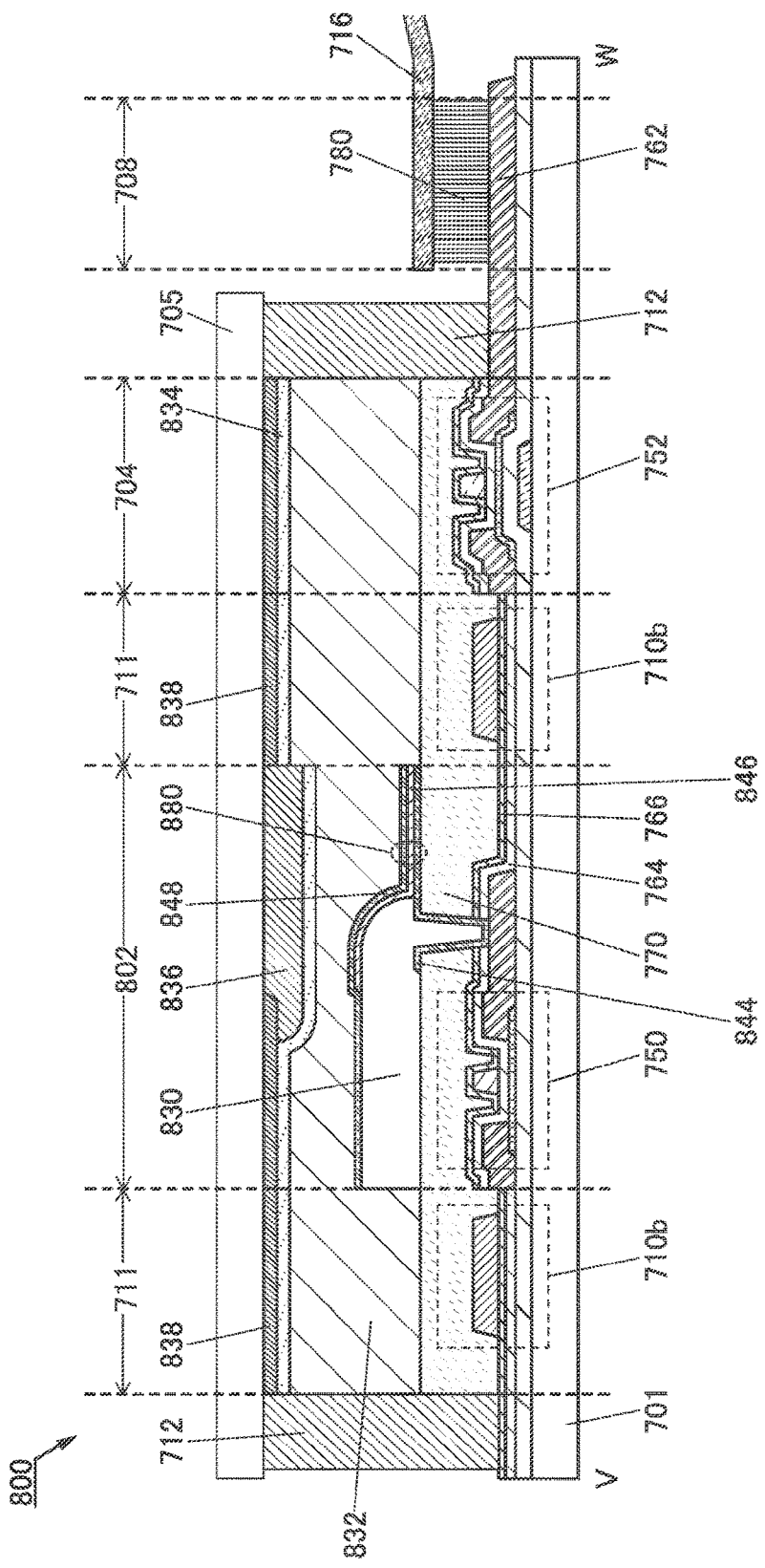
FIG. 42 is a cross-sectional view illustrating one embodiment of a display device.

The display devices 700 and 800 illustrated in FIG. 41 and FIG. 42 include a lead wiring portion 711, the pixel portion 702 or 802, the source driver circuit portion 704, and the FPC terminal portion 708. Note that the lead wiring portion 711 includes the signal line 710*a* or the signal line 710*b*.

The signal line 710*a* included in the lead wiring portion 711 is formed in the same process as conductive films serving as a source electrode and a drain electrode of a transistor 750 or 752. The signal line 710*b* included in the lead wiring portion 711 is formed in a process different from a process for forming a gate electrode, the source electrode, and the drain electrode of the transistor 750 or 752. Note that the signal line 710*a* or 710*b* may be formed using a conductive film which is formed in the same process as a conductive film functioning as the gate electrode of the transistor 750 or 752 or a conductive film which is formed in a process different from a process for forming the gate electrode, the source electrode, or the drain electrode.

The FPC terminal portion 708 includes a connection electrode 760, an anisotropic conductive film 780, and the FPC 716. Note that the connection electrode 760 is formed in the same process as the conductive films functioning as the source electrode layer and the drain electrode layer of the transistor 750. The connection electrode 760 is electrically connected to a terminal included in the FPC 716 through the anisotropic conductive film 780.

The display devices 700 and 800 illustrated in FIG. 41 and FIG. 42 are examples in which the transistor 750 is provided in the pixel portion 702 or 802, and a transistor 752 is provided in the source driver circuit portion 704. The transistor 750 has the same structure as the transistor 390 in Embodiment 3, and the transistor 752 has the same structure as the transistor 394 in Embodiment 3. Note that the structures of the transistors 750 and 752 are not limited to the structures of the transistors 390 and 394, and any of the other structures of transistors may be used as appropriate.

In the transistor used in this embodiment, which includes an oxide semiconductor film which is highly purified and in which formation of oxygen vacancy is suppressed, the current in an off state (off-state current) can be made low. Accordingly, an electrical signal such as an image signal can be held for a longer period, and a writing interval can be set longer in an on state. Accordingly, frequency of refresh operation can be reduced, which leads to an effect of suppressing power consumption.

The transistor used in this embodiment, which includes an oxide semiconductor film which is highly purified and in which formation of oxygen vacancy is suppressed, can have relatively high field-effect mobility and thus can operate at high speed. For example, with such a transistor which can operate at high speed used for a liquid crystal display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor which can operate at high speed can be used also in the pixel portion, whereby a high-quality image can be provided.

A wiring containing a copper element can be used for the signal line connected to the transistor in the pixel portion and the transistor in the driver circuit portion. Therefore, in the display device of one embodiment of the present invention, signal delay or the like due to wiring resistance is reduced, which enables display on a large screen.

Note that in this embodiment, the transistor 750 included in the pixel portion 702 or 802 and the transistor 752 included in the source driver circuit portion 704 have in the same size; however, this embodiment is not limited to this. The sizes (L/W) or the number of the transistors used in the pixel portion 702 and the source driver circuit portion 704 may vary as appropriate. The gate driver circuit portion 706 is not illustrated in FIG. 41 and FIG. 42; however, the gate driver circuit portion 706 can have a structure similar to that of the source driver circuit portion 704 by changing the portion to which the gate driver circuit portion 706 is connected, the connecting method, and the like.

Furthermore, in FIG. 41 and FIG. 42, a planarization insulating film 770 is provided over insulating films 764 and 766 included in the transistor 750 and the transistor 752.

The insulating film 766 can be formed using a material and a method similar to those of the insulating film 376 described in the above embodiments.

The planarization insulating film 770 can be formed using a heat-resistant organic material, such as a polyimide resin, an acrylic resin, a polyimide amide resin, a benzocyclobutene resin, a polyamide resin, or an epoxy resin. Note that the planarization insulating film 770 may be formed by stacking a plurality of insulating films formed using these materials. Alternatively, a structure without the planarization insulating film 770 may be employed.

A conductive film 772 or a conductive film 844 is connected to one of the conductive films functioning as the source electrode and the drain electrode included in the transistor 750. The conductive films 772 and 844 are each formed over the planarization insulating film 770 to function as a pixel electrode, i.e., one electrode of the display portion. As the conductive film 772, a conductive film which transmits visible light is preferably used. For example, the conductive film is preferably formed using a material including one of indium (In), zinc (Zn), and tin (Sn). As the conductive film 844, a reflective conductive film is preferably used.

<Structure Example 1 of Display Device Using Liquid Crystal Element as Display Element>

The display device 700 illustrated in FIG. 41 includes a liquid crystal element 775. The liquid crystal element 775 includes the conductive film 772, a conductive film 774, and a liquid crystal layer 776. The conductive film 774 is provided on the second substrate 705 side and functions as a counter electrode. The display device 700 in FIG. 41 is capable of displaying an image in such a manner that transmission or non-transmission is controlled by change in the alignment state of the liquid crystal layer 776 depending on a voltage applied to the conductive film 772 and the conductive film 774.

Although not illustrated in FIG. 41, an alignment film may be provided on a side of the conductive film 772 in contact with the liquid crystal layer 776 and on a side of the conductive film 774 in contact with the liquid crystal layer 776.

The display device 700 includes a light-blocking film 738, an insulating film 734, and a coloring film 736 on the second substrate 705 side. The coloring film 736 is provided to overlap with the liquid crystal element 775, and the light-blocking film 738 is provided in the lead wiring portion 711 and the source driver circuit portion 704. The coloring film 736 and the light-blocking film 738 are covered with the insulating film 734. The transistor 752 in the driver circuit portion and the transistor 750 in the pixel portion overlap with the light-blocking film 738; therefore, the transistors can be prevented from being irradiated with external light. Note that a coloring film may be provided instead of the light-blocking film 738.

Although not illustrated in FIG. 41, an optical member (an optical substrate) and the like such as a polarizing member, a retardation member, or an anti-reflection member may be provided as appropriate. For example, circular polarization may be employed by using a polarizing substrate and a retardation substrate. In addition, a backlight, a sidelight, or the like may be used as a light source.

For example, a glass substrate can be used as the first substrate 701 and the second substrate 705. As the first substrate 701 and the second substrate 705, a flexible substrate may be used. Examples of the flexible substrate include a plastic substrate.

A spacer 778 is provided between the first substrate 701 and the second substrate 705. The spacer 778 is a columnar spacer obtained by selective etching of an insulating film and is provided to control the thickness (cell gap) of the liquid crystal layer 776. Note that a spherical spacer may be used as the spacer 778.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased.

Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time and has optical isotropy. In addition, the liquid crystal composition which includes liquid crystal exhibiting a blue phase does not need alignment treatment and has a small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

In the case where a liquid crystal element is used as the display element, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode may be used. There are some examples of a vertical alignment mode; for example, a multi-domain vertical alignment (MVA) mode, a patterned vertical alignment (PVA) mode, an ASV mode, or the like can be employed.

As a display method in the pixel portion 702, a progressive method, an interlace method, or the like can be employed. Furthermore, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Note that, the sizes of display regions may be different between respective dots of color elements. Embodiments of the disclosed invention are not limited to a display device for color display; the disclosed invention can also be applied to a display device for monochrome display.

<Display Device Using Light-Emitting Element as Display Element>

The display device 800 illustrated in FIG. 42 includes a light-emitting element 880. The light-emitting element 880 includes the conductive film 844, an EL layer 846, and a conductive film 848. The display device 800 is capable of displaying an image by light emission from the EL layer 846 included in the light-emitting element 880.

In the display device 800 illustrated in FIG. 42, the insulating film 830 is provided over the planarization insulating film 770 and the conductive film 844. The insulating film 830 covers part of the conductive film 844. Note that the light-emitting element 880 has a top emission structure. Therefore, the conductive film 848 has a light-transmitting property and transmits light emitted from the EL layer 846. Although the top-emission structure is described as an example in this embodiment, one embodiment of the present invention is not limited thereto. A bottom-emission structure in which light is emitted to the conductive film 844 side, or a dual-emission structure in which light is emitted to both the conductive film 844 side and the conductive film 848 side may be employed.

The coloring film 836 is provided to overlap the light-emitting element 880, and the light-blocking film 838 is provided to overlap the insulating film 830 and to be included in the lead wiring portion 711 and in the source driver circuit portion 704. The coloring film 836 and the light-blocking film 838 are covered with the insulating film 834. A space between the light-emitting element 880 and the insulating film 834 is filled with the sealing film 832. Although the structure of the display device 800 with the coloring film 836 is described in this embodiment, one embodiment of the present invention is not limited thereto. For example, a structure without the coloring film 836 may be employed in the case where the EL layer 846 is formed by separate coloring.

Next, a display device 700a that is a modification example of the display device 700 illustrated in FIG. 41 is described with reference to FIG. 43.

<Structure Example 2 of Display Device Using Liquid Crystal Element as Display Element>

Figure 43:
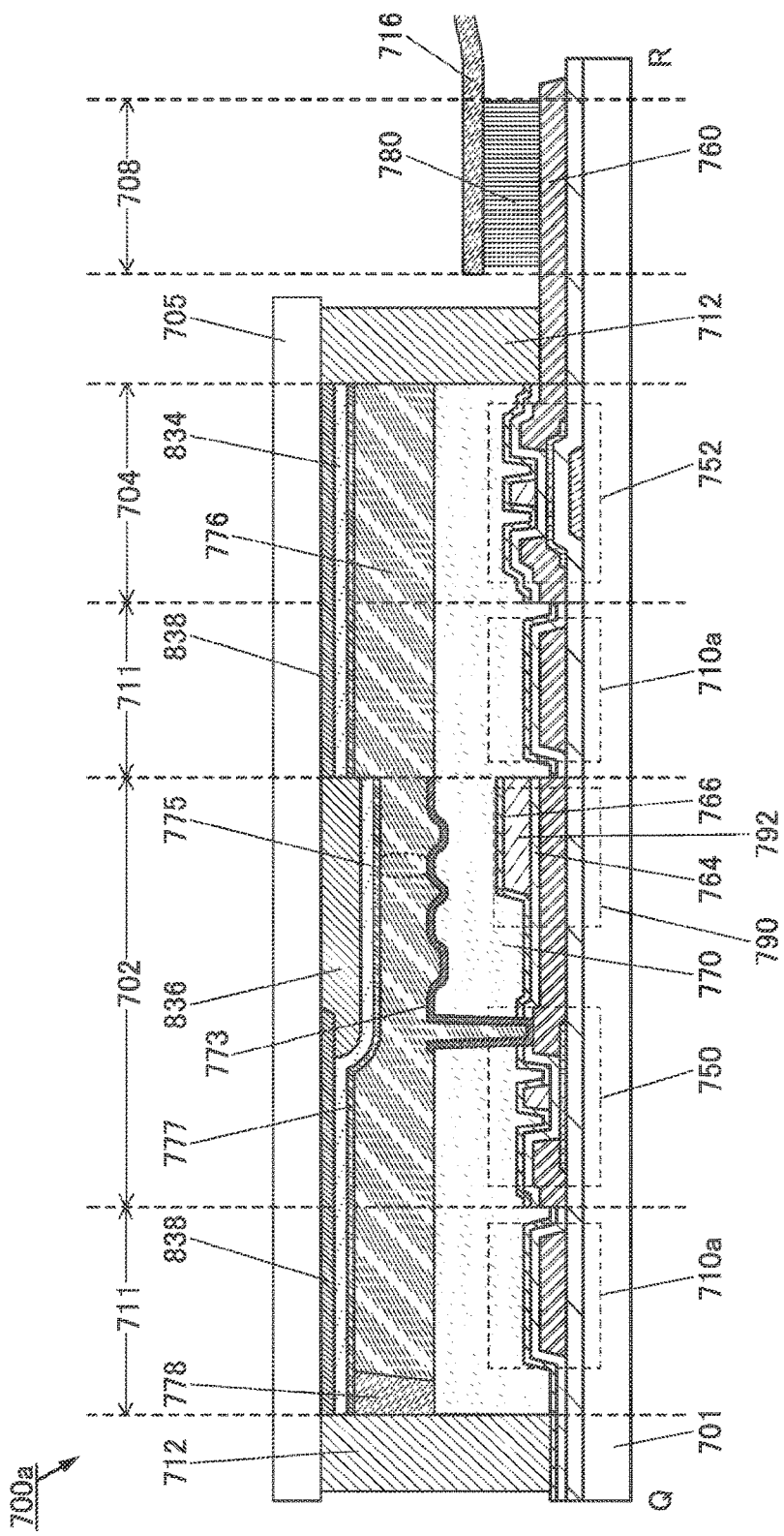
FIG. 43 is a cross-sectional view illustrating one embodiment of a display device.

The display device 700a in FIG. 43 includes the liquid crystal element 775. The liquid crystal element 775 includes a conductive film 773, a conductive film 777, and the liquid crystal layer 776. The conductive film 773 is provided over the planarization insulating film 770 over the first substrate 701 to function as a reflective electrode. The display device 700a in FIG. 43 is what is called a reflective color liquid crystal display device in which external light is reflected by the conductive film 773 to display an image through the coloring film 836.

Note that projections and depressions are provided in part of the planarization insulating film 770 of the pixel portion 702 in the display device 700a in FIG. 43. The projections and depressions can be formed in such a manner that the planarization insulating film 770 is formed using an organic resin film or the like, and projections and depressions are formed on the surface of the organic resin film. The conductive film 773 functioning as a reflective electrode is formed along the projections and depressions. Therefore, when external light is incident on the conductive film 773, the light is reflected diffusely at the surface of the conductive film 773, whereby visibility can be improved.

The display device 700a includes the light-blocking film 838, the insulating film 834, and the coloring film 836 on the second substrate 705 side. The conductive film 773 included in the display device 700a is electrically connected to the conductive films functioning as the source electrode or the drain electrode of the transistor 750. For the conductive film 773, the material and method in the description of the conductive film 844 can be referred to.

The display device 700a includes a capacitor 790. The capacitor 790 includes a pair of electrodes and an insulating film therebetween. Specifically, in the capacitor 790, a conductive film which is formed in the same process as the conductive film functioning as the source electrode or the drain electrode of the transistor 750 is used as one electrode, a conductive film 792 which is formed in the same process as a conductive film functioning as the gate electrode of the transistor 750 is used as the other electrode, and an insulating film which is formed in the same process as an insulating film functioning as the gate insulating film of the transistor 750 are included.

As described above, the transistor that is the semiconductor device of one embodiment of the present invention can be applied to a variety of display devices.

The structure described in this embodiment can be used in appropriate combination with the structure described in any of the other embodiments.

Embodiment 8

In this embodiment, a display device that can be formed using a semiconductor device of one embodiment of the present invention is described with reference to FIGS. 44A to 44C.

The display device illustrated in FIG. 44A includes a region including pixels of display elements (hereinafter the region is referred to as a pixel portion 502), a circuit portion being provided outside the pixel portion 502 and including a circuit for driving the pixels (hereinafter the portion is referred to as a driver circuit portion 504), circuits each having a function of protecting an element (hereinafter the circuits are referred to as protection circuits 506), and a terminal portion 507. Note that the protection circuits 506 are not necessarily provided.

A part or the whole of the driver circuit portion 504 is preferably formed over a substrate over which the pixel portion 502 is formed, in which case the number of components and the number of terminals can be reduced. When a part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X rows (X is a natural number of 2 or more) and Y columns (Y is a natural number of 2 or more) (hereinafter, such circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter, such wirings are referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, the gate driver 504a can supply another signal.

The source driver 504b includes a shift register or the like. The source driver 504b receives a signal (video signal) from which a data signal is derived, as well as a signal for driving the shift register, through the terminal portion 507. The source driver 504b has a function of generating a data signal to be written to the pixel circuit 501 which is based on the video signal. In addition, the source driver 504b has a function of controlling output of a data signal in response to a pulse signal produced by input of a start pulse signal, a clock signal, or the like. Furthermore, the source driver 504b has a function of controlling the potentials of wirings supplied with data signals (hereinafter such wirings are referred to as signal lines DL_1 to DL_Y). Alternatively, the source driver 504b has a function of supplying an initialization signal. Without being limited thereto, the source driver 504b can supply another signal.

The source driver 504b includes a plurality of analog switches or the like, for example. The source driver 504b can output, as the data signals, signals obtained by time-dividing the video signal by sequentially turning on the plurality of analog switches. The source driver 504b may include a shift register or the like.

A pulse signal and a data signal are input to each of the plurality of pixel circuits 501 through one of the plurality of scan lines GL supplied with scan signals and one of the plurality of signal lines DL supplied with data signals, respectively. Writing and holding of the data signal to and in each of the plurality of pixel circuits 501 are controlled by the gate driver 504a. For example, to the pixel circuit 501 in the m-th row and the n-th column (m is a natural number of less than or equal to X, and n is a natural number of less than or equal to Y), a pulse signal is input from the gate driver 504a through the scan line GL_m, and a data signal is input from the source driver 504b through the signal line DL_n in accordance with the potential of the scan line GL_m.

Figure 44A:
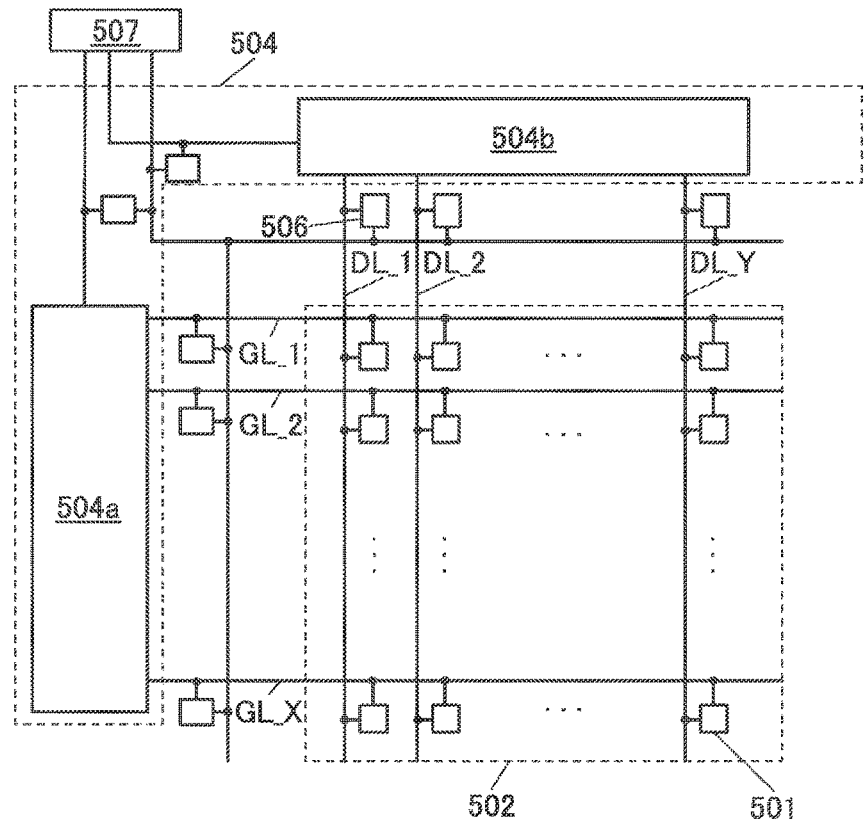
FIGS. 44A to 44C are a block diagram and circuit diagrams illustrating a display device.

The protection circuit 506 shown in FIG. 44A is connected to, for example, the scan line GL between the gate driver 504a and the pixel circuit 501. Alternatively, the protection circuit 506 is connected to the signal line DL between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 means a portion having terminals for inputting power, control signals, and video signals to the display device from external circuits.

The protection circuit 506 is a circuit that electrically connects a wiring connected to the protection circuit to another wiring when a potential out of a certain range is applied to the wiring connected to the protection circuit.

As illustrated in FIG. 44A, the protection circuits 506 are provided for the pixel portion 502 and the driver circuit portion 504, so that the resistance of the display device to overcurrent generated by electrostatic discharge (ESD) or the like can be improved. Note that the configuration of the protection circuits 506 is not limited to that, and for example, the protection circuit 506 may be configured to be connected to the gate driver 504a or the protection circuit 506 may be configured to be connected to the source driver 504b. Alternatively, the protection circuit 506 may be configured to be connected to the terminal portion 507.

In FIG. 44A, an example in which the driver circuit portion 504 includes the gate driver 504a and the source driver 504b is shown; however, the structure is not limited thereto. For example, only the gate driver 504a may be formed and a separately prepared substrate where a source driver circuit is formed (e.g., a driver circuit substrate formed with a single crystal semiconductor film or a polycrystalline semiconductor film) may be mounted.

Figure 44B:
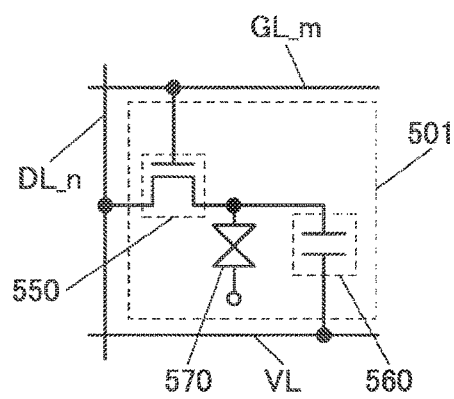

Each of the plurality of pixel circuits 501 in FIG. 44A can have the structure illustrated in FIG. 44B, for example.

The pixel circuit 501 illustrated in FIG. 44B includes a liquid crystal element 570, a transistor 550, and a capacitor 560.

As the transistor 550, any of the transistors described in the above embodiment, for example, can be used as appropriate.

The potential of one of a pair of electrodes of the liquid crystal element 570 is set in accordance with the specifications of the pixel circuit 501 as appropriate. The alignment state of the liquid crystal element 570 depends on written data. A common potential may be supplied to one of the pair of electrodes of the liquid crystal element 570 included in each of the plurality of pixel circuits 501. Furthermore, the potential supplied to one of the pair of electrodes of the liquid crystal element 570 in the pixel circuit 501 in one row may be different from the potential supplied to one of the pair of electrodes of the liquid crystal element 570 in the pixel circuit 501 in another row.

As examples of a driving method of the display device including the liquid crystal element 570, any of the following modes can be given: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like. Other examples of the driving method of the display device include an electrically controlled birefringence (ECB) mode, a polymer dispersed liquid crystal (PDLC) mode, a polymer network liquid crystal (PNLC) mode, and a guest-host mode. Note that the present invention is not limited to these examples, and various liquid crystal elements and driving methods can be applied to the liquid crystal element and the driving method thereof.

In the pixel circuit 501 in the m-th row and the n-th column, one of a source electrode and a drain electrode of the transistor 550 is electrically connected to the signal line DL_n, and the other is electrically connected to the other of the pair of electrodes of the liquid crystal element 570. A gate electrode of the transistor 550 is electrically connected to the scan line GL_m. The transistor 550 has a function of controlling whether to write a data signal by being turned on or off.

One of a pair of electrodes of the capacitor 560 is electrically connected to a wiring to which a potential is supplied (hereinafter referred to as a potential supply line VL), and the other is electrically connected to the other of the pair of electrodes of the liquid crystal element 570. The potential of the potential supply line VL is set in accordance with the specifications of the pixel circuit 501 as appropriate. The capacitor 560 functions as a storage capacitor for storing written data.

For example, in the display device including the pixel circuit 501 in FIG. 44B, the pixel circuits 501 are sequentially selected row by row by the gate driver 504a illustrated in FIG. 44A, whereby the transistors 550 are turned on and a data signal is written.

When the transistors 550 are turned off, the pixel circuits 501 in which the data has been written are brought into a holding state. This operation is sequentially performed row by row; thus, an image can be displayed.

Figure 44C:
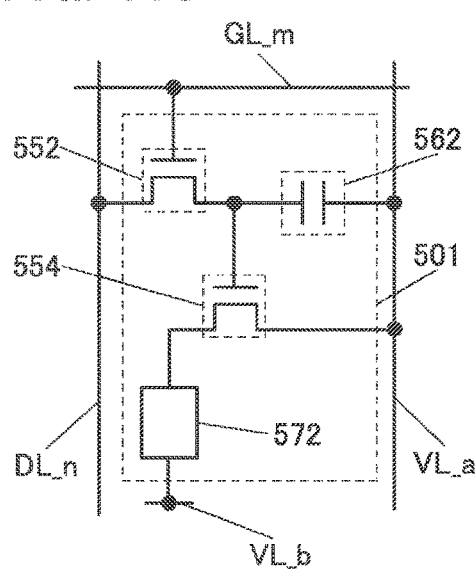

Alternatively, each of the plurality of pixel circuits 501 in FIG. 44A can have the structure illustrated in FIG. 44C, for example.

The pixel circuit 501 illustrated in FIG. 44C includes transistors 552 and 554, a capacitor 562, and a light-emitting element 572. Here, any of the transistors described in the above embodiment, for example, can be used as one or both of the transistors 552 and 554 as appropriate.

One of a source electrode and a drain electrode of the transistor 552 is electrically connected to a wiring to which a data signal is supplied (a signal line DL_n). A gate electrode of the transistor 552 is electrically connected to a wiring to which a gate signal is supplied (a scan line GL_m).

The transistor 552 has a function of controlling whether to write a data signal by being turned on or off.

One of a pair of electrodes of the capacitor 562 is electrically connected to a wiring to which a potential is supplied (hereinafter referred to as a potential supply line VL_a), and the other is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. Furthermore, a gate electrode of the transistor 554 is electrically connected to the other of the source electrode and the drain electrode of the transistor 552.

One of an anode and a cathode of the light-emitting element 572 is electrically connected to a potential supply line VL_b, and the other is electrically connected to the other of the source electrode and the drain electrode of the transistor 554.

As the light-emitting element 572, an organic electroluminescent element (also referred to as an organic EL element) or the like can be used, for example. Note that the light-emitting element 572 is not limited to an organic EL element; an inorganic EL element including an inorganic material may be used.

A high power supply potential VDD is supplied to one of the potential supply line VL_a and the potential supply line VL_b, and a low power supply potential VSS is supplied to the other.

For example, in the display device including the pixel circuit 501 in FIG. 44C, the pixel circuits 501 are sequentially selected row by row by the gate driver 504a illustrated in FIG. 44A, whereby the transistors 552 are turned on and a data signal is written.

When the transistors 552 are turned off, the pixel circuits 501 in which the data has been written are brought into a holding state. Furthermore, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image can be displayed.

The structure described in this embodiment can be used in appropriate combination with any of the structures described in the other embodiments.

Embodiment 9

In this embodiment, a display module and electronic devices that can be formed using a semiconductor device of one embodiment of the present invention are described with reference to FIG. 45 and FIGS. 46A to 46H.

Figure 45:
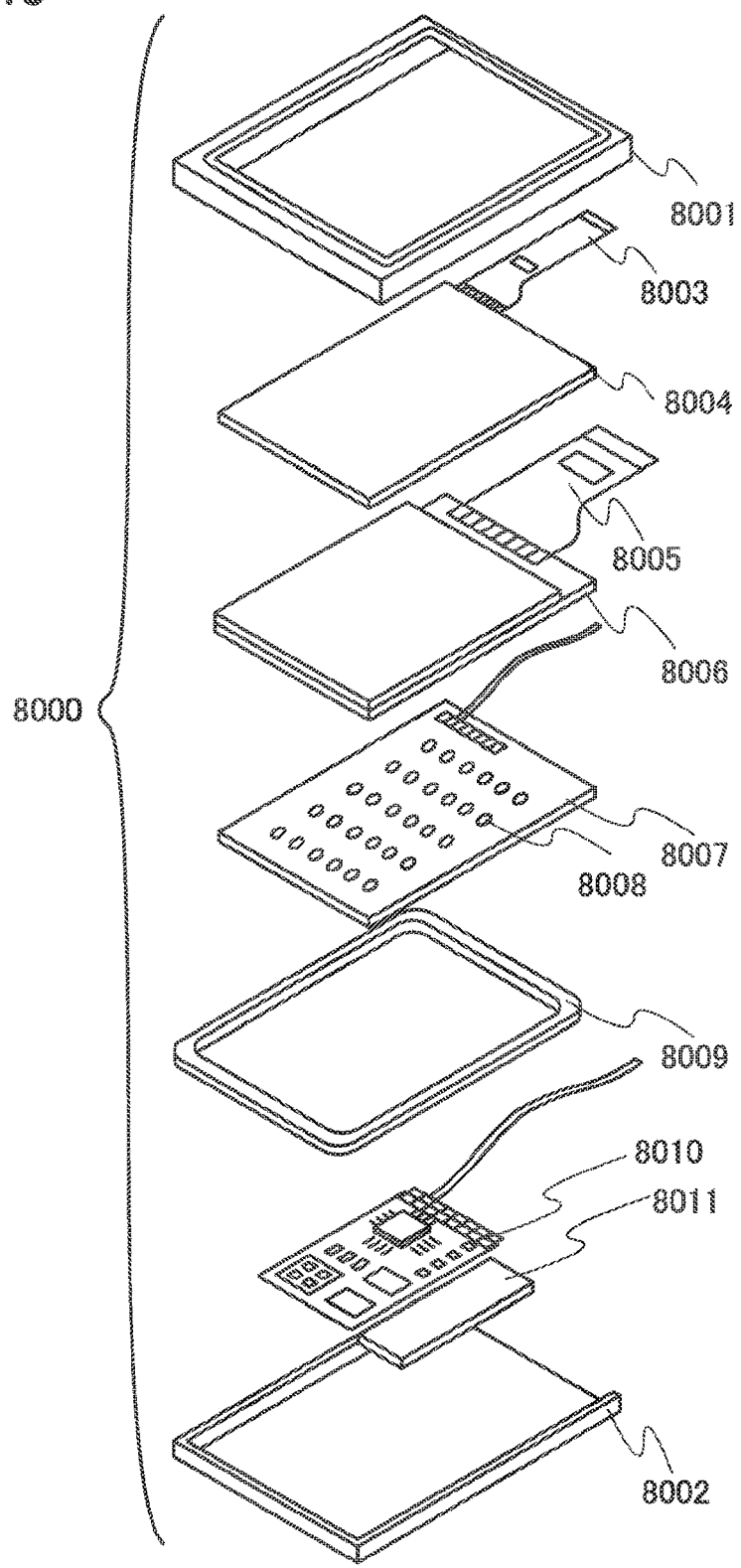
FIG. 45 illustrates a display module.

In a display module 8000 illustrated in FIG. 45, a touch panel 8004 connected to an FPC 8003, a display panel 8006 connected to an FPC 8005, a backlight 8007, a frame 8009, a printed board 8010, and a battery 8011 are provided between an upper cover 8001 and a lower cover 8002.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. A counter substrate (sealing substrate) of the display panel 8006 can have a touch panel function. A photosensor may be provided in each pixel of the display panel 8006 to form an optical touch panel.

The backlight 8007 includes a light source 8008. Note that although a structure in which the light sources 8008 are provided over the backlight 8007 is illustrated in FIG. 45, one embodiment of the present invention is not limited to this structure. For example, a structure in which the light source 8008 is provided at an end portion of the backlight 8007 and a light diffusion plate is further provided may be employed. Note that the backlight 8007 need not be provided in the case where a self-luminous light-emitting element such as an organic EL element is used or in the case where a reflective panel or the like is employed.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 46A to 46H illustrate electronic devices. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 46A:
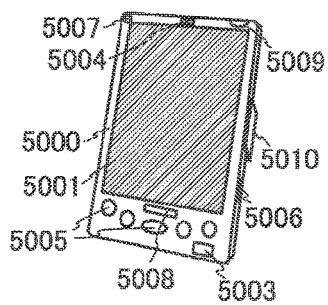
FIGS. 46A to 46H illustrate electronic devices.
Figure 46B:
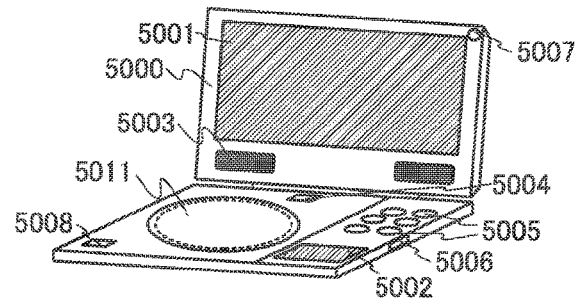
Figure 46C:
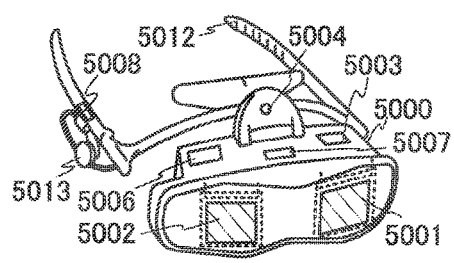
Figure 46D:
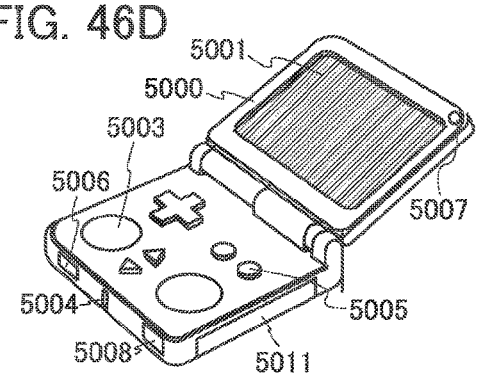
Figure 46E:
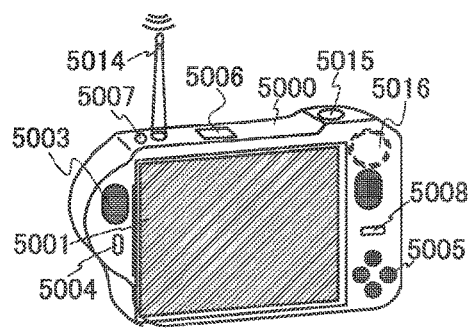
Figure 46F:
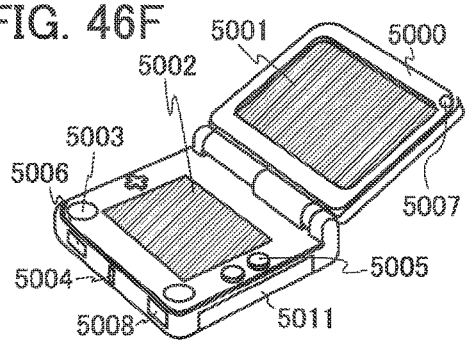
Figure 46G:
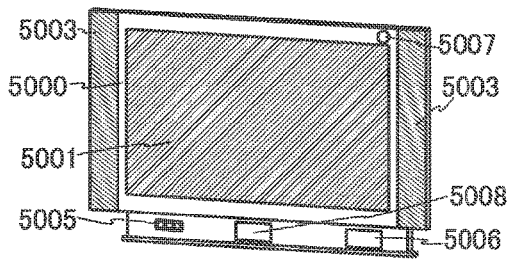
Figure 46H:
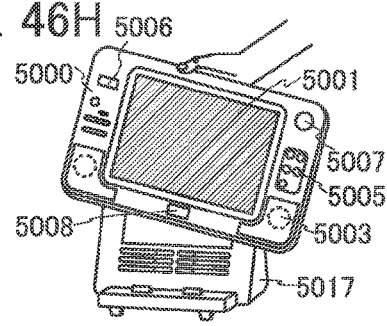

FIG. 46A illustrates a mobile computer that can include a switch 5009, an infrared port 5010, and the like in addition to the above components. FIG. 46B illustrates a portable image reproducing device (e.g., a DVD player) that is provided with a memory medium and can include a second display portion 5002, a memory medium reading portion 5011, and the like in addition to the above components. FIG. 46C illustrates a goggle-type display that can include the second display portion 5002, a support 5012, an earphone 5013, and the like in addition to the above components. FIG. 46D illustrates a portable game machine that can include the memory medium reading portion 5011 and the like in addition to the above components. FIG. 46E illustrates a digital camera that has a television reception function and can include an antenna 5014, a shutter button 5015, an image receiving portion 5016, and the like in addition to the above components. FIG. 46F illustrates a portable game machine that can include the second display portion 5002, the memory medium reading portion 5011, and the like in addition to the above components. FIG. 46G illustrates a television receiver that can include a tuner, an image processing portion, and the like in addition to the above components. FIG. 46H illustrates a portable television receiver that can include a charger 5017 capable of transmitting and receiving signals, and the like in addition to the above components.

The electronic devices illustrated in FIGS. 46A to 46H can have a variety of functions, for example, a function of displaying a variety of data (a still image, a moving image, a text image, and the like) on the display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Furthermore, the electronic device including a plurality of display portions can have a function of displaying image data mainly on one display portion while displaying text data on another display portion, a function of displaying a three-dimensional image by displaying images on a plurality of display portions with a parallax taken into account, or the like. Furthermore, the electronic device including an image receiving portion can have a function of shooting a still image, a function of taking a moving image, a function of automatically or manually correcting a shot image, a function of storing a shot image in a memory medium (an external memory medium or a memory medium incorporated in the camera), a function of displaying a shot image on the display portion, or the like. Note that functions that can be provided for the electronic devices illustrated in FIGS. 46A to 46H are not limited to those described above, and the electronic devices can have a variety of functions.

The electronic devices described in this embodiment each include the display portion for displaying some sort of data. Note that the semiconductor device of one embodiment of the present invention can also be used for an electronic device which does not have a display portion.

The structure described in this embodiment can be used in appropriate combination with any of the structures described in the other embodiments.

REFERENCE NUMERALS

DL_Y: signal line, DL_1: signal line, GL_X: scan line, GL_1: scan line, 102: substrate, 103: insulating film, 104: insulating film, 104a: nitride insulating film, 104b: oxide insulating film, 106: oxide semiconductor film, 106a: region, 106b: region, 106c: region, 106d: region, 107: oxide semiconductor film, 107a: oxide semiconductor film, 107b: oxide semiconductor film, 107c: oxide semiconductor film, 108: insulating film, 109: conductive film, 110: conductive film, 110a: conductive film, 110b: conductive film, 110c: conductive film, 111: mask, 112: conductive film, 112a: conductive film, 112b: conductive film, 112c: conductive film, 114: conductive film, 114a: conductive film, 114b: conductive film, 114c: conductive film, 116: insulating film, 117: impurity element, 118: insulating film, 119: film, 121: oxygen, 122: insulating film, 123: etching gas, 124: conductive film, 135: end portion, 136: end portion, 137: end portion, 140a: opening portion, 140b: opening portion, 142a: opening portion, 142b: opening portion, 150: transistor, 151: transistor, 152: transistor, 153: transistor, 154: transistor, 156: oxide semiconductor film, 159: capacitor, 162: substrate, 164: insulating film, 164a: nitride insulating film, 164b: oxide insulating film, 166: oxide semiconductor film, 166a: region, 166b: region, 166c: region, 166d: region, 167: etching gas, 167a: oxide semiconductor film, 167b: oxide semiconductor film, 167c: oxide semiconductor film, 168: insulating film, 169: conductive film, 170: conductive film, 170a: conductive film, 170b: conductive film, 170c: conductive film, 172: conductive film, 172a: conductive film, 172b: conductive film, 172c: conductive film, 174:

conductive film, 174a: conductive film, 174b: conductive film, 174c: conductive film, 176: insulating film, 177: impurity element, 178: insulating film, 180a: opening portion, 180b: opening portion, 182: insulating film, 182a: opening portion, 182b: opening portion, 183: opening portion, 184: conductive film, 190: transistor, 191: transistor, 192: transistor, 193: transistor, 194: transistor, 195: end portion, 196: end portion, 197: end portion, 198: oxide semiconductor film, 199: capacitor, 201: conductive film, 206: oxide semiconductor film, 210: conductive film, 212: conductive film, 214: conductive film, 220a: opening portion, 220b: opening portion, 221: conductive film, 226: oxide semiconductor film, 230: conductive film, 232: conductive film, 234: conductive film, 240a: opening portion, 240b: opening portion, 246: oxide semiconductor film, 261: conductive film, 265a: oxide semiconductor film, 265b: oxide semiconductor film, 266: oxide semiconductor film, 267a: oxide semiconductor film, 267b: oxide semiconductor film, 267c: oxide semiconductor film, 268: conductive film, 270: conductive film, 272: insulating film, 274: conductive film, 306: oxide semiconductor film, 312: insulating film, 331a: sidewall insulating film, 331b: sidewall insulating film, 350: transistor, 354: transistor, 362: substrate, 364: insulating film, 364a: nitride insulating film, 364b: oxide insulating film, 366: oxide semiconductor film, 366a: region, 366b: region, 366c: region, 366d: region, 366e: offset region, 366x: region, 366y: region, 367: conductive film, 367a: oxide semiconductor film, 367b: oxide semiconductor film, 367c: oxide semiconductor film, 368: conductive film, 368a: conductive film, 368b: conductive film, 368c: conductive film, 368d: conductive film, 370: conductive film, 370a: conductive film, 370b: conductive film, 370c: conductive film, 370d: conductive film, 372: insulating film, 373: conductive film, 374: conductive film, 374a: conductive film, 374b: conductive film, 374d: conductive film, 374e: conductive film, 375: insulating film, 376: insulating film, 377: impurity element, 382: insulating film, 384: conductive film, 385: end portion, 386: end portion, 387: end portion, 388a: opening portion, 388b: opening portion, 390: transistor, 390a: transistor, 391: transistor, 392: transistor, 393: transistor, 394: transistor, 395a: transistor, 395b: transistor, 396: oxide semiconductor film, 397a: transistor, 397b: transistor, 399: capacitor, 501: pixel circuit, 502: pixel portion, 504: driver circuit portion, 504a: gate driver, 504b: source driver, 506: protection circuit, 507: terminal portion, 550: transistor, 552: transistor, 554: transistor, 560: capacitor, 562: capacitor, 570: liquid crystal element, 572: light-emitting element, 700: display device, 700a: display device, 701: substrate, 702: pixel portion, 704: source driver circuit portion, 705: substrate, 706: gate driver circuit portion, 708: FPC terminal portion, 710a: signal line, 710b: signal line, 711: wiring portion, 712: sealant, 716: FPC, 734: insulating film, 736: coloring film, 738: light-blocking film, 750: transistor, 752: transistor, 760: connection electrode, 764: insulating film, 766: insulating film, 770: planarization insulating film, 772: conductive film, 773: conductive film, 774: conductive film, 775: liquid crystal element, 776: liquid crystal layer, 777: conductive film, 778: spacer, 780: anisotropic conductive film, 790: capacitor, 792: conductive film, 800: display device, 802: pixel portion, 830: insulating film, 832: sealing film, 834: insulating film, 836: coloring film, 838: light-blocking film, 844: conductive film, 846: EL layer, 848: conductive film, 880: light-emitting element, 5000: housing, 5001: display portion, 5002: display portion, 5003: speaker, 5004: LED lamp, 5005: operation key, 5006: connection terminal, 5007: sensor, 5008: microphone, 5009: switch, 5010: infrared port, 5011: memory medium reading portion, 5012: support, 5013: earphone, 5014: antenna, 5015: shutter button, 5016: image receiving portion, 5017: charger, 5100: pellet, 5100a: pellet, 5100b: pellet, 5101: ion, 5102: zinc oxide layer, 5103: particle, 5105a: pellet, 5105a1: region, 5105a2: pellet, 5105b: pellet, 5105c: pellet, 5105d: pellet, 5105d1: region, 5105e: pellet, 5120: substrate, 5130: target, 5161: region, 8000: display module, 8001: upper cover, 8002: lower cover, 8003: FPC, 8004: touch panel, 8005: FPC, 8006: display panel, 8007: backlight, 8008: light source, 8009: frame, 8010: printed board, 8011: battery.

This application is based on Japanese Patent Application serial no. 2013-271783 filed with Japan Patent Office on Dec. 27, 2013, the entire contents of which are hereby incorporated by reference.

What is claimed is:

1. A semiconductor device comprising:
a pixel portion comprising:
a first transistor comprising:
a first oxide semiconductor film over and in direct contact with a first insulating film;
a gate insulating film over the first oxide semiconductor film; and
a gate electrode over the gate insulating film,
a second transistor electrically connected to the first transistor;
a second insulating film over the gate electrode of the first transistor;
a conductive film electrically connected to the first oxide semiconductor film; and
a capacitor comprising:
a second oxide semiconductor film over and in direct contact with the first insulating film;
the second insulating film over the second oxide semiconductor film; and
the conductive film over the second insulating film, and
a driver circuit portion electrically connected to the first transistor,
wherein the second insulating film is in direct contact with the first oxide semiconductor film, the gate insulating film, the gate electrode, the conductive film, and the second oxide semiconductor film.

2. The semiconductor device according to claim 1, wherein the first oxide semiconductor film comprises a rare gas element.

3. The semiconductor device according to claim 1, wherein the conductive film is electrically connected to one of a source and a drain of the first transistor through a hole provided in the second insulating film.

4. The semiconductor device according to claim 1, wherein the second insulating film is in direct contact with a top surface and a side surface of the gate insulating film.

5. The semiconductor device according to claim 1, wherein the conductive film is a transparent conductive film.

6. The semiconductor device according to claim 1, wherein the conductive film comprises any one of indium tin oxide, indium oxide including tungsten oxide, indium zinc oxide including tungsten oxide, indium oxide including titanium oxide, indium tin oxide including titanium oxide, indium zinc oxide, and indium tin oxide including silicon oxide.

7. The semiconductor device according to claim 1, wherein each of the gate electrode and the conductive film comprises copper.

8. The semiconductor device according to claim 1, further comprising an organic resin film over the second insulating film,
wherein the organic resin film comprises any one of polyimide, acrylic, polyamide, and epoxy.

9. The semiconductor device according to claim 1, further comprising a third transistor in the driver circuit portion,
wherein the first transistor and the third transistor have different structures.

10. The semiconductor device according to claim 1,
wherein the first oxide semiconductor film comprises a crystalline structure.

11. A semiconductor device comprising:
a pixel portion comprising:
 a first transistor comprising:
  a first oxide semiconductor film over and in direct contact with a first insulating film;
  a gate insulating film over the first oxide semiconductor film; and
  a gate electrode over the gate insulating film,
 a second transistor electrically connected to the first transistor;
 a second insulating film over the gate electrode of the first transistor;
 a conductive film electrically connected to the first oxide semiconductor film;
 a light-emitting element electrically connected to the second transistor; and
 a capacitor comprising:
  a second oxide semiconductor film over and in direct contact with the first insulating film;
  the second insulating film over the second oxide semiconductor film; and
  the conductive film over the second insulating film, and
a driver circuit portion electrically connected to the first transistor,
wherein the second insulating film is in direct contact with the first oxide semiconductor film, the gate insulating film, the gate electrode, the conductive film, and the second oxide semiconductor film.

12. The semiconductor device according to claim 11,
wherein the first oxide semiconductor film comprises a rare gas element.

13. The semiconductor device according to claim 11,
wherein the conductive film is electrically connected to one of a source and a drain of the first transistor through a hole provided in the second insulating film.

14. The semiconductor device according to claim 11,
wherein the second insulating film is in direct contact with a top surface and a side surface of the gate insulating film.

15. The semiconductor device according to claim 11,
wherein the conductive film is a transparent conductive film.

16. The semiconductor device according to claim 11,
wherein the conductive film comprises any one of indium tin oxide, indium oxide including tungsten oxide, indium zinc oxide including tungsten oxide, indium oxide including titanium oxide, indium tin oxide including titanium oxide, indium zinc oxide, and indium tin oxide including silicon oxide.

17. The semiconductor device according to claim 11,
wherein each of the gate electrode and the conductive film comprises copper.

18. The semiconductor device according to claim 11, further comprising an organic resin film over the second insulating film,
wherein the organic resin film comprises any one of polyimide, acrylic, polyamide, and epoxy.

19. The semiconductor device according to claim 11, further comprising a third transistor in the driver circuit portion,
wherein the first transistor and the third transistor have different structures.

20. The semiconductor device according to claim 11,
wherein the first oxide semiconductor film comprises a crystalline structure.

* * * * *